US012784664B2

(12) United States Patent
Kim

(10) Patent No.: US 12,784,664 B2
(45) Date of Patent: Nov. 3, 2026

(54) DISPLAY DEVICE

(71) Applicant: LG Display Co., Ltd., Seoul (KR)

(72) Inventor: YoungJin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/246,710

(22) Filed: Jun. 24, 2025

(65) Prior Publication Data

US 2026/0031025 A1 Jan. 29, 2026

(30) Foreign Application Priority Data

Jul. 23, 2024 (KR) ........................ 10-2024-0097529

(51) Int. Cl.
*G09G 3/32* (2016.01)
*H10H 29/49* (2025.01)

(52) U.S. Cl.
CPC ............... *G09G 3/32* (2013.01); *H10H 29/49* (2025.01); *G09G 2300/0819* (2013.01); *G09G 2300/0861* (2013.01); *G09G 2310/08* (2013.01); *G09G 2320/0233* (2013.01); *G09G 2320/04* (2013.01); *G09G 2330/08* (2013.01); *G09G 2330/10* (2013.01); *G09G 2330/12* (2013.01); *G09G 2354/00* (2013.01)

(58) Field of Classification Search
CPC ... G09G 2300/0426; G09G 2320/0233; G09G 3/3233; G09G 2300/0842
See application file for complete search history.

(56) References Cited

U.S. PATENT DOCUMENTS

| | | | | |
|---|---|---|---|---|
| 2019/0347985 | A1 | 11/2019 | Shaeffer et al. | |
| 2021/0384253 | A1* | 12/2021 | Tchoulfian | H10H 20/814 |
| 2022/0131104 | A1* | 4/2022 | Kim | H10K 59/124 |
| 2022/0415246 | A1* | 12/2022 | Huang | G09G 3/3275 |
| 2023/0012711 | A1* | 1/2023 | Kim | G09G 3/32 |
| 2023/0012927 | A1* | 1/2023 | Kim | G09G 5/10 |
| 2024/0032386 | A1* | 1/2024 | Tian | H10K 59/352 |
| 2024/0290767 | A1* | 8/2024 | Kim | H10H 20/857 |

FOREIGN PATENT DOCUMENTS

| | | |
|---|---|---|
| KR | 10-2282170 B1 | 7/2021 |
| KR | 10-2545633 B1 | 6/2023 |

* cited by examiner

*Primary Examiner* — Van N Chow
(74) *Attorney, Agent, or Firm* — Fenwick & West LLP

(57) ABSTRACT

A display device may include a substrate including a display area, a plurality of light emitting devices in the display area, a plurality of column lines in the display area and extending in a column direction, a plurality of row lines in the display area and extending in a row direction, and a plurality of drivers on the substrate and positioned in the display area, and configured to drive the column lines and the row lines. Each of the plurality of column lines may be electrically connected with a first electrode of each of two or more light emitting devices arranged in the same column among the plurality of light emitting devices. Each of the plurality of row lines may be electrically connected with a second electrode of each of two or more light emitting devices arranged in the same row among the plurality of light emitting devices.

35 Claims, 52 Drawing Sheets

DISPLAY DEVICE

CROSS REFERENCE TO RELATED APPLICATION

This application claims the benefit and priority to Republic of Korea Patent Application No. 10-2024-0097529, filed on Jul. 23, 2024, which is hereby incorporated by reference in its entirety.

TECHNICAL FIELD

Embodiments of the present disclosure relate to a display device, and more particularly, for example, without limitation, to a display device having a wiring structure arranged in a matrix form to effectively drive a plurality of light emitting devices.

BACKGROUND

A display device is applied to various electronic devices such as televisions, mobile phones, laptops, and tablets. Display devices include organic light emitting displays (OLEDs) that emit light on their own, and liquid crystal displays (LCDs) that require a separate light source.

Recently, display devices with light emitting diodes (LEDs) are attracting attention as next-generation display devices. Since light emitting diodes are made of inorganic materials rather than organic materials, a display device with the light emitting diode has a characteristics of a faster lighting speed, superior light emitting efficiency, and can display high-luminance images compared to a liquid crystal display or an organic light emitting display.

The description provided in the discussion of the related art section should not be assumed to be prior art merely because it is mentioned in or associated with that section. The discussion of the related art section may include information that describes one or more aspects of the subject technology, and the description in this section does not limit the disclosure.

SUMMARY

Embodiments of the present disclosure may provide a display device having a wiring structure arranged in a matrix form to effectively drive a plurality of light emitting devices.

Embodiments of the present disclosure may provide a display device capable of effectively driving a plurality of light emitting devices by using a plurality of column lines connecting first electrodes of two or more light emitting devices arranged in a column direction and a plurality of row lines connecting second electrodes of two or more light emitting devices arranged in a row direction.

Embodiments of the present disclosure may provide a display device that utilizes a plurality of row lines connecting the second electrodes of two or more light emitting devices arranged in a row direction as a common electrode when driving a display and as a touch sensor when driving a touch.

Embodiments of the present disclosure may provide a display device capable of preventing or at least reducing image defects even when defects occur due to defects and/or omissions in the light emitting device.

Embodiments of the present disclosure may provide a display device having a structure capable of enabling process optimization in manufacturing.

Embodiments of the present disclosure may provide a display device that does not require separate formation of a dedicated touch sensor structure for touch operation and touch sensing.

Embodiments of the present disclosure may provide a display device capable of reducing the number of driving components (e.g. drivers) connected to the outside of a display panel.

The objects of the embodiments of the present disclosure are not limited to the objects described in this disclosure, and other objects not mentioned will be clearly understood by those skilled in the art from the description below.

A display device according to exemplary embodiments of the present disclosure may include a substrate including a display area, a plurality of light emitting devices disposed in the display area, a plurality of column lines disposed in the display area and extending in a column direction respectively, a plurality of row lines disposed in the display area and extending in a row direction respectively, and a plurality of drivers disposed on the substrate and positioned in the display area, and configured to drive the plurality of column lines and the plurality of row lines. Each of the plurality of column lines may be electrically connected in common with a first electrode of each of two or more light emitting devices arranged in the same column among the plurality of light emitting devices. Each of the plurality of row lines may be electrically connected in common with a second electrode of each of two or more light emitting devices arranged in the same row among the plurality of light emitting devices.

In the display device according to exemplary embodiments of the present disclosure, the plurality of light emitting devices may include a first light emitting device with a defect, or a missing area in which the first light emitting device is missing may exist in an arrangement of the plurality of light emitting devices. In this case, the plurality of column lines may include a first column line electrically connected to a first electrode of the first light emitting device or disposed to overlap with at least a part of the missing area, and the plurality of row lines may include a first row line electrically connected to a second electrode of the first light emitting device or disposed to overlap with at least a part of the missing area.

In the display device according to exemplary embodiments of the present disclosure, a predefined low level voltage may be supplied to the first column line during a first display-on driving period predefined for the first light emitting device.

A display device according to exemplary embodiments of the present disclosure may include a substrate including a display area, a plurality of light emitting devices disposed in the display area, a plurality of column lines arranged in the display area and extending in a column direction respectively, a plurality of row lines arranged in the display area and extending in a row direction respectively, and a plurality of drivers arranged on the substrate and positioned in the display area and configured to drive the plurality of column lines and the plurality of row lines.

In the display device according to exemplary embodiments of the present disclosure, each of the plurality of column lines may be electrically connected in common with a first electrode of each of two or more light emitting devices arranged in the same column among the plurality of light emitting devices. Each of the plurality of row lines may be electrically connected in common with a second electrode of each of two or more light emitting devices arranged in the same row among the plurality of light emitting devices.

In the display device according to exemplary embodiments of the present disclosure, a first low-potential voltage may be applied to a first row line during a first period. A second low-potential voltage higher than the first low-potential voltage may be applied to the first row line during a second period different from the first period.

A display device according to exemplary embodiments of the present disclosure may include a substrate including a display area; a plurality of light emitting devices disposed in the display area and comprising a first light emitting device with a defect; a plurality of column lines comprising a first column line electrically connected to the first light emitting device. A predefined low level voltage may be supplied to the first column line during a first display-on driving period predefined for the first light emitting device. During the first display-on driving period, the other light emitting devices connected to the first column line except for the first light emitting device do not emit light.

According to embodiments of the present disclosure, it is possible to provide a display device having a wiring structure (e.g., multiple row lines, multiple column lines) arranged in a matrix form to effectively drive a plurality of light emitting devices.

According to embodiments of the present disclosure, it is possible to provide a display device capable of effectively driving a plurality of light emitting devices by using a plurality of column lines connecting first electrodes of two or more light emitting devices arranged in a column direction and a plurality of row lines connecting second electrodes of two or more light emitting devices arranged in a row direction.

According to embodiments of the present disclosure, it is possible to provide a display device capable of preventing or at least reducing image defects even when defects occur due to defects and/or omissions in the light emitting device.

According to embodiments of the present disclosure, it is possible to provide a display device capable of utilizing a plurality of row lines used as common electrodes when driving a display and as touch sensors when driving a touch screen. Accordingly, it is possible to implement the process optimization for manufacturing a display device without separately forming a dedicated touch sensor structure for touch driving and touch sensing.

According to embodiments of the present disclosure, it is possible to provide a display device capable of reducing the number of circuit components (e.g. drivers) connected to the outside of a display panel, thereby enabling the process optimization for assembly of display devices.

The effects of the embodiments of the present disclosure are not limited to the effects mentioned above, and other effects not mentioned will be clearly understood by those skilled in the art from the description of the claims. Further, it will be easily understood that the purposes and advantages according to the present disclosure may be realized using means shown in the claims or combinations thereof.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

Figure 1:
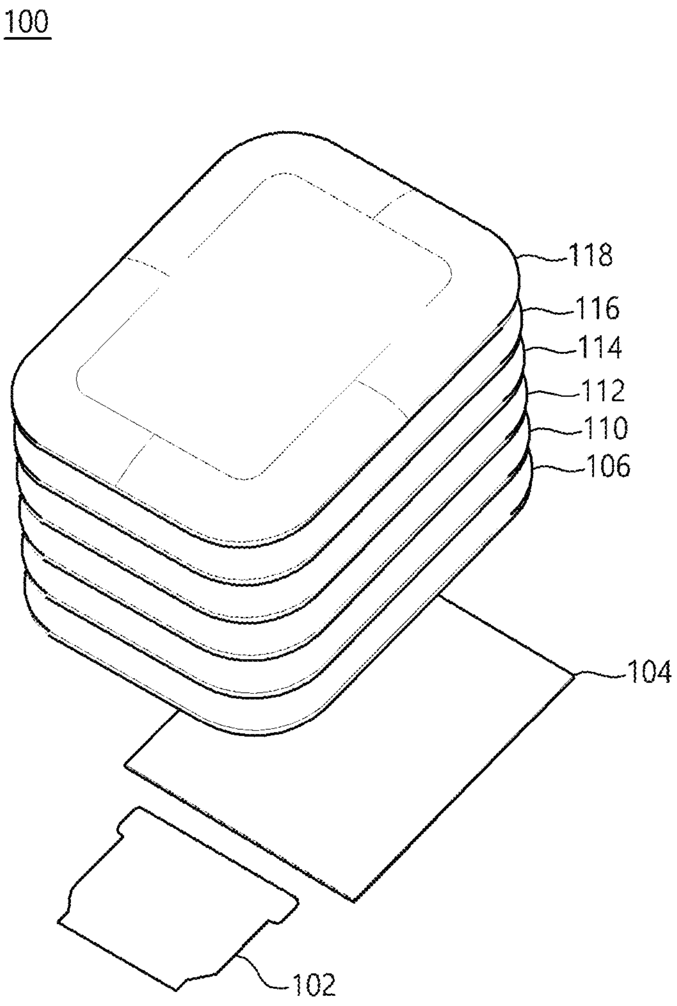
FIG. 1 illustrates a display device according to exemplary embodiments of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

The advantages and features of the present disclosure and the method for achieving them will become clear with reference to the embodiments described in detail below together with the accompanying drawings. However, the present disclosure is not limited to the embodiments disclosed below, but may be implemented in various different forms, and these exemplary embodiments are provided only to make the disclosure of the present disclosure complete and to fully inform a person having ordinary skill in the art to which the present specification belongs of the scope of the invention. Further, the present disclosure is only defined by scopes of claims.

The shapes, sizes, ratios, angles, numbers, etc. disclosed in the drawings for explaining the embodiments of this specification are exemplary, and therefore this specification is not limited to the matters illustrated. In assigning reference numerals to components of each drawing, the same components may be assigned the same numerals even when they are shown on different drawings. When determined to make the subject matter of the disclosure unclear, the detailed of the known art or functions may be skipped. As used herein, when a component "includes," "has," "contain," "constitute," "make up of," "formed of," or "is composed of" another component, other components may be added unless "only" is used. When a component is expressed in the singular, it includes cases where the plural is included unless otherwise explicitly stated.

In interpreting a component, even if there is no separate explicit description of the error range, it is interpreted as including the error range.

In the case of a description of a positional relationship, for example, if the positional relationship between two parts is described as "on," "over," 'upon', 'above', "below," "beneath" "next to," or "adjacent," one or more other parts may be located between the two parts unless "directly," "directly," or "nearly," are used, that is, one or more other parts may be disposed located between the two parts. For example, where an element or layer is disposed "on" another element or layer, a third layer or element may be interposed therebetween.

In describing a temporal relationship, if the temporal continuity is described as "after," "following," "next to," or "before,", it may also include cases where it is not continuous, unless "right away," or "directly," is used.

Although the terms first, second, A, B, (A), or (B) etc. are used to describe various elements, these components are not limited by these terms. These terms are only used to distinguish one component from another. Therefore, the first element mentioned below may also be the second element, and, similarly, a second element could be termed a first element, within the technical scope of this specification.

In describing the components of this specification, terms such as first, second, A, B, (a), or (b) may be used. These terms are only intended to distinguish the components from other components, and the nature, order, sequence, or number of the components are not limited by the terms.

If a component is described as being "connected," "coupled," "linked," or "attached," to another component, it should be understood that the component may be directly connected, coupled, linked, or attached to the other component, but that other components may be interposed between each component that may be indirectly connected, coupled, linked, or attached without any specific explicit description.

When a component or layer is described as being "contacted," or "overlapping," to another component or layer, it should be understood that the component or layer may directly contact or overlap the other component or layer, but that other components may be interposed between each component that may be indirectly contacted or overlapped without any specific explicit description.

"At least one" should be understood to include any combination of one or more of the associated components. For example, "at least one of the first, second, and third components" can be interpreted to include not only the first, second, or third components, but also any combination of two or more of the first, second, and third components.

"First direction," "Second direction," "Third direction," "X-axis direction," "Y-axis direction," and "Z-axis direction" should not be interpreted as merely geometric relationships in which the relationship between them is perpendicular to each other, but can mean a wider directionality within the range in which the configuration of the present specification can function functionally.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Each feature of the various embodiments of the present specification can be partially or wholly combined or combined with each other, and various technical connections and operations are possible, and each embodiment can be implemented independently of each other or can be implemented together in a related relationship.

Hereinafter, various embodiments of the disclosure are described in detail with reference to the accompanying drawings. The scales of the components shown in the drawings have different scales from the actual ones for convenience of explanation, and thus are not limited to the scales shown in the drawings.

Figure 2:
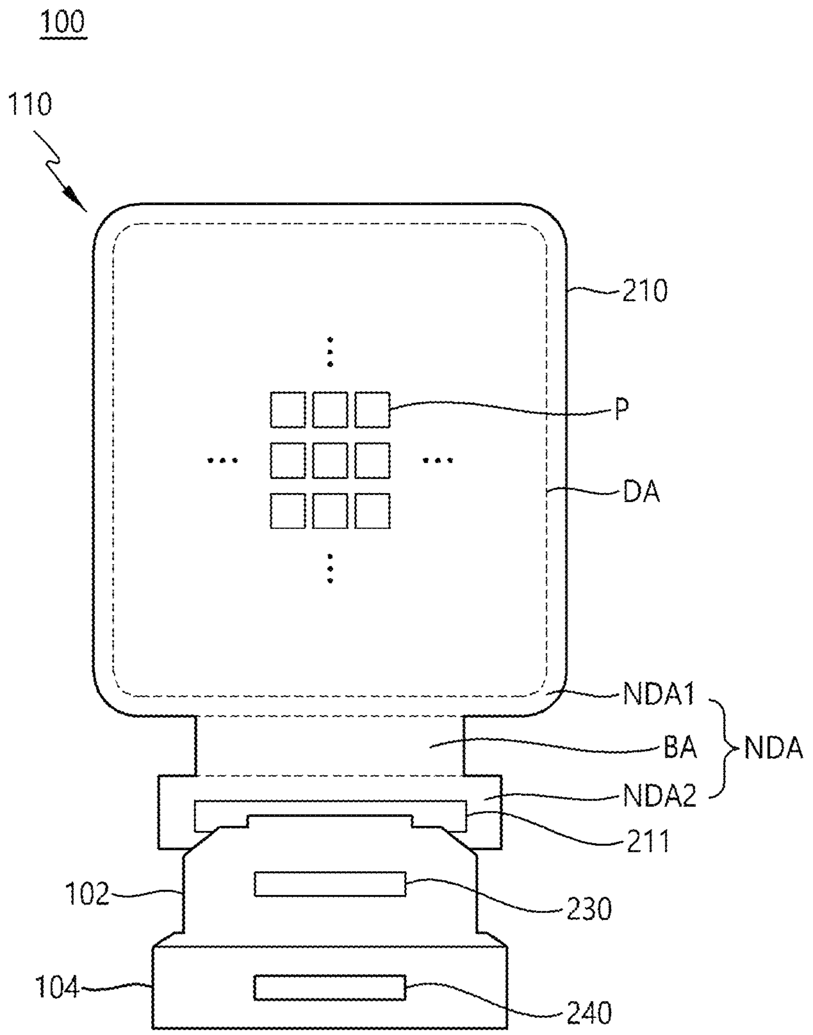
FIG. 2 is a plan view of a display device according to exemplary embodiments of the present disclosure.

FIG. 1 illustrates a display device 100 according to exemplary embodiments of the present disclosure, and FIG. 2 is a plan view of a display device 100 according to exemplary embodiments of the present disclosure.

Referring to FIG. 1, a display device 100 according to the embodiments of the present disclosure may include a display panel 110, a cover member 118 disposed on the display panel 110, a flexible printed circuit 102 connected to the display panel 110, and a printed circuit board 104 connected to the flexible printed circuit 102.

The display device 100 according to the embodiments of the present disclosure may further include a support substrate 106 disposed under the display panel 110 and supporting the lower portion of the display panel 110, a polarizing layer 114 disposed on the display panel 110, a first adhesive layer 112 disposed between the display panel 110 and the polarizing layer 114, and a second adhesive layer 116 disposed between the polarizing layer 114 and the cover member 118.

The display panel 110 may include a substrate 210. The substrate 210 may be a member on which various components such as a plurality of metal layers and a plurality of insulating material layers are formed. The substrate 210 may be made of an insulating material. For example, the substrate 210 may be made of glass or resin. In addition, the substrate 210 may be made of a flexible material. For example, the substrate 210 may be made of a flexible plastic material such as polyimide (PI). However, the embodiments of the present disclosure are not limited thereto.

The display panel 110 may display information, images, and/or images provided to a user. For example, the display panel 110 may include a display area DA and a non-display area NDA. For example, the substrate 210 may include a display area DA and a non-display area NDA. The display area DA and the non-display area NDA are not limited to the substrate 210, but can be described throughout the entire display device 100.

The display area DA may be an area where an image is displayed. The display area DA may include a plurality of pixels P. Each of the plurality of pixels P may be composed of a plurality of subpixels. At least one light emitting device may be arranged in each of the plurality of subpixels. The light emitting device may be configured differently depending on the type of the display device 100. For example, if the display device 100 is an inorganic light emitting display device, the light emitting device may be an inorganic-based light emitting device, such as a light emitting diode (LED), a micro LED, or a mini LED, but the embodiments of the present disclosure are not limited thereto.

The non-display area NDA may be an area where an image is not displayed. In the non-display area NDA, various wirings, and circuits for driving a plurality of pixels P of the display area DA may be arranged. For example, various driving circuits and various wirings may be arranged in the non-display area NDA, and a pad section 211 to which an integrated circuit and a printed circuit are connected may be arranged, but the embodiments of the present disclosure are not limited thereto.

For example, the driving circuit may include a data driving circuit and/or a gate driving circuit, but the embodiments of the present disclosure are not limited thereto. Wires or lines supplied with a control signal for controlling the driving circuit may be arranged on the substrate 210. For example, the control signal may include various timing signals including a clock signal, an input data enable signal, and synchronization signals, but the embodiments of the present disclosure are not limited thereto. The control signal may be supplied to the substrate 210 from the outside of the substrate 210 through the pad section 211. For example, circuit components such as a flexible printed circuit 102 and a printed circuit board 104 may be connected to the pad section 211.

According to the present embodiments, the non-display area NDA may include a first non-display area NDA1, a bending area BA, and a second non-display area NDA2. For example, the bending area BA can be disposed between the first non-display area NDA1 and the second non-display area NDA2. For example, the first non-display area NDA1 may be an area surrounding at least a portion of the display area DA. The bending area BA may be an area extending from at least one of a plurality of sides of the first non-display area NDA1 and may be a bendable area. The second non-display area NDA2 may be an area extending from the bending area BA and may include a pad section 211. For example, the bending area BA may be in a bent state, and the remaining area of the substrate 210 excluding the bending area BA may be in a flat state. In this case, as the bending area BA is bent, the second non-display area NDA2 may be located on the back surface of the display area DA. However, the embodiments of the present disclosure are not limited thereto.

The display area DA of the substrate 210 or the display device 100 may be configured in various shapes according to the design of the display device 100. For example, the display area DA may be configured in a rectangular shape with four corners formed in a round shape, but the embodiments of the present disclosure are not limited thereto. For another example, the display area DA may be configured in a rectangular shape with four corners formed in a right angle shape, a circular shape, but the embodiments of the present disclosure are not limited thereto.

According to the embodiments of the present disclosure, a width of the second non-display area NDA2 where the pad section 211 is arranged may be wider than a width of the bending area BA. In addition, a width of the display area DA may be wider than the width of the bending area BA. In the drawing, the width of the bending area BA is depicted in the drawing as being narrower than the width of other areas of the substrate 210, but the shape of the substrate 210 including the bending area BA is exemplary, and the embodiments of the present disclosure are not limited thereto.

Referring to FIG. 1 and FIG. 2, a flexible printed circuit 102 where a first circuit component 230 is arranged and a printed circuit board 104 where a second circuit component 240 is arranged may be disposed at a lower portion of the display panel 110. The flexible printed circuit 102 and the printed circuit board 104 may be arranged at one edge of the display panel 110, but the embodiments of the present disclosure are not limited thereto. One side of the flexible printed circuit 102 may be connected to the display panel 110, and the other side may be connected to the printed circuit board 104, but the embodiments of the present disclosure are not limited thereto. The flexible printed circuit 102 may be a flexible film, but the embodiments of the present disclosure are not limited thereto.

The pad section 211 disposed in the second non-display area NDA2 includes a plurality of pads, and a driving component including one or more flexible printed circuits 102 and a printed circuit board 104 can be attached or bonded. The plurality of pads included in the pad section 211 are electrically connected to one or more flexible printed circuits 102, and may transmit various signals (or power) from the printed circuit board 104 and one or more flexible printed circuits 102 to a driving circuit (for example, a driver DRV of FIG. 3) arranged in the display area DA.

The flexible printed circuit 102 may be a film in which various components are arranged on a flexible base film. For example, a first circuit component 230, such as a gate drive integrated circuit and/or a data drive integrated circuit, may be arranged on one or more flexible printed circuits 102, but the embodiments of the present disclosure are not limited thereto. The first circuit component 230 may be a component that processes data and a driving signal for displaying an image, but the embodiments of the present disclosure are not limited thereto. The first circuit component 230 may be arranged in a manner such as a chip-on-glass (COG), a chip-on-film (COF), or a tape carrier package (TCP) depending on the mounting method, but the embodiments of the present disclosure are not limited thereto. The flexible printed circuit 102 may be attached or bonded to a plurality of pads through a conductive adhesive layer, but the embodiments of the present disclosure are not limited thereto.

The printed circuit board 104 may be a component that is electrically connected to the flexible printed circuit 102 and supplies a signal to the first circuit component 230. The printed circuit board 104 may be arranged on one side of the flexible printed circuit 102 and may be electrically connected to the flexible printed circuit 102. Various components for supplying various signals to the first circuit component 230 disposed on the flexible printed circuit 102 may be arranged on the printed circuit board 104. For example, various second circuit components 240, such as a timing controller, a power supply, a memory, or a processor, may be arranged on the printed circuit board 104, but the embodiments of the present disclosure are not limited thereto. For example, the second circuit components 240 arranged on the printed circuit board 104 may include a timing controller and/or a power management integrated circuit (PMIC), but the embodiments of the present disclosure are not limited thereto.

The printed circuit board 104 may include at least one hole, but the embodiments of the present disclosure are not limited thereto. An internal component detecting ambient light or temperature, such as a plurality of sensors, may be arranged in an area corresponding to at least one hole. For example, the internal component may include an ambient light sensor (ALS) or a temperature sensor, but the embodiments of the present disclosure are not limited thereto. For example, the hole may be a transmission hole, but the embodiments of the present disclosure are not limited thereto.

Referring to FIG. 1, a polarizing layer 114 may be arranged on a display panel 110 and may prevent or reduce light generated from an external light source from entering the display panel 110 and affecting a light emitting device. For example, the polarizing layer 114 may be arranged on the first adhesive layer 112.

A cover member 118 may be arranged on a polarizing layer 114 and may be a member for protecting the display panel 110. For example, the cover member 118 may be arranged on the second adhesive layer 116.

A second adhesive layer 116 may be disposed between the polarizing layer 114 and the cover member 118. The second adhesive layer 116 may attach the cover member 118 to the polarizing layer 114, without being limited thereto. Alternatively, the second adhesive layer 116 may attach the cover member 118 to the display panel 110.

A first adhesive layer 112 may be disposed between the display panel 110 and the polarizing layer 114. The first adhesive layer 112 may attach the polarizing layer 114 to the display panel 110. The first adhesive layer 112 may be omitted.

Each of the first adhesive layer 112 and the second adhesive layer 116 may include an optically clear adhesive (OCA), an optically clear resin (OCR), or a pressure sensitive adhesive (PSA), but the embodiments of the present disclosure are not limited thereto.

The support substrate 106 may be disposed between the display panel 110 and the printed circuit board 104 to reinforce the rigidity of the display panel 110. The support substrate 106 may be aback plate, but the embodiments of the present disclosure are not limited thereto.

Figure 3:
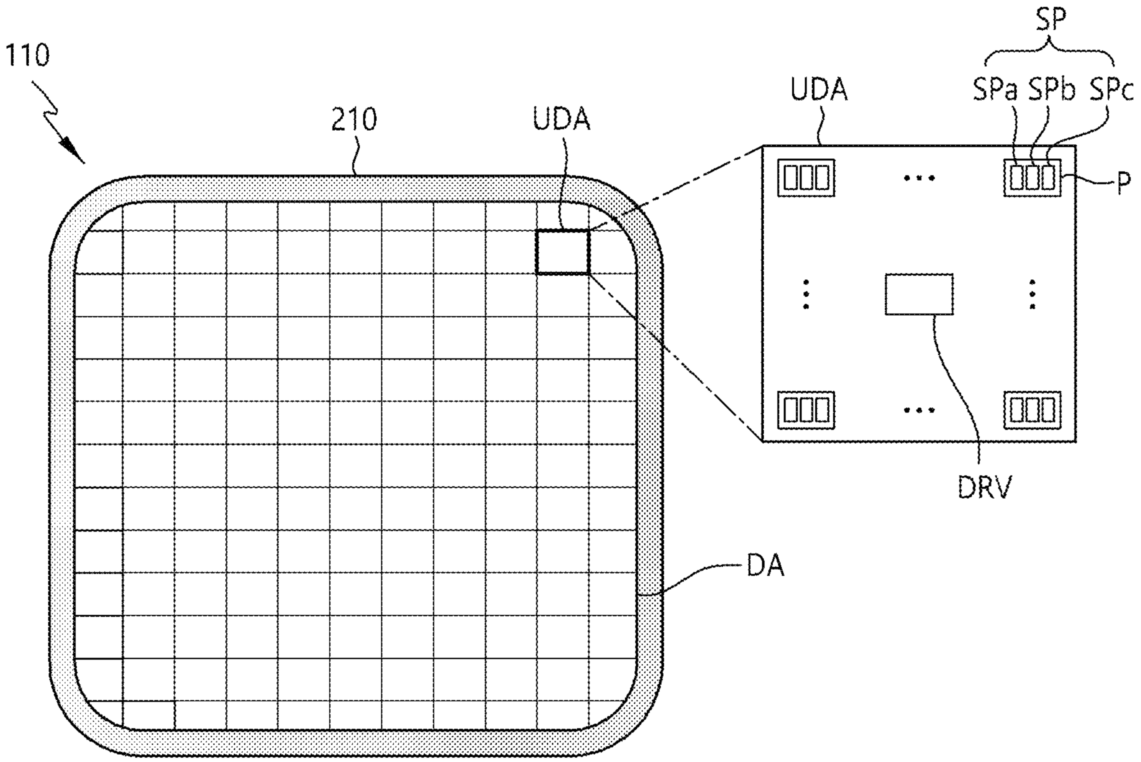
FIG. 3 is a plan view of a display panel according to exemplary embodiments of the present disclosure.
Figure 4:
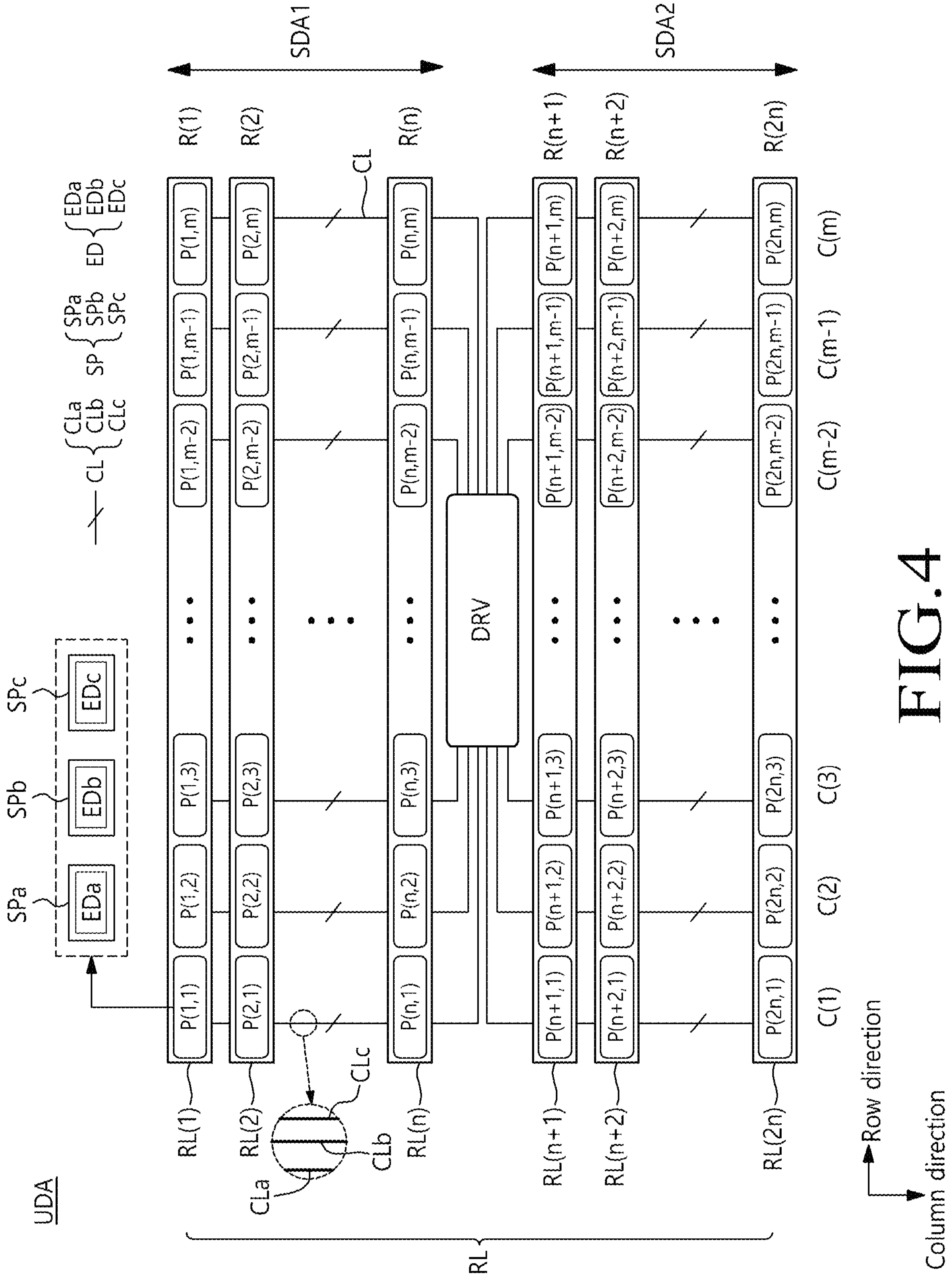
FIG. 4 is a plan view of a unit driving area of a display panel according to exemplary embodiments of the present disclosure.

FIG. 3 is a plan view of a display panel 110 according to exemplary embodiments of the present disclosure, and FIG. 4 is a plan view of a unit driving area UDA of a display panel 110 according to exemplary embodiments of the present disclosure.

Referring to FIG. 3, the display area DA of the display panel 110 according to the exemplary embodiments of the present disclosure may include a plurality of unit driving areas UDA.

Referring to FIG. 3, the display panel 110 according to the embodiments of the present disclosure may include a driver DRV arranged in each of the plurality of unit driving areas UDA. For example, each of the plurality of drivers DRV may be arranged in each of the plurality of unit driving areas UDA. For example, the driver DRV may be a driving chip manufactured using a metal-oxide-silicon field effect transistor (MOSFET) manufacturing process on a semiconductor substrate, but the embodiments of the present disclosure are not limited thereto.

Referring to FIG. 3, each of the plurality of unit driving areas UDA may be a driving area driven by one driver DRV, but the embodiments of the present disclosure are not limited thereto. That is, the plurality of unit driving areas UDA may be independent driving areas driven by different drivers DRV.

Referring to FIG. 3, the display panel 110 according to the embodiments of the present disclosure may include a substrate 210 including a display area DA, and a plurality of pixels P arranged in a matrix form in the display area DA.

A plurality of pixels P may be arranged in each of the plurality of unit driving areas UDA. Each of the plurality of pixels P may include a plurality of subpixels SP. Each of the plurality of subpixels SP may include at least one light emitting device.

For example, the plurality of subpixels SP may include a first subpixel SPa, a second subpixel SPb, and a third subpixel SPc, but is not limited thereto. More or less subpixel may be included. The first subpixel SPa may include a first light emitting device that emits a first color light, the second subpixel SPb may include a second light emitting device that emits a second color light, and the third subpixel SPc may include a third light emitting device that emits a third color light. As one example, the first subpixel SPa, the second subpixel SPb, and the third subpixel SPc may emit any one of red light, green light, and blue light, without being limited thereto. For example, the first color light, the second color light, and the third color light may be red light, green light, and blue light, respectively, but are not limited thereto.

Referring to FIG. 4, the display panel 110 according to the embodiments of the present disclosure may include a plurality of light emitting devices ED. Each of the plurality of subpixels SP may include a light emitting device ED.

For example, the first subpixel SPa may include a first light emitting device EDa, the second subpixel SPb may include a second light emitting device EDb, and the third subpixel SPc may include a third light emitting device EDc.

Referring to FIG. 4, the display panel 110 according to the embodiments of the present disclosure may include a plurality of row lines RL and a plurality of column lines CL.

Each of the plurality of row lines RL may be arranged to extend in a row direction. The plurality of row lines RL may be electrically connected to a first electrode of each of a plurality of light emitting devices ED.

Each of the plurality of column lines CL may be arranged to extend in a column direction. The plurality of column lines CL may be electrically connected to a second electrode of each of the plurality of light emitting device ED.

For example, the first electrode of each of the plurality of light emitting device ED may be an anode electrode, and the second electrode of each of the plurality of light emitting device ED may be a cathode electrode. For another example, the first electrode of each of the plurality of light emitting device ED may be a cathode electrode, and the second electrode of each of the plurality of light emitting device ED may be an anode electrode.

Each of the plurality of row lines RL may be electrically connected to the second electrode of each of the plurality of light emitting device ED. That is, the second electrodes of each of the plurality of light emitting device ED may be commonly connected to one row line RL.

Each of the plurality of column lines CL may be electrically connected to the first electrode of each of the plurality of light emitting device ED. That is, the first electrode of each of the plurality of light emitting device ED may be commonly connected to one column line CL.

Referring to FIG. 4, the line width of each of the plurality of row lines RL may be greater than the line width of each of the plurality of column lines CL, without being limited thereto.

Referring to FIG. 4, the display panel 110 according to the embodiments of the present disclosure may include a plurality of drivers DRV. The plurality of drivers DRV may drive the plurality of light emitting device ED, the plurality of column lines CL, and the plurality of row lines RL.

The plurality of drivers DRV may be built into the display panel 110. The plurality of drivers DRV may be arranged in the display area DA and may be arranged on the substrate 210. The plurality of drivers DRV may be arranged to correspond to a plurality of unit driving areas UDA. That is, one driver DRV may be arranged in one unit driving area UDA. That is, one unit driving area UDA may be driven by one driver DRV.

Each of the plurality of drivers DRV can drive a plurality of row lines RL and a plurality of column lines CL arranged in a corresponding unit driving area UDA among the plurality of unit driving areas UDA, thereby emitting light from a plurality of light emitting device ED arranged in the corresponding unit driving area UDA.

The plurality of drivers DRV are disposed in the display area DA and may be positioned closer to the substrate 210 than the plurality of light emitting device ED.

For example, the plurality of row lines RL may be driven sequentially. In another example, the plurality of row lines RL may be driven simultaneously. In another example, two or more row lines RL among the plurality of row lines RL may be driven simultaneously.

For example, during a specific display driving period, among the plurality of row lines RL arranged in the unit driving area UDA, at least one row line RL may be driven, and the remaining row lines RL may not be driven.

According to the embodiments of the present disclosure, a voltage applied to the row line RL may be referred to as a low-potential voltage, and the low-potential voltage may also be referred to as a row line voltage or a cathode voltage. The low-potential voltage may have various voltage values depending on the driving type or driving state. For example, the low-potential voltage may include a first low-potential voltage, a second low-potential voltage, and a third low-potential voltage.

Driving the row line RL may mean that the first low-potential voltage is supplied to the row line RL. Not driving the row line RL may mean that the second low-potential voltage higher than the first low-potential voltage is supplied to the row line RL. Accordingly, the light emitting device ED overlapping with the driven row line RL may emit light, and the light emitting device ED overlapping with the non-driven row line RL may not emit light.

For example, any first row line RL among the plurality of row lines RL may be supplied with a first low-potential voltage during a first period and may be supplied with a second low-potential voltage higher than the first low-potential voltage during a second period different from the first period. Accordingly, the light emitting devices ED overlapping with the first row line RL may emit light during the first period and may not emit light during the second period different from the first period. For example, the first period and the second period may be included in one display driving period. For another example, the first period and the second period may be included in different display driving periods.

The structure of one unit driving area UDA will be described in more detail with reference to FIG. 4.

As one example, one unit driving area UDA may be divided into two sub-driving areas. Referring to FIG. 4, as an example, one unit driving area UDA may be divided into a first sub-driving area SDA1 and a second sub-driving area SDA2. As another example, one unit driving area UDA may be divided into three or more sub-driving areas. As another example, one unit driving area UDA may not be divided into two or more sub-driving areas.

Referring to FIG. 4, one unit driving area UDA may include one driver DRV and (2n×m) pixels P(1, 1), . . . , P(1, m), P(2, 1), . . . , P(2, m), . . . , P(2n, 1), . . . , P(2n, m) driven by one driver DRV)

In the embodiments of the present disclosure, n may be a sequence number of a row, or the number of rows in each of the first sub-driving area SDA1 and the second sub-driving area SDA2, or the number of row lines RL in each of the first sub-driving area SDA1 and the second sub-driving area SDA2, or the number of pixel rows in each of the first sub-driving area SDA1 and the second sub-driving area SDA2. m may be a sequence number of a column, or the number of columns in each of the first sub-driving area SDA1 and the second sub-driving area SDA2, or the number of column lines CL in each of the first sub-driving area SDA1 and the second sub-driving area SDA2, or the number of pixel columns in each of the first sub-driving area SDA1 and the second sub-driving area SDA2.

In the embodiments of the present disclosure, n may be a natural number greater than or equal to 1, and m may be a natural number greater than or equal to 1.

Referring to FIG. 4, (2n×m) pixels P(1, 1), . . . , P(1, m), P(2, 1), . . . , P(2, m), . . . , P(2n, 1), . . . , P(2n, m) may be arranged in 2n rows R(1), . . . , R(2n) and m columns C(1), . . . , C(m).

Among (2n×m) pixels P(1, 1), . . . , P(1, m), P(2, 1), . . . , P(2, m), . . . , P(2n, 1), . . . , P(2n, m), (n×m) pixels P(1, 1), . . . , P(1, m), P(2, 1), . . . , P(2, m), . . . , P(n, 1), . . . , P(n, m) arranged in the first to n-th rows R(1), . . . , R(n) may be arranged in the first sub-driving area SDA1.

Among (2n×m) pixels P(1, 1), . . . , P(1, m), P(2, 1), . . . , P(2, m), . . . , P(2n, 1), . . . , P(2n, m), (n×m) pixels P(n+1, 1), . . . , P(n+1, m), P(n+2, 1), . . . , P(n+2, m), . . . , P(2n, 1), . . . , P(2n, m) arranged in the (n+1)-th to the 2n-th row R(n+1), . . . , R(2n) may be arranged in the second sub-driving area SDA2.

Referring to FIG. 4, one unit driving area UDA may include 2n row lines RL(1), . . . , RL(2n) to drive (2n×m) pixels P(1, 1), . . . , P(1, m), P(2, 1), . . . , P(2, m), . . . , P(2n, 1), . . . , P(2n, m).

Among the 2n row lines RL(1), . . . , RL(2n), the first to n-th row lines R(1), . . . , RL(n) may be arranged in the first sub-driving area SDA1. Among the 2n row lines RL(1), . . . , RL(2n), the (n+1)-th to the 2n-th row lines R(n+1), . . . , R(2n) may be arranged in the second sub-driving area SDA2.

Each of the 2n row lines RL(1), . . . , RL(2n) may overlap with m pixels. For example, the first row line RL(1) may overlap with m pixels P(1, 1), . . . P(1, m) arranged in the first row R(1). The n-th row line RL(n) may overlap with m pixels P(n, 1), . . . P(n, m) arranged in the n-th row (R(n)). The (n+1)-th row line RL(n+1) may overlap with the m pixels P(n+1, 1), . . . P(n+1, m) arranged in the (n+1)-th row R(n+1). The 2n-th row line RL(2n) may overlap with the m pixels P(2n, 1), . . . P(2n, m) arranged in the 2nth row R(2n).

For example, the first row line RL(1) may be connected to the k subpixels SPa, SPb and SPc included in each of the m pixels P(1, 1), . . . P(1, m) arranged in the first row R(1). More specifically, the first row line RL(1) may be connected to the second electrodes of the k light emitting devices EDa, EDb and EDc included in each of the m pixels P(1, 1), . . . P(1, m) arranged in the first row R(1).

For example, the n-th row line RL(n) may be connected to the k subpixels SPa, SPb and SPc included in each of the m pixels P(n, 1), . . . P(n, m) arranged in the n-th row R(n). More specifically, the n-th row line RL(n) may be connected to the first electrodes of the k light emitting devices EDa, EDb and EDc included in each of the m pixels P(n, 1), . . . P(n, m) arranged in the n-th row R(n).

For example, the (n+1)-th row line RL(n+1) may be connected to k subpixels SPa, SPb and SPc included in each of m pixels P(n+1, 1), . . . P(n+1, m) arranged in the (n+1)-th row R(n+1). More specifically, the (n+1)-th row line RL(n+1) may be connected to first electrodes of k light emitting devices EDa, EDb and EDc included in each of m pixels P(n+1, 1), . . . P(n+1, m) arranged in the (n+1)-th row R(n+1).

For example, the 2n-th row line RL(2n) may be connected to k subpixels SPa, SPb and SPc included in each of m pixels P(2n, 1), . . . P(2n, m) arranged in the 2n-th row R(2n). More specifically, the 2n-th row line RL(2n) may be connected to first electrodes of k light emitting devices EDa, EDb and EDc included in each of m pixels P(2n, 1), . . . P(2n, m) arranged in the 2n-th row R(2n).

Referring to FIG. 4, one unit driving area UDA may include (m×k×2) column lines CL to drive (2n×m) pixels P(1, 1), . . . , P(1, m), P(2, 1), . . . , P(2, m), . . . , P(2n, 1), . . . , P(2n, m). Here, k is the number of subpixels SP included in one pixel P. In the example of FIG. 4, k is 3. That is, one pixel P may include three subpixels SPa, SPb and SPc.

The first sub-driving area SDA1 may include (m×k) column lines CL to drive (n×m) pixels P(1, 1), . . . , P(1, m), . . . , P(n, 1), . . . , P(n, m) arranged in the first sub-driving area SDA1. In the example of FIG. 4, since k is 3, the first sub-driving area SDA1 may include 3m column lines CL.

In the first sub-driving area SDA1, k column lines CLa, CLb and CLb may be arranged in each of the m columns C(1), . . . , C(m). In the example of FIG. 4, since k is 3, in the first sub-driving area SDA1, each of the m columns C(1), . . . , C(m) may include three column lines CLa, CLb and CLc.

In each of the m columns C(1), . . . , C(m), each of the k column lines CL may be commonly connected to n pixels arranged in the corresponding column. In each of the m columns C(1), . . . , C(m), each of the k column lines CL may be commonly connected to first electrodes of n light emitting devices ED arranged in the corresponding column. In the example of FIG. 4, since k is 3, in each of the m columns C(1), . . . , C(m), three column lines CLa, CLb and CLc may be connected to the first electrodes of the 3n light emitting devices ED included in the n pixels arranged in the corresponding column. For example, in each of the m columns C(1), . . . , C(m), a first column line CLa may be commonly connected to the first electrodes of the n first light emitting devices EDa arranged in the corresponding column. In each of the m columns C(1), . . . , C(m), a second column line CLb may be commonly connected to the first electrodes of the n second light emitting devices EDb arranged in the corresponding column. In each of the m columns C(1), . . . , C(m), a third column line CLc may be commonly connected to the first electrodes of the n third light emitting devices EDc arranged in the corresponding column.

The second sub-driving area SDA2 may include (m×k) column lines CL to drive (n×m) pixels P(n+1, 1), . . . , P(n+1, m), . . . , P(2n, 1), . . . , P(2n, m) arranged in the second sub-driving area SDA2. In the example of FIG. 4, since k is 3, the second sub-driving area SDA2 may include 3m column lines CL.

In the second sub-driving area SDA2, k column lines CL may be arranged in each of the m columns C(1), . . . , C(m). In the example of FIG. 4, since k is 3, in the second sub-driving area SDA2, each of the m columns C(1), . . . , C(m) may include three column lines CLa, CLb and CLc.

In each of the m columns C(1), . . . , C(m), each of the k column lines CL may be commonly connected to n pixels arranged in the corresponding column. In each of the m columns C(1), . . . , C(m), each of the k column lines CL may be commonly connected to first electrodes of n light emitting devices ED arranged in the corresponding column. In the example of FIG. 4, since k is 3, in each of the m columns C(1), . . . , C(m), three column lines CLa, CLb and CLc may be connected to the first electrodes of the 3n light emitting devices ED included in the n pixels arranged in the corresponding column. For example, in each of the m columns C(1), . . . , C(m), a first column line CLa may be commonly connected to the first electrodes of the n first light emitting devices EDa arranged in the corresponding column. In each of the m columns C(1), . . . , C(m), the second column line CLb may be commonly connected to the first electrodes of the n second light emitting devices EDb arranged in the corresponding column. In each of the m columns C(1), . . . , C(m), the third column line CLc may be commonly connected to the first electrodes of the n third light emitting devices EDc arranged in the corresponding column.

Figure 5:
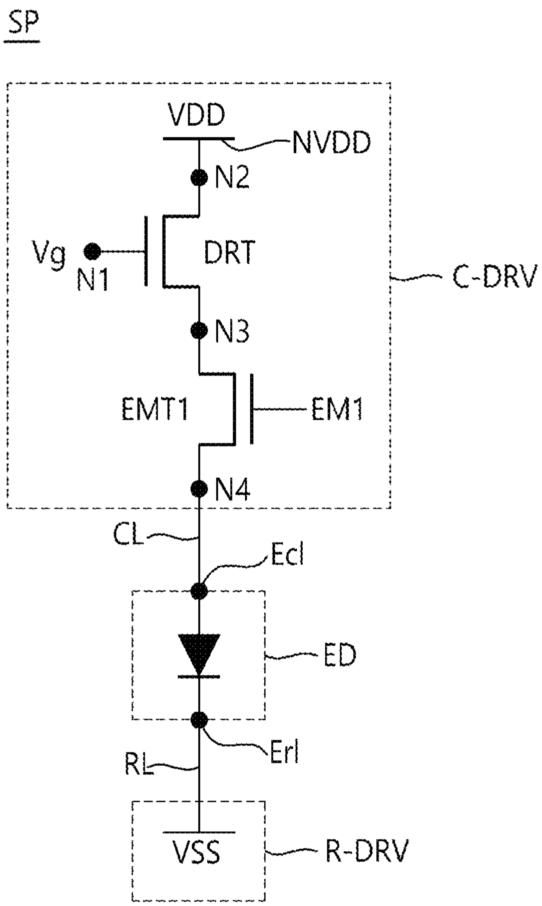
FIG. 5 illustrates a subpixel of a display panel according to exemplary embodiments of the present disclosure.

FIG. 5 illustrates a subpixel SP of a display panel 110 according to exemplary embodiments of the present disclosure.

Referring to FIG. 5, the subpixel SP according to exemplary embodiments of the present disclosure may include a light emitting device ED including a first electrode Ecl and a second electrode Erl, a column driver C-DRV for driving a column line CL electrically connected to the first electrode Ecl of the light emitting device ED, and a row driver R-DRV for driving a row line RL electrically connected to the second electrode Erl of the light emitting device ED.

Referring to FIG. 5, the light emitting device ED may include a first electrode Ecl and a second electrode Erl. The first electrode Ecl may be electrically connected to a column line CL, and the second electrode Erl may be electrically connected to a row line RL. For example, the first electrode Ecl may be an anode electrode, and the second electrode Erl may be a cathode electrode, without being limited thereto. For another example, the first electrode Ecl may be a cathode electrode, and the second electrode Erl may be an anode electrode.

Referring to FIG. 5, a column driver C-DRV included in a unit driving area UDA may be connected to a plurality of column lines CL included in the unit driving area UDA and may drive a plurality of column lines CL included in the unit driving area UDA. Each of the plurality of column lines CL may be commonly connected to the first electrode Ecl of each of the plurality of light emitting devices ED included in the plurality of subpixels SP arranged in the corresponding column.

Referring to FIG. 5, a row driver R-DRV included in a unit driving area UDA may be connected to a plurality of row lines RL included in the unit driving area UDA and may drive a plurality of row lines RL included in the unit driving area UDA. Each of the plurality of row lines RL may be commonly connected to a second electrode Erl of each of a plurality of light emitting devices ED included in a plurality of subpixels SP arranged in the corresponding row.

Referring to FIG. 5, the column driver C-DRV may include main nodes including a first node N1, a second node N2, a third node N3, and a fourth node N4. The column driver C-DRV may include a driving transistor DRT and a first emission control transistor EMT1.

The first node N1 may be anode to which a voltage Vg for controlling the on-off of the driving transistor DRT is applied. The second node N2 may be a node electrically connected to a high-potential voltage node NVDD to which a high-potential voltage VDD is applied. The third node N3 may be a node to which the driving transistor DRT and the first emission control transistor EMT1 are connected. The fourth node N4 may be a node to which the first emission control transistor EMT1 and the light emitting device ED are electrically connected and may be a node to which the column line CL is electrically connected. Here, a source electrode or a drain electrode of the first emission control transistor EMT1 and the first electrode Ecl of the light emitting device ED may be commonly connected to the column line CL. Here, a source electrode or a drain electrode of the driving transistor DRT and a source electrode or a drain electrode of the first emission control transistor EMT1 may be commonly connected to the third node N3.

The driving transistor DRT supplies a driving current to make the light emitting device ED emit light, is connected between the second node N2 and the third node N3 and may control the connection between the second node N2 and the third node N3 according to the voltage of the first node N1.

The gate electrode of the driving transistor DRT is electrically connected to the first node N1, and a gate voltage Vg may be applied thereto. The drain electrode or the source electrode of the driving transistor DRT may be electrically connected to the second node N2. The source electrode or the drain electrode of the driving transistor DRT may be electrically connected to the third node N3. For example, the driving transistor DRT is turned on or off in response to the voltage Vg applied to the first node N1.

The first emission control transistor EMT1 may control a connection of a path through which the driving current flows, and may play a role in controlling an emission of the light emitting device ED. For example, the first emission control transistor EMT1 may be connected between the third node N3 and the fourth node N4.

If the driving transistor DRT and the first emission control transistor EMT1 are turned on between a high potential voltage VDD and a low potential voltage VSS, the driving current can be supplied to the light emitting device ED through the driving transistor DRT and the first emission control transistor EMT1. Accordingly, the light emitting device ED can emit light.

The first emission control transistor EMT1 is connected between the third node N3 and the fourth node N4 and can control the connection between the third node N3 and the fourth node N4 according to a first emission control signal EM1. The first emission control signal EM1 may be applied to the gate electrode of the first emission control transistor EMT1. The drain electrode or the source electrode of the first emission control transistor EMT1 may be electrically connected to the third node N3. The source electrode or drain electrode of the first emission control transistor EMT1 may be electrically connected to the fourth node N4. For example, the first emission control transistor EMT1 is turned on or off in response to the first emission control signal EM1 applied to the gate electrode of the first emission control transistor EMT1. If the driving transistor DRT is turned on in response to the gate voltage Vg, and the first emission control transistor EMT1 is turned on in response to the first emission control signal EM1, the light emitting device ED can emit light. Also, if the driving transistor DRT and/or the first emission control transistor EMT1 is turned off, the light emitting device ED will not emit light.

The first emission control signal EM1 may be a pulse width modulation signal that varies at a predefined time (for example, each frame, or each sub-frame included in one frame), but the embodiments of the present disclosure are not limited thereto.

The first emission control signal EM1 may be generated by the driver DRV or may be supplied to the driver DRV from a driving-related circuit such as a timing controller.

Referring to FIG. 5, the row driver R-DRV may drive at least one row line RL by supplying a low-potential voltage VSS to at least one row line RL.

The row driver R-DRV may perform display-on driving or display-off driving for one row line RL.

The row driver R-DRV may supply a low-potential voltage for display-on driving to one row line RL in order to perform display-on driving for one row line RL. The row driver R-DRV may supply a low-potential voltage for display-off driving to one row line RL in order to perform display-off driving for one row line RL.

A low-potential voltage for display-on driving and a low-potential voltage for display-off driving may be different. For example, the low-potential voltage for display-on driving may be lower than the low-potential voltage for display-off driving. In the embodiments of the present disclosure, the "low-potential voltage for display-on driving" is also referred to as the "first low-potential voltage," and the "low-potential voltage for display-off driving" is also referred to as the "second low-potential voltage."

Referring to FIG. 5, the column driver C-DRV may further include at least one switching element and/or at least one transistor in addition to the driving transistor DRT and the first emission control transistor EMT1. Each of the transistors included in the column driver C-DRV may be an n-type transistor or a p-type transistor.

The column driver C-DRV may further include at least one capacitor.

The column driver C-DRV may further include at least one circuit element. For example, the at least one circuit element may include a power output buffer, without being limited thereto.

Referring to FIG. 5, the row driver R-DRV may include at least one switching element and/or at least one transistor. Each of the transistors included in the row driver R-DRV may be an n-type transistor or a p-type transistor.

The row driver R-DRV may further include at least one circuit element. For example, at least one circuit element may include a power output buffer, without being limited thereto.

As one example, referring to FIG. 5, the column driver C-DRV and the row driver R-DRV may be internal circuits included in the driver DRV, without being limited thereto. As another example, the column driver C-DRV and the row driver R-DRV may not be included in the driver DRV and may be circuits formed on the substrate 210 of the display panel 110.

Figure 6:
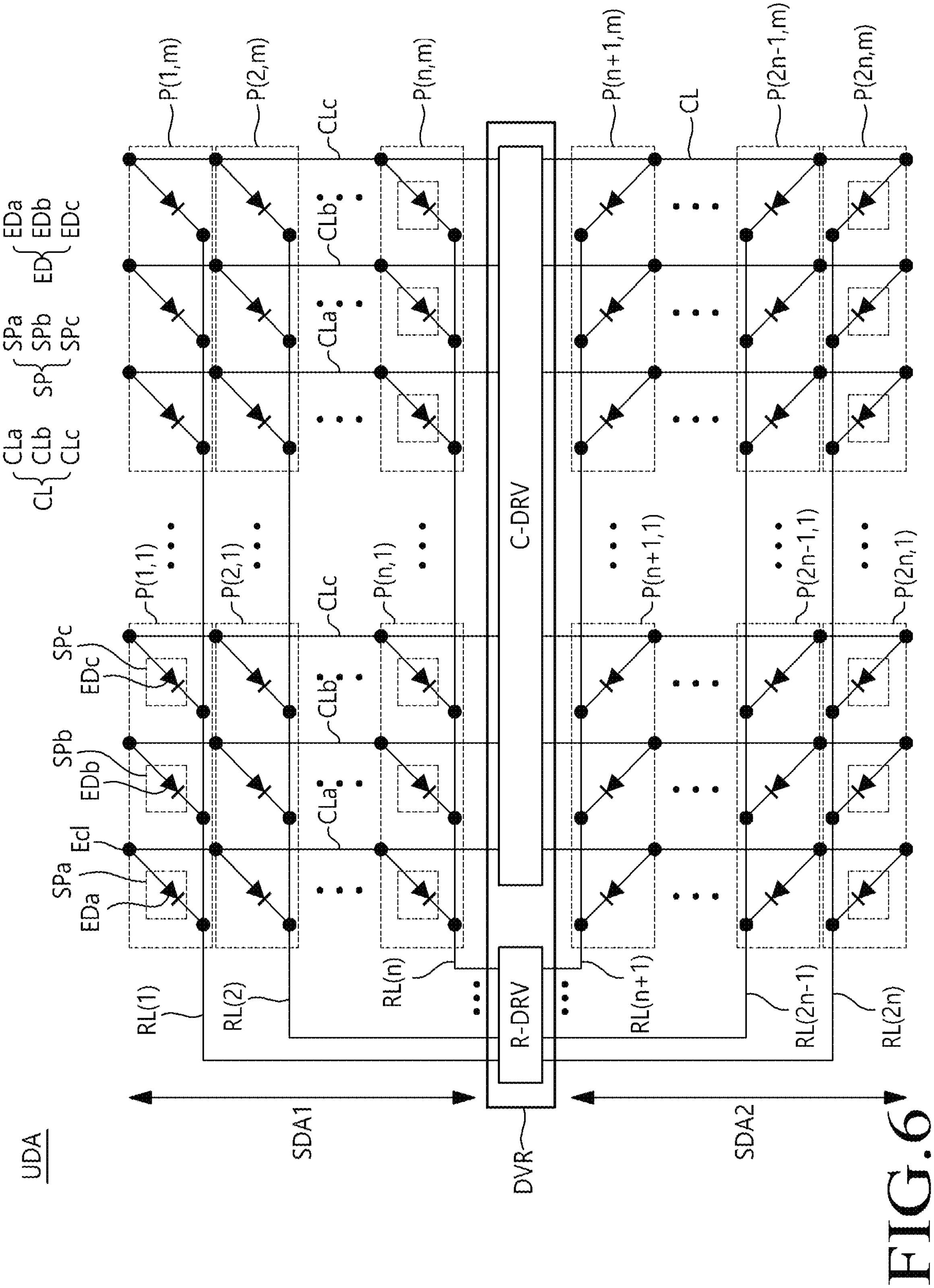
FIG. 6 is an equivalent circuit diagram of a unit driving area of a display panel according to exemplary embodiments of the present disclosure.

FIG. 6 is an equivalent circuit diagram of a unit driving area UDA of a display panel 110 according to exemplary embodiments of the present disclosure. In the following description, FIG. 4 and FIG. 5 are also referred to.

Referring to FIG. 6, each of the plurality of unit driving areas UDA may correspond to one driver DRV among the plurality of drivers DRV. For example, one driver DRV among the plurality of drivers DRV may be arranged in each of the plurality of unit driving areas UDAs.

Referring to FIG. 6, each of the plurality of unit driving areas UDAs may include two or more row lines RL(1) to RL(2*n*) among all row lines RL arranged in the display panel 110 and two or more column lines CL among all column lines CL arranged in the display panel 110.

Referring to FIG. 6, each of the plurality of unit driving areas UDAs may include a first sub-driving area SDA1 and a second sub-driving area SDA2. Some of the two or more row lines RL(1) to RL(2*n*) may be arranged in the first sub-driving area SDA1), and the rest may be arranged in the second sub-driving area SDA2. Some of the two or more column lines CL may be arranged in the first sub-driving area SDA1, and the rest may be arranged in the second sub-driving area SDA2.

Referring to FIG. 6, each of the plurality of unit driving areas UDAs may include a plurality of pixels P(1, 1), . . . , P(1, m), P(2, 1), . . . , P(2, m), . . . , P(2*n*, 1), . . . , P(2*n, m*) arranged in a matrix form.

Each of the plurality of pixels P(1, 1), . . . , P(1, m), P(2, 1), . . . , P(2, m), . . . , P(2*n*, 1), . . . , P(2*n, m*) may include k subpixels. For example, each of the plurality of pixels P(1, 1), . . . , P(1, m), P(2, 1), . . . , P(2, m), . . . , P(2*n*, 1), . . . , P(2*n, m*) may include three subpixels such as subpixels SPa, SPb and SPc, without being limited thereto. The k subpixels SPa, SPb and SPc may include k light emitting devices EDa, EDb and EDc.

Some of the plurality of pixels P(1, 1), . . . , P(1, m), P(2, 1), . . . , P(2, m), . . . , P(2*n*, 1), . . . , P(2*n, m*) may be arranged in the first sub-driving area SDA1, and the rest may be arranged in the second sub-driving area SDA2.

The k is the number of subpixels included in one pixel. In the example of FIG. 6, k is 3. That is, one pixel may include three subpixels SPa, SPb and SPc. Hereinafter, it will be described the structure of the unit driving area UDA is exemplary explained based on an example where K is 3.

The unit driving area UDA may include (2n×m) pixels P(1, 1), . . . , P(1, m), P(2, 1), . . . , P(2, m), . . . , P(2*n*, 1), . . . , P(2*n, m*). The (2n×m) pixels P(1, 1), . . . , P(1, m), P(2, 1), . . . , P(2, m), . . . , P(2*n*, 1), . . . P(2*n, m*) may be arranged in 2n rows and m columns.

According to the example of FIG. 6, each of the (2n×m) pixels P(1, 1), . . . , P(1, m), P(2, 1), . . . , P(2, m), . . . , P(2*n*, 1), . . . , P(2*n, m*) may include three subpixels SPa, SPb and SPc.

According to the example of FIG. 6, three subpixels may include a first subpixel SPa including a first light emitting device EDa, a second subpixel SPb including a second light emitting device EDb, and a third subpixel SPc including a third light emitting device EDc.

Referring to FIG. 6, (n×m) pixels, which are half of the (2n×m) pixels, may be arranged in the first sub-driving area SDA1, and remaining half (n×m) pixels, may be arranged in the second sub-driving area SDA2.

Half of the (2n×m) pixels P(1, 1), . . . , P(1, m), P(2, 1), . . . , P(2, m), . . . , P(2*n*, 1), . . . , P(2*n, m*), which are (n×m) pixels P(1, 1), . . . , P(1, m), . . . , P(n, 1), . . . , P(n, m), may be arranged in the first sub-driving area SDA1.

Among the (2n×m) pixels P(1, 1), . . . , P(1, m), P(2, 1), . . . , P(2, m), . . . , P(2*n*, 1), . . . , P(2*n, m*), the remaining half (n×m) pixels P(n+1, 1), . . . , P(n+1, m), . . . , P(2*n*, 1), . . . , P(2*n, m*) may be arranged in the second sub-driving area SDA2.

According to the example of FIG. 6, the unit driving area UDA may include 2n row lines RL(1) to RL(2*n*) and (m×3×2) column lines CL.

Referring to FIG. 6, n row lines RL(1) to RL(n), which are half of 2n row lines RL(1) to RL(2*n*), may be arranged in the first sub-driving area SDA1, and n row lines RL(n+1) to RL(2*n*), which are the remaining half of 2n row lines RL(1) to RL(2*n*), may be arranged in the second sub-driving area SDA2.

The n row lines RL(1)~RL(n) arranged in the first sub-driving area SDA1 may correspond to (n×m) pixels P(1, 1), . . . , P(1, m), . . . , P(n, 1), . . . , P(n, m arranged in the first sub-driving area SDA1 by row (i.e., pixel row).

For example, among the n row lines RL(1) to RL(n) arranged in the first sub-driving area SDA1, the first row line RL(1) arranged in the first row (i.e., the first pixel row) may correspond to m pixels P(1, 1), . . . , P(1, m) included in the first pixel row. The first row line RL(1) may be electrically connected to all of the second electrodes Erl of each of the 3m light emitting devices ED included in the first pixel row.

In another example, among the n row lines RL(1) to RL(n) arranged in the first sub-driving area SDA1, the second row line RL(2) arranged in the second row (i.e., the second pixel row) may correspond to m pixels P(2, 1), . . . , P(2, m) included in the second pixel row. The second row line RL(2) may be electrically connected to all of the second electrodes Erl of each of the 3m light emitting devices ED included in the second pixel row.

In another example, among the n row lines RL(1) to RL(n) arranged in the first sub-driving area SDA1, the n-th row line RL(n) arranged in the n-th row (i.e., the n-th pixel row) may correspond to the m pixels P(n, 1), . . . , P(n, m) included in the n-th pixel row. The n-th row line RL(n) may be electrically connected to all of the second electrodes Erl of each of the 3m light emitting devices ED included in the n-th pixel row.

Then rows RL(n+1) to RL(2*n*) arranged in the second sub-driving area SDA2 may correspond to the (n×m) pixels P(n+1, 1), . . . , P(n+1, m), . . . , P(2*n*, 1), . . . , P(2*n, m*) arranged in the second sub-driving area SDA2 by row (i.e., pixel row).

For example, among then row lines RL(n+1) to RL(2*n*) arranged in the second sub-driving area SDA2, the (n+1)-th row line RL(n+1) arranged in the (n+1)-th row (i.e., the (n+1)-th pixel row) may correspond to the m pixels P(n+1, 1), . . . , P(n+1, m) included in the (n+1)-th pixel row. The (n+1)-th row line RL(n+1) may be electrically connected to all of the second electrodes Erl of each of the 3m light emitting devices ED included in the (n+1)-th pixel row.

In another example, among then row lines RL(n+1) to RL(2*n*) arranged in the second sub-driving area SDA2, the (2n−1)-th row line RL(2*n*−1) arranged in the (2n−1)-th row (i.e., the (n+2)-th pixel row) may correspond to the m pixels P(2*n*−1, 1), . . . , P(2*n*−1, m) included in the (n+2)-th pixel row. The (2n−1)-th row line RL(2*n*−1) may be electrically connected to all of the second electrodes Erl of each of the 3m light emitting devices ED included in the (2n−1)-th pixel row.

In another example, among then row lines RL(n+1) to RL(2*n*) arranged in the second sub-driving area SDA2, the 2n-th row line RL(2*n*) arranged in the 2n-th row (i.e., 2n-th pixel row) may correspond to the m pixels P(2*n*, 1), . . . , P(2*n, m*) included in the 2n-th pixel row. The 2n-th row line RL(2*n*) may be electrically connected to all of the second electrodes Erl of each of the 3m light emitting devices ED included in the 2n-th pixel row.

Referring to FIG. 6, 3m column lines CL, which are half of the (m×3×2) column lines CL, may be arranged in the first sub-driving area SDA1, and the remaining half of the (m×3×2) column lines CL, which are 3m column lines CL, may be arranged in the second sub-driving area SDA2.

Referring to FIG. 6, 3m column lines CL arranged in the first sub-driving area SDA1 may correspond to (n×m) pixels P(1, 1), . . . , P(1, m), . . . , P(n, 1), . . . , P(n, m) placed in the first sub-driving area SDA1 by column (i.e., pixel column).

For example, among the 3m column lines CL arranged in the first sub-driving area SDA1, three first column lines CLa, CLb and CLc arranged in a first column (i.e., the first pixel column) may correspond to n pixels P(1, 1), P(2, 1), . . . , P(n, 1) arranged in the first pixel column.

In the first sub-driving area SDA1, three first column lines CLa, CLb and CLc arranged in the first pixel column may be connected to three subpixels SPa, SPb and SPc included in each of n pixels P(1, 1), P(2, 1), . . . , P(n, 1) arranged in the first pixel column.

In the first sub-driving area SDA1, three first column lines CLa, CLb and CLc arranged in the first pixel column may be electrically connected to all of the first electrodes Ecl of three light emitting devices EDa, EDb and EDc included in each of n pixels P(1, 1), P(2, 1), . . . , P(n, 1) arranged in the first pixel column.

For example, among the 3m column lines CL arranged in the first sub-driving area SDA1, three m-th column lines CLa, CLb and CLc arranged in a m-th column (i.e., m-th pixel column) may correspond to n pixels P(1, m), P(2, m), . . . , P(n, m) arranged in the m-th pixel column.

In the first sub-driving area SDA1, three m-th column lines CLa, CLb and CLc arranged in the m-th pixel column may be connected to three subpixels SPa, SPb and SPc included in each of n pixels P(1, m), P(2, m), . . . , P(n, m) arranged in the m-th pixel column.

In the first sub-driving area SDA1, three m-th column lines CLa, CLb and CLc arranged in the m-th pixel column may be electrically connected to all of the first electrodes Ecl of three light emitting devices EDa, EDb and EDc included in each of n pixels P(1, m), P(2, m), . . . , P(n, m) arranged in the m-th pixel column.

Referring to FIG. 6, 3m column lines CL arranged in the second sub-driving area SDA2 may correspond to (n×m) pixels P(n+1, 1), . . . , P(n+1, m), . . . , P(2*n*, 1), . . . , P(2*n, m*) arranged in the second sub-driving area SDA2 by column (i.e., pixel column).

For example, among the 3m column lines CL arranged in the second sub-driving area SDA2, three first column lines CLa, CLb and CLc arranged in the first column (i.e., the first pixel column) may correspond to n pixels P(n+1, 1), . . . , P(2*n*−1, 1), P(2*n*, 1) arranged in the first pixel column.

In the second sub-driving area SDA2, three first column lines CLa, CLb and CLc arranged in the first pixel column may be connected to three subpixels SPa, SPb and SPc included in each of n pixels P(n+1, 1), . . . , P(2*n*−1, 1), P(2*n*, 1) arranged in the first pixel column.

In the second sub-driving area SDA2, the three first column lines CLa, CLb and CLc arranged in the first pixel column may be electrically connected to all of the first electrodes Ecl of the three light emitting devices EDa, EDb and EDc included in each of the n pixels P(n+1, 1), . . . , P(2*n*−1, 1), P(2*n*, 1) arranged in the first pixel column.

For example, among the 3m column lines CL arranged in the second sub-driving area SDA2, the three m-th column lines CLa, CLb and CLc arranged in the m-th column (i.e., the m-th pixel column) may correspond to the n pixels P(n+1, m), . . . , P(2*n*−1, m), P(2*n, m*) arranged in the m-th pixel column.

In the second sub-driving area SDA2, three m-th column lines CLa, CLb and CLc arranged in the m-th pixel column can be connected to three subpixels SPa, SPb and SPc included in each of n pixels P(n+1, m), . . . , P(2n−1, m), P(2n, m) arranged in the m-th pixel column.

In the second sub-driving area SDA2, three m-th column lines CLa, CLb and CLc arranged in the m-th pixel column may be electrically connected to all of the first electrodes Ecl of three light emitting devices EDa, EDb and EDc included in each of n pixels P(n+1, m), . . . , P(2n−1, m), P(2n, m) arranged in the m-th pixel column.

Referring to FIG. 6, two or more row lines RL(1) to RL(2n) arranged in the unit driving area UDA may be electrically connected to the row driver R-DRV included in the driver DRV of the unit driving area UDA. Two or more column lines CL arranged in the unit driving area UDA may be electrically connected to the column driver C-DRV included in the driver DRV of the unit driving area UDA.

Referring to FIG. 6, one driver DRV may be arranged in one unit driving area UDA. For example, the driver DRV may be arranged between the first sub-driving area SDA1 and the second sub-driving area SDA2, without being limited thereto. There is no specific limitation on the position of the driver DRV, as long as the unit driving area UDA is driven by the driver DRV.

Figure 7:
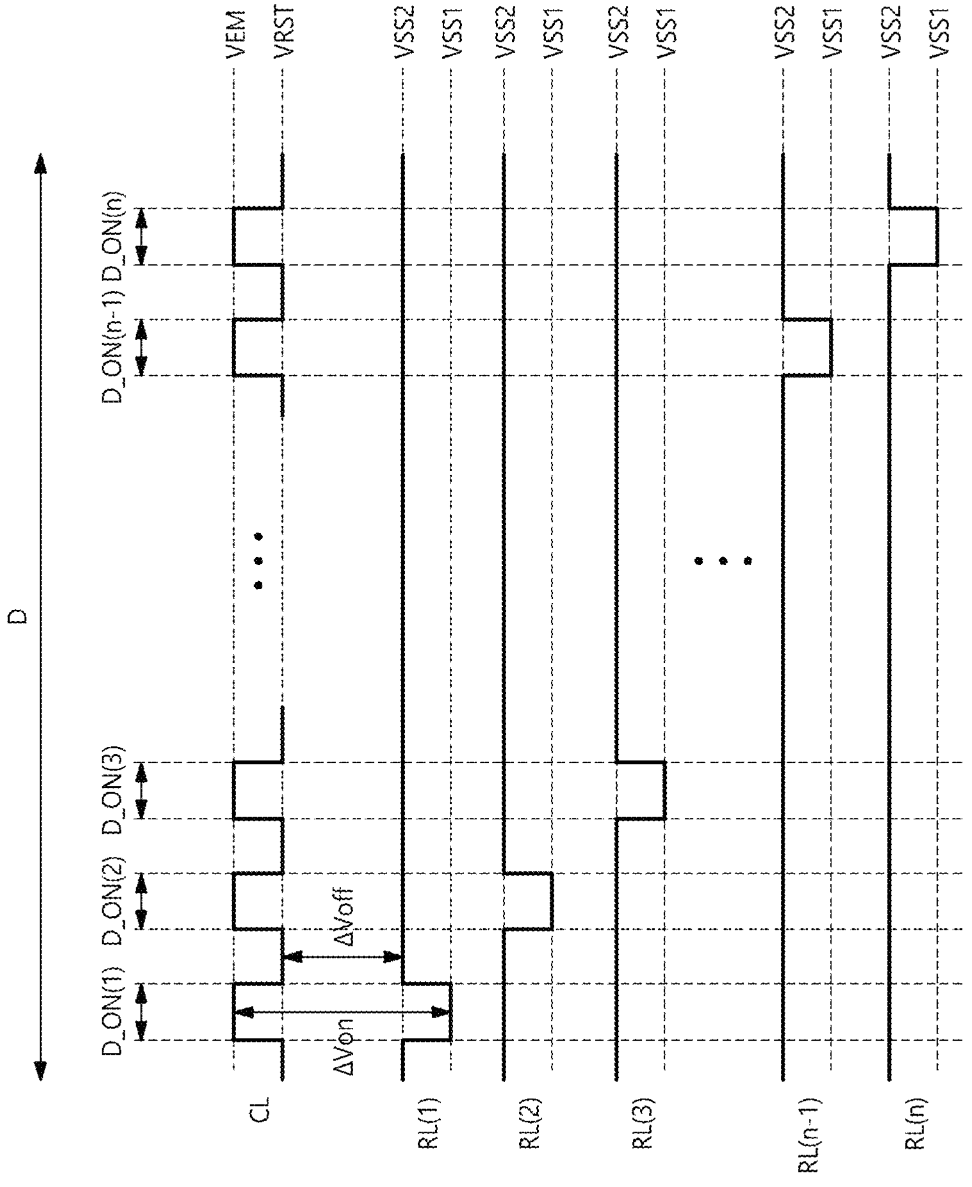
FIG. 7 illustrates a driving timing diagram for n row lines and one column line included in a first sub-driving area of a display panel according to exemplary embodiments of the present disclosure.

FIG. 7 illustrates a driving timing diagram for n row lines RL(1) to RL(n) and one column line CL included in a first sub-driving area SDA1 of a display panel 110 according to exemplary embodiments of the present disclosure. However, FIG. 6 is also referred to in the following description.

The row driver R-DRV of the driver DRV may drive n row lines RL(1) to RL(n) arranged in the first sub-driving area SDA1.

The driving for each of the n row lines RL(1) to RL(n) arranged in the first sub-driving area SDA1 may include display-on driving for emitting light emitting devices ED arranged in each of the n row lines RL(1) to RL(n) and display-off driving for not emitting light emitting devices EDs arranged in each of the n row lines RL(1) to RL(n).

Hereinafter, it will be exemplified the driving sequence for each of the n row lines RL(1) to RL(n) arranged in the first sub-driving area SDA1.

For example, display-on driving for each of the plurality of row lines RL may be performed sequentially. As another example, display-on driving for each of the plurality of row lines RL may be performed simultaneously. As another example, display-on driving for each of two or more row lines RL among the plurality of row lines RL may be performed simultaneously. As another example, display-on driving for each of two or more row lines RL among the plurality of row lines RL may be performed sequentially. Hereinafter, for convenience of explanation, it will be described as an example a case in which display-on driving for each of the plurality of row lines RL is performed sequentially. However, it is not limited thereto.

The row driver R-DRV of the driver DRV may sequentially drive n row lines RL(1) to RL(n) arranged in the first sub-driving area SDA1. That is, display-on driving periods D_ON(1) to D_ON(n) for n row lines RL(1) to RL(n) arranged in the first sub-driving area SDA1 may be sequential.

Among the n row lines RL(1) to RL(n) arranged in the first sub-driving area SDA1, for any one row line RL, during the display driving period D, the display-on driving period D_ON(1) for the corresponding row line RL may exist at least once. During the display driving period D, all remaining times except the display-on driving period D_ON(1) for the corresponding row line RL may be display-off driving periods.

Referring to FIG. 7, during any one display driving period D, among the n row lines RL(1) to RL(n) arranged in the unit driving area UDA, the display-on driving may be performed for at least one row line RL, and the display-on driving may not be performed for the remaining row lines RL, but the display-off driving may be performed.

For example, during any one display driving period D, among the n row lines RL(1) to RL(n) arranged in the unit driving area UDA, display-on driving may be performed for a first row line RL(1), and display-off driving may be performed for the second to n-th row lines RL(2) to RL(n).

In another example, during any one display driving period D, among the n row lines RL(1) to RL(n) arranged in the unit driving area UDA, display-on driving may be performed for the second row line RL(2), and display-on driving may not be performed for the first row line RL(1) and a third to n-th row lines RL(3) to RL(n). For example, display-on driving may be performed for the second row line RL(2), and display-off driving may be performed instead of display-on driving for the first row line RL(1) and a third to n-th row lines RL(3) to RL(n).

In another example, during any one display driving period D, among the n row lines RL(1) to RL(n) arranged in the unit driving area UDA, display-on driving may be performed for the third row line RL(3), and display-off driving may be performed instead of display-on driving for the first and second row lines RL(1), RL(2) and the fourth to n-th row lines RL(4) to RL(n).

In another example, during any one display driving period D, among the n row lines RL(1) to RL(n) arranged in the unit driving area UDA, display-on driving may be performed for the (n−1)-th row line RL(n−1), and display-off driving may be performed instead of display-on driving for the first to (n−2)-th row lines RL(1) to RL(n−2) and the n-th row line RL(n).

F In or another example, during any one display driving period D, among the n row lines RL(1) to RL(n) arranged in the unit driving area UDA, display-on driving may be performed for the n-th row line RL(n), and display-off driving may be performed instead of display-on driving for the first to (n−1)-th row lines RL(1) to RL(n−1).

For example, during any one display driving period D, among the n row lines RL(1) to RL(n) arranged in the unit driving area UDA, display-on driving may be performed for any row line, and display-off driving may be performed instead of display-on driving for the remaining row lines.

Referring to FIG. 7, if display-on driving is performed for any row line RL among the n row lines RL(1) to RL(n) arranged in the unit driving area UDA, it may mean that a first low-potential voltage VSS1 of a predefined level is supplied to the corresponding row line RL. When display-on driving is performed for any row line RL, the light emitting devices ED arranged corresponding to the corresponding row line RL may emit light. For example, when display-on driving is performed for any row line RL, and a first low-potential voltage VSS1 of a predefined level is supplied to the corresponding row line RL, the light emitting devices ED arranged corresponding to the corresponding row line RL may emit light.

When display-off driving is performed for any row line RL among the n row lines RL(1) to RL(n) arranged in the unit driving area UDA without display-on driving, it may mean that a second low-potential voltage VSS2 of a predefined level is supplied to the corresponding row line RL.

When display-off driving is performed for a specific row line RL, the light emitting devices ED arranged corresponding to the corresponding row line RL may not emit light. For example, when display-off driving is performed for any row line RL, and a second low-potential voltage VSS2 of a predefined level is supplied to the corresponding row line RL, the light emitting devices ED arranged corresponding to the corresponding row line RL may not emit light.

The first low-potential voltage VSS1 may be a low-potential voltage VSS for display-on driving, and the second low-potential voltage VSS2 may be a low-potential voltage VSS for display-off driving. The second low-potential voltage VSS2 may be a voltage higher than the first low-potential voltage VSS1, without being limited thereto.

Referring to FIG. 7, any one row line RL among the n row lines RL(1) to RL(n) arranged in the unit driving area UDA may be supplied with the first low-potential voltage VSS1 during a first period and may be supplied with the second low-potential voltage VSS2 higher than the first low-potential voltage VSS1 during a second period different from the first period. For example, the first period and the second period may be included in one display driving period D. For another example, the first period and the second period may be included in different display driving periods D.

For example, among the n row lines RL(1) to RL(n) arranged in the unit driving area UDA, the first row line RL(1) may be supplied with a first low-potential voltage VSS1 during a first display-on driving period D_ON(1), and may be supplied with a second low-potential voltage VSS2 higher than the first low-potential voltage VSS1 during a second display-on driving period D_ON(2) to D_ON(n) different from the first display-on driving period D_ON(1).

For example, during the first display-on driving period D_ON(1), the first row line RL(1) may be supplied with a first low-potential voltage VSS1, and the second to n-th row lines RL(2) to RL(n) may be supplied with a second low-potential voltage VSS2. During the second display-on driving period D_ON(2), the second row line RL(2) may be supplied with a first low-potential voltage VSS1, and the first row line RL(1) and the third to n-th row lines RL(3) to RL(n) may be supplied with a second low-potential voltage VSS2. For example, during the third display-on driving period D_ON(3), the third row line RL(3) may be supplied with the first low-potential voltage VSS1, and the first to second row lines RL(1) to RL(2) and the fourth to n-th row lines RL(4) to RL(n) may be supplied with the second low-potential voltage VSS2.

For example, during the first display-on driving period D_ON(1), a plurality of light emitting devices ED overlapping with the first row line RL(1) and arranged in the first row may emit light, and a plurality of light emitting devices ED overlapping with the second to n-th row lines RL(2) to RL(n) and arranged in the second to n-th rows may not emit light. During the second display-on driving period D_ON (2), a plurality of light emitting devices ED overlapping with the second row line RL(2) and arranged in the second row may emit light, and a plurality of light emitting devices ED overlapping with the first row line RL(1) and the third to n-th row lines RL(3) to RL(n) and arranged in the first row and the third to n-th rows may not emit light. During the third display-on driving period D_ON(3), a plurality of light emitting devices ED overlapping with the third row line RL(3) and arranged in the third row may emit light, and a plurality of light emitting devices ED overlapping with the first to second row lines RL(1) to RL(2) and the fourth to n-th row lines RL(4) to RL(n) and arranged in the first to second rows and the fourth to n-th rows may not emit light.

For example, the first display-on driving period D_ON(1) and the second to n-th display-on driving period D_ON(2) to D_ON(n) may be included in one display driving period D. For another example, the first display-on driving period D_ON(1) and the second to n-th display-on driving period D_ON(2) to D_ON(n) may be included in different display driving periods D.

Referring to FIG. 7, (m×k) column lines CL may be arranged in a unit driving area UDA. In the unit driving area UDA, the (m×k) column lines CL may intersect with n row lines RL(1) to RL(n). The column line CL illustrated in FIG. 7 may be one of the (m×k) column lines CL.

During the display driving period D, each of the (m×k) column lines CL intersecting then row lines RL(1) to RL(n) may be supplied with a display voltage VEM required to emit light from the corresponding light emitting device ED in synchronization with the display-on driving period D_ON (1) to D_ON(n) of each of the n row lines RL(1) to RL(n). Here, the display voltage VEM may also be referred to as a light emitting driving voltage or an emission driving voltage.

During the display driving period D, during all remaining times except for the display-on driving period D_ON(1) to D_ON(n) of each of the n row lines RL(1) to RL(n), a reset voltage VRST may be applied to each of the (m×k) column lines CL intersecting the n row lines RL(1) to RL(n).

The display voltage VEM may be a constant voltage or a voltage that varies depending on the image signal. The reset voltage VRST may be a voltage that is lower than the display voltage VEM and may be a constant voltage or a variable voltage.

During the display driving period D, during the display-on driving period D_ON(1) to D_ON(n) of each of the n row lines RL(1) to RL(n), the voltage difference VEM-VSS1 between the display voltage VEM applied to the corresponding column line CL and the first low-potential voltage VSS1 applied to the corresponding row line RL may be a display-on voltage ΔVon.

A light emitting device ED may be connected between the corresponding column line CL and the corresponding row line RL. A display voltage VEM and a first low-potential voltage VSS1 may be applied to each of the first electrode Ecl and the second electrode Erl of the light emitting device ED.

The display-on voltage ΔVon is a voltage difference between the first electrode Ecl and the second electrode Erl of the light emitting device ED and may be a voltage that can cause the light emitting device ED to emit light. For example, the display-on voltage ΔVon may be equal to or higher than a threshold voltage, which is a unique characteristic value of the light emitting device ED.

During the display driving period D, during all the remaining time except for the display-on driving period D_ON(1) to D_ON(n) of each of the n row lines RL(1) to RL(n), the voltage difference VRST-VSS2 between the reset voltage VRST applied to the corresponding column line CL and the second low-potential voltage VSS2 applied to the corresponding row line RL may be a display-off voltage ΔVoff.

A light emitting device ED may be connected between the corresponding column line CL and the corresponding row line RL. A reset voltage VRST and a second low-potential voltage VSS2 may be applied to each of the first electrode Ecl and the second electrode Erl of the light emitting device ED)

The display-off voltage ΔVoff is a voltage difference between the first electrode Ecl and the second electrode Erl of the corresponding light emitting device ED and may be a voltage that does not allow the corresponding light emitting device ED to emit light. For example, the display-off voltage ΔVoff may be less than the threshold voltage, which is a unique characteristic of the corresponding light emitting device ED. That is, the display-on voltage ΔVon may be greater than or equal to the display-off voltage ΔVoff.

Hereinafter, it will be described in more detail a circuit for driving n light emitting devices ED(1) to ED(n) connected to one column line CL in the display panel 110 according to exemplary embodiments of the present disclosure.

Figure 8:
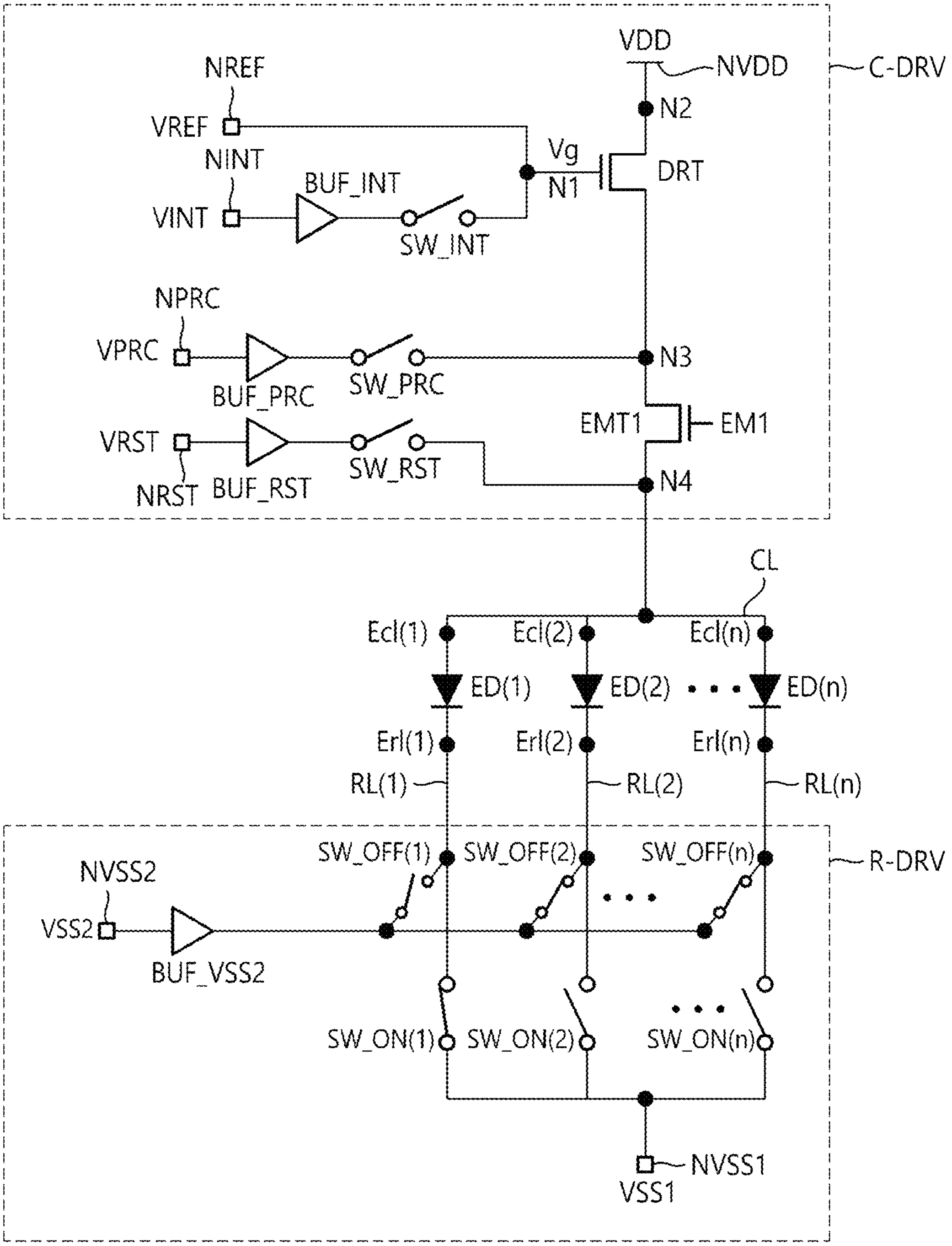
FIG. 8 and FIG. 9 illustrate circuits for driving n light emitting devices connected to one column line included in a first sub-driving area of a display panel according to exemplary embodiments of the present disclosure.

FIG. 8 illustrates a circuit for driving n light emitting devices ED(1) to ED(n) connected to one column line CL included in a first sub-driving area SDA1 of a display panel 110 according to exemplary embodiments of the present disclosure. FIG. 4 and FIG. 6 may also be referred to in the following description.

Referring to FIG. 8, n light emitting devices ED(1) to ED(n) connected to one column line CL may be arranged in the same column. The n light emitting devices ED(1) to ED(n) arranged in the same column may be connected to one column line CL. The n light emitting devices ED(1) to ED(n) connected to one column line CL may be arranged in one of the first sub-driving area SDA1 and the second sub-driving area SDA2 included in the unit driving area UDA, without being limited thereto. The n light emitting devices ED(1) to ED(n) arranged in the same column may be arranged in one of the first sub-driving area SDA1 and the second sub-driving area SDA2 included in the unit driving area UDA.

The n light emitting devices ED(1) to ED(n) connected to one column line CL may be light emitting devices emitting the same color light. The n light emitting devices ED(1) to ED(n) arranged in the same column may be light emitting devices emitting the same color light, without being limited thereto. Alternatively, the n light emitting devices ED(1) to ED(n) connected to one column line CL may be light emitting devices emitting the different color light. The n light emitting devices ED(1) to ED(n) arranged in the same column may be light emitting devices emitting the different color light.

For example, the n light emitting devices ED(1) to ED(n) arranged in the same column may emit light sequentially. As another example, the n light emitting devices ED(1) to ED(n) arranged in the same column may emit light simultaneously. As another example, two or more of n light emitting devices ED(1) to ED(n) arranged in the same column may emit light simultaneously. As another example, two or more of n light emitting devices ED(1) to ED(n) arranged in the same column may emit light sequentially.

Referring to FIG. 8, n light emitting devices ED(1) to ED(n) arranged in the same column may include first electrodes Ecl(1) to Ecl(n) and second electrodes Erl(1) to Erl(n). For example, the first light emitting device ED(1) may include a first electrode Ecl(1) and a second electrodes Erl(1), the second light emitting device ED(2) may include a first electrode Ecl(2) and a second electrodes Erl(2), and the n-th light emitting device ED(n) may include a first electrode Ecl(n) and a second electrodes Erl(n).

All first electrodes Ecl(1) to Ecl(n) of n light emitting devices ED(1) to ED(n) arranged in the same column may be connected to one column line CL. The second electrodes Erl(1) to Erl(n) of the n light emitting devices ED(1) to ED(n) arranged in the same column may be respectively connected to the n row lines RL(1) to RL(n).

Referring to FIG. 8, a circuit for driving the n light emitting devices ED(1) to ED(n) arranged in the same column may include a column driver C-DRV and a row driver R-DRV.

For example, the column driver C-DRV may be configured to drive the column line CL. The column driver C-DRV may be configured to drive the column line CL connected to all of the first electrodes Ecl(1) to Ecl(n) of the n light emitting devices ED(1) to ED(n) arranged in the same column.

For example, the row driver R-DRV may be configured to drive n row lines RL(1) to RL(n). The row driver R-DRV may be configured to drive n row lines RL(1) to RL(n) which are respectively connected to the second electrodes Erl(1) to Erl(n) of n light emitting devices ED(1) to ED(n) arranged in the same column.

Referring to FIG. 8, the column driver C-DRV may include main nodes including first to fourth nodes N1 to N4, and may include a driving transistor DRT and a first emission control transistor EMT1.

The first node N1 may be anode to which a voltage Vg for controlling the on-off of the driving transistor DRT is applied. The second node N2 may be a node electrically connected to a high-potential voltage node NVDD to which a high-potential voltage VDD is applied. The third node N3 may be a node to which the driving transistor DRT and the first emission control transistor EMT1 are connected. The fourth node N4 may be a node to which the first emission control transistor EMT1 and the n light emitting devices ED(1) to ED(n) are electrically connected and may be a node to which the column line CL is electrically connected. Here, the source electrode or the drain electrode of the first emission control transistor EMT1 and the first electrodes Ecl(1) to Ecl(n) of the n light emitting devices ED(1) to ED(n) may be commonly connected to the column line CL. Here, a source electrode or a drain electrode of the driving transistor DRT and a source electrode or a drain electrode of the first emission control transistor EMT1 may be commonly connected to the third node N3.

The driving transistor DRT supplies a driving current to emit light to n light emitting devices ED(1) to ED(n), is connected between the second node N2 and the third node N3 and may control the connection between the second node N2 and the third node N3 according to the voltage of the first node N1.

The gate electrode of the driving transistor DRT is electrically connected to the first node N1 and is supplied with a gate voltage Vg. The drain electrode or the source electrode of the driving transistor DRT may be electrically connected to the second node N2. The source electrode or the drain electrode of the driving transistor DRT may be electrically connected to the third node N3. For example, the driving transistor DRT is turned on or off in response to the voltage Vg applied to the first node N1.

The first emission control transistor EMT1 may control the connection of a path through which the driving current flows, and may play a role in controlling an emission of the light emitting device ED. For example, the first emission control transistor EMT1 may be connected between the third node N3 and the fourth node N4.

The first emission control transistor EMT1 is connected between the third node N3 and the fourth node N4 and may control the connection between the third node N3 and the fourth node N4 according to the first emission control signal EM1. The first emission control signal EM1 may be applied to the gate electrode of the first emission control transistor EMT1. The drain electrode or the source electrode of the first emission control transistor EMT1 may be electrically connected to the third node N3. The source electrode or the drain electrode of the first emission control transistor EMT1 may be electrically connected to the fourth node N4. For example, the first emission control transistor EMT1 is turned on or off in response to the first emission control signal EM1 applied to the gate electrode of the first emission control transistor EMT1.

The first emission control signal EM1 may be a pulse width modulation signal that varies at a predefined time (for example, each frame, or each sub-frame included in one frame), but the embodiments of the present disclosure are not limited thereto.

The first emission control signal EM1 may be generated from the driver DRV or supplied to the driver DRV from a driving-related circuit such as a timing controller.

Referring to FIG. 8, the column driver C-DRV may further include a reference voltage node NREF electrically connected to the first node N1. A reference voltage VREF may be applied to the reference voltage node NREF. Here, the reference voltage VREF may be a gate voltage Vg of the driving transistor DRT.

For example, the reference voltage VREF applied to the reference voltage node NREF' may have a constant voltage value, without being limited thereto. For another example, the reference voltage VREF may have a different voltage value.

For another example, the reference voltage VREF may have a different voltage value depending on the color light emitted from the light emitting device ED in which the display-on operation is performed. For example, the reference voltage VREF applied to the first node N1 during the driving period for emitting light of the light emitting device EDa emitting a first color light, the reference voltage VREF applied to the first node N1 during the driving period for emitting light of the light emitting device EDb emitting a second color light, and the reference voltage VREF applied to the first node N1 during the driving period for emitting light of the light emitting device EDc emitting a third color light may have different voltage values.

Referring to FIG. 8, the column driver C-DRV may further include an initialization voltage node NINT electrically connected to the first node N1 through an initialization switch SW_INT. An initialization voltage VINT may be applied to the initialization voltage node NINT. Here, the initialization voltage VINT may be a gate voltage Vg of the driving transistor DRT.

The column driver C-DRV may further include an initialization buffer BUF_INT connected between the initialization switch SW_INT and the initialization voltage node NINT. The initialization buffer BUF_INT may amplify the initialization voltage VINT applied to the initialization voltage node NINT and supply an amplified initialization voltage to the first node N1. For example, the initialization buffer BUF_INT may supply the amplified initialization voltage to the first node N1 by the initialization switch SW_INT.

Referring to FIG. 8, the column driver C-DRV may further include a pre-charge voltage node NPRC electrically connected to a third node N3 through a pre-charge switch SW_PRC. A pre-charge voltage VPRC may be applied to the pre-charge voltage node NPRC.

The column driver C-DRV may further include a pre-charge buffer BUF_PRC connected between the pre-charge switch SW_PRC and the pre-charge voltage node NPRC. The pre-charge buffer BUF_PRC may amplify the pre-charge voltage VPRC applied to the pre-charge voltage node NPRC and supply it to the third node N3. Here, the third node N3 may be electrically connected to the source electrode or the drain electrode of the driving transistor DRT and the source electrode or the drain electrode of the first emission control transistor EMT1.

Referring to FIG. 8, the column driver C-DRV may further include a reset voltage node NRST electrically connected to a fourth node N4 through a reset switch SW_RST. A reset voltage VRST may be applied to the reset voltage node NRST.

The column driver C-DRV may further include a reset buffer BUF_RST connected between the reset switch SW_RST and the reset voltage node NRST. The reset buffer BUF_RST may amplify the reset voltage VRST applied to the reset voltage node NRST and supply it to the fourth node N4. Here, the fourth node N4 may be electrically connected to the corresponding column line CL.

Referring to FIG. 8, the row driver R-DRV may be configured to drive n row lines RL(1) to RL(n) each connected to the second electrodes Erl(1) to Erl(n) of n light emitting devices ED(1) to ED(n) arranged in the same column.

Referring to FIG. 8, the row driver R-DRV may include n display-on switches SW_ON(1) to SW_ON(n) that electrically connect each of n row lines RL(1) to RL(n) to a first low-potential voltage node NVSS1. A first low-potential voltage VSS1 may be applied to the first low-potential voltage node NVSS1.

The turn-on timing of each of the n display-on switches SW_ON(1) to SW_ON(n) may be different from each other. Accordingly, display-on driving for the n row lines RL(1) to RL(n) may be sequentially performed.

Referring to FIG. 8, the row driver R-DRV may include n display-off switches SW_OFF(1) to SW_OFF(n) that electrically connect each of the n row lines RL(1) to RL(n) to a second low-potential voltage node NVSS2 to which a second low-potential voltage VSS2 is applied. The second low-potential voltage VSS2 may be a low-potential voltage higher than the first low-potential voltage VSS1. The row driver R-DRV may further include a second low-potential buffer BUF_VSS2 connected between the n display-off switches SW_OFF(1) to SW_OFF(n) and the second low-potential voltage node NVSS2.

The turn-on timing of each of the n display-off switches SW_OFF(1) to SW_OFF(n) may be different from each other. Accordingly, the display-off driving for the n display-off switches SW_OFF(1) to SW_OFF(n) may be performed at different timings.

According to the example of FIG. 8, the row driver R-DRV may perform display-on driving for the first row line RL(1) among the n row lines RL(1) to RL(n) and perform display-off driving for the second to n-th row lines RL(2) to RL(n).

To this end, according to the example of FIG. 8, among the n display-on switches SW_ON(1) to SW_ON(n), a first display-on switch SW_ON(1) may be in a turn-on state, and a second to n-th display-on switches SW_ON(2) to SW_ON (n) may be in a turn-off state. In addition, among the n display-off switches SW_OFF(1) to SW_OFF(n), the first display-off switch SW_OFF(1) may be in a turn-off state, and the second to n-th display-off switches SW_OFF(2) to SW_OFF(n) may be in a turn-on state.

Also, the row driver R-DRV may perform display-on driving for the second row line RL(2) among the n row lines RL(1) to RL(n), and perform display-off driving for the first row line RL(1) and the third to n-th row lines RL(2) to RL(n).

To this end, among then display-on switches SW_ON(1) to SW_ON(n), a second display-on switch SW_ON(2) may be in a turn-on state, and the first row line RL(1) and the third to n-th display-on switches SW_ON(3) to SW_ON(n) may be in a turn-off state. In addition, among the n display-off switches SW_OFF(1) to SW_OFF(n), the second display-off switch SW_OFF(2) may be in a turn-off state, and the first display-off switches SW_OFF(1) and the third to n-th display-off switches SW_OFF(3) to SW_OFF(n) may be in a turn-on state.

Accordingly, among then row lines RL(1) to RL(n), a first low-potential voltage VSS1) may be applied to the first row line RL(1), and a second low-potential voltage VSS2 may be applied to the second to n-th row lines RL(2) to RL(n). Here, the first low-potential voltage VSS1 may have a lower voltage value than the second low-potential voltage VSS2.

Referring to FIG. 8, each of the transistors DRT and EMT1 included in the column driver C-DRV may be an n-type transistor or a p-type transistor. The switches SW_ON(1) to SW_ON(n), SW_OFF(1) to SW_OFF(n) included in the row driver R-DRV may be implemented as an n-type transistor or a p-type transistor. The column driver C-DRV may further include at least one capacitor.

Hereinafter, it will be described the different circuit structures of the column driver C-DRV and the row driver R-DRV with reference to FIG. 9.

Figure 9:
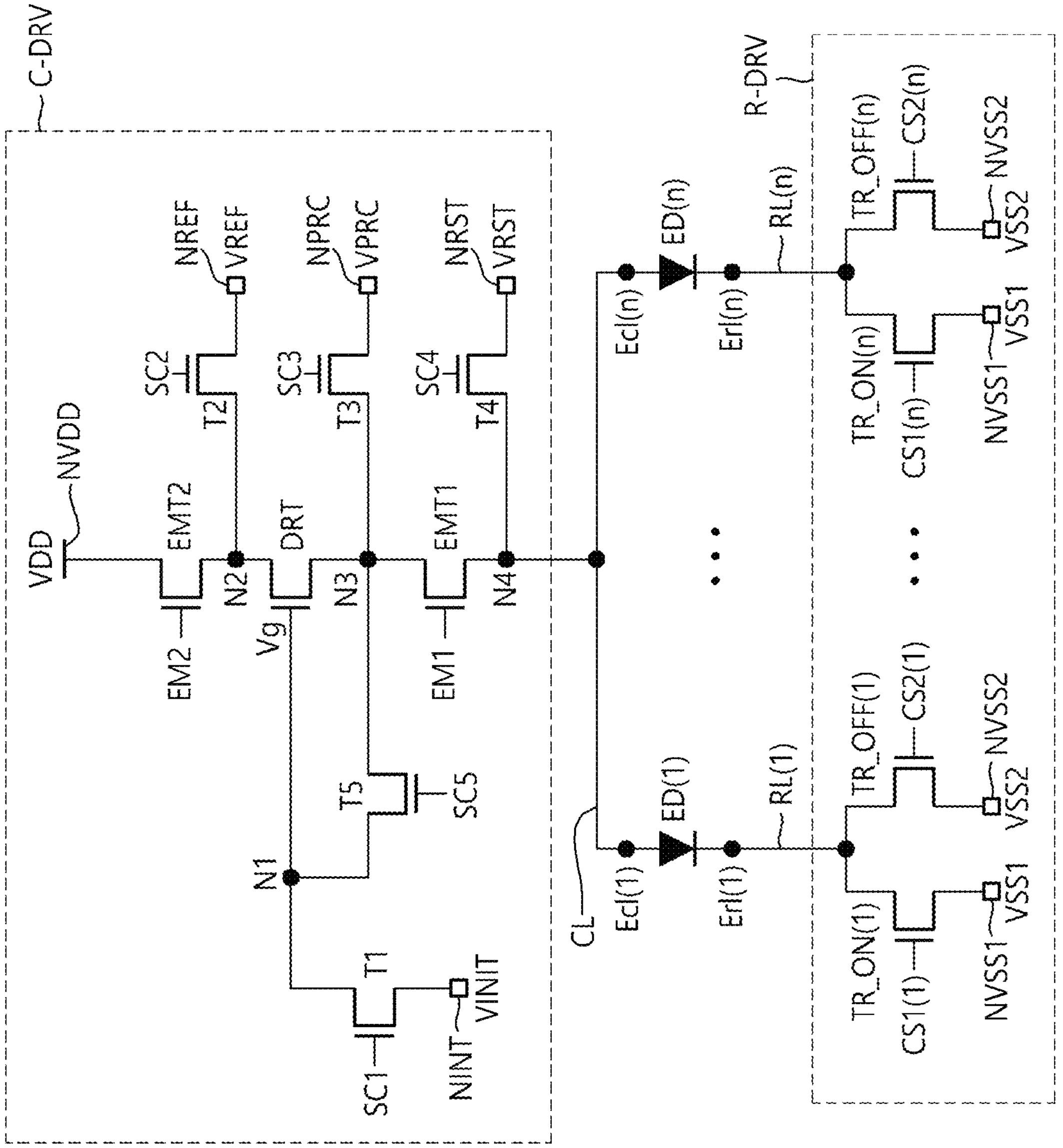

FIG. 9 illustrates another circuit for driving n light emitting devices ED(1) to ED(n) connected to one column line CL included in the first sub-driving area SDA1 of the display panel 110 according to the embodiments of the present disclosure. In the following description, the description of the same content as in the circuit of FIG. 8 may be omitted.

Referring to FIG. 9, n light emitting devices ED(1) to ED(n) connected to one column line CL may be arranged in the same column. The n light emitting devices ED(1) to ED(n) arranged in the same column may be connected to one column line CL. The n light emitting devices ED(1) to ED(n) connected to one column line CL may be arranged in one of the first sub-driving area SDA1 and the second sub-driving area SDA2 included in the unit driving area UDA, without being limited thereto. The n light emitting devices ED(1) to ED(n) arranged in the same column may be arranged in one of the first sub-driving area SDA1 and the second sub-driving area SDA2 included in the unit driving area UDA.

The n light emitting devices ED(1) to ED(n) connected to one column line CL may be light emitting devices emitting the same color light. The n light emitting devices ED(1) to ED(n) arranged in the same column may be light emitting devices emitting the same color light, without being limited thereto. Alternatively, the n light emitting devices ED(1) to ED(n) connected to one column line CL may be light emitting devices emitting the different color light. The n light emitting devices ED(1) to ED(n) arranged in the same column may be light emitting devices emitting the different color light.

Referring to FIG. 9, the n light emitting devices ED(1) to ED(n) arranged in the same column may include first electrodes Ecl(1) to Ecl(n) and second electrodes Erl(1) to Erl(n).

The first electrodes Ecl(1) to Ecl(n) of the n light emitting devices ED(1) to ED(n) arranged in the same column may all be connected to one column line CL. The second electrodes Erl(1) to Erl(n) of the n light emitting devices ED(1) to ED(n) arranged in the same column may be respectively connected to the n row lines RL(1) to RL(n).

Referring to FIG. 9, a circuit for driving the n light emitting devices ED(1) to ED(n) arranged in the same column may include a column driver C-DRV and a row driver R-DRV.

Referring to FIG. 9, the column driver C-DRV may include first to fourth nodes N1 to N4, and may include a driving transistor DRT, a first emission control transistor EMT1, and a second emission control transistor EMT2.

The first node N1 may be anode to which a voltage Vg for controlling on-off of the driving transistor DRT is applied. The second node N2 may be a node to which the second emission control transistor EMT2 and the driving transistor DRT are connected. The third node N3 may be a node to which the driving transistor DRT and the first emission control transistor EMT1 are connected. The fourth node N4 may be a node to which the first emission control transistor EMT1 and the n light emitting devices ED(1) to ED(n) are electrically connected and may be a node to which the column line CL is electrically connected. Here, the source electrode or the drain electrode of the first emission control transistor EMT1 and the first electrodes Ecl(1) to Ecl(n) of the n light emitting devices ED(1) to ED(n) may be commonly connected to the column line CL. Here, a source electrode or a drain electrode of the driving transistor DRT and a source electrode or a drain electrode of the first emission control transistor EMT1 may be commonly connected to the third node N3.

The driving transistor DRT supplies a driving current to emit light to n light emitting devices ED(1) to ED(n), is connected between the second node N2 and the third node N3 and may control the connection between the second node N2 and the third node N3 according to the voltage of the first node N1.

The gate electrode of the driving transistor DRT is electrically connected to the first node N1 and may be supplied with a gate voltage Vg. The drain electrode or the source electrode of the driving transistor DRT may be electrically connected to the second node N2. The source electrode or the drain electrode of the driving transistor DRT may be electrically connected to the third node N3. For example, the driving transistor DRT is turned on or off in response to the voltage Vg applied to the first node N1.

The first emission control transistor EMT1 and the second emission control transistor EMT2 may control the connection of a path through which a driving current flows, and may play a role in controlling an emission of a light emitting device ED.

The first emission control transistor EMT1 is connected between the third node N3 and the fourth node N4 and may control the connection between the third node N3 and the fourth node N4 according to a first emission control signal EM1. The first emission control signal EM1 may be applied to the gate electrode of the first emission control transistor EMT1. The drain electrode or the source electrode of the first emission control transistor EMT1 may be electrically connected to the third node N3. The source electrode or the drain electrode of the first emission control transistor EMT1 may be electrically connected to the fourth node N4. For example, the first emission control transistor EMT1 is turned on or off in response to the first emission control signal EM1 applied to the gate electrode of the first emission control transistor EMT1.

The first emission control signal EM1 may be a pulse width modulation signal that varies at a predefined time (for example, each frame, or each sub-frame included in a frame), but the embodiments of the present disclosure are not limited thereto. The first emission control signal EM1 may be generated by the driver DRV or may be supplied to the driver DRV from a driving-related circuit such as a timing controller.

The second emission control transistor EMT2 is connected between the high-potential voltage node NVDD and the second node N2 and may control the connection between the high-potential voltage node NVDD and the second node N2 according to a second emission control signal EM2. The second emission control signal EM2 may be applied to the gate electrode of the second emission control transistor EMT2. The drain electrode or the source electrode of the second emission control transistor EMT2 may be electrically connected to the high-potential voltage node NVDD. The source electrode or drain electrode of the second emission control transistor EMT2 may be electrically connected to the second node N2. Here, the second emission control signal EM2 may be the same as or different from the first emission control signal EM1. For example, the second emission control transistor EMT2 is turned on or off in response to the second emission control signal EM2 applied to the gate electrode of the second emission control transistor EMT2.

Referring to FIG. 9, the column driver DRV may further include a first transistor T1 whose on-off is controlled according to a first scan signal SC1 and controls the connection between the first node N1 and the initialization voltage node NINT. If the first transistor T1 is turned on, the first node N1 and the initialization voltage node NINT are electrically connected. Here, the initialization voltage VINT may be applied to the initialization voltage node NINT.

Referring to FIG. 9, the column driver DRV may further include a second transistor T2 whose on-off is controlled according to a second scan signal SC2 and controls the connection between the second node N2 and the reference voltage node NREF. If the second transistor T2 is turned on, the second node N2 and the reference voltage node NREF are electrically connected. Here, a reference voltage VREF may be applied to the reference voltage node NREF.

Referring to FIG. 9, the column driver DRV may further include a third transistor T3 whose on-off is controlled according to a third scan signal SC3 and controls the connection between the third node N3 and the pre-charge voltage node NPRC. If the third transistor T3 is turned on, the third node N3 and the pre-charge voltage node NPRC are electrically connected. Here, a pre-charge voltage VPRC may be applied to the pre-charge voltage node NPRC.

Referring to FIG. 9, the column driver DRV may further include a fourth transistor T4 whose on-off is controlled according to a fourth scan signal SC4 and controls the connection between the fourth node N4 and the reset voltage node NRST. If the fourth transistor T4 is turned on, the fourth node N4 and the reset voltage node NRST are electrically connected. Here, a reset voltage VRST may be applied to the reset voltage node NRST.

Referring to FIG. 9, the column driver DRV may further include a fifth transistor T5 that controls the connection between the first node N1 and the third node N3 by controlling the on-off according to a fifth scan signal SC5. If the fifth transistor T5 is turned on, the first node N1 and the third node N3 are electrically connected, so that the driving transistor DRT may be in a diode-connected state. Here, for example, the fifth scan signal SC5 may be a scan signal that is different from or the same as the second scan signal SC2.

Referring to FIG. 9, the row driver R-DRV may be configured to drive n row lines RL(1) to RL(n) that are respectively connected to the second electrodes Erl(1) to Erl(n) of n light emitting devices ED(1) to ED(n) arranged in the same column.

Referring to FIG. 9, the row driver R-DRV may include n display-on transistors TR_ON(1) to TR_ON(n) that electrically connect each of n row lines RL(1) to RL(n) to a first low-potential voltage node NVSS1. A first low-potential voltage VSS1 may be applied to the first low-potential voltage node NVSS1. The n display-on transistors TR_ON(1) to TR_ON(n) may be turned on and off by n display-on control signals CS1(1) to CS1(*n*).

The turn-on timing of each of the n display-on transistors TR_ON(1) to TR_ON(n) may be different from each other. Accordingly, display-on driving for the n row lines RL(1) to RL(n) may be sequentially performed.

Referring to FIG. 9, the row driver R-DRV may include n display-off transistors TR_OFF(1) to TR_OFF(n) that electrically connect each of n row lines RL(1) to RL(n) to a second low-potential voltage node NVSS2 to which a second low-potential voltage VSS2 is applied. The second low-potential voltage VSS2 may be a low-potential voltage higher than the first low-potential voltage VSS1. The n display-off transistors TR_OFF(1) to TR_OFF(n) may be turned on and off by n display-off control signals CS2(1) to CS2(*n*).

The turn-on timing of each of the n display-off transistors TR_OFF(1) to TR_OFF(n) may be different from each other. Accordingly, display-off driving for n display-off transistors TR_OFF(1) to TR_OFF(n) may be performed at different timings.

That is, one display-on transistor among n display-on transistors TR_ON(1) to TR_ON(n) and one display-off transistor among n display-off transistors TR_OFF(1) to TR_OFF(n) may be connected to each of n row lines RL(1) to RL(n).

One of the display-on transistors and display-off transistors connected to each of n row lines RL(1) to RL(n) may be selectively turned on.

For example, if a display-on driving is performed for the first row line RL(1) among then row lines RL(1) to RL(n), among the first display-on transistor TR_ON(1) and the first display-off transistor TR_OFF(1) connected to the first row line RL(1), the first display-on transistor TR_ON(1) may be turned on and the first display-off transistor TR_OFF(1) may be turned off. At this time, if display-on driving is performed for the second to n-th row lines RL(2) to RL(n), among the display-on transistors and display-off transistors connected to each of the second to n-th row lines RL(2) to RL(n), the display-on transistor may be turned off and the display-off transistor may be turned on. Accordingly, a first low-potential voltage VSS1, which is a low-potential voltage for driving the display-on, may be applied only to the first row line RL(1) among the n row lines RL(1) to RL(n), and a second low-potential voltage VSS2, which is a low-potential voltage for driving the display-off, may be applied to the remaining second to n-th row lines RL(2) to RL(n). Referring to FIG. 9, the driving timing of the subpixel SP is as follows.

During a first driving period, the first transistor T1 among the first to fifth transistors T1 to T5 may be turned on, and the initialization voltage VINT may be applied to the first node N1. The driving transistor DRT may be turned on by the initialization voltage VINT applied to the first node N1.

Thereafter, during a second driving period, the second transistor T2 may be turned on, and the reference voltage VRE may be applied to the second node N2. In this case, the fifth transistor T5 may also be turned on.

Thereafter, during a third driving period, the third transistor T3 may be turned on, so that the pre-charge voltage VPRC may be applied to the third node N3.

Then, during a fourth driving period, one of then light emitting devices ED(1) to ED(n) may emit light. During the fourth driving period, the light emitting devices in an emission state among the n row lines RL(1) to RL(n) may be supplied with the first low-potential voltage VSS1, which is a low-potential voltage for display-on driving, and the light emitting devices in a non-emission state may be supplied with the second low-potential voltage VSS2, which is a low-potential voltage for display-off driving.

To this end, among then row lines RL(1) to RL(n), the row line on which display-on driving is performed may be supplied with the first low-potential voltage VSS1, and the remaining row lines on which display-off driving is performed may be supplied with the second low-potential voltage VSS2.

Therefore, among the display-on transistor and the display-off transistor connected to the row line where the display-on driving is performed, the display-on transistor may be in a turn-on state and the display-off transistor may be in a turn-off state.

Among the display-on transistor and the display-off transistor connected to the row line where the display-off driving is performed, the display-on transistor may be in a turn-off state and the display-off transistor may be in a turn-on state.

Thereafter, during a fifth driving period, the fourth transistor T4 may be turned on, so that the reset voltage VRST may be applied to the fourth node N4. Accordingly, the column line CL may be reset to the reset voltage VRST. In addition, all of the first electrodes Ecl(1) to Ecl(n) of the n light emitting devices ED(1) to ED(n) connected to the column line CL may be reset to the reset voltage VRST.

The first to fourth scan signals SC1 to SC4 and the first and second emission control signals EM1 and EM2 may be generated by the corresponding driver DRV or may be supplied to the corresponding driver DRV from a driving-related circuit such as a timing controller.

Referring to FIG. 9, each of the transistors DRT and T1 to T5 included in the column driver C-DRV may be an n-type transistor or a p-type transistor. Each of the transistors TR_ON(1) to TR_ON(n), TR_OFF(1) to TR_OFF(n) included in the row driver R-DRV may be an n-type transistor or a p-type transistor. The column driver C-DRV may further include at least one capacitor.

As described above, the column driver C-DRV and the row driver R-DRV may be included in the driver DRV.

In order for the plurality of drivers DRV included in the display device 100 according to the embodiments of the present disclosure to perform a driving operation, the plurality of drivers DRV are required to be supplied with power required for the driving operation. Accordingly, hereinafter, it will be described a power supply structure for supplying power required for the driving operation to the plurality of drivers DRV with reference to FIG. 10.

Figure 10:
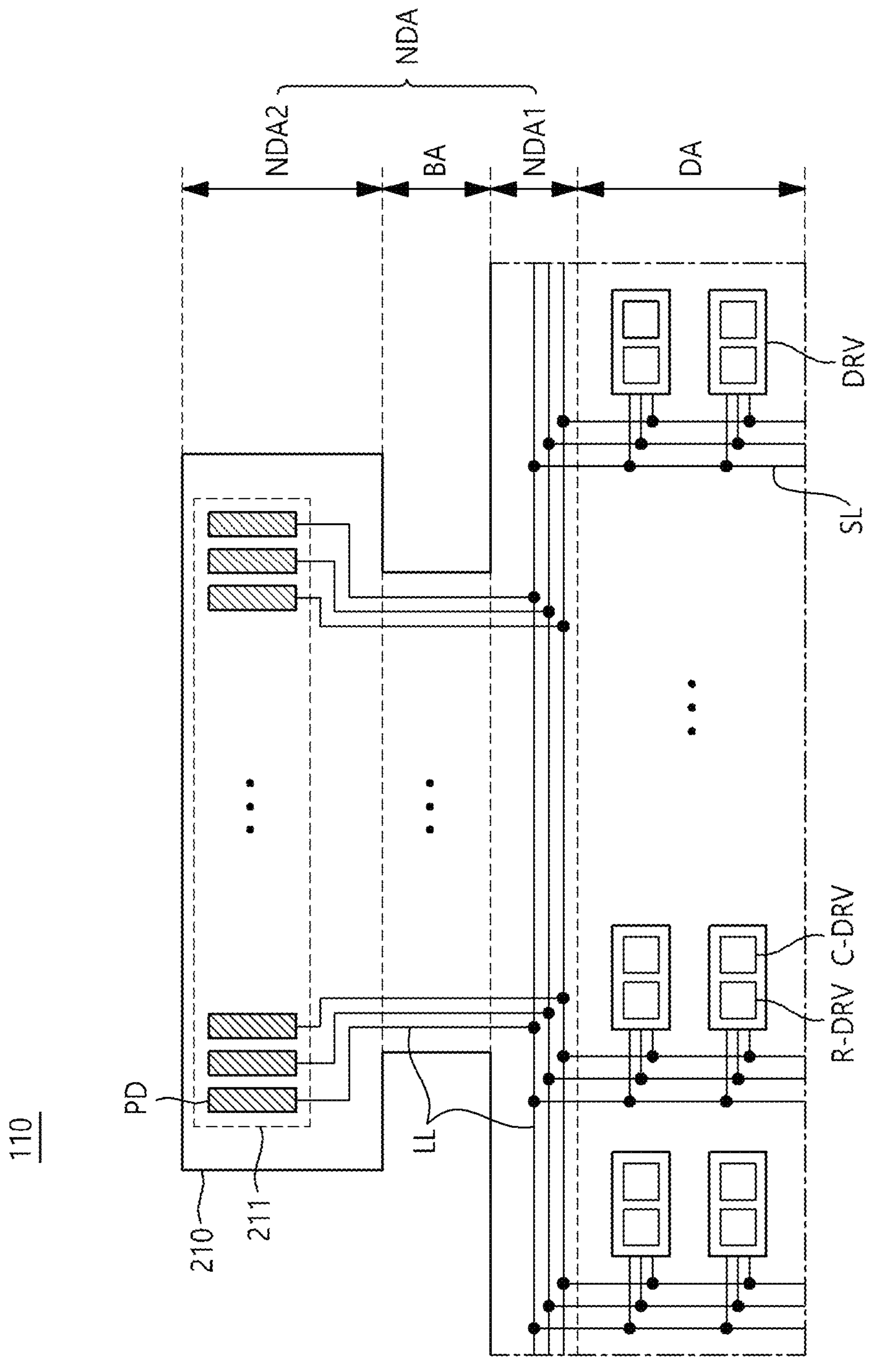
FIG. 10 is a plan view of a display panel according to exemplary embodiments of the present disclosure.

FIG. 10 is a plan view of the display panel 110 according to the embodiments of the present disclosure.

Referring to FIG. 10, the substrate 210 of the display panel 110 according to the embodiments of the present disclosure may include a display area DA and a non-display area NDA, and the non-display area NDA may include a first non-display area NDA1, a bending area BA, and a second non-display area NDA2. For example, the bending area BA can be disposed between the first non-display area NDA1 and the second non-display area NDA2. The bending area BA may be an area extending from at least one of a plurality of sides of the first non-display area NDA1 and may be a bendable area.

Referring to FIG. 10, a plurality of drivers DRV may be arranged in the display area DA. Each of the plurality of drivers DRV may be a circuit for driving light emitting devices of a plurality of subpixels included in a corresponding unit driving area (UDA of FIGS. 4 and 6). Each of the plurality of drivers DRV may include a row driver R-DRV for driving a plurality of row lines and a column driver C-DRV for driving a plurality of column lines, in order to drive a plurality of light emitting devices ED included in a corresponding unit driving area (UDA of FIGS. 4 and 6).

Referring to FIG. 10, a pad section 211 including a plurality of pads PD may be arranged in the second non-display area NDA2.

Referring to FIG. 10, a plurality of signal lines SL and a plurality of link lines LL for signal transmission between a plurality of drivers DRV arranged in the display area DA and the pad section 211 may be arranged on the substrate 210. The plurality of signal lines SL may be electrically connected between the plurality of link lines LL and the plurality of drivers DRV. The plurality of link lines LL may electrically connect the plurality of pads PD and the plurality of signal lines SL.

Referring to FIG. 10, the plurality of link lines LL may be arranged in the non-display area NDA, and all or part of each of the plurality of signal lines SL may be arranged in the display area DA.

Each of the plurality of drivers DRV may receive various signals to perform a driving operation through the plurality of link lines LL and the plurality of signal lines SL. Here, the various signals may include various power voltages and various signals required for the driving operation of each of the plurality of drivers DRV.

As the bending area BA is bent, a portion of the plurality of link lines LL may also be bent. Stress may be concentrated on a portion of the bent link line LL, and thus cracks may occur in the link line LL. Accordingly, the plurality of link lines LL may be formed of a conductive material having excellent ductility to reduce cracks when the bending area BA is bent. For example, the plurality of link lines LL may be formed of a conductive material having excellent ductility, such as gold (Au), silver (Ag), aluminum (Al), but the embodiments of the present disclosure are not limited thereto. In addition, the plurality of link lines LL may be composed of one of various conductive materials used in the display area DA. For example, the plurality of link lines LL may be composed of molybdenum (Mo), chromium (Cr), titanium (Ti), nickel (Ni), neodymium (Nd), copper (Cu), and an alloy of silver (Ag) and magnesium (Mg), or an alloy thereof, but the embodiments of the present disclosure are not limited thereto. The plurality of link lines LL may be composed of a multilayer structure including various conductive materials. For example, the plurality of link lines LL may be composed of a triple layer structure. For example, the plurality of link lines LL may be composed of a triple layer structure of titanium (Ti)/aluminum (Al)/titanium (Ti), but the embodiments of the present disclosure are not limited thereto.

The plurality of link lines LL may be composed of various shapes to reduce stress. At least a portion of the plurality of link lines LL arranged on the bending area BA may extend in the same direction as the extension direction of the bending area BA or may extend in a direction different from the extension direction of the bending area BA to reduce stress. For example, if the bending area BA extends in one direction from the first non-display area NDA1 toward the second non-display area NDA2, at least a portion of the link lines LL arranged on the bending area BA may extend in a direction oblique to the one direction. As another example, at least a portion of the plurality of link lines LL may be configured as patterns of various shapes. For example, at least a portion of the plurality of link lines LL arranged on the bending area BA may be a shape in which conductive patterns having at least one shape among a diamond shape, a rhombus shape, a trapezoidal wave shape, a triangular wave shape, a sawtooth wave shape, a sine wave shape, a circular shape, and an omega (Ω) shape are repeatedly arranged, but the embodiments of the present disclosure are not limited thereto. Therefore, in order to minimize the stress concentrated on the plurality of link lines LL and the resulting cracks, the shapes of the plurality of link lines LL may be formed in various shapes including the shapes described above, but the embodiments of the present disclosure are not limited thereto.

Figure 11:
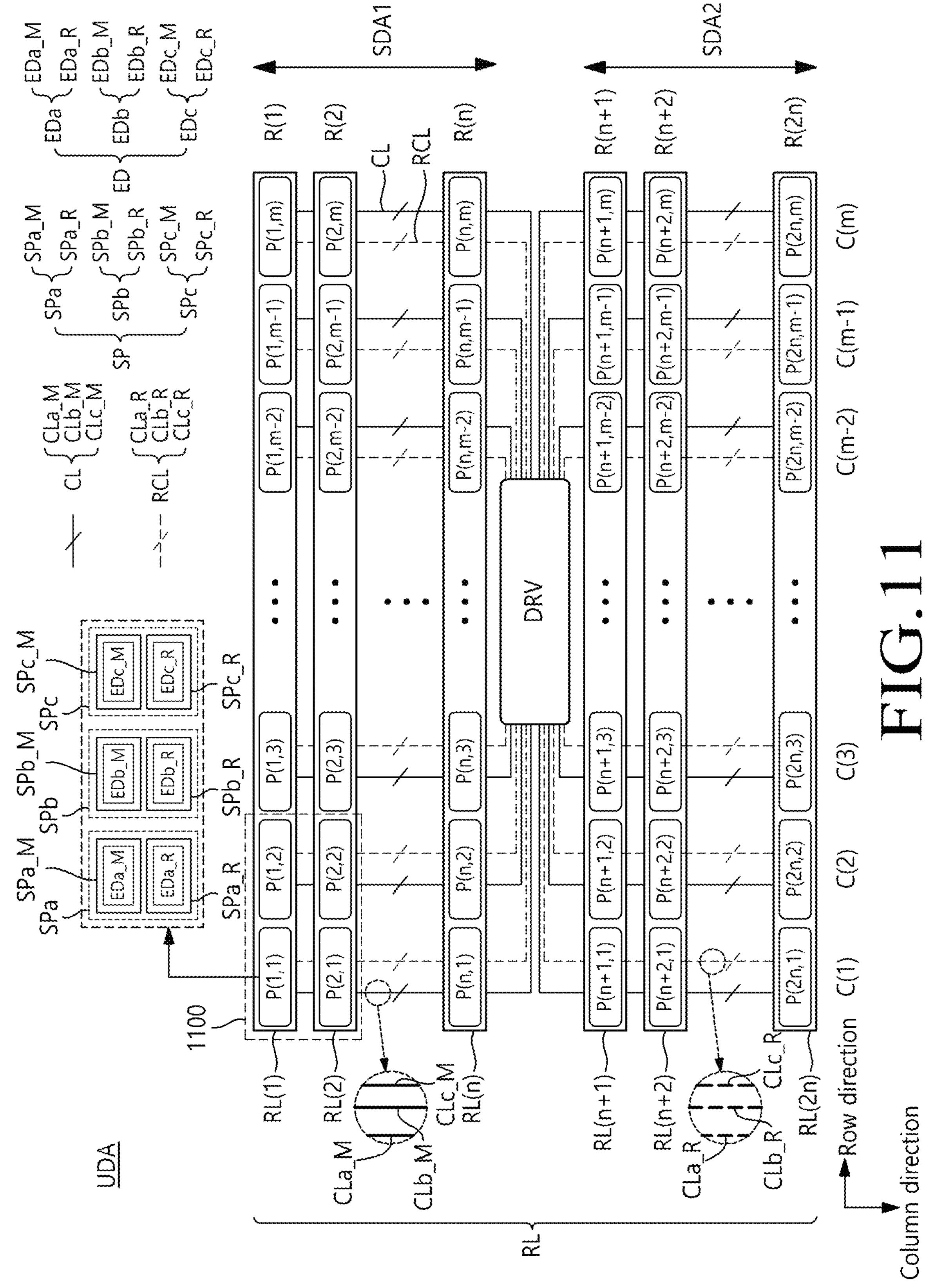
FIG. 11 illustrates a unit driving area of a display panel according to exemplary embodiments of the present disclosure.

FIG. 11 illustrates a unit driving area UDA of a display panel 110 according to exemplary embodiments of the present disclosure. In the following description, FIG. 3 and FIG. 4 are also referred to, and the same contents described with reference to FIG. 3 and FIG. 4 may be omitted.

Referring to FIG. 11, the display panel 110 according to exemplary embodiments of the present disclosure may include a plurality of pixels P, a plurality of row lines RL, and a plurality of column lines CL.

According to the example of FIG. 11, the plurality of pixels P may include pixels P(1, 1), . . . , P(1, m), P(2, 1), . . . , P(2, m), . . . , P(2*n*, 1), . . . , P(2*n, m*) of (2n×m) pixels arranged in the unit driving area UDA. The plurality of row lines RL may include 2n row lines RL(1) to RL(2*n*) arranged in the unit driving area UDA.

Referring to FIG. 11, the display panel 110 according to the embodiments of the present disclosure may include a redundancy structure.

Referring to FIG. 11, according to the redundancy structure, each of the plurality of pixels P may include k main subpixels and k redundancy subpixels. Each of the k main subpixels may include a main light emitting device, and each of the k redundancy subpixels may include a redundancy light emitting device. In other words, each of the plurality of pixels P may include k main light emitting devices and k redundancy light emitting devices. Referring to FIG. 11, each of the plurality of pixels P may include k main light emitting devices such as EDa_M, EDb_M and EDc_M and k redundancy light emitting devices such as EDa_R, EDb_R and EDc_R, without being limited thereto.

Referring to FIG. 11, each of the plurality of pixels P(1, 1), . . . , P(1, m), P(2, 1), . . . , P(2, m), . . . , P(2*n*, 1), . . . , P(2*n, m*) may include a plurality of subpixels, such as a first subpixel SPa, a second subpixel SPb, and a third subpixel SP.

The first subpixel SPa may include a first main subpixel SPa_M and a first redundancy subpixel SPa_R. The first main subpixel SPa_M may include a first main light emitting device EDa_M, and the first redundancy subpixel SPa_R may include a first redundancy light emitting device EDa_R.

The first subpixel SPa may include a first light emitting device EDa that emits a first color light, and the first light emitting device EDa may include a first main light emitting device EDa_M and a first redundancy light emitting device EDa_R.

The second subpixel SPb may include a second main subpixel SPb_M and a second redundancy subpixel SPb_R. The second main subpixel SPb_M may include a second main light emitting device EDb_M, and the second redundancy subpixel SPb_R may include a second redundancy light emitting device EDb_R.

The second subpixel SPb may include a second light emitting device EDb that emits second color light, and the second light emitting device EDb may include a second main light emitting device EDb_M and a second redundancy light emitting device EDb_R.

The third subpixel SPc may include a third main subpixel SPc_M and a third redundancy subpixel SPc_R. The third main subpixel SPc_M may include a third main light emitting device EDc_M, and the third redundancy subpixel SPc_R may include a third redundancy light emitting device EDc_R.

The third subpixel SPc may include a third light emitting device EDc that emits a third color light, and the third light emitting device EDc may include a third main light emitting device EDc_M and a third redundancy light emitting device EDc_R.

Referring to FIG. 11, the plurality of column lines CL may include a plurality of main column lines CLa_M, CLb_M and CLc_M and a plurality of redundancy column lines CLa_R, CLb_R and CLc_R.

In each of the plurality of columns (i.e., a plurality of pixel columns) included in each of the first sub-driving area SDA1 and the second sub-driving area SDA2, k main column lines CLa_M, CLb_M and CLc_M, and k redundancy column lines CLa_R, CLb_R and CLc_R may be arranged.

In each column (i.e., each pixel column), k main column lines CLa_M, CLb_M and CLc_M may be connected to the first electrodes Ecl of k main light emitting devices EDa_M, EDb_M and EDc_M.

In each column (i.e., each pixel column), k redundancy column lines CLa_R, CLb_R and CLc_R may be connected to the first electrodes Ecl of k redundancy light emitting devices EDa_R, EDb_R and EDc_R.

Hereinafter, in order to examine the planar structure of the display panel 110 according to the embodiments of the present disclosure in more detail, it will be described the planar structure of a portion 1100 of the planar view of FIG. 11 in more detail as an example.

Figure 12:
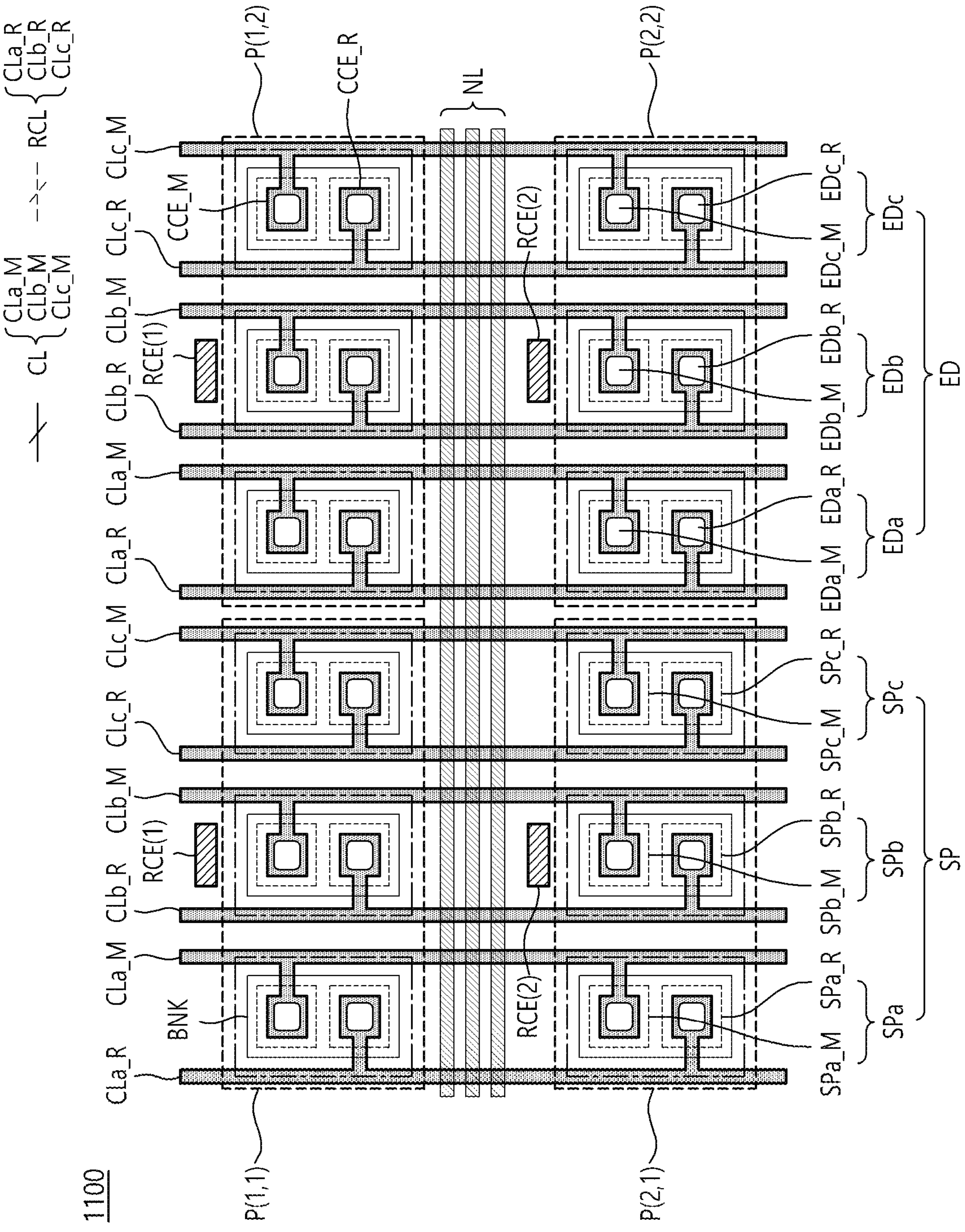
FIG. 12 and FIG. 13 are plan views of a portion of a display panel according to exemplary embodiments of the present disclosure.
Figure 13:
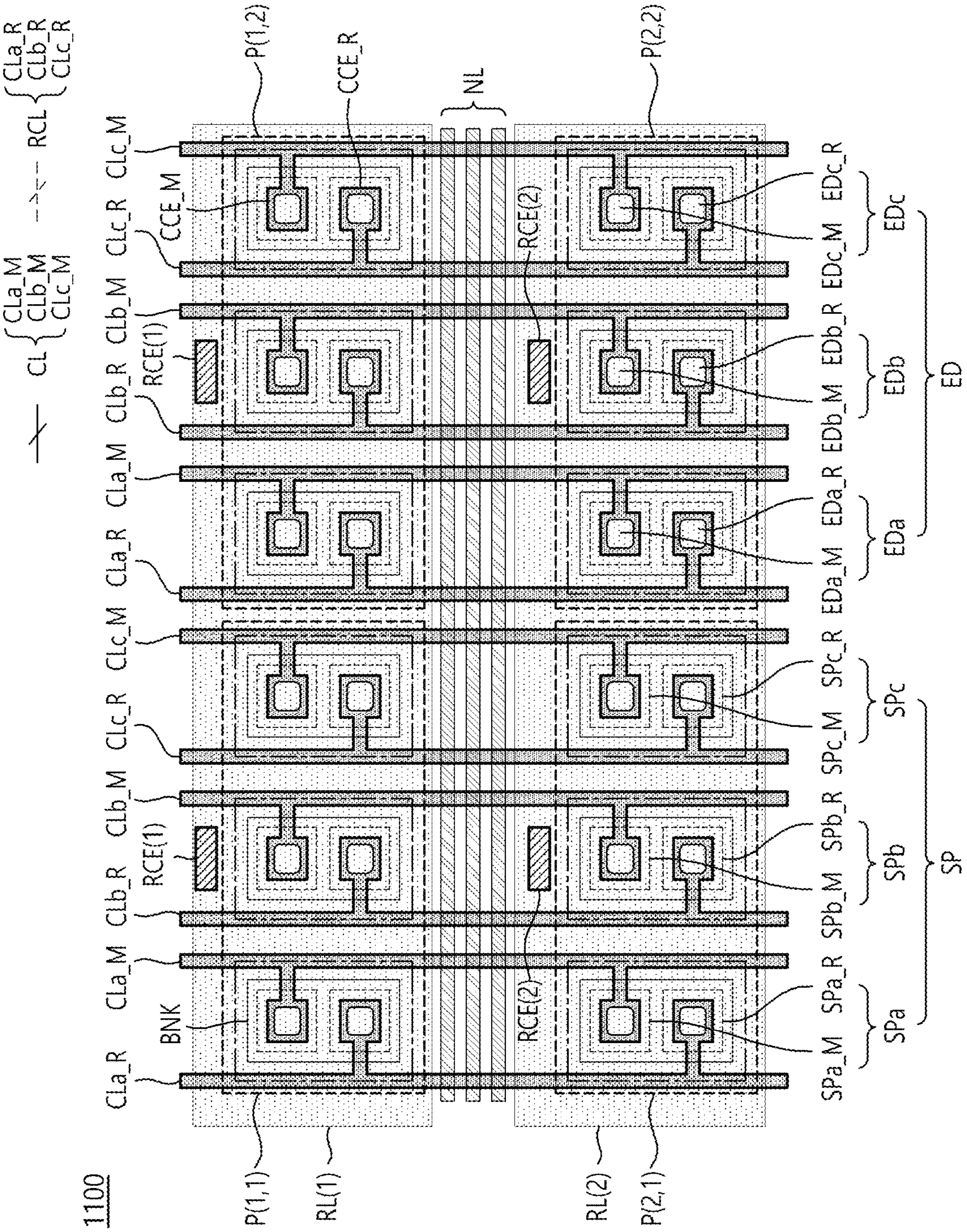

FIG. 12 and FIG. 13 are plan views of a portion 1100 of a display panel 110 according to exemplary embodiments of the present disclosure.

FIG. 12 and FIG. 13 are enlarged plan views of a portion 1100 of the plan view of FIG. 11 and are enlarged plan views of a two-row, two-column area 1100.

FIG. 12 is a plan view that does not represent two row lines RL(1) and RL(2) arranged in a two-row, two-column area 1100, and FIG. 13 is a plan view that adds two row lines RL(1) and RL(2) arranged in a two-row, two-column area 1100 to the plan view of FIG. 12.

Referring to FIG. 12 and FIG. 13, in the two-row, two-column area 1100, four pixels P(1,1), P(1,2), P(2,1), P(2,2) may be arranged in two rows and two columns. That is, in the two-row, two-column area 1100, two pixels P(1,1) and P(1,2) may be arranged in a first row (e.g., a first pixel row), and two pixels P(2,1) and P(2,2) may be arranged in a second row (e.g., a second pixel row). In addition, two pixels P(1,1) and P(2,1) may be arranged in a first column (e.g., a first pixel column), and two pixels P(1,2) and P(2,2) may be arranged in a second column (e.g., a second pixel column).

Referring to FIG. 12 and FIG. 13, in the two-row, two-column area 1100, each of the four pixels P(1,1), P(1,2), P(2,1) and P(2,2) arranged in two rows and two columns may include k subpixels. Here, k is the number of subpixels included in one pixel.

In FIG. 12 and FIG. 13, it is exemplified a case where k is 3 is as an example. Accordingly, in the two-row, two-column area 1100, each of the four pixels P(1,1), P(1,2), P(2,1) and P(2,2)) arranged in two rows and two columns may include three subpixels SPa, SPb and SPc, without being limited thereto. In the following description, it may be explained assuming the case where k is 3.

The three subpixels may include a first subpixel SPa including a first light emitting device EDa that emits a first color light, a second subpixel SPb including a second light emitting device EDb that emits a second color light, and a third subpixel SPc including a third light emitting device EDc that emits a third color light.

If the display panel 110 according to the embodiments of the present disclosure has a redundancy structure, the subpixel redundancy structure is as follows.

The first subpixel SPa may include a first main subpixel SPa_M including a first main light emitting device EDa_M and a first redundancy subpixel SPa_R including a first redundancy light emitting device EDa_R, the second subpixel SPb may include a second main subpixel SPb_M including a second main light emitting device EDb_M and a second redundancy subpixel SPb_R including a second redundancy light emitting device EDb_R, and the third subpixel SPc may include a third main subpixel SPc_M including a third main light emitting device EDc_M and a third redundancy subpixel SPc_R including a third redundancy light emitting device EDc_R.

If the display panel 110 according to the embodiments of the present disclosure has a redundancy structure, the light emitting device redundancy structure is as follows.

The first light emitting device EDa may include a first main light emitting device EDa_M that emits a first color light and a first redundancy light emitting device EDa_R that emits a first color light, the second light emitting device EDb may include a second main light emitting device EDb_M that emits a second color light and a second redundancy light emitting device EDb_R that emits a second color light, and the third light emitting device EDb may include a third main light emitting device EDc_M that emits a third color light and a third redundancy light emitting device EDc_R that emits a third color light.

Referring to FIG. 12 and FIG. 13, in the two-row, two-column area 1100, a first row line RL(1) and a second row line RL(2) may be arranged. The first row line RL(1) may be arranged in the first row (i.e., the first pixel row), and the second row line RL(2) may be arranged in the second row (i.e., the second pixel row).

The first row line RL(1) may correspond to two pixels P(1,1) and P(1,2) arranged in the first row (or the first pixel row), and may correspond to three subpixels SPa, SPb and SPc included in each of the two pixels P(1,1) and P(1,2) arranged in the first row (or the first pixel row).

At least a portion of the first row line RL(1) may overlap with three subpixels SPa, SPb and SPc included in each of the two pixels P(1,1) and P(1,2) arranged in the first row (or the first pixel row).

In terms of the subpixel redundancy structure, the first row line RL(1) may be connected to the first main subpixel SPa_M, the first redundancy subpixel SPa_R, the second main subpixel SPb_M, the second redundancy subpixel SPb_R, the third main subpixel SPc_M, and the third redundancy subpixel SPc_R arranged in the first row (or the first pixel row).

At least a portion of the first row line RL(1) may overlap with the first main subpixel SPa_M, the first redundancy subpixel SPa_R, the second main subpixel SPb_M, the second redundancy subpixel SPb_R, the third main subpixel SPc_M, and the third redundancy subpixel SPc_R arranged in the first row (or the first pixel row).

From the perspective of the light emitting device redundancy structure, the first row line RL(1) may be connected to the second electrode Erl of each of the first main light emitting device EDa_M, the first redundancy light emitting device EDa_R, the second main light emitting device EDb_M, the second redundancy light emitting device EDb_R, the third main light emitting device EDc_M, and the third redundancy light emitting device EDc_R arranged in the first row (or the first pixel row).

At least a part of the first row line RL(1) may overlap with the first main light emitting device EDa_M, the first redundancy light emitting device EDa_R, the second main light emitting device EDb_M, the second redundancy light emitting device EDb_R, the third main light emitting device EDc_M, and the third redundancy light emitting device EDc_R arranged in the first row (or the first pixel row).

The second row line RL(2) may correspond to two pixels P(2,1) and P(2,2) arranged in a second row (or the second pixel row), and may correspond to three subpixels SPa, SPb and SPc included in each of the two pixels P(2,1) and P(2,2) arranged in the second row (or the second pixel row).

At least a portion of the second row line RL(2) may overlap with three subpixels SPa, SPb and SPc included in each of the two pixels P(2,1) and P(2,2) arranged in the second row (or the second pixel row).

In terms of the subpixel redundancy structure, the second row line RL(2) may be connected to the first main subpixel SPa_M, the first redundancy subpixel SPa_R, the second main subpixel SPb_M, the second redundancy subpixel SPb_R, the third main subpixel SPc_M, and the third redundancy subpixel SPc_R arranged in the second row (or the second pixel row).

At least a portion of the second row line RL(2) may overlap with the first main subpixel SPa_M, the first redundancy subpixel SPa_R, the second main subpixel SPb_M, the second redundancy subpixel SPb_R, the third main subpixel SPc_M, and the third redundancy subpixel SPc_R arranged in the second row (or the second pixel row).

In terms of the light emitting device redundancy structure, the second row line RL(2) may be connected to the second electrode Erl of each of the first main light emitting device EDa_M, the first redundancy light emitting device EDa_R, the second main light emitting device EDb_M, the second redundancy light emitting device EDb_R, the third main light emitting device EDc_M, and the third redundancy light emitting device EDc_R arranged in the second row (or the second pixel row).

At least a portion of the second row line RL(2) may overlap with the first main light emitting device EDa_M, the first redundancy light emitting device EDa_R, the second main light emitting device EDb_M, the second redundancy light emitting device EDb_R, the third main light emitting device EDc_M, and the third redundancy light emitting device EDc_R arranged in the second row (or the second pixel row).

Referring to FIG. 12 and FIG. 13, a plurality of column lines CL may be arranged in the two-row two-column area 1100. A plurality of column lines CL arranged in a two-row two-column area 1100 may include a plurality of first column lines CL connected to two pixels P(1,1) and P(2,1) arranged in a first column (or a first pixel column), and a plurality of second column lines CL connected to two pixels P(1,2) and P(2,2) arranged in a second column (or a second pixel column).

Referring to FIGS. 12 and 13, from the perspective of subpixel redundancy, a plurality of first column lines CL arranged in a first column (or first pixel column) may include a first main column line CLa_M that is commonly connected to a first main subpixel SPa_M included in each of two pixels P(1,1) and P(2,1) arranged in the first column (or first pixel column), and a first redundancy column line CLa_R that is commonly connected to a first redundancy subpixel SPa_R included in each of two pixels P(1,1) and P(2,1) arranged in the first column (or first pixel column).

The first main subpixel SPa_M included in each of the two pixels P(1,1) and P(2,1) arranged in the first column (or the first pixel column) may include a first main light emitting device EDa_M, and the first redundancy subpixel SPa_R included in each of the two pixels P(1,1) and P(2,1) arranged in the first column (or the first pixel column) may include a first redundancy light emitting device (EDa_R).

The first main column line CLa_M arranged in the first column (or the first pixel column) may be commonly connected to the first electrodes Ecl of the two first main light emitting devices EDa_M arranged in the first column (or the first pixel column).

The first redundancy column line CLa_R arranged in the first column (or the first pixel column) may be commonly connected to the first electrodes Ecl of two first redundancy light emitting devices EDa_R arranged in the first column (or the first pixel column).

In addition, the plurality of first column lines CL arranged in the first column (or the first pixel column) may further include a second main column line CLb_M commonly connected to a second main subpixel SPb_M included in each of the two pixels P(1,1) and P(2,1) arranged in the first column (or the first pixel column), and a second redundancy column line CLb_R commonly connected to a second redundancy subpixel SPb_R included in each of the two pixels P(1,1) and P(2,1) arranged in the first column (or the first pixel column).

The second main subpixel SPb_M included in each of the two pixels P(1,1) and P(2,1) arranged in the first column (or the first pixel column) may include a second main light emitting device EDb_M, and the second redundancy subpixel SPb_R included in each of the two pixels P(1,1) and P(2,1) arranged in the first column (or the first pixel column) may include a second redundancy light emitting device EDb_R.

The second main column line CLb_M arranged in the first column (or the first pixel column) may be commonly connected to the first electrodes Ecl of the two second main light emitting devices EDb_M arranged in the first column (or the first pixel column).

The second redundancy column line CLb_R arranged in the first column (or the first pixel column) may be commonly connected to the first electrodes Ecl of the two second redundancy light emitting devices EDb_R arranged in the first column (or the first pixel column).

In addition, the plurality of first column lines CL arranged in the first column (or the first pixel column) may further include a third main column line CLc_M commonly connected to the third main subpixel SPc_M included in each of the two pixels P(1,1) and P(2,1) arranged in the first column (or the first pixel column), and a third redundancy column line CLc_R commonly connected to the third redundancy subpixel SPc_R included in each of the two pixels P(1,1) and P(2,1) arranged in the first column (or the first pixel column).

The third main subpixel SPc_M included in each of the two pixels P(1,1) and P(2,1) arranged in the first column (or the first pixel column) may include a third main light emitting device EDc_M, and the third redundancy subpixel SPc_R included in each of the two pixels P(1,1) and P(2,1) arranged in the first column (or the first pixel column) may include a third redundancy light emitting device EDc_R.

The third main column line CLc_M arranged in the first column (or the first pixel column) may be commonly connected to the first electrodes Ecl of the two third main light emitting devices EDc_M arranged in the first column (or the first pixel column).

At least a portion of the third main column line CLc_M arranged in the first column (or the first pixel column) may overlap with the first electrodes Ecl of the two third main light emitting devices EDc_M arranged in the first column (or the first pixel column).

The third redundancy column line CLc_R arranged in the first column (or the first pixel column) may be commonly connected to the first electrodes Ecl of two third redundancy light emitting devices EDc_R arranged in the first column (or the first pixel column).

At least a portion of the third redundancy column line CLc_R arranged in the first column (or the first pixel column) may overlap with the first electrodes Ecl of two third redundancy light emitting devices EDc_R arranged in the first column (or the first pixel column).

Referring to FIGS. 12 and 13, from the perspective of subpixel redundancy, a plurality of second column lines CL arranged in a second column (or second pixel column) may include a first main column line CLa_M that is commonly connected to a first main subpixel SPa_M included in each of two pixels P(1,2) and P(2,2) arranged in the second column (or second pixel column), and a first redundancy column line CLa_R that is commonly connected to a first redundancy subpixel SPa_R included in each of two pixels P(1,2) and P(2,2) arranged in the second column (or second pixel column).

The first main subpixel SPa_M included in each of the two pixels P(1,2) and P(2,2) arranged in the second column (or the second pixel column) may include a first main light emitting device EDa_M, and the first redundancy subpixel SPa_R included in each of the two pixels P(1,2) and P(2,2) arranged in the second column (or the second pixel column) may include a first redundancy light emitting device EDa_R.

The first main column line CLa_M arranged in the second column (or the second pixel column) may be commonly connected to the first electrodes Ecl of the two first main light emitting devices EDa_M arranged in the second column (or the second pixel column).

The first redundancy column line CLa_R arranged in the second column (or the second pixel column) may be commonly connected to the first electrodes Ecl of the two first redundancy light emitting devices EDa_R arranged in the second column (or the second pixel column).

In addition, the plurality of second column lines CL arranged in the second column (second pixel column) may further include a second main column line CLb_M commonly connected to a second main subpixel SPb_M included in each of two pixels P(1,2) and P(2,2) arranged in the second column (or second pixel column), and a second redundancy column line CLb_R commonly connected to a second redundancy subpixel SPb_R included in each of two pixels P(1,2) and P(2,2) arranged in the second column (or second pixel column).

The second main subpixel SPb_M included in each of the two pixels P(1,2) and P(2,2) arranged in the second column (or the second pixel column) may include a second main light emitting device EDb_M, and the second redundancy subpixel SPb_R included in each of the two pixels P(1,2)

and P(2,2) arranged in the second column (or the second pixel column) may include a second redundancy light emitting device EDb_R.

The second main column line CLb_M arranged in the second column (or the second pixel column) may be commonly connected to the first electrodes Ecl of the two second main light emitting devices EDb_M arranged in the second column (or the second pixel column).

The second redundancy column line CLb_R arranged in the second column (or the second pixel column) may be commonly connected to the first electrodes Ecl of two second redundancy light emitting devices EDb_R arranged in the second column (or the second pixel column).

In addition, the plurality of first column lines CL arranged in the second column (or the second pixel column) may further include a third main column line CLc_M commonly connected to a third main subpixel SPc_M included in each of two pixels P(1,2) and P(2,2) arranged in the second column (or the second pixel column), and a third redundancy column line CLc_R commonly connected to a third redundancy subpixel SPc_R included in each of two pixels P(1,2) and P(2,2) arranged in the second column (or the second pixel column).

The third main subpixel SPc_M included in each of the two pixels P(1,2) and P(2,2) arranged in the second column (or the second pixel column) may include a third main light emitting device EDc_M and the third redundancy subpixel SPc_R included in each of the two pixels P(1,2) and P(2,2) arranged in the second column (or the second pixel column) may include a third redundancy light emitting device EDc_R.

The third main column line CLc_M arranged in the second column (or the second pixel column) may be commonly connected to the first electrodes Ecl of the two third main light emitting devices EDc_M arranged in the second column (or the second pixel column).

At least a portion of the third main column line CLc_M arranged in the second column (or the second pixel column) may overlap with the first electrodes Ecl of the two third main light emitting devices EDc_M arranged in the second column (or the second pixel column).

The third redundancy column line CLc_R arranged in the second column (or the second pixel column) may be commonly connected to the first electrodes Ecl of two third redundancy light emitting devices EDc_R arranged in the second column (or the second pixel column).

At least a portion of the third redundancy column line CLc_R arranged in the second column (or the second pixel column) may overlap with the first electrodes Ecl of two third redundancy light emitting devices EDc_R arranged in the second column (or the second pixel column).

Referring to FIGS. 12 and 13, in each of the first column (or the first pixel column) and the second column (or the second pixel column), each of the plurality of column lines CL may include at least one column connection electrode having a shape protruding above a bank BNK. For example, the at least one column connection electrode may be an electrode electrically connected to each of the plurality of column lines CL or a portion protruding from each of the plurality of column lines C.

Referring to FIGS. 12 and 13, in each of the first column (or first pixel column) and the second column (or second pixel column), each of the first main column line CLa_M, the second main column line CLb_M, and the third main column line CLc_M may include a main column connection electrode CCE_M protruding above the bank BNK and extending above the bank BNK.

The first main light emitting devices EDa_M, the second main light emitting devices EDb_M, and the third main light emitting devices EDc_M may be arranged on the main column connection electrodes CCE_M arranged to extend above the bank BNK.

Referring to FIGS. 12 and 13, in each of the first column (or first pixel column) and the second column (or second pixel column), each of the first redundancy column line CLa_R, the second redundancy column line CLb_R, and the third redundancy column line CLc_R may include a redundancy column connection electrode CCE_R that protrudes toward the bank BNK and extends above the bank (BNK).

On the redundancy column connection electrodes CCE_R arranged to extend above the bank BNK, the first redundancy light emitting devices EDa_R, the second redundancy light emitting devices EDb_R, and the third redundancy light emitting devices EDc_R may be arranged.

The main column connection electrodes CCE_M and the redundancy column connection electrodes CCE_R arranged in the first column (or the first pixel column) may be disposed between the first main column line CLa_M and the first redundancy column line CLa_R.

The main column connection electrodes CCE_M and the redundancy column connection electrodes CCE_R arranged in the second column (or the second pixel column) may be disposed between the second main column line CLb_M and the second redundancy column line CLb_R.

The main column connection electrodes CCE_M and the redundancy column connection electrodes CCE_R arranged in the third column (or the third pixel column) may be disposed between the third main column line CLc_M and the third redundancy column line CLc_R.

The display panel 110 according to the embodiments of the present disclosure may further include at least one row connection electrode for electrically connecting each of the plurality of row lines RL to the driver DRV.

Referring to FIGS. 12 and 13, the display panel 110 according to the embodiments of the present disclosure may further include at least one first row connection electrode RCE(1) connected to a first row line RL(1) arranged in a first row (or a first pixel row), and at least one second row connection electrode RCE(2) connected to a second row line RL(2) arranged in a second row (or a second pixel row).

The first row line RL(1) may be vertically overlapped with at least one first row connection electrode RCE(1), and the second row line RL(2) may be vertically overlapped with at least one second row connection electrode RCE(2).

The first row line RL(1) may be electrically connected to the row driver R-DRV of the corresponding driver DRV through at least one first row connection electrode RCE(1). The second row line RL(2) may be electrically connected to the row driver R-DRV of the corresponding driver DRV through at least one second row connection electrode RCE (2).

According to embodiments of the present disclosure, a bank BNK may be arranged in each of a plurality of subpixels SP. The plurality of banks BNK may be structures on which a plurality of light emitting devices ED are mounted. When manufacturing a panel, in a transfer process for transferring a plurality of light emitting devices ED to a display device 100, a plurality of banks BNK can guide the positions of the plurality of light emitting devices ED. That is, when manufacturing a panel, a plurality of light emitting devices ED can be transferred onto a plurality of banks BNK in a transfer process of the plurality of light emitting devices ED. The plurality of banks BNK may be an organic insulating layer, a bank pattern, or a structure, but the embodiments of the present disclosure are not limited thereto.

The banks BNK of each of the plurality of subpixels SP may be arranged to be spaced apart from each other. The banks BNK of each of the plurality of subpixels SP may be configured to be separated from each other. Accordingly, the banks BNK of the first subpixel SPa, the second subpixel SPb, and the third subpixel SPc to which different types of light emitting devices ED are transferred can be easily identified.

The bank BNK of the first main subpixel SPa_M and the bank BNK of the first redundancy subpixel SPa_R may be connected to each other or may be formed spaced apart from each other or separately, without being limited thereto. For example, considering the design of the transfer process requirements, the bank BNK of the first main subpixel SPa_M and the bank BNK of the first redundancy subpixel SPa_R, in which light emitting devices EDa_M, EDa_R of the same type (for example, types that emit the same color light) are arranged, may be connected to each other, or may be formed spaced apart from each other or separately.

In addition, the bank BNK of the second main subpixel SPb_M and the bank BNK of the second redundancy subpixel SPb_R may be connected to each other or may be formed spaced apart from each other or separately, without being limited thereto. For example, considering the design of the transfer process requirements, the bank BNK of the second main subpixel SPb_M and the bank BNK of the second redundancy subpixel SPb_R, in which light emitting devices EDa_M, EDa_R of the same type (for example, types that emit the same color light) are arranged, may be connected to each other, or may be formed spaced apart from each other or separately.

The bank BNK of the third main subpixel SPc_M and the bank BNK of the third redundancy subpixel SPc_R may be connected to each other or may be formed to be spaced apart from each other or separated from each other, without being limited thereto. For example, considering the design of the transfer process requirements, the bank BNK of the third main subpixel SPc_M and the bank BNK of the third redundancy subpixel SPc_R, in which light emitting devices EDa_M, EDa_R of the same type (for example, types that emit the same color light) are arranged, may be connected to each other, or may be formed spaced apart from each other or separately.

The bank BNK of the first main subpixel SPa_M and the first redundancy subpixel SPa_R, the bank BNK of the second main subpixel SPb_M and the second redundancy subpixel SPb_R, and the bank BNK of the third main subpixel SPc_M and the third redundancy subpixel SPc_R may be formed in various ways, and the embodiments of the present disclosure are not limited thereto.

For example, the plurality of banks BNK may be formed of an organic insulating material. The plurality of banks BNK may be formed of a single layer or multiple layers of an organic insulating material. For example, the plurality of banks BNK may be composed of a photo resist, a polyimide (PI), or an acrylic material, but the embodiments of the present disclosure are not limited thereto.

The plurality of row lines RL may be formed of a transparent conductive material, but the embodiments of the present disclosure are not limited thereto. The plurality of row lines RL may be composed of a transparent conductive material so that light emitted from the light emitting devices ED may be directed upward through the row lines RL. For example, the plurality of row lines RL may be composed of a transparent conductive material such as indium tin oxide (ITO), indium zinc oxide (IZO), indium gallium zinc oxide (IGZO), and the like, but the embodiments of the present disclosure are not limited thereto.

The plurality of column lines CL may be made of a conductive material. For example, the plurality of column lines CL may be formed of a conductive material such as titanium (Ti), aluminum (Al), copper (Cu), molybdenum (Mo), nickel (Ni), chromium (Cr), indium tin oxide (ITO), indium zinc oxide (IZO), indium gallium zinc oxide (IGZO), but the embodiments of the present disclosure are not limited thereto. For another example, the plurality of column lines CL may have a multilayer structure of conductive materials. For example, the plurality of column lines CL may be made of a multilayer structure of titanium (Ti)/aluminum (Al)/titanium (Ti)/indium tin oxide (ITO), but the embodiments of the present disclosure are not limited thereto.

For example, if the light emitting device ED is a device manufactured through a semiconductor process, such as a micro LED, a plurality of light emitting devices ED may be formed on a wafer and the light emitting devices ED may be transferred to a substrate 210 of the display panel 110 to manufacture the display panel 110. In the process of transferring a plurality of light emitting devices ED having a microscopic size from the wafer to the substrate 210, various defects may occur. For example, a non-transfer defect may occur in which the light emitting device ED is not transferred in some subpixels SP, and a misalignment defect may occur in which the light emitting device ED is transferred out of its proper position due to an alignment error in other subpixels SP. In addition, the transfer process may proceed normally, but the transferred light emitting device ED itself may have a defect. Therefore, considering the defects (including non-transfer defects) that occur during the transfer process of the light emitting devices EDs, the main light emitting device and the redundancy light emitting device, which are light emitting devices of the same type (e.g., light emitting devices that emit light of the same color), can be transferred to one subpixel SP. A lighting test may be performed on the main light emitting device and the redundancy light emitting device of the same type, and it is possible to utilize only one of the main light emitting device and the redundancy light emitting device that is finally determined to be normal.

For example, the first main light emitting device EDa_M and the first redundancy light emitting device EDa_R may be transferred together to one first subpixel SPa, and the first main light emitting device EDa_M and the first redundancy light emitting device EDa_R may be inspected for defects. If, as a result of the inspection, both the first main light emitting device EDa_M and the first redundancy light emitting device EDa_R are determined to be normal, only the first main light emitting device EDa_M can be used, and the first redundancy light emitting device EDa_R may be not used, without being limited thereto. As another example, if, as a result of the inspection, both the first main light emitting device EDa_M and the first redundancy light emitting device EDa_R are determined to be normal, only the first redundancy light emitting device EDa_R can be used, and the first main light emitting device EDa_M may be not used. In other words, if, as a result of the inspection, both the first main light emitting device EDa_M and the first redundancy light emitting device EDa_R are determined to be normal, any one of the first redundancy light emitting device EDa_R and the first main light emitting device EDa_M can be used, and the other may be not used.

If, as a result of the inspection, the first redundancy light emitting device EDa_R among the first main light emitting device EDa_M and the first redundancy light emitting device EDa_R is normal, the first main light emitting device EDa_M is not used, and the first redundancy light emitting device EDa_R can be used. Accordingly, even if the same first main light emitting device EDa_M and the first redundancy light emitting device EDa_R are transferred to one first subpixel SPa, only one of the first main light emitting device EDa_M and the first redundancy light emitting device EDa_R can be used finally.

Accordingly, among the main light emitting device and the redundancy light emitting device arranged in one subpixel SP, the redundancy light emitting device may be a spare light emitting device transferred in preparation for a failure of the main light emitting device. In the event of a failure of the main light emitting device, the redundancy light emitting device can be used as a replacement. Therefore, by transferring the main light emitting device and the redundancy light emitting device together to one subpixel SP, it is possible to minimize or at least reduce the deterioration of display quality due to a defect in one of the main light emitting device and the redundancy light emitting device.

In the embodiments of the present disclosure, the first main subpixel SPa_M and the first redundancy subpixel SPa_R may also be referred to as a 1-1 subpixel and a 1-2 subpixel, respectively, the second main subpixel SPb_M and the second redundancy subpixel SPb_R may also be referred to as a 2-1 subpixel and a 2-2 subpixel, and the third main subpixel SPc_M and the third redundancy subpixel SPc_R may also be referred to as a 3-1 subpixel and a 3-2 subpixel, respectively.

In the embodiments of the present disclosure, the first main light emitting device EDa_M and the first redundancy light emitting device EDa_R may also be referred to as a 1-1 light emitting device and a 1-2 light emitting device, the second main light emitting device EDb_M and the second redundancy light emitting device EDb_R may also be referred to as a 2-1 light emitting device and a 2-2 light emitting device, and the third main light emitting device EDc_M and the third redundancy light emitting device EDc_R may also be referred to as a 3-1 light emitting device and a 3-2 light emitting device.

Referring to FIG. 12 and FIG. 13, the display panel 110 according to the embodiments of the present disclosure may further include a plurality of communication lines NL. The plurality of communication lines NL may be arranged so as not to overlap with the metal layer in a vertical direction. For example, a plurality of communication lines NL may be arranged between a first row line RL(1) and a second row line RL(2).

For example, the plurality of communication lines NL may be wires for short-range communication such as NFC (Near Field Communication) and Bluetooth. The plurality of communication lines NL may serve as signal transmission wires and/or antennas, but the embodiments of the present disclosure are not limited thereto.

Referring to FIG. 13, the first row line RL(1) may be arranged above a plurality of light emitting devices arranged in the first row (or the first pixel row) and may be arranged in a shape overlapping with all of the plurality of light emitting devices arranged in the first row (or the first pixel row). For example, the first row line RL(1) may be arranged in a bar shape overlapping with all of the plurality of light emitting devices arranged in the first row (or the first pixel row), without being limited thereto.

The second row line RL(2) may be arranged above the plurality of light emitting devices arranged in the second row (or the second pixel row) and may be arranged in a shape overlapping with all of the plurality of light emitting devices arranged in the second row (or the second pixel row). For example, the second row line RL(2) may be arranged in a bar shape overlapping with all of the plurality of light emitting devices arranged in the second row (or the second pixel row), without being limited thereto.

Figure 14:
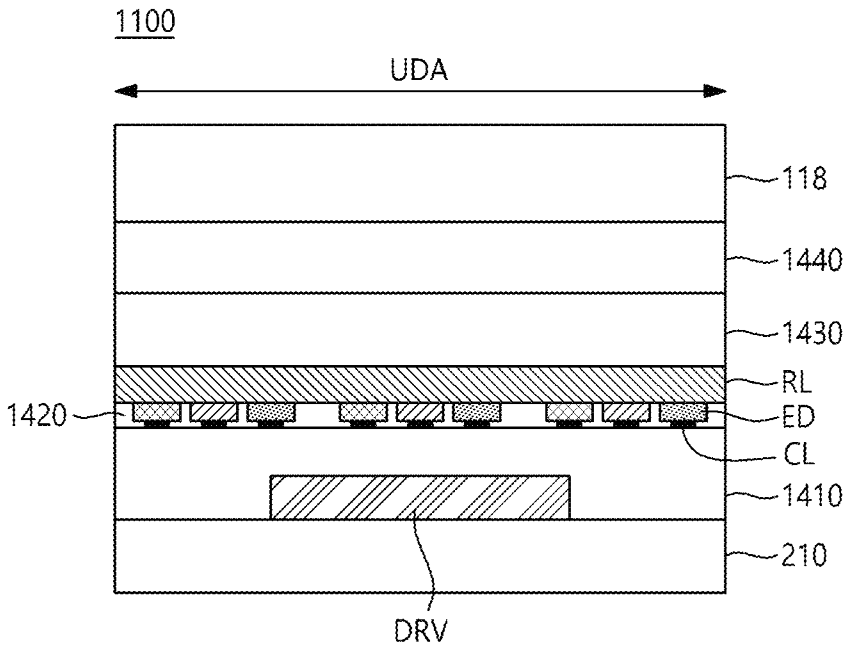
FIG. 14 is a cross-sectional view of a display panel according to exemplary embodiments of the present disclosure.

FIG. 14 is a cross-sectional view of a display panel 110 according to exemplary embodiments of the present disclosure. However, FIG. 14 is a cross-sectional view of a portion of a unit driving area UDA in which one driver DRV is arranged.

Referring to FIG. 14, a display panel 110 according to exemplary embodiments of the present disclosure may include a substrate 210, a driver DRV on the substrate 210, a layer stack 1410 on the driver DRV, a plurality of light emitting devices ED disposed on the layer stack 1410, an optical layer 1420 disposed on the layer stack 1410 and between the plurality of light emitting devices ED, an overcoat layer 1430 disposed on the plurality of light emitting devices ED and the optical layer 1420, an adhesive layer 1440 disposed on the overcoat layer 1430, and a cover member 118 disposed on the adhesive layer 1440, without being limited thereto. As one example, the overcoat layer 1430 can be omitted. In this way, the adhesive layer 1440 may be disposed on the plurality of light emitting devices ED and the optical layer 1420.

Referring to FIG. 14, a plurality of column lines CL may be arranged on a layer stack 1410. Each of the plurality of column lines CL may be arranged between the layer stack 1410 and a light emitting device ED. A plurality of row lines RL may be arranged on a plurality of light emitting devices ED and an optical layer 1420.

A display panel 110 according to exemplary embodiments of the present disclosure may include a substrate 210 including a display area DA, a plurality of light emitting devices ED arranged in the display area DA, a plurality of column lines CL electrically connected to first electrodes Ecl of each of the plurality of light emitting devices ED, a plurality of row lines RL electrically connected to second electrodes Erl of each of the plurality of light emitting devices ED, and a plurality of drivers DRV configured to drive the plurality of light emitting devices ED, the plurality of column lines CL, and the plurality of row lines RL. For example, the driver DRV may be connected to the plurality of column lines CL, and the plurality of row lines RL.

A plurality of drivers DRV may be arranged in the display area DA, and may be positioned closer to the substrate 210 than the plurality of light emitting devices ED. For example, the plurality of drivers DRV may be arranged on the substrate 210 in the display area DA, without being limited thereto.

The layer stack 1410 may include a plurality of insulating layers. The plurality of insulating layers may include a plurality of organic layers. At least one of the plurality of organic layers may be arranged on a side of the driver DRV. For example, two or more organic layers may be arranged on a side of the driver DRV.

The layer stack 1410 may further include at least one metal layer connecting the driver DRV and the column line CL, and at least one metal layer connecting the driver DRV and the row line RL.

Figure 15:
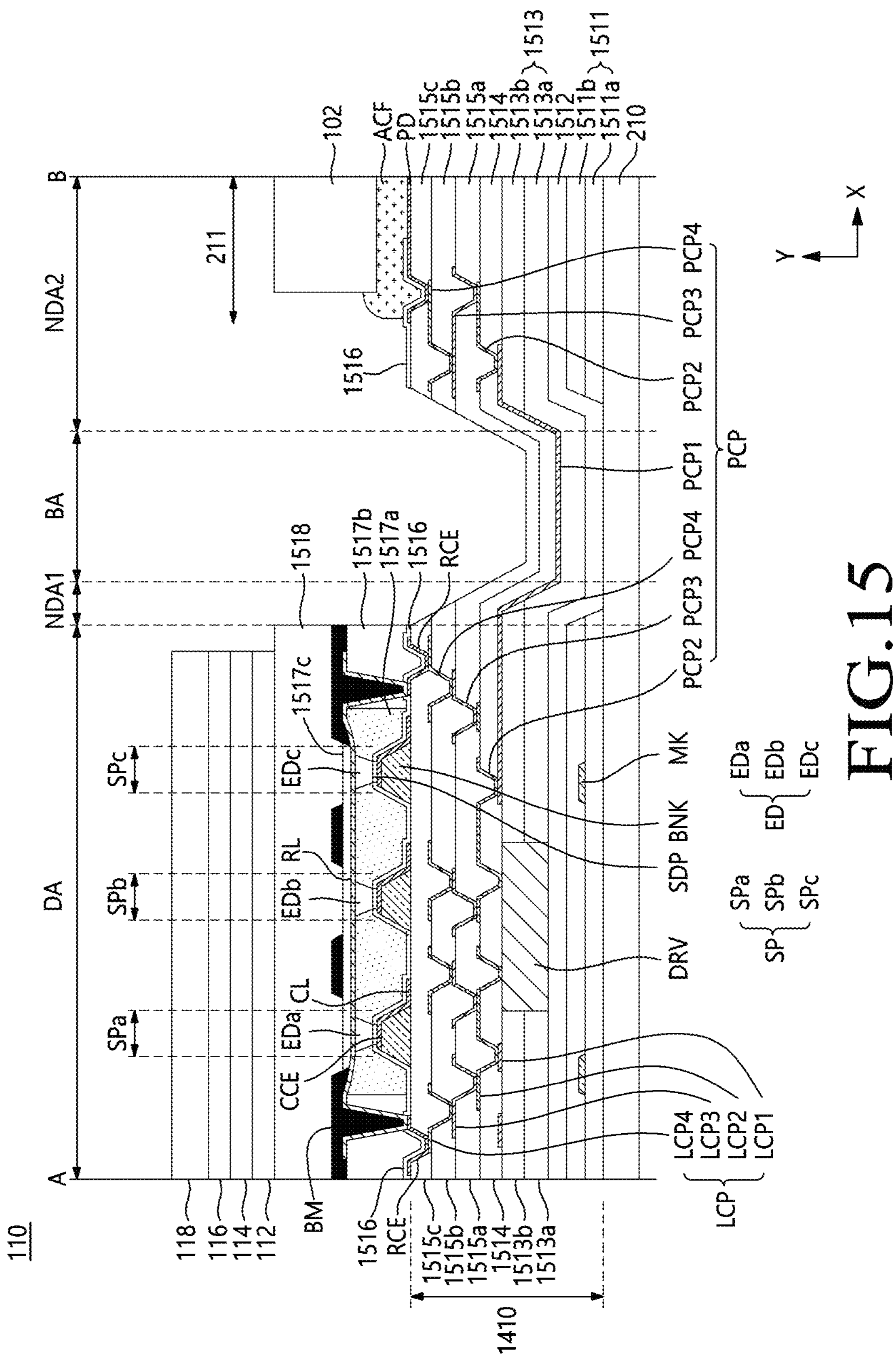
FIG. 15 is a detailed cross-sectional view of a display panel taken along the A-B cutting line of FIG. 10 according to exemplary embodiments of the present disclosure.
Figure 16:
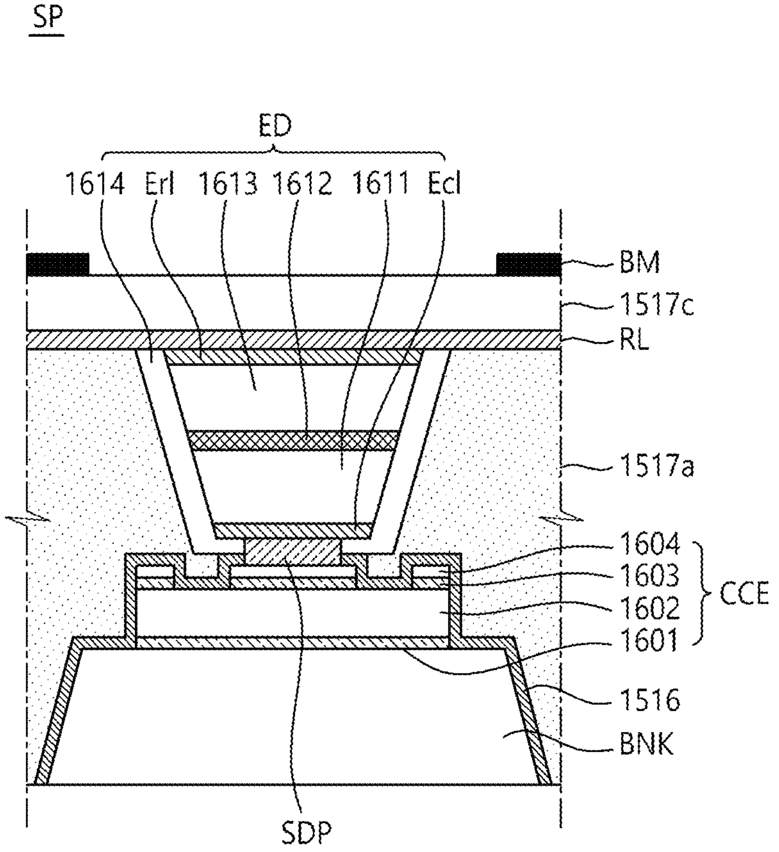
FIG. 16 is an enlarged cross-sectional view of a first subpixel of a display panel according to exemplary embodiments of the present disclosure.

FIG. 15 is a detailed cross-sectional view of a display panel 110 taken along the A-B cutting line of FIG. 10 according to exemplary embodiments of the present disclosure, and FIG. 16 is an enlarged cross-sectional view of a subpixel SP of a display panel 110 according to exemplary embodiments of the present disclosure. However, FIG. 15 is a cross-sectional view of a display area DA, a first non-display area NDA1, a bending area BA, and a second non-display area NDA2.

Meanwhile, for convenience of illustration, the A-B cutting line in FIG. 10 is illustrated as not overlapping with a signal line SL and a link line LL, but the A-B cutting line in FIG. 10 is intended to indicate the same position as the adjacent signal line SL and the link line LL.

Referring to FIG. 15, a buffer layer 1511 may be included on the substrate 210. The buffer layer 1511 may include a first buffer layer 1511*a* and a second buffer layer 1511*b*. The first buffer layer 1511*a* and the second buffer layer 1511*b* may be arranged in the display area DA, the first non-display area NDA1, and the second non-display area NDA2, and may not be arranged in the entirety or part of the bending area BA. However, the present disclosure is not limited thereto.

The first buffer layer 1511*a* and the second buffer layer 1511*b* may reduce the penetration of moisture or impurities through the substrate 210. The first buffer layer 1511*a* and the second buffer layer 1511*b* may be made of an inorganic insulating material. For example, the first buffer layer 1511*a* and the second buffer layer 1511*b* may be composed of a single layer or multiple layers of silicon oxide (SiOx) or silicon nitride (SiNx), but the embodiments of the present disclosure are not limited thereto.

For example, a portion of the first buffer layer 1511*a* and the second buffer layer 1511*b* on the bending area BA may be removed. The upper surface of the substrate 210 located on the bending area BA may be exposed by the area (e.g., opening) where the first buffer layer 1511*a* and the second buffer layer 1511*b* are removed.

By removing the first buffer layer 1511*a* and the second buffer layer 1511*b* from the bending area BA, it is possible to minimize an occurrence of cracks in the first buffer layer 1511*a* and the second buffer layer 1511*b* that may occur during bending.

A plurality of alignment keys MK may be arranged between the first buffer layer 1511*a* and the second buffer layer 1511*b*. The plurality of alignment keys MK may be configured to identify the position of the driver DRV during the manufacturing process of the display panel 110. For example, the plurality of alignment keys MK may be configured to align the position of the driver DRV transferred on the adhesive layer 1512. In another example, the plurality of alignment keys MK may be omitted.

An adhesive layer 1512 may be disposed on the second buffer layer 1511*b*. The adhesive layer 1512 may be disposed in the display area DA, the first non-display area NDA1, the bending area BA, and the second non-display area NDA2. For example, the adhesive layer 1512 may be disposed on the second buffer layer 1511*b* in the display area DA, the first non-display area NDA1, and the second non-display area NDA2, and on the substrate 210 in the bending area BA, without being limited thereto. For another example, at least a portion of the adhesive layer 1512 may be removed in the non-display area NDA including the bending area BA. For example, the adhesive layer 1512 may be made of any one of an adhesive polymer, an epoxy resin, a UV-curable resin, a polyimide series, an acrylate series, a urethane series, and a polydimethylsiloxane (PDMS), but the embodiments of the present disclosure are not limited thereto.

A driver DRV may be disposed on the adhesive layer 1512 in the display area DA. If the driver DRV is implemented as a driving chip (e.g., driver integrated circuit), the driving driver may be mounted on the adhesive layer 1512 by a transfer process, but the embodiments of the present disclosure are not limited thereto.

The display panel 110 may further include aside protection layer 1513 disposed on the side of the plurality of drivers DRV, and an upper protection layer 1514 disposed on the plurality of drivers DRV and the side protection layer 1513. For example, the side protection layer 1513 may include at least one of a first protection layer 1513*a* and a second protection layer 1513*b* disposed on the side of the plurality of drivers DRV, and in some cases, may further include at least one additional protection layer. The first protection layer 1513*a* and the second protection layer 1513*b* may be disposed on the adhesive layer 1512. The first protection layer 1513*a* and the second protection layer 1513*b* may be arranged to surround the side surface of the driver DRV, but the embodiments of the present disclosure are not limited thereto. For example, the second protection layer 1513*b* may be arranged to cover at least a portion of the upper surface of the driver DRV. For example, at least one of the first protection layer 1513*a* and the second protection layer 1513*b* arranged on the bending area BA may be omitted. For example, the first protection layer 1513*a* may be arranged entirely on the display area DA and the non-display area NDA, and the second protection layer 1513*b* may be partially arranged on the display area DA, the first non-display area NDA1, and the second non-display area NDA2. For example, at least a portion of the second protection layer 1513*b* may be removed in all or part of the bending area BA. However, the embodiments of the present disclosure are not limited thereto.

For example, the side protection layer 1513 including at least one of the first protection layer 1513*a* and the second protection layer 1513*b* may be composed of an organic insulating material (i.e., organic layer), but the embodiments of the present disclosure are not limited thereto. For example, the first protection layer 1513*a* and the second protection layer 1513*b* may be composed of a photo resist, a polyimide (PI), or a photo acryl-based material, but the embodiments of the present disclosure are not limited thereto. For example, the first protection layer 1513*a* and the second protection layer 1513*b* may be an overcoating layer or an insulating layer, but the embodiments of the present disclosure are not limited thereto.

According to embodiments of the present disclosure, in the display area DA, a plurality of line connection patterns LCP may be arranged on the second protection layer 1513*b*. The plurality of line connection patterns LCP may be wiring for electrically connecting the driver DRV to other components. For example, the driver DRV may be electrically connected to a plurality of column lines CL, a plurality of row lines RL, and a plurality of row connection electrodes RCE through the plurality of line connection patterns LCP.

For example, the plurality of line connection patterns LCP may include a first line connection pattern LCP1, a second line connection pattern LCP2, a third line connection pattern LCP3, and a fourth line connection pattern LCP4, but the embodiments of the present disclosure are not limited thereto. For example, the first line connection pattern LCP1, the second line connection pattern LCP2, the third line connection pattern LCP3, and the fourth line connection pattern LCP4 may be arranged in different metal layers.

For example, a plurality of first line connection patterns LCP1 may be arranged on the second protection layer

1513*b*. The plurality of first line connection patterns LCP1 may be electrically connected to the driver DRV. The plurality of first line connection patterns LCP1 may transmit the voltage output from the driver DRV to the column line CL or the row line RL.

The display panel 110 may further include aside protection layer 1513 including at least one of the first protection layer 1513*a* and the second protection layer 1513*b*, and an upper protection layer 1514 arranged on the plurality of drivers DRV. For example, the upper protection layer 1514 may include a third protection layer 1514, and in some cases, may further include at least one additional protection layer. The third protection layer 1514 may be disposed on the second protection layer 1513*b* and the plurality of first line connection patterns LCP1. The third protection layer 1514 may be disposed entirely in the display area DA and the non-display area NDA. In the bending area BA, the third protection layer 1514 may cover or enclose the side surface of the second protection layer 1513*b* and the upper surface of the first protection layer 1513*a*.

For example, the third protection layer 1514 may be composed of an organic insulating material. For example, the third protection layer 1514 may be composed of a photo resist, a polyimide (PI), or a photo acryl-based material, but the embodiments of the present disclosure are not limited thereto. For example, the first protection layer 1513*a*, the second protection layer 1513*b*, and the third protection layer 1514 may be composed of the same insulating material, or at least one of the first protection layer 1513*a*, the second protection layer 1513*b*, and the third protection layer 1514 may be composed of a different insulating material from the rest. However, the embodiments of the present disclosure are not limited thereto.

A plurality of second line connection patterns LCP2 may be arranged on the third protection layer 1514. The plurality of second line connection patterns LCP2 may be electrically connected or directly connected to the driver DRV. For example, some of the second line connection patterns LCP2 may be directly or indirectly connected to the driver DRV through contact holes of the third protection layer 1514. Other parts of the second line connection patterns LCP2 may be electrically connected to the first line connection pattern LCP1 through contact holes of the third protection layer 1514. However, the embodiments of the present disclosure are not limited thereto. The voltage output from the driver DRV may be transmitted to the column line CL or the row line RL through the plurality of second line connection patterns LCP2 and other connection patterns.

A first insulating layer 1515*a* may be disposed on the plurality of second line connection patterns LCP2. The first insulating layer 1515*a* may be disposed entirely over the display area DA and the non-display area NDA, but the embodiments of the present disclosure are not limited thereto. The first insulating layer 1515*a* may be composed of an organic insulating material, but the embodiments of the present disclosure are not limited thereto. For example, the first insulating layer 1515*a* may be composed of a photo resist, a polyimide (PI), or a photo acryl-based material, but the embodiments of the present disclosure are not limited thereto.

A plurality of third line connection patterns LCP3 may be disposed on the first insulating layer 1515*a*. The plurality of third line connection patterns LCP3 may be electrically connected to the plurality of second line connection patterns LCP2. For example, the third line connection pattern LCP3 may be electrically connected to the second line connection pattern LCP2 through a contact hole of the first insulating layer 1515*a*.

A second insulating layer 1515*b* may be disposed on a plurality of third line connection patterns LCP3. The second insulating layer 1515*b* may be disposed in the display area DA, the first non-display area NDA1, and the second non-display area NDA2, and may not be disposed in the entirety or part of the bending area BA, but the embodiments of the present disclosure are not limited thereto. For example, the second insulating layer 1515*b* may be removed from the entirety or part of the bending area BA. The second insulating layer 1515*b* may be composed of an organic insulating material, but the embodiments of the present disclosure are not limited thereto. For example, the second insulating layer 1515*b* may be composed of a photo resist, a polyimide (PI), or a photo acryl-based material, but the embodiments of the present disclosure are not limited thereto.

A plurality of fourth line connection patterns LCP4 may be arranged on the second insulating layer 1515*b*. The plurality of fourth line connection patterns LCP4 may be electrically connected to a plurality of third line connection patterns LCP3. For example, the fourth line connection patterns LCP4 may be electrically connected to the third line connection patterns LCP3 through a contact hole of the second insulating layer 1515*b*.

Referring to FIG. 15, according to the embodiments of the present disclosure, in the non-display area NDA, a plurality of pad connection patterns PCP may be arranged on the second protection layer 1513*b*. A plurality of pad connection patterns PCPs may be wiring for transmitting a signal transmitted from a flexible printed circuit 102 to a pad section 211 to a driver DRV of a display area DA. For example, a plurality of pad connection patterns PCP may be electrically connected to a plurality of pads PDs and may receive signals from the flexible printed circuit 102 through the plurality of pads PDs. The flexible printed circuit 102 may be connected to a printed circuit board 104 (see FIGS. 1 and 2).

For example, a plurality of pad connection patterns PCP may extend from the pad section 211 toward the display area DA and transmit signals to the wiring of the display area DA. In this case, a plurality of pad connection patterns PCP may function as link wiring LL (see FIG. 10). The plurality of pad connection patterns PCP may include a first pad connection pattern PCP1, a second pad connection pattern PCP2, a third pad connection pattern PCP3, and a fourth pad connection pattern PCP4.

The plurality of first pad connection patterns PCP1 may be arranged on the second protection layer 1513*b*. For example, at least a portion of the second protection layer 1513*b* may be removed in all or part of the bending area BA. For example, the plurality of first pad connection patterns PCP1 may be arranged on the second protection layer 1513*b* in display area DA, the first non-display area NDA1, and the second non-display area NDA2, and the plurality of first pad connection patterns PCP1 may be arranged on the first protection layer 1513*a* in the bending area B, without being limited thereto. Each of the plurality of first pad connection patterns PCP1 may be arranged across the second non-display area NDA2, the bending area BA, and the first non-display area NDA1. Each of the plurality of first pad connection patterns PCP1 may include a first portion arranged in the bending area BA, a second portion extending from the first portion to the first non-display area NDA1, and a third portion extending from the first portion to the second non-display area NDA2. Each of the plurality of first pad connection patterns PCP1 may extend from the first non-display area NDA1 to a portion of the display area DA. The plurality of first pad connection patterns PCP1 may transmit a signal transmitted from the flexible printed circuit 102 to the pad portion 211 to the driver DRV of the display area DA.

Each of the plurality of first pad connection patterns PCP1 may be electrically connected to the pad PD of the pad section 211 through connection patterns arranged in the second non-display area NDA2. Here, the connection patterns electrically connecting each of the plurality of first pad connection patterns PCP1 to the pad PD may include at least one of the second pad connection pattern PCP2, the third pad connection pattern PCP3, and the fourth pad connection pattern PCP4 arranged in the second non-display area NDA2.

Each of the plurality of first pad connection patterns PCP1 may be electrically connected to the driver DRV through connection patterns arranged in the display area DA. Here, the connection patterns electrically connecting each of the plurality of first pad connection patterns PCP1 to the driver DRV may include at least one of the second pad connection pattern PCP2, the third pad connection pattern PCP3, and the fourth pad connection pattern PCP4 arranged in the display area DA.

The plurality of second pad connection patterns PCP2 may be arranged on the third protection layer 1514. The plurality of second pad connection patterns PCP2 may be arranged in the second non-display area NDA2. The second pad connection pattern PCP2 may be electrically connected to the first pad connection pattern PCP1 through a contact hole of the third protection layer 1514. Therefore, the signal supplied from the flexible printed circuit 102 can be transmitted to the first pad connection pattern PCP1 through the second pad connection pattern PCP.

The third pad connection pattern PCP3 may be arranged on the first insulating layer 1515*a*. The third pad connection pattern PCP3 may be arranged in the second non-display area NDA2. The third pad connection pattern PCP3 may be electrically connected to the second pad connection pattern PCP2 through a contact hole of the first insulating layer 1515*a*. Therefore, the signal supplied from the flexible printed circuit 102 can be transmitted to the second pad connection pattern PCP2 through the third pad connection pattern PCP3, and the signal transmitted to the second pad connection pattern PCP2 can be transmitted again to the first pad connection pattern PCP1.

The fourth pad connection pattern PCP4 may be arranged on the second insulating layer 1515*b*. The fourth pad connection pattern PCP4) may be arranged in the second non-display area NDA2. The fourth pad connection pattern PCP4 may be electrically connected to the third pad connection pattern PCP3 through a contact hole of the second insulating layer 1515*b*. The pad PD of the pad section 211 may be electrically connected to the fourth pad connection pattern PCP4 through a contact hole of the third insulating layer 1515*c*.

A signal supplied from a flexible printed circuit 102 is input to a pad PD of a pad section 211, and a signal input to the pad PD is transmitted to a third pad connection pattern PCP3 through a fourth pad connection pattern PCP4, and a signal transmitted to the third pad connection pattern PCP3 can be transmitted again to a first pad connection pattern PCP1 through a second pad connection pattern PCP2. A signal transmitted to the first pad connection pattern PCP1 can be transmitted to a driver DRV through connection patterns arranged in a display area DA.

Referring to FIG. 15, a plurality of line connection patterns LCP and a plurality of pad connection patterns PCP may be arranged in various metal layers. The plurality of line connection patterns LCP and the plurality of pad connection patterns PCP may be formed of any one of a conductive material having excellent ductility or various conductive materials used in a display area DA.

For example, a metal pattern such as a first pad connection pattern PCP1 at least partially disposed in the bending area BA may be composed of a conductive material having excellent ductility, such as gold (Au), silver (Ag), or aluminum (Al), but the embodiments of the present disclosure are not limited thereto. For another example, the plurality of line connection patterns LCP and the plurality of pad connection patterns PCP may be composed of molybdenum (Mo), chromium (Cr), titanium (Ti), nickel (Ni), neodymium (Nd), copper (Cu), and an alloy of silver (Ag) and magnesium (Mg), or an alloy thereof, but the embodiments of the present disclosure are not limited thereto.

A third insulating layer 1515*c* may be disposed on the plurality of line connection patterns LCP and the plurality of pad connection patterns PCP. The third insulating layer 1515*c* is disposed in the display area DA, the first non-display area NDA1, and the second non-display area NDA2, and may be disposed in all or part of the bending area BA, but the embodiments of the present disclosure are not limited thereto. In the bending area BA, a part of the third insulating layer 1515*c* may be removed. The third insulating layer 1515*c* may be composed of an organic insulating material, but the embodiments of the present disclosure are not limited thereto. For example, the third insulating layer 1515*c* may be composed of a photo resist, a polyimide (PI), or a photo acryl-based material, but the embodiments of the present disclosure are not limited thereto.

A plurality of banks BNK may be disposed on the third insulating layer 1515*c* in the display area DA. The plurality of banks BNKs may be arranged to overlap with at least a portion of each of the plurality of subpixels SPa, SPb and SPc. For example, the first subpixel SPa may include a first light emitting device EDa that emits a first color light, the second subpixel SPb may include a second light emitting device EDb that emits a second color light, and the third subpixel SPc may include a third light emitting device EDc that emits a third color light. For example, the first color light, the second color light, and the third color light may be red light, green light, and blue light, respectively, but are not limited thereto.

As an example, one light emitting device ED may be arranged on top of each of the plurality of banks BNKs. As another example, two or more light emitting devices ED may be arranged on top of each of the plurality of banks BNK. The two or more light emitting devices EDs arranged on top of each of the plurality of banks BNK may be light emitting devices of the same type. When manufacturing a panel, in a transfer process for transferring a plurality of light emitting devices ED to a display device 100, a plurality of banks BNK can guide the positions of the plurality of light emitting devices ED. For example, the light emitting devices of the same type may be light emitting devices that emit the same color light. For example, the two or more light emitting devices ED arranged on top of each of the plurality of banks BNK may include a main light emitting device and a redundancy light emitting device.

In the display area DA, a plurality of row connection electrodes RCE may be arranged on the third insulating layer 1515*c*. The plurality of row connection electrodes RCE may transfer a low-potential voltage VSS output from the driver DRV to the row line RL.

In the display area DA, a plurality of column lines CL may be arranged on the third insulating layer 1515*c*. The plurality of column lines CL may be arranged in an area between the plurality of banks BNK. For example, the plurality of column lines CL may be arranged adjacent to one of the plurality of banks BNK.

Each of the plurality of column lines CL may include a wiring portion and a column connection electrode CCE protruding from the wiring portion. The wiring portion and the column connection electrode CCE included in each of the plurality of column lines CL may be formed integrally or may be different metals that are electrically connected.

For example, each of the plurality of column lines CL may include a column connection electrode CCE that is a portion protruding above an adjacent bank BNK among the plurality of banks BNK. The column connection electrode CCE of each of the plurality of column lines CL may be arranged to extend along the side and upper surface of the bank BNK. The column connection electrode CCE may be an electrode electrically connected to each of the plurality of column lines CL or may be a portion protruding from each of the plurality of column lines CL.

Referring to FIG. 16, the column connection electrode CCE of the column line CL may be composed of one conductive layer or multiple conductive layers. For example, a column connection electrode CCE electrically connected to a column line CL or protruding from the column line CL may include a first conductive layer 1601, a second conductive layer 1602, a third conductive layer 1603, and a fourth conductive layer 1604, but the embodiments of the present disclosure are not limited thereto.

The first conductive layer 1601 may be disposed on a bank BNK. The second conductive layer 1602 may be disposed on the first conductive layer 1601. The third conductive layer 1603 may be disposed on the second conductive layer 1602, and the fourth conductive layer 1604 may be disposed on the third conductive layer 1603. For example, each of the first conductive layer 1601, the second conductive layer 1602, the third conductive layer 1603, and the fourth conductive layer 1604 may be composed of titanium (Ti), molybdenum (Mo), aluminum (Al), or titanium (Ti) and indium tin oxide (ITO), but the embodiments of the present disclosure are not limited thereto.

According to the embodiments of the present disclosure, among the plurality of conductive layers constituting the column connection electrode CCE, some conductive layers having good reflection efficiency may be configured as an alignment key and/or a reflector for aligning the light emitting devices ED. For example, among the plurality of conductive layers constituting the column connection electrode CCE, the second conductive layer 1602 may include a reflective material. For example, the second conductive layer 1602 may include aluminum (Al), but the embodiments of the present disclosure are not limited thereto. Accordingly, the second conductive layer 1602 may be configured as a reflector. In addition, due to the high reflection efficiency of the second conductive layer 1602, it can be easily identified in the manufacturing process, and thus the position or transfer position of the light emitting device ED can be aligned based on the second conductive layer 1602.

For example, in order to configure the second conductive layer 1602 as a reflector, the third conductive layer 1603 and the fourth conductive layer 1604 disposed on the second conductive layer 1602 may be partially removed or etched. For example, a portion of the third conductive layer 1603 and the fourth conductive layer 1604 disposed on the bank BNK may be removed or etched to expose the upper surface of the second conductive layer 1602. That is, the openings of the third conductive layer 1603 and the fourth conductive layer 1604 may overlap with a portion of the upper surface of the second conductive layer 1602. For example, in the third conductive layer 1603 and the fourth conductive layer 1604, the central portion and the edge portion where a solder pattern SDP is arranged may remain, and the remaining portions excluding this portion (e.g., the central portion, the edge portion) may be removed. For example, the edge portion of each of the third conductive layer 1603 made of titanium (Ti) and the fourth conductive layer 1604 made of indium tin oxide (ITO) may not be etched. Accordingly, it is possible to prevent other conductive layers of the column connection electrode CCE of the column line (CL) from being corroded by the tetra methyl ammonium hydroxide (TMAH) solution used in the mask process of the column connection electrode CCE.

According to the embodiments of the present disclosure, the first conductive layer 1601 and the third conductive layer 1603 may include titanium (Ti) or molybdenum (Mo). The second conductive layer 1602 may include aluminum (Al). The fourth conductive layer 1604 may include a transparent conductive oxide layer such as indium tin oxide (ITO) or indium zinc oxide (IZO) that has good adhesion to the solder pattern SDP and corrosion resistance and acid resistance. However, the embodiments of the present disclosure are not limited thereto.

The first conductive layer 1601, the second conductive layer 1602, the third conductive layer 1603, and the fourth conductive layer 1604 may be sequentially deposited and then patterned by performing a photolithography process and an etching process, but the embodiments of the present disclosure are not limited thereto.

According to embodiments of the present disclosure, two or more of the column connection electrode CCE, the column line CL, the row connection electrode RCE, and the pad PD may be arranged on the same layer. The column connection electrode CCE, the column line CL, the row connection electrode RCE, and the pad PD may be composed of a single layer or multiple layers of a conductive material, but the embodiments of the present disclosure are not limited thereto. For example, two or more of the column connection electrode CCE, the column line CL, the row connection electrode RCE, and the pad PD may be composed of a multiple layer of indium tin oxide (ITO)/titanium (Ti)/aluminum (Al)/titanium (Ti), but the embodiments of the present disclosure are not limited thereto.

According to embodiments of the present disclosure, a solder pattern SDP may be arranged on the column connection electrode CCE in each of a plurality of subpixels. The solder pattern SDP may bond the light emitting device ED to the column connection electrode CCE. The column connection electrode CCE and the light emitting device ED may be electrically connected through eutectic bonding using the solder pattern SDP, but the embodiments of the present disclosure are not limited thereto. For example, if the solder pattern SDP is composed of indium (In) and the first electrode Ecl of the light emitting device ED is composed of gold (Au), the solder pattern SDP and the first electrode Ecl of the light emitting device ED may be bonded by applying heat and pressure in a transfer process of the light emitting device ED. Through eutectic bonding, the light emitting device ED may be bonded to the solder pattern SDP and the column connection electrode CCE without a separate adhesive. For example, the solder pattern SDP may be composed of indium (In), tin (Sn), or an alloy thereof, but the embodiments of the present disclosure are not limited thereto. For example, the solder pattern SDP may be a bonding pad, but the embodiments of the present disclosure are not limited thereto.

According to the embodiments of the present disclosure, the passivation layer 1516 may be disposed on a plurality of column lines CL, a plurality of column connection electrodes CCE, a plurality of row connection electrodes RCE, and a third insulating layer 1515*c*.

For example, the passivation layer 1516 may be disposed on a display area DA, a first non-display area NDA1, and a second non-display area NDA2. In the entirety or a portion of the bending area BA, at least a portion of the passivation layer 1516 covering the plurality of pads PD may be removed. A portion of the passivation layer 1516 covering the plurality of pads PD in the second non-display area NDA2 may be removed. In addition, as illustrated in FIG. 16, the passivation layer 1516 may be removed from the area where the solder pattern SDP is arranged.

Since the passivation layer 1516 is arranged to cover the remaining area except for the bending area BA, the plurality of pads PD, and the area where the solder pattern SDP is arranged, the penetration of moisture or impurities into the light emitting device ED can be reduced. For example, the passivation layer 1516 may be composed of a single layer or multiple layers of silicon oxide (SiOx) or silicon nitride (SiNx), but the embodiments of the present disclosure are not limited thereto. For example, the passivation layer 1516 may be a protection layer or an insulating layer, but the embodiments of the present disclosure are not limited thereto. For example, as illustrated in FIG. 16, the passivation layer 1516 may include a hole through which the solder pattern SDP is exposed. That is, the hole of the passivation layer 1516 may overlap with the solder pattern SDP.

Referring to FIG. 16, a light emitting device ED may be arranged on the solder pattern SDP in each of a plurality of subpixels SP. The light emitting device ED may be formed on a silicon wafer by a method such as metal organic chemical vapor deposition (MOCVD), chemical vapor deposition (CVD), plasma-enhanced chemical vapor deposition (PDCVD), molecular beam epitaxy (MBE), hydride vapor phase epitaxy (HVPD), or sputtering, but the embodiments of the present disclosure are not limited thereto.

Referring to FIG. 16, the light emitting device ED may include a first electrode Ecl, a first semiconductor layer 1611, an active layer 1612, a second semiconductor layer 1613, a second electrode Erl, and an encapsulation film 1614, but the embodiments of the present disclosure are not limited thereto. For example, the encapsulation film 1614 may not be included in the light emitting device ED.

The first semiconductor layer 1611 may be disposed on the solder pattern SDP. The second semiconductor layer 1613 may be disposed on the first semiconductor layer 1611. For example, the active layer 1612 may be disposed on the first semiconductor layer 1611, and the second semiconductor layer 1613 may be disposed on the active layer 1612.

For example, one of the first semiconductor layer 1611 and the second semiconductor layer 1613 may be implemented as a compound semiconductor of group III-V, group II-VI, and may be doped with an impurity (or dopant). For example, one of the first semiconductor layer 1611 and the second semiconductor layer 1613 may be a semiconductor layer doped with an n-type impurity, and the other may be a semiconductor layer doped with a p-type impurity, but the embodiments of the present disclosure are not limited thereto. For example, at least one of the first semiconductor layer 1611 and the second semiconductor layer 1613 may be a layer doped with an n-type or p-type impurity in a material such as gallium nitride (GaN), gallium phosphide (GaP), gallium arsenide phosphide (GaAsP), aluminum gallium indium phosphide (AlGaInP), indium aluminum phosphide (InAlP), aluminum gallium nitride (AlGaN), aluminum indium nitride (AlInN), aluminum indium gallium nitride (AlInGaN), aluminum gallium arsenide (AlGaAs), or gallium arsenide (GaAs), but the embodiments of the present disclosure are not limited thereto. For example, the n-type impurity may be silicon (Si), germanium (Ge), selenium (Se), carbon (C), tellurium (Te), or tin (Sn), but the embodiments of the present disclosure are not limited thereto. For example, the p-type impurity may be magnesium (Mg), zinc (Zn), calcium (Ca), strontium (Sr), barium (Ba), or beryllium (Be), but the embodiments of the present disclosure are not limited thereto.

As one example, each of the first semiconductor layer 1611 and the second semiconductor layer 1613 may be a nitride semiconductor, without being limited thereto. For example, the first semiconductor layer 1611 and the second semiconductor layer 1613 may be a nitride semiconductor including an n-type impurity and a nitride semiconductor including a p-type impurity, respectively, but the embodiments of the present disclosure are not limited thereto. For example, the first semiconductor layer 1611 may be a nitride semiconductor containing a p-type impurity, and the second semiconductor layer 1613 may be a nitride semiconductor containing an n-type impurity, but the embodiments of the present disclosure are not limited thereto.

The active layer 1612 may be arranged between the first semiconductor layer 1611 and the second semiconductor layer 1613. The active layer 1612 may receive holes and electrons from the first semiconductor layer 1611 and the second semiconductor layer 1613) to emit light. For example, the active layer 1612 may be configured as one of a single well structure, a multi-well structure, a single quantum well structure, a multi-quantum well (MQW) structure, a quantum dot structure, and a quantum wire structure, but the embodiments of the present disclosure are not limited thereto. For example, the active layer 1612 may be configured as indium gallium nitride (InGaN) or gallium nitride (GaN), but the embodiments of the present disclosure are not limited thereto.

For another example, the active layer 1612 may include a multi-quantum well (MQW) structure having a well layer and a barrier layer having a higher band gap than the well layer. For example, the active layer 1612 may be formed of InGaN as a well layer and an AlGaN layer as a barrier layer, but the embodiments of the present disclosure are not limited thereto.

The first electrode Ecl of the light emitting device ED may be arranged between the first semiconductor layer 1611 and the solder pattern SDP. For example, the first electrode Ecl of the light emitting device ED may electrically connect the first semiconductor layer 1611 and the column connection electrode CCE. The column line voltage (e.g., the anode voltage) output from the driver DRV may be applied to the first semiconductor layer 1611 through the column line CL, the column connection electrode CCE, and the first electrode Ecl. For example, the first electrode Ecl may be composed of a conductive material capable of eutectic bonding with the solder pattern SDP, but the embodiments of the present disclosure are not limited thereto. For example, the first electrode Ecl of the light emitting device ED may be composed of gold (Au), tin (Sn), tungsten (W), silicon (Si), silver (Ag), titanium (Ti), iridium (Ir), chromium (Cr), indium (In), zinc (Zn), lead (Pb), nickel (Ni), platinum (Pt), and copper (Cu), or an alloy thereof, but the embodiments of the present disclosure are not limited thereto.

The second electrode Erl of the light emitting device ED may be disposed on the second semiconductor layer 1613. For example, the second electrode Erl of the light emitting device ED may electrically connect the second semiconductor layer 1613 and the row line RL. A row line voltage (e.g., referred to as a low-potential voltage VSS as a cathode voltage) output from the driver DRV may be applied to the second semiconductor layer 1613 through the row connection electrode RCE, the row line RL, and the second electrode Erl. The second electrode Erl of the light emitting device ED may be made of a transparent conductive material so that light emitted from the light emitting device ED can be directed to the upper portion of the light emitting device ED, but the embodiments of the present disclosure are not limited thereto. For example, the second electrode Erl may be made of a material such as indium tin oxide (ITO), indium zinc oxide (IZO), or indium gallium zinc oxide (IGZO), but the embodiments of the present disclosure are not limited thereto.

The encapsulation film 1614 may be disposed on at least a portion of the first semiconductor layer 1611, the active layer 1612, the second semiconductor layer 1613, the first electrode Ecl, and the second electrode Erl. For example, the encapsulation film 1614 may surround at least a portion of the first semiconductor layer 1611, the active layer 1612, the second semiconductor layer 1613, the first electrode Ecl, and the second electrode Erl, without being limited thereto. For example, the encapsulation film 1614 may not be included in the light emitting device ED.

For example, the encapsulation film 1614 may protect the first semiconductor layer 1611, the active layer 1612, and the second semiconductor layer 1613. For example, the encapsulation film 1614 may be disposed on a side surface of the first semiconductor layer 1611, a side surface of the active layer 1612, and a side surface of the second semiconductor layer 161. For example, the encapsulation film 1614 may surround a side surface of the first semiconductor layer 1611, a side surface of the active layer 1612, and a side surface of the second semiconductor layer 161.

For example, the encapsulation film 1614 may be disposed on at least a portion of the first electrode Ecl and the second electrode Erl of the light emitting device ED. For example, the encapsulation film 1614 may be disposed on an edge portion (or one side) of the first electrode Ecl of the light emitting device ED and an edge portion (or one side) of the second electrode Erl of the light emitting device ED. For example, the encapsulation film 1614 may surround an edge portion (or one side) of the first electrode Ecl of the light emitting device ED and an edge portion (or one side) of the second electrode Erl of the light emitting device ED. At least a portion of the first electrode Ecl may be exposed from the encapsulation film 1614 so that the first electrode Ecl may be connected to the solder pattern SDP. For example, at least a portion of the second electrode Erl may be exposed from the encapsulation film 1614 so that the second electrode Erl may be connected to the row line RL. For example, the encapsulation film 1614 may be made of an insulating material such as silicon nitride (SiNx) or silicon oxide (SiOx), but the embodiments of the present disclosure are not limited thereto.

For another example, the encapsulation film 1614 may have a structure in which a reflective material is dispersed in a resin layer, but the embodiments of the present disclosure are not limited thereto. For example, the encapsulation film 1614 may be manufactured as a reflector of various structures, but the embodiments of the present disclosure are not limited thereto. Light emitted from the active layer 1612 may be reflected upward by the encapsulation film 1614, thereby improving light extraction efficiency. For example, the encapsulation film 1614 may be a reflective layer, but the embodiments of the present disclosure are not limited thereto.

According to the embodiments of the present disclosure, the light emitting device ED is described as having a vertical structure, but the embodiments of the present disclosure are not limited thereto. For example, the light emitting device ED may have a lateral structure or a flip chip structure.

The structure of the light emitting device ED illustrated in FIG. 16 may be substantially equally applied to all of the first light emitting device EDa, the second light emitting device EDb, and the third light emitting device EDc. According to exemplary embodiments of the present disclosure, a first optical layer 1517*a* may be arranged to surround a plurality of light emitting devices ED in the display area DA. For example, the first optical layer 1517*a* may be arranged to cover a plurality of light emitting devices ED and the bank BNK in the area of a plurality of subpixels SP. For example, the first optical layer 1517*a* may cover a bank BNK, a portion of the passivation layer 1516, and a region between the plurality of light emitting devices ED. The first optical layer 1517*a* may be arranged or covered between a plurality of light emitting devices ED included in one pixel and between a plurality of banks BNK. For example, the first optical layer 1517*a* may be arranged to extend in the first direction (X) and be spaced apart from each other in the second direction (Y). For example, the first optical layer 1517*a* may be arranged between the passivation layer 1516 and the row line RL, but the embodiments of the present disclosure are not limited thereto. For example, the first optical layer 1517*a* may be arranged to surround the side of the light emitting devices ED and the banks BNK between the passivation layer 1516 and the row line RL, but the embodiments of the present disclosure are not limited thereto. For example, the first optical layer 1517*a* may be a diffusion layer or a sidewall diffusion layer, but the embodiments of the present disclosure are not limited thereto.

The first optical layer 1517*a* may include an organic insulating material having fine particles dispersed therein, but the embodiments of the present disclosure are not limited thereto. For example, the first optical layer 1517*a* may be composed of siloxane having fine metal particles, such as titanium dioxide (TiO2) particles, dispersed therein, but the embodiments of the present disclosure are not limited thereto. Light from a plurality of light emitting devices ED may be scattered by the fine particles dispersed in the first optical layer 1517*a* and emitted to the outside of the display device 100. Accordingly, the first optical layer 1517*a* may improve the extraction efficiency of light emitted from the plurality of light emitting devices ED.

For example, the first optical layer 1517*a* may be arranged on each of a plurality of pixels, or may be arranged together on some pixels arranged in the same row, but the embodiments of the present disclosure are not limited thereto. For example, the first optical layer 1517*a* may be arranged on each of a plurality of pixels, or the plurality of pixels may share one first optical layer 1517*a*, but the embodiments of the present disclosure are not limited thereto. For another example, each of the plurality of subpixels may separately include a first optical layer 1517*a*, but the embodiments of the present disclosure are not limited thereto.

According to the embodiments of the present disclosure, in the display area DA, a second optical layer 1517*b* may be arranged on the passivation layer 1516. For example, the second optical layer 1517*b* may be arranged to surround the first optical layer 1517*a*. For example, the second optical layer 1517*b* may be in contact with a side surface of the first optical layer 1517*a*. For example, the second optical layer 1517*b* may be arranged in an area between the plurality of pixels. However, the embodiments of the present disclosure are not limited thereto. For example, the second optical layer 1517*b* may be a diffusion layer, a diffusion layer window, or a window diffusion layer, but the embodiments of the present disclosure are not limited thereto.

The second optical layer 1517*b* may be composed of an organic insulating material, but the embodiments of the present disclosure are not limited thereto. The second optical layer 1517*b* may be composed of the same material as the first optical layer 1517*a*, but the embodiments of the present disclosure are not limited thereto. For example, the second optical layer 1517*b* may be composed of the different material from the first optical layer 1517*a*. For example, the first optical layer 1517*a* may include fine particles, and the second optical layer 1517*b* may not include fine particles. For example, the second optical layer 1517*b* may be composed of siloxane, but the embodiments of the present disclosure are not limited thereto.

For example, the thickness of the first optical layer 1517*a* may be smaller than the thickness of the second optical layer 1517*b*, but the embodiments of the present disclosure are not limited thereto. Accordingly, when viewed from a planar view, the area where the first optical layer 1517*a* is disposed may include a concave portion that is sunken inwardly from the upper surface of the second optical layer 1517*b*.

According to the embodiments of the present disclosure, a row line RL may be disposed on the first optical layer 1517*a* and the second optical layer 1517*b*. For example, the row line RL may be electrically connected to a plurality of row connection electrodes RCE through contact holes of the second optical layer 1517*b*. For example, the row line RL may be disposed on a plurality of light emitting devices ED. For example, the row line RL may include a transparent conductive oxide such as indium tin oxide (ITO) or indium zinc oxide (IZO), but the embodiments of the present disclosure are not limited thereto. For example, the row line RL may be arranged to be in contact with the second electrode Erl of the light emitting device ED. For example, the row line RL may overlap with the first optical layer 1517*a*. For example, the row line RL may cover a plane on the outside of the first optical layer 1517*a*.

The row line RL may extend continuously in the first direction (X) of the substrate 210. Accordingly, the row line RL may be commonly connected to a plurality of pixels arranged in the first direction (X) of the substrate 210. For example, the row line RL may be commonly connected to a plurality of pixels.

According to the embodiments of the present disclosure, the row line RL may be continuously extended on the first optical layer 1517*a*, the second optical layer 1517*b*, and the light emitting device ED. The area where the first optical layer 1517*a* is disposed may include a concave portion that is sunken inwardly from the upper surface of the second optical layer 1517*b*. Accordingly, the first part of the row line RL disposed on the first optical layer 1517*a* may be disposed along the concave portion, and thus may be disposed at a lower position than the second part of the row line RL disposed on the second optical layer 1517*b*.

A third optical layer 1517*c* may be disposed on the row line RL. The third optical layer 1517*c* may be disposed so as to overlap with a plurality of light emitting devices ED and the first optical layer 1517*a*. Since the third optical layer 1517*c* is arranged on the row line RL and the plurality of light emitting devices ED, it is possible to improve a mura that may occur in some of the plurality of light emitting devices ED. For example, when transferring a plurality of light emitting devices ED onto the substrate 210 of the display panel 110, there may occur an area where the spacing between the plurality of light emitting devices ED is not uniform due to process deviation. If the spacing between the plurality of light emitting devices ED is not uniform, an emission area of each of the plurality of light emitting devices ED may be arranged unevenly, and thus a mura may be visible to the user. Accordingly, since the third optical layer 1517*c* is arranged to uniformly diffuse light over the plurality of light emitting devices ED, it is possible to reduce light emitted from some of the light emitting devices ED from being visible as a mura. Accordingly, since the light emitted from the plurality of light emitting devices EDs is evenly diffused by the third optical layer 1517*c* and extracted to the outside of the display device 100, the luminance uniformity of the display device 100 can be improved.

The third optical layer 1517*c* may be composed of the same material as the first optical layer 1517*a*, but the embodiments of the present disclosure are not limited thereto. The third optical layer 1517*c* may be composed of an organic insulating material in which fine particles are dispersed, but the embodiments of the present disclosure are not limited thereto. For example, the third optical layer 1517*c* may be composed of siloxane in which fine metal particles such as titanium dioxide (TiO2) particles are dispersed, but the embodiments of the present disclosure are not limited thereto. The third optical layer 1517*c* may be composed of the different material from the first optical layer 1517*a*, but the embodiments of the present disclosure are not limited thereto. For example, the third optical layer 1517*c* may be a diffusion layer or an upper diffusion layer, but the embodiments of the present disclosure are not limited thereto.

According to the embodiments of the present disclosure, light from a plurality of light emitting devices ED may be scattered by fine particles dispersed in a third optical layer 1517*c* and emitted to the outside of the display device 100. The third optical layer 1517*c* may evenly mix light emitted from a plurality of light emitting devices ED, thereby further improving the luminance uniformity of the display device 100. In addition, the light extraction efficiency of the display device 100 may be improved by the light scattered from the plurality of fine particles, thereby enabling the display device 100 to be driven at low power.

A black matrix BM may be arranged on the row line RL, the first optical layer 1517*a*, the second optical layer 1517*b*, and the third optical layer 1517*c* in the display area DA. For example, the black matrix BM may fill a contact hole of the second optical layer 1517*b*. The black matrix BM may be configured to cover the display area DA, so that the color mixing of light and external light reflection of the plurality of subpixels can be reduced. For example, the black matrix BM may also be arranged in the contact hole where the row line RL and the row connection electrode RCE are connected, so that light leakage between the neighboring plurality of subpixels can be prevented.

For example, the black matrix BM may be composed of an opaque material, but the embodiments of the present disclosure are not limited thereto. For example, the black matrix BM may be an organic insulating material to which a black pigment or a black dye is added, but the embodiments of the present disclosure are not limited thereto.

A cover layer 1518 may be arranged on the black matrix BM in the display area DA. The cover layer 1518 may protect a configuration under the cover layer 1518. For example, the cover layer 1518 may be composed of an organic insulating material, but the embodiments of the present disclosure are not limited thereto. For example, the cover layer 1518 may be composed of a photo resist, polyimide (PI), or photo acryl-based material, but the embodiments of the present disclosure are not limited thereto. For example, the cover layer 1518 may be an overcoat layer or an insulating layer, but the embodiments of the present disclosure are not limited thereto.

A polarizing layer 114 may be arranged on the cover layer 1518 via a first adhesive layer 112. A cover member 118 may be arranged on the polarizing layer 114 via a second adhesive layer 116. For example, the first adhesive layer 112 and the second adhesive layer 116 may include an optically clear adhesive (OCA), an optically clear resin (OCR), or a pressure sensitive adhesive (PSA), but the embodiments of the present disclosure are not limited thereto.

According to embodiments of the present disclosure, a plurality of pads PD may be arranged on a third insulating layer 1515*c* in a second non-display area NDA2. For example, at least a portion of the plurality of pads PD may be exposed from a passivation layer 1516. For example, the plurality of pads PD may be electrically connected to a fourth pad connection pattern PCP4 through a contact hole of the third insulating layer 1515*c*.

An adhesive layer ACF may be arranged on the plurality of pads PD. The adhesive layer ACF may be an adhesive layer in which conductive balls are dispersed in an insulating material, but embodiments of the present disclosure are not limited thereto. When heat or pressure is applied to the adhesive layer ACF, the conductive balls may be electrically connected at a portion where the heat or pressure is applied, thereby having conductive properties. The adhesive layer ACF may be disposed between a plurality of pads PD and a flexible printed circuit 102, so that the flexible printed circuit 102 may be attached or bonded to the plurality of pads PD. For example, the adhesive layer ACF may be an anisotropic conductive film ACF, but the embodiments of the present disclosure are not limited thereto.

The adhesive layer ACF may be disposed on the plurality of pads PD, and a flexible printed circuit 102 may be disposed on the adhesive layer ACF. The flexible printed circuit 102 may be electrically connected to the plurality of pads PD through the adhesive layer ACF. Accordingly, a signal supplied from the flexible printed circuit 102 may be transmitted to a driver DRV of a display area DA through the plurality of pads PD, the fourth pad connection pattern PCP4, the third pad connection pattern PCP3, the second pad connection pattern PCP2, and the first pad connection pattern PCP1.

Referring to FIG. 15, the display panel 110 according to the embodiments of the present disclosure may include a substrate 210, a layer stack 1410 on a plurality of drivers DRV disposed on the substrate 210, an optical layer 1517*a* disposed between a plurality of light emitting devices EDa, EDb and EDc on the layer stack 1410, an adhesive layer 116 disposed on the plurality of light emitting devices EDa, EDb and EDc and the optical layer 1517*a*, and a cover member 118 disposed on the adhesive layer 116.

Referring to FIG. 15, a plurality of column lines CL may be disposed between the layer stack 1410 and the plurality of light emitting devices EDa, EDb and EDc.

Referring to FIG. 15, a plurality of row lines RL may be arranged on a plurality of light emitting devices EDa, EDb and EDc and an optical layer 1517*a*. A plurality of row lines RL may be arranged between a plurality of light emitting devices EDa, EDb and EDc, an optical layer 1517*a*, and an adhesive layer 116.

Referring to FIG. 15, a layer stack 1410 may include a plurality of protection layers 1513*a*, 1513*b* and 1514 arranged on the side and upper surface of each of a plurality of drivers DRV, a plurality of insulating layers 1515*a*, 1515*b* and 1515*c* arranged on the plurality of protection layers 1513*a*, 1513*b* and 1514, and a bank BN arranged on the plurality of insulating layers.

The plurality of protection layers 1513*a*, 1513*b* and 1514 may further include a side protection layer 1513 disposed on each side of the plurality of drivers DRV and an upper protection layer 1514 disposed on the upper surface of each of the plurality of drivers DRV. For example, the upper protection layer 1514 may be disposed on the plurality of drivers DRV and the side protection layer 1513. Specifically, the upper protection layer 1514 may be disposed on the plurality of drivers DRV and the second protection layer 1513*b* of the side protection layer 1513.

The side protection layer 1513 may include a first protection layer 1513*a* disposed on the substrate 210 and a second protection layer 1513*b* disposed on the first protection layer 1513*a*.

The upper protection layer 1514 may include a second protection layer 1513*b* and a third protection layer 1514 disposed on the plurality of drivers DRV.

The plurality of insulating layers 1515*a*, 1515*b* and 1515*c* may be disposed on the upper protection layer 1514. The plurality of insulating layers 1515*a*, 1515*b* and 1515*c* may include a first insulating layer 1515*a* disposed on the upper protection layer 1514, and a second insulating layer 1515*b* disposed on the first insulating layer 1515*a*. The plurality of insulating layers 1515*a*, 1515*b* and 1515*c* may further include a third insulating layer 1515*c* disposed on the second insulating layer 1515*b*.

The bank BNK may be disposed on the plurality of insulating layers 1515*a*, 1515*b* and 1515*c*.

Each of the plurality of light emitting devices EDa, EDb and EDc may be disposed on the bank BNK and positioned in an opening of the optical layer 1517*a*.

At least a portion of each of the plurality of column lines CL may extend onto the bank BNK on the plurality of insulating layers 1515*a*, 1515*b* and 1515*c*. Each of the plurality of row lines RL may be arranged on the optical layer 1517*a* and the plurality of light emitting devices EDa, EDb and EDc.

A first electrode Ecl of each of the plurality of light emitting devices EDa, EDb and EDc may be electrically connected to at least a portion of a column line CL extending onto the bank BNK among the plurality of column lines CL. A second electrode Erl of each of the plurality of light emitting devices EDa, EDb and EDc may be electrically connected to one of the plurality of row lines RL.

Referring to FIG. 15, the display panel 110 according to the embodiments of the present disclosure may include a plurality of line connection patterns LCPs that connect each of a plurality of lines including a plurality of row lines RL and a plurality of column lines CL to a plurality of drivers DR.

The plurality of line connection patterns LCPs may include a first line connection pattern LCP1 disposed on a side protection layer 1513, a second line connection pattern LCP2 disposed on an upper protection layer 1514 and electrically connected to the first line connection pattern LCP1 through a hole in the upper protection layer 1514, a third line connection pattern LCP3 disposed on a first insulating layer 1515*a* and electrically connected to the second line connection pattern LCP2 through a hole in the first insulating layer 1515*a*, and a fourth line connection pattern LCP4 disposed on a second insulating layer 1515*b* and electrically connected to the third line connection pattern LCP3 through a hole in the second insulating layer 1515*b*.

The first line connection pattern LCP1 may be electrically connected to one of the plurality of drivers DRV. The fourth line connection pattern LCP4 may be electrically connected to at least one second electrode Erl of the plurality of light emitting devices EDa, EDb and EDc, or may be electrically connected to at least one first electrode Ecl of the plurality of light emitting devices EDa, EDb and EDc.

As one example, the side protection layer may include at least one organic layer. The side protection layer 1513 arranged on each side of the plurality of drivers DRV may include two or more organic layers.

The first and second protection layers 1513*a* and 1513*b* as the side protection layer 1513, the third protection layer 1514 as the upper protection layer 1514, and the first to third insulating layers 1515*a*, 1515*b* and 1515*c* may each be composed of organic layers.

In the above, there have been described the structure and operation related to the display function of the display device 100 according to the embodiments of the present disclosure.

The display device 100 according to the embodiments of the present disclosure may provide not only a display function but also a touch sensing function. Accordingly, hereinafter, it will be described a structure and an operation related to the touch sensing function of the display device 100 according to the embodiments of the present disclosure.

Figure 17:
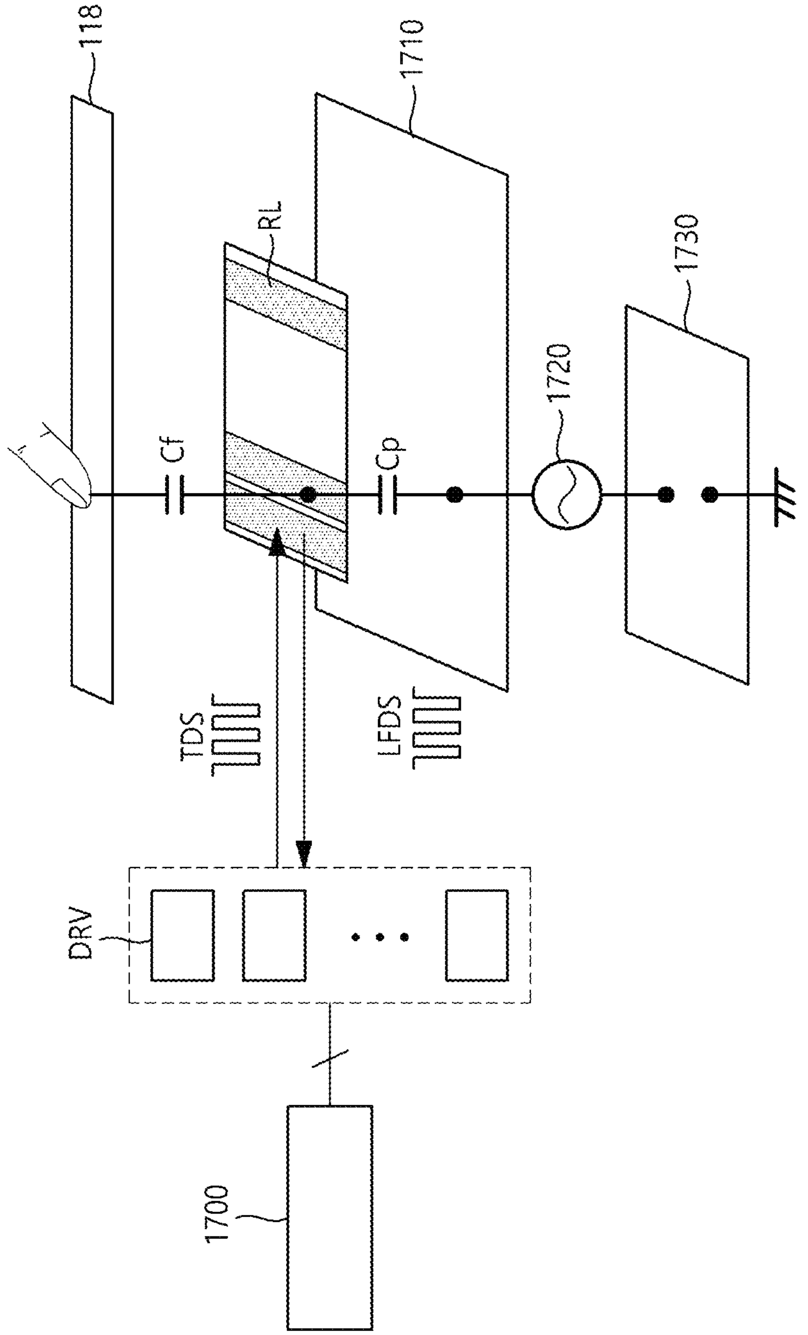
FIG. 17 illustrates a touch sensing structure of a display device according to exemplary embodiments of the present disclosure.

FIG. 17 is a diagram briefly illustrating the touch sensing structure of the display device 100 according to the embodiments of the present disclosure.

Referring to FIG. 17, the display device 100 according to the embodiments of the present disclosure may include a plurality of row lines RL that serve as touch sensors to perform touch sensing, a plurality of drivers DRV for driving and sensing the plurality of row lines RL, and a touch control circuit 1700 that controls the plurality of drivers DRV.

The plurality of drivers DRV may supply a touch driving signal TDS having a variable voltage level to at least one of the plurality of row lines RL. The touch driving signal TDS is a signal whose voltage level fluctuates, and may also be referred to as an AC signal or a pulse signal. For example, the touch driving signal TDS may have a signal waveform such as a square wave, a sine wave, or a triangular wave. For example, the frequency of the touch driving signal TDS may be constant. For another example, the frequency of the touch driving signal TDS may be variable. If the frequency of the touch driving signal TDS is variable according to the touch driving period T or time, it is possible to prevent the touch sensitivity degradation due to noise generated during the touch driving.

A plurality of drivers DRV may sense or detect an electrical state (e.g., a capacitance change) in at least one of a plurality of row lines RL to generate sensing data, and output the generated sensing data. Here, the sensing data may include digital sensing values.

The plurality of drivers DRV may include at least one analog-to-digital converter ADC to sense an electrical state in at least one of the plurality of row lines RL to obtain digital sensing values.

For example, the electrical state in at least one of the plurality of row lines RL may include a capacitance Cf between a touch object such as a finger or a pen and each row line RL. For another example, the electrical state in at least one of the plurality of row lines RL may include a capacitance between two row lines RL.

The touch control circuit 1700 may supply a touch driving signal TDS or a signal as abase of the touch driving signal TDS to each of the plurality of drivers DRV, and determine an occurrence of a touch or a touch position based on sensing data provided from each of the plurality of drivers RV. For example, the touch control circuit 1700 may include a timing controller or a micro-control unit. The touch control circuit 1700 may further include a power management integrated circuit PMIC, etc.

The display device 100 according to the embodiments of the present disclosure may perform self-capacitance-based touch sensing and/or mutual-capacitance-based touch sensing.

Referring to FIG. 17, if a touch driving signal TDS is applied to at least one of a plurality of row lines RL for touch sensing, an unwanted parasitic capacitance Cp may be formed between the row line RL supplied with the touch driving signal TDS and other electrodes or other wirings around the corresponding row line RL. The parasitic capacitance Cp may be a factor causing a reduction of the touch sensitivity.

Referring to FIG. 17, the display device 100 according to the embodiments of the present disclosure may further include a touch ground 1710 arranged below the plurality of row lines RL. The touch ground 1710 may correspond to an electrode that forms a parasitic capacitance Cp with the row line RL.

Referring to FIG. 17, the display device 100 according to the embodiments of the present disclosure may further include a guard driver 1720 that supplies a load free driving signal LFDS whose signal characteristics correspond to the touch driving signal TDS to the touch ground 1710 in order to prevent an unwanted parasitic capacitance Cp from being formed between the row line RL and the touch ground 1710.

The load free driving signal LFDS output from the guard driver 1720 applied to the touch ground 1710 may be a signal whose signal characteristics are similar to the touch driving signal TDS output from the driver DRV and supplied to the row line RL. For example, the signal characteristics may include frequency, amplitude, and phase.

For example, the load free driving signal LFDS may have the same frequency as the touch driving signal TDS. The load free driving signal LFDS may have the same amplitude as the touch driving signal TDS. The load free driving signal LFDS may have the same phase as the touch driving signal TDS.

Referring to FIG. 17, the display device 100 according to the embodiments of the present disclosure may further include a system ground 1730 that serves as a ground for the entire system.

Hereinafter, it will be described the touch sensing system and touch sensing operation of the display device 100 according to the embodiments of the present disclosure in more detail.

Figure 18:
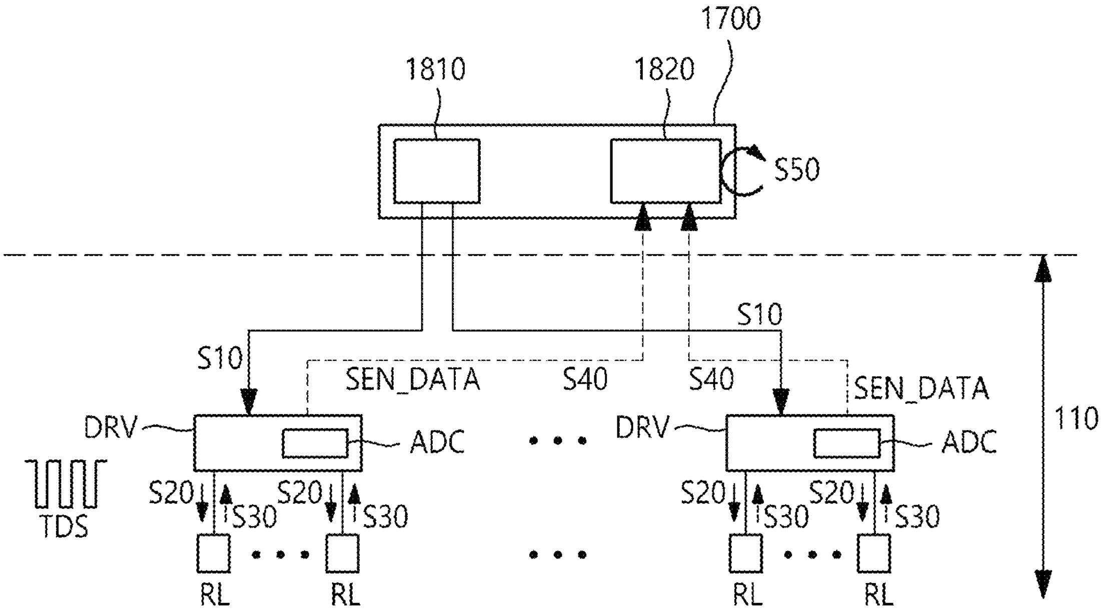
FIG. 18 illustrates a touch sensing system of a display device according to exemplary embodiments of the present disclosure.

FIG. 18 illustrates the touch sensing system of the display device 100 according to the embodiments of the present disclosure.

Referring to FIG. 18, the display device 100 according to the embodiments of the present disclosure may include a plurality of row lines RL corresponding to touch sensors, a plurality of drivers DRV for driving and sensing the plurality of row lines RL, and a touch control circuit 1700 for controlling the plurality of drivers DRV.

Referring to FIG. 18, the touch control circuit 1700 may include a signal supply circuit 1810 that supplies a touch driving signal TDS to at least one of the plurality of drivers DRV, and a touch sensing circuit 1820 that receives sensing data SEN_DATA from at least one of the plurality of drivers DRV to determine an occurrence of a touch and/or a touch position (e.g., touch coordinates).

Referring to FIG. 18, each of the plurality of drivers DRV may include an analog-to-digital converter ADC that converts a signal (e.g., analog signal) sensed through at least one row line RL of the plurality of row lines RL into a digital sensing value. In this way, since the analog-to-digital converter ADC exists in the display panel 110, a digital sensing value corresponding to a digital signal may exist among various signals existing in the display panel 110. That is, the display panel 110 may be a unique panel in which an analog domain in which an analog signal exists and a digital domain in which a digital signal exists coexist.

Referring to FIG. 18, the signal supply circuit 1810 of the touch control circuit 1700 may supply a touch driving signal TDS or a signal that is the basis of the touch driving signal TDS to each of the plurality of drivers DRV (S10).

Referring to FIG. 18, each of the plurality of drivers DRV may receive a touch driving signal TDS or a signal that is the basis of the touch driving signal TDS from the signal supply circuit 1810 of the touch control circuit 1700 (S10) and output the touch driving signal TDS to at least one of two or more row lines RL arranged in the corresponding unit driving area UDA (S20).

Each of the plurality of drivers DRV may supply a touch driving signal TDS to all or part of two or more row lines RL included in a corresponding unit driving area UDA (S20).

Referring to FIG. 18, each of the plurality of drivers DRV may sense at least one of two or more row lines RL arranged in the corresponding unit driving area UDA (S30). Each of the plurality of drivers DRV may sense at least one of the two or more row lines RL, convert a sensing signal obtained according to the sensing result into a digital sensing value, and generate sensing data SEN_DATA including the converted digital sensing values.

Referring to FIG. 18, each of the plurality of drivers DRV may provide sensing data SEN_DATA to a touch sensing circuit 1820 of a touch control circuit 1700.

Referring to FIG. 18, the touch control circuit 1700 may determine whether a touch has occurred or a touch position based on sensing data SEN_DATA provided from each of the plurality of drivers DRV (S50).

Figure 19:
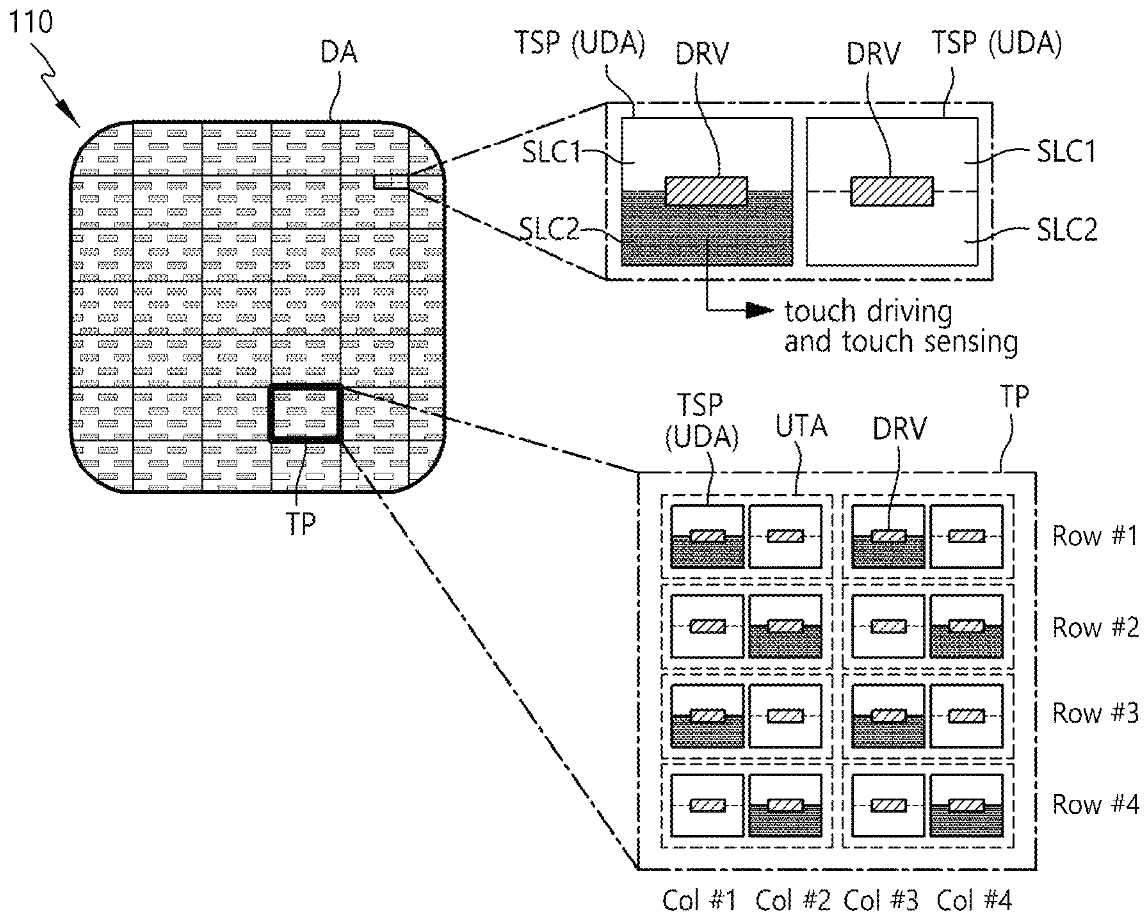
FIG. 19 illustrates a touch driving structure of a display panel according to exemplary embodiments of the present disclosure.

FIG. 19 illustrates a touch driving structure of a display panel 110 according to exemplary embodiments of the present disclosure. FIG. 4, FIG. 6, and FIG. 11 may also be referred to in the following description.

Referring to FIG. 19, the display area DA of the display panel 110 may include a plurality of touch pixel areas TP. Each of the plurality of touch pixel areas TP may be an area corresponding to one touch electrode TE.

A plurality of row lines RL arranged in one touch pixel area TP corresponding to one touch electrode and simultaneously performing touch driving may be processed as one touch electrode TE in the touch control circuit 1700 even if they are driven and sensed by a plurality of drivers DRV. That is, a plurality of row lines RL arranged in one touch pixel area TP and simultaneously performing touch driving may be recognized as one touch electrode TE electrically connected to each other.

The touch control circuit 1700 may determine an occurrence of the touch and/or a touch coordinate by considering the combined sensing data SEN_DATA obtained from each of the plurality of row lines RL arranged in one touch pixel area TP and simultaneously performing touch driving as sensing data obtained from one touch electrode TE.

Referring to FIG. 19, each of the plurality of touch pixel areas TP may include a plurality of touch subpixel areas TSP. According to the example of FIG. 19, each of the plurality of touch pixel areas TP may include 16 touch subpixel areas TSP. The 16 touch subpixel areas TSP may be arranged in 4 rows and 4 columns.

Referring to FIG. 19, each of the plurality of touch subpixel areas TSP may include one of the plurality of drivers DRV. That is, one driver DRV may be arranged in one touch subpixel area TSP. One touch subpixel area TSP may correspond to one unit driving area UDA.

Each of the plurality of touch subpixel areas TSP may include two or more row lines RL and two or more column lines CL. Each of the plurality of touch subpixel areas TSP may include two or more subpixels SP. Each of the plurality of touch subpixel areas TSP may include two or more light emitting devices ED.

Referring to FIG. 19, each of the plurality of touch pixel areas TP may include two or more unit touch driving areas UTA. Each of the two or more unit touch driving areas UTA may include at least one touch subpixel area TSP. According to the example of FIG. 19, each of the two or more unit touch driving areas UTA may include two touch subpixel areas TSP. Here, the unit touch driving area UTA is an area that becomes a basic unit of a touch driving pattern.

Referring to FIG. 19, one touch subpixel area TSP corresponding to one unit driving area UDA may include two sub-touch driving areas SLC1 and SLC2. The two sub-touch driving areas may include a first sub-touch driving area SLC1 and a second sub-touch driving area SLC2. For example, the first sub-touch driving area SLC1 may correspond to an upper area in one touch subpixel area TSP, and the second sub-touch driving area SLC2 may correspond to a lower area in one touch subpixel area TSP. However, embodiments of the present disclosure are not limited thereto.

Two or more row lines RL and two or more column lines CL may be arranged in each of the first sub-touch driving area SLC1 and the second sub-touch driving area SLC2. Each of the first sub-touch driving area SLC1 and the second sub-touch driving area SLC2 may include two or more light emitting devices ED.

Two or more row lines RL arranged in the first sub-touch driving area SLC1 and two or more row lines RL arranged in the second sub-touch driving area SLC2 may not be connected to each other and may be arranged separately from each other. Two or more column lines CL arranged in the first sub-touch driving area SLC1 and two or more column lines CL arranged in the second sub-touch driving area SLC2 may not be connected to each other and may be arranged separately from each other.

The two sub-touch driving areas SLC1 and SLC2 may correspond to the two sub-driving areas SDA1 and SDA2 included in one unit driving area UDA in FIG. 4, FIG. 6, and FIG. 11, respectively.

Referring to FIG. 19, one unit touch driving area UTA may include two touch subpixel areas TSP. One unit touch driving area UTA may include two sub-touch driving areas SLC1 and SLC2 included in each of two touch subpixel areas TSP. That is, one unit touch driving area UTA may include four sub-touch driving areas. One unit touch driving area UTA may include two drivers DRV.

For example, a touch pixel area TP may include 16 touch subpixel areas TSP arranged in four rows and four columns. Each of the 16 touch subpixel areas TSP may include one driver DRV and two sub-touch driving areas SLC1 and SLC2. For example, the driver DRV included in one touch subpixel area TSP may drive and sense two sub-touch driving areas SLC1 and SLC2 included in the touch subpixel area TSP.

As an example, during a touch driving period for touch sensing, all four sub-touch driving areas included in one unit touch driving area UTA may be driven and sensed. Accordingly, during a touch driving period for touch sensing, each of the two drivers DRV included in one unit touch driving area UTA may drive and sense all two sub-touch driving areas SLC1 and SLC2 included in the corresponding touch subpixel area TSP. For example, during a touch driving period for touch sensing, one of the two drivers DRV included in one unit touch driving area UTA may drive and sense two sub-touch driving areas SLC1 and SLC2 included in the corresponding touch subpixel area TSP, and the other one of the two drivers DRV included in one unit touch driving area UTA may drive and sense the remaining two sub-touch driving areas SLC1 and SLC2, without being limited thereto.

As another example, during a touch driving period for touch sensing, only some of the four sub-touch driving areas included in one unit touch driving area UTA may be driven and sensed. According to the example of FIG. 19, during the touch driving period for touch sensing, only one sub-touch driving area among four sub-touch driving areas included in one unit touch driving area UTA may be driven and sensed, without being limited thereto. Accordingly, during the touch driving period for touch sensing, only one driver DRV among two drivers DRV included in one unit touch driving area UTA may drive and sense one of two sub-touch driving areas SLC1 and SLC2 included in the corresponding touch subpixel area TSP.

As another example, during a touch driving period for touch sensing, only some of the four sub-touch driving areas included in one unit touch driving area UTA may be driven and sensed. For example, during the touch driving period for touch sensing, only two sub-touch driving areas among four sub-touch driving areas included in one unit touch driving area UTA may be driven and sensed, without being limited thereto. Accordingly, during the touch driving period for touch sensing, only one driver DRV among two drivers DRV included in one unit touch driving area UTA may drive and sense two sub-touch driving areas SLC1 and SLC2 included in the corresponding touch subpixel area TSP, without being limited thereto.

According to the embodiments of the present disclosure, the fact that the sub-touch driving area is driven and sensed may mean that two or more row lines RL arranged in the sub-touch driving area are driven (i.e., touch driven) and sensed.

The fact that two or more row lines RL arranged in the sub-touch driving area are driven (i.e., touch driven) may mean that a touch driving signal TDS having a variable voltage level is applied to two or more row lines RL arranged in the sub-touch driving area.

Referring to FIG. 19, in the touch pixel area TP, the sub-touch driving area where touch driving and touch sensing are performed may be arranged in a zigzag shape.

For example, if a touch pixel area TP includes 16 touch subpixel areas TSP arranged in four rows and four columns, in each of the first touch subpixel row Row #1 and the third touch subpixel row Row #3, the second sub-touch driving area SLC2 among the two sub-touch driving areas SLC1 and SLC2 included in the touch subpixel area TSP located in the first column Col #1 may be driven and sensed, the two sub-touch driving areas SLC1 and SLC2 included in the touch subpixel area TSP located in the second column Col #2 may be not driven and sensed. In addition, the second sub-touch driving area SLC2 among the two sub-touch driving areas SLC1 and SLC2 included in the touch subpixel area TSP located in the third column Col #3 may be driven and sensed, and the two sub-touch driving areas SLC1 and SLC2 included in the touch subpixel area TSP located in the fourth column Col #4 may not be driven and sensed.

In the second touch subpixel row Row #2 and the fourth touch subpixel row Row #4, the two sub-touch driving areas SLC1 and SLC2 included in the touch subpixel area TSP located in the first column Col #1 may not be driven and sensed, and the second sub-touch driving area SLC2 among the two sub-touch driving areas SLC1 and SLC2 included in the touch subpixel area TSP located in the second column Col #2 may be driven and sensed. In addition, the two sub-touch driving areas SLC1 and SLC2 included in the touch subpixel area TSP located in the third column Col #3 may not be driven and sensed, and the second sub-touch driving area SLC2 among the two sub-touch driving areas SLC1 and SLC2 included in the touch subpixel area TSP located in the fourth column Col #4 may be driven and sensed.

Referring to FIG. 19, one touch pixel area TP includes a plurality of touch subpixel areas TSP, and each of the plurality of touch subpixel areas TSP may include two or more row lines RL and two or more column lines CL. Each of the plurality of touch subpixel areas TSP may include two or more light emitting devices ED.

Referring to FIG. 19, one touch pixel area TP includes a plurality of touch subpixel areas TSP, and each of the plurality of touch subpixel areas TSP may include two sub-touch driving areas SLC1 and SLC2. Each of the two sub-touch driving areas SLC1 and SLC2 may include two or more row lines RL and two or more column lines CL. Each of the two sub-touch driving areas SLC1 and SLC2 may include two or more light emitting devices ED.

The touch subpixel area TSP will be exemplified by using the (2n×m) pixel array structure of FIG. 4.

One touch subpixel area TSP may be a unit driving area UDA driven by one of the plurality of drivers DRV. The plurality of row lines RL and the plurality of column lines CL included in one touch subpixel area TSP may be driven by the same driver DRV.

Each of the plurality of pixels P may include k light emitting devices ED among the plurality of light emitting devices ED, and k may be a natural number greater than or equal to 2.

Each of the plurality of touch subpixel areas TSP may include (2n×m) pixels P arranged in 2n rows and m columns among the plurality of pixels P, 2n row lines RL among the plurality of row lines RL, and (m×k) column lines CL or (m×k×2) column lines CL among the plurality of column lines CL.

Each of the 2n row lines RL may correspond to m pixels P arranged in the same row among the (2n×m) pixels P. The (2n×m) pixels P may include (2n×m×k) light emitting devices ED. The n may be a natural number greater than or equal to 1, and the m may be a natural number greater than or equal to 1.

Each of the plurality of touch subpixel areas TSP may be divided into a first sub-touch driving area SLC1 and a second sub-touch driving area SLC2, which correspond to two sub-driving areas SDA1 and SDA2.

Each of the first sub-touch driving area SLC1 and the second sub-touch driving area SLC2 may include (n×m) pixels P arranged in n rows and m columns among (2n×m) pixels P, n row lines RL among 2n row lines RL, and (m×k) column lines CL among (m×k×2) column lines CL.

One row line RL among the n row lines RL may be shared by m pixels P arranged in one row among the (n×m) pixels P. The k column lines CL among the (m×k) column lines CL may be shared by n pixels P arranged in the same column among the (n×m) pixels P.

Each of the first sub-touch driving area SLC1 and the second sub-touch driving area SLC2 may include (n×m×k) light emitting devices ED. Among the (n×m×k) light emitting devices ED, the first electrodes Ecl of the n light emitting devices ED arranged in the same column may be electrically connected in common with one of the (m×k) column lines CL. Among the (n×m×k) light emitting devices ED, the second electrodes Erl of the (m×k) light emitting devices ED arranged in the same row may be electrically connected in common with one of the n row lines RL.

Among the plurality of touch subpixel areas TSP, two adjacent touch subpixel areas TSP may be combined to define one unit touch driving area UTA. For example, one unit touch driving area UTA may be driven by two of the plurality of drivers DRV, and one of two touch subpixel areas TSP included in the unit touch driving area UTA may be driven by one of the plurality of drivers DRV.

Among the plurality of touch subpixel areas TSPs, two adjacent touch subpixel areas TSP may include four sub-touch driving areas.

As one example, during the touch driving period, a touch driving signal TDS may be supplied to all or some of the four sub-touch driving areas. That is, during the touch driving period, all or some of the four sub-touch driving areas may be driven and sensed.

For example, during the touch driving period, a touch driving signal TDS may be supplied to all four sub-touch driving areas. That is, during the touch driving period, all four sub-touch driving areas may be driven and sensed.

For another example, during the touch driving period, a touch driving signal TDS may be supplied to only one to three sub-touch driving areas among the four sub-touch driving areas. That is, during the touch driving period, one to three sub-touch driving areas among the four sub-touch driving areas may be driven and sensed.

Hereinafter, it will be described a planar structure of the touch pixel area TP with reference to FIG. 20, and it will be described display driving and touch driving for the touch pixel area TP with reference to FIG. 21 and FIG. 22.

Figure 20:
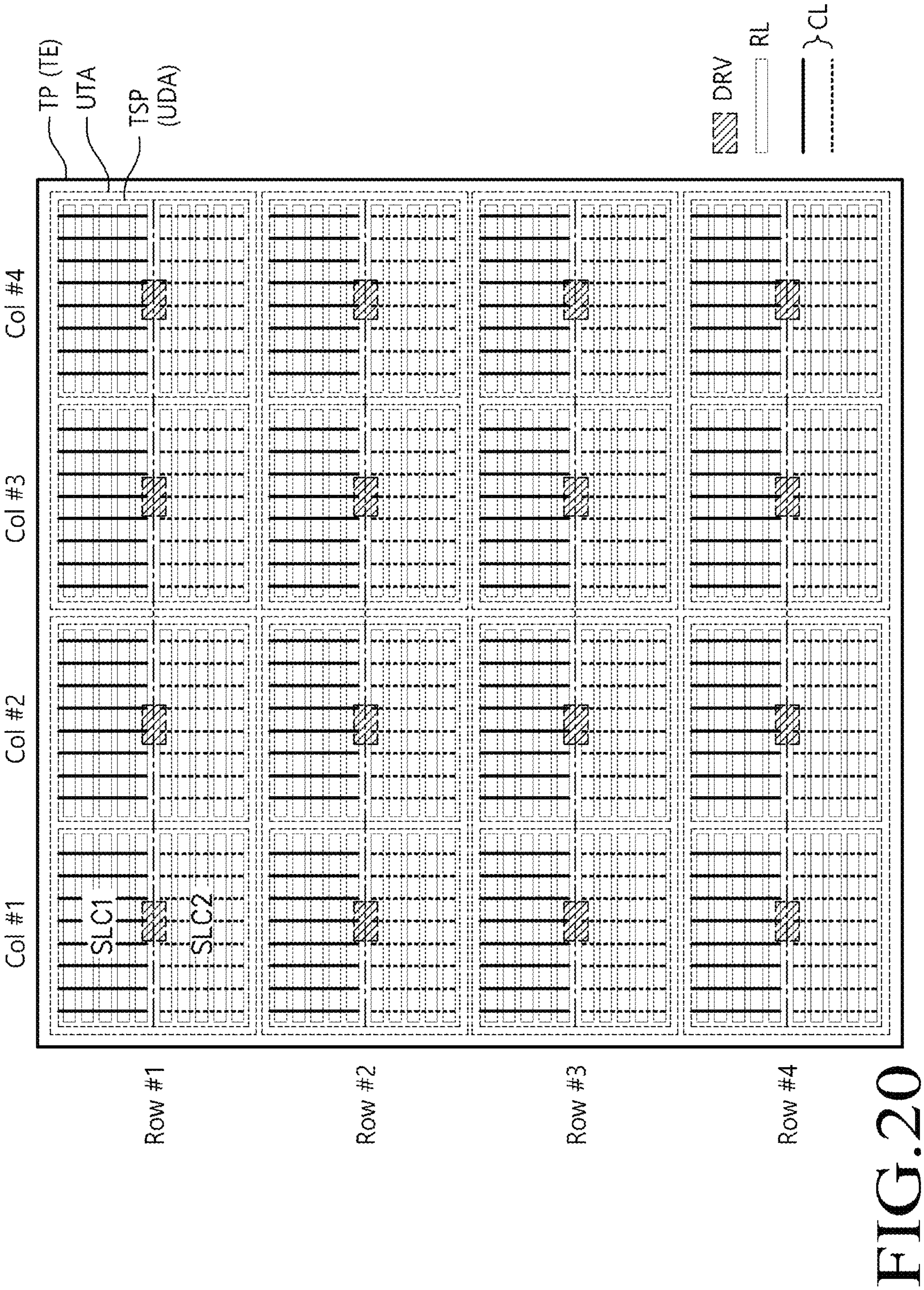
FIG. 20 is a plan view of a touch pixel area of a display panel according to exemplary embodiments of the present disclosure.

FIG. 20 is a plan view of one touch pixel area TP of a display panel 110 according to exemplary embodiments of the present disclosure.

Referring to FIG. 20, one touch pixel area TP may be an area of one touch electrode TE. At least one row line RL among a plurality of row lines RL arranged in one touch pixel area TP may constitute one touch electrode TE.

The touch pixel area TP may include a plurality of touch subpixel areas TSP arranged in a matrix form. For example, the touch pixel area TP may include 16 touch subpixel areas TSP arranged in four rows Row #1 to Row #4 and four columns Col #1 to Col #4.

Each of the 16 touch subpixel areas TSP may be a unit driving area UDA and may include one driver DRV as a driving circuit. For example, each of the 16 touch subpixel areas TSP may be driven by one of the plurality of drivers DRV.

Each of the 16 touch subpixel areas TSP may include a plurality of row lines RL and a plurality of column lines CL. The plurality of row lines RL and the plurality of column lines CL may overlap and intersect with each other. The plurality of row lines RL and the plurality of column lines CL may be arranged in different metal layers.

In each of the 16 touch subpixel areas TSP, a plurality of row lines RL and a plurality of column lines CL may be driven by the same driver DRV. For example, each of the 16 touch subpixel areas TSP may be driven by the same driver DRV.

Each of the 16 touch subpixel areas TSP may include a first sub-touch driving area SLC1 and a second sub-touch driving area SLC2. Each of the first sub-touch driving area SLC1 and the second sub-touch driving area SLC2 may include at least one row line RL and at least one column line CL.

Each of the 16 touch subpixel areas TSP may include a plurality of pixels P, each of the plurality of pixels P may include two or more subpixels SP, and each of the two or more subpixels SP may include at least one light emitting device ED.

The light emitting device ED may include a first electrode and a second electrode. The first electrode may be electrically connected to one column line CL, and the second electrode may be electrically connected to one row line RL.

Two adjacent touch subpixel areas TSP may constitute one unit touch driving area UTA. One unit touch driving area UTA may be driven by two drivers DRV.

Figure 21:
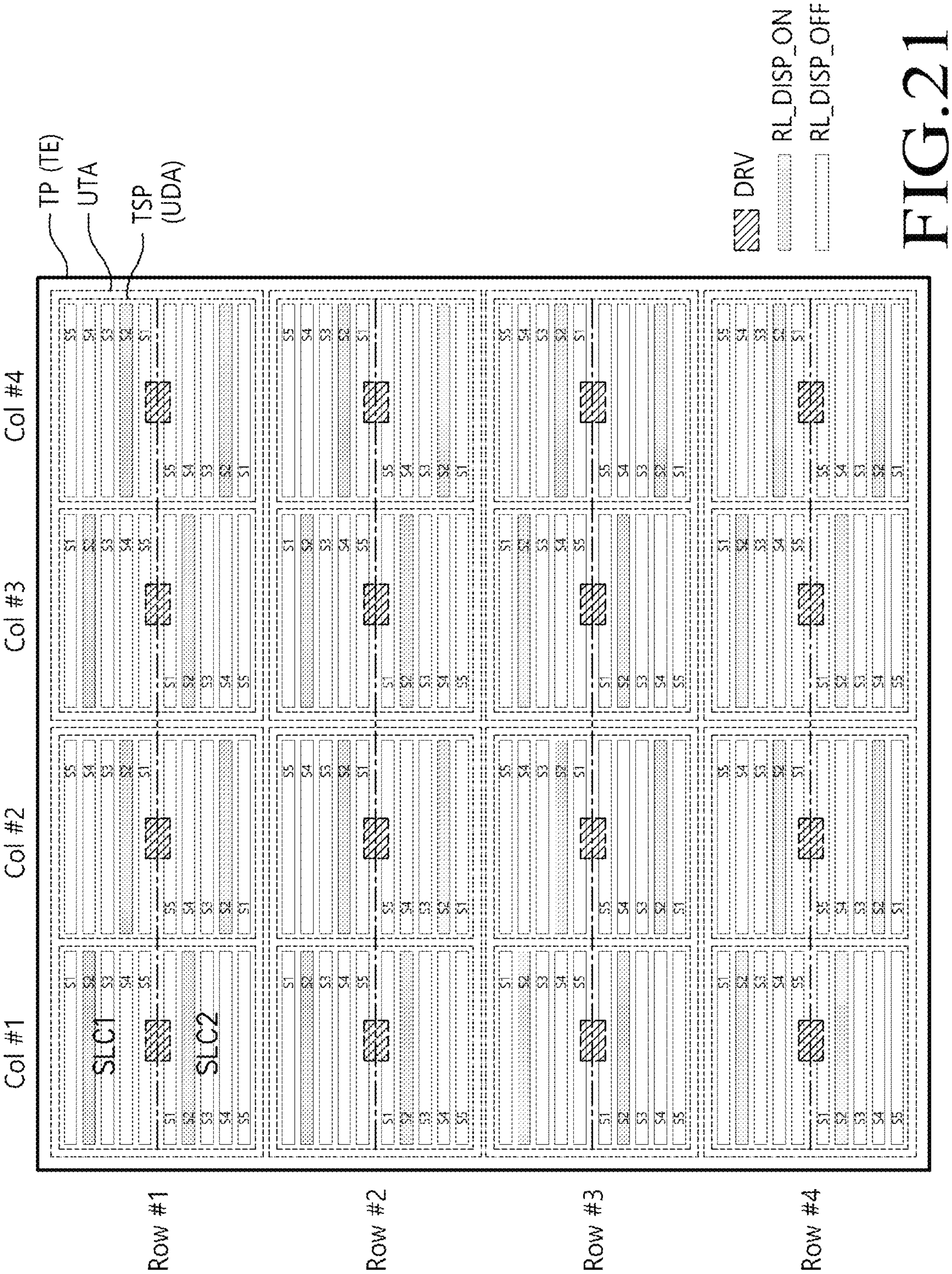
FIG. 21 illustrates a driving situation for one touch pixel area during a display driving period of a display device according to exemplary embodiments of the present disclosure.

FIG. 21 illustrates a display driving situation for one touch pixel area TP during a display driving period D of a display device 100 according to exemplary embodiments of the present disclosure. Hereinafter, FIG. 20 is also referred to in the following description.

Referring to FIG. 21, during the display driving period D, a plurality of row lines RL may be classified into a display-on driving row line RL_DISP_ON in which display-on driving is performed and a display-off driving row line RL_DISP_OFF in which display-off driving is performed.

Referring to FIG. 21, a first low-potential voltage VSS1 may be applied to a display-on driving row line RL_DISP_ON, and a second low-potential voltage VSS2 may be applied to a display-off driving row line RL_DISP_OFF.

Referring to FIG. 21, when driving a display for a touch pixel area TP during a display driving period D, each of the 16 touch subpixel areas TSP included in the touch pixel area TP may be driven independently of each other.

Referring to FIG. 21, a first sub-touch driving area SLC1 and a second sub-touch driving area SLC2 included in each of the 16 touch subpixel areas TSP may be driven independently of each other. That is, in the 16 touch subpixel areas TSP, when the first sub-touch driving area SLC1 is driven, the second sub-touch driving area SLC2 may also be driven. That is, in the 16 touch subpixel areas TSP, when the second sub-touch driving area SLC2 is driven, the first sub-touch driving area SLC1 may also be driven.

Referring to FIG. 21, in the 16 touch subpixel areas TSP, a plurality of row lines RL included in the first sub-touch driving area SLC1 may be driven sequentially, and a plurality of row lines RL included in the second sub-touch driving area SLC2 may be driven sequentially, without being limited thereto. As another example, a plurality of row lines RL included in the first sub-touch driving area SLC1 may be driven simultaneously, and a plurality of row lines RL included in the second sub-touch driving area SLC2 may be driven simultaneously, without being limited thereto.

Referring to FIG. 21, the display driving method of each of the 8 touch subpixel areas TSP arranged in the odd columns Col #1 and Col #3 may be the same, and the display driving method of each of the 8 touch subpixel areas TSP arranged in the even columns Col #2 and Col #4 may be the same.

Referring to FIG. 21, the display driving method of each of the eight touch subpixel areas TSP arranged in odd columns Col #1 and Col #3 and the display driving method of each of the eight touch subpixel areas TSP arranged in even columns Col #2 and Col #4 may be different from each other.

Referring to FIG. 21, in each of the 8 touch subpixel areas TSP arranged in odd columns Col #1 and Col #3, a plurality of row lines RL arranged in the first sub-touch driving area SLC1 may be sequentially driven from top to bottom, and a plurality of row lines RL arranged in the second sub-touch driving area SLC2 may also be sequentially driven from top to bottom. In FIG. 21, S1 to S5 are indexes indicating the driving order, S1 is an index indicating the earliest driving order, and S5 is an index indicating the latest driving order.

Referring to FIG. 21, in each of the 8 touch subpixel areas TSP arranged in even columns Col #2 and Col #4, a plurality of row lines RL arranged in the first sub-touch driving area SLC1 may be sequentially driven from bottom to top, and a plurality of row lines RL arranged in the second sub-touch driving area SLC2 may also be sequentially driven from bottom to top.

For example, in the touch subpixel area TSP of the first row Row #1 in the first column Col #1, a plurality of row lines RL arranged in the first sub-touch driving area SLC1 may be sequentially driven from top to bottom, and a plurality of row lines RL arranged in the second sub-touch driving area SLC2 may also be sequentially driven from top to bottom.

In the second column Col #2, in the touch subpixel area TSP of the first row Row #1, a plurality of row lines RL arranged in the first sub-touch driving area SLC1 may be sequentially driven from the bottom to the top, and a plurality of row lines RL arranged in the second sub-touch driving area SLC2 may also be sequentially driven from the bottom to the top.

FIG. 21 illustrates a situation at a specific point in time (e.g., a point in time corresponding to S2) during the display driving period D.

Referring to FIG. 21, at a specific point in time (e.g., a point in time corresponding to S2) during the display driving period D, in each touch subpixel area TSP arranged in an odd column Col #1 and Col #3, among the five row lines RL arranged in each of the first sub-touch driving area SLC1 and the second sub-touch driving area SLC2, the second row line RL from the top may be a display-on driving row line RL_DISP_ON, and the remaining row lines RL may be display-off driving row lines RL_DISP_OFF.

Referring to FIG. 21, at a specific point in time (e.g., a point in time corresponding to S2) during the display driving period D, in each touch subpixel area TSP arranged in an even column Col #2 and Col #4, the second row line RL from the bottom among the five row lines RL arranged in each of the first sub-touch driving area SLC1 and the second sub-touch driving area SLC2 may be a display-on driving row line RL_DISP_ON, and the remaining row lines RL may be display-off driving row lines RL_DISP_OFF.

A first low-potential voltage VSS1 may be applied to the display-on driving row line RL_DISP_ON. Accordingly, the light emitting devices EL connected to the display-on driving row line RL_DISP_ON may emit light.

A second low-potential voltage VSS2 higher than the first low-potential voltage VSS1 may be applied to the display-off driving row line RL_DISP_OFF. Accordingly, the light emitting devices EL connected to the display-off driving row line RL_DISP_OFF may not emit light.

Figure 22:
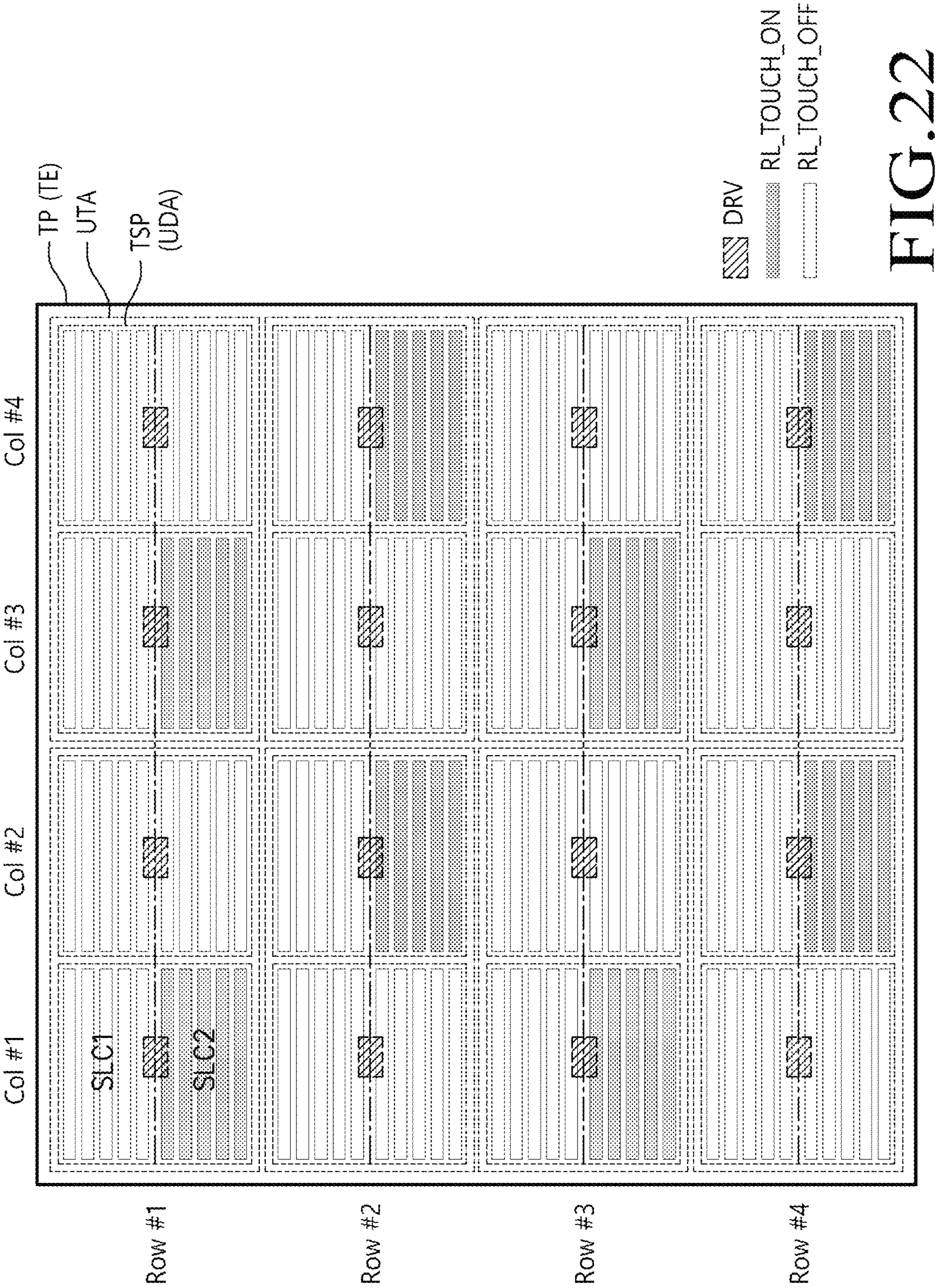
FIG. 22 illustrates a driving situation for one touch pixel area during a touch driving period of a display device according to exemplary embodiments of the present disclosure.

FIG. 22 illustrates a touch driving situation for one touch pixel area TP during a touch driving period T of a display device 100 according to exemplary embodiments of the present disclosure.

Referring to FIG. 22, during the touch driving period T, a touch driving signal TDS is applied to the row line RL to drive the row line RL.

During the touch driving period T, a plurality of row lines RL may be classified into a touch driving row line RL_TOUCH_ON and a non-touch driving row line RL_TOUCN_OFF.

A touch driving signal TDS whose voltage level is variable may be applied to a touch driving row line RL_TOUCH_ON. The touch driving row line RL_TOUCH_ON may be sensed by a driver DRV.

A touch driving signal TDS whose voltage level is variable may not be applied to a non-touch driving row line RL_TOUCN_OFF. The non-touch driving row line RL_TOUCN_OFF may not be sensed by a driver DRV. In some cases, even if a touch driving signal TDS or a similar signal is applied to the non-touch driving row line RL_TOUCN_OFF, the non-touch driving row line RL_TOUCN_OFF may not be sensed by a driver DRV. For example, even if a touch driving signal TDS whose voltage level is variable or a similar signal is applied to the non-touch driving row line RL_TOUCN_OFF, the non-touch driving row line RL_TOUCN_OFF may not be sensed by a driver DRV.

Hereinafter, it will be described a touch driving method for 16 touch subpixel areas TSP included in a touch pixel area TP during a touch driving period T.

As an example, during one touch driving period T, all 16 touch subpixel areas TSP included in a touch pixel area TP may be driven.

In this case, all or part of a plurality of row lines RL included in each of the 16 touch subpixel areas TSPs may be driven. For example, all or part of a plurality of row lines RL arranged in each of the first sub-touch driving area SLC1 and the second sub-touch driving area SLC2 included in each of the 16 touch subpixel areas TSP may be driven. For another example, all or part of the plurality of row lines RL arranged in one of the first sub-touch driving area SLC1 and the second sub-touch driving area SLC2 included in each of the 16 touch subpixel areas TSP may be driven.

As another example, during one touch driving period T, only at least one of the 16 touch subpixel areas TSPs included in the touch pixel area TP may be driven.

In this case, all or part of the plurality of row lines RL included in each of at least one of the 16 touch subpixel areas TSP may be driven. For example, all or part of the plurality of row lines RL arranged in each of the first sub-touch driving area SLC1 and the second sub-touch driving area SLC2 included in each of at least one of the 16 touch subpixel areas TSP may be driven. For another example, all or part of a plurality of row lines RL arranged in one of the first sub-touch driving area SLC1 and the second sub-touch driving area SLC2 included in at least one of the 16 touch subpixel areas TSP may be driven.

According to the example of FIG. 22, during one touch driving period T, among the four touch subpixel areas TSP arranged in each of the first row Row #1 and the second row Row #2, only the touch subpixel areas TSP arranged in the first column Col #1 and the third column Col #3 may be driven. In addition, in this case, among the four touch subpixel areas TSP arranged in each of the second row Row #2 and the fourth row Row #4, only the touch subpixel areas TSP arranged in the second column Col #2 and the fourth column Col #4 may be driven.

In each of the first row Row #1 and the second row Row #2, among the first sub-touch driving area SLC1 and the second sub-touch driving area SLC2 included in each of the touch subpixel areas TSP arranged in the first column Col #1 and the third column Col #3 where touch driving is performed, only the second sub-touch driving area SLC2 may be driven. If a touch driving signal TDS is applied to five row lines RL arranged in the second sub-touch driving area SLC2, which is the area where touch driving is performed, the second sub-touch driving area SLC2 may be driven.

In each of the second row Row #2 and the fourth row Row #4, among the first sub-touch driving area SLC1 and the second sub-touch driving area SLC2 included in each of the touch subpixel areas TSP arranged in the second column Col #2 and the fourth column Col #4 where touch driving is performed, only the second sub-touch driving area SLC2 may be driven. The second sub-touch driving area SLC2 may be driven by applying a touch driving signal TDS to five row lines RL arranged in the second sub-touch driving area SLC2, which is the area where touch driving is performed.

Hereinafter, it will be described a driving method of a display device 100 according to exemplary embodiments of the present disclosure in more detail.

Figure 23:
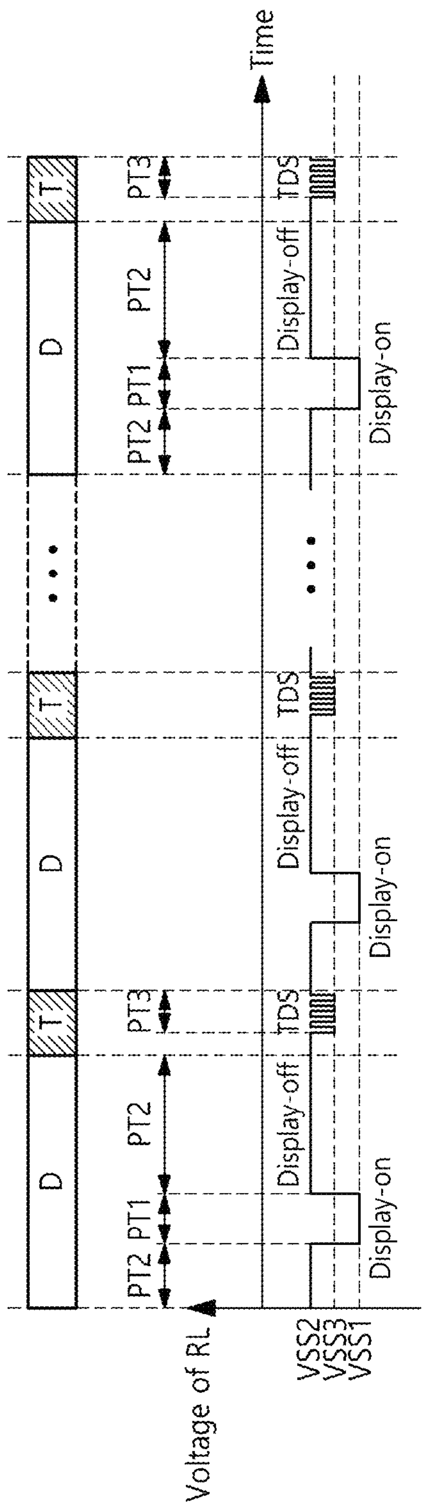
FIG. 23 and FIG. 24 are driving timing diagrams of a display device according to exemplary embodiments of the present disclosure.
Figure 24:
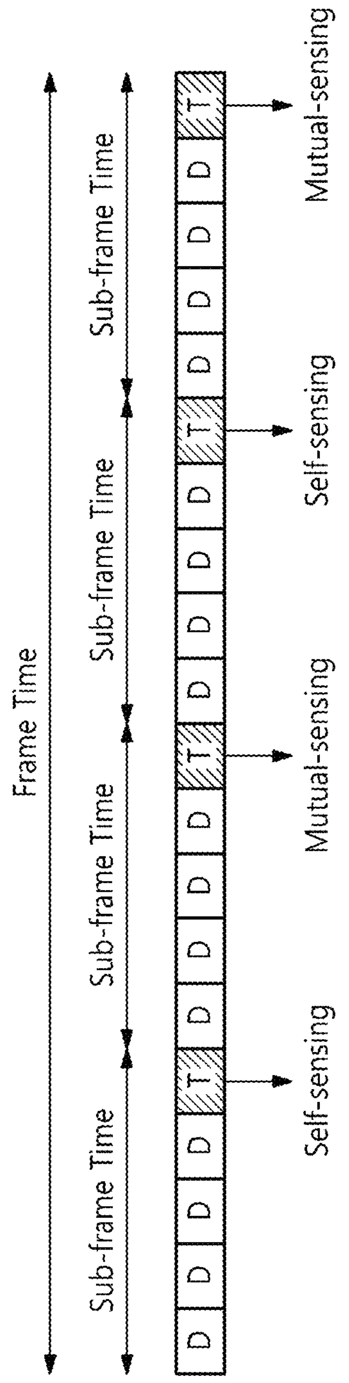

FIG. 23 and FIG. 24 are driving timing diagrams of a display device 100 according to exemplary embodiments of the present disclosure.

Referring to FIG. 23 and FIG. 24, the display device 100 according to the embodiments of the present disclosure may perform display driving for image display and touch driving (or touch sensing) for touch sensing.

The display device 100 according to the embodiments of the present disclosure may allocate a display driving period D and a touch driving period T, perform display driving during the display driving period D, and perform touch driving during the touch driving period T.

The display device 100 according to the embodiments of the present disclosure may perform display driving and touch driving according to a time-division driving method or a simultaneous driving method. In the time-division driving method, the display driving and the touch driving may be performed separately, and in the simultaneous driving method, the display driving and the touch driving may be performed simultaneously.

For example, the display device 100 according to the embodiments of the present disclosure may allocate the display driving period D and the touch driving period T as separate time periods according to the time-division driving method, and may perform display driving during the display driving period D and perform touch driving during the touch driving period T different from the display driving period D.

In another example, the display device 100 according to the embodiments of the present disclosure may perform display driving and touch driving simultaneously during the display driving period D and the touch driving period T that overlap in time according to the simultaneous driving method.

Hereinafter, for the convenience of explanation, the display device 100 according to the embodiments of the present disclosure performs display driving and touch driving at different time periods according to the time division driving method as an example. However, this is not limited thereto.

As an example of a time division driving method, as illustrated in FIG. 23, one display driving period D and one touch driving period T may alternately proceed. That is, one display driving period D may proceed, and then one touch driving period T may proceed.

As an example, one display driving period D may be a period during which display driving is performed to display an image on the entire screen. That is, the period that is the sum of one display driving period D and one touch driving period T may be a frame time. In this case, one display driving period D may correspond to an active period among the active time and a blank time included in one frame time, and one touch driving period T may correspond to a blank time among the active time and blank time included in one frame time.

In another example, two or more display driving periods D may be a period during which display driving is performed to display an image on the entire screen. That is, the time period that is the sum of two or more display driving periods D and two or more touch driving periods T may be a frame time. In this case, one frame time may include two or more sub-frame times. Each of the two or more sub-frame times may include a sub-active time and a sub-blank time. The time summing one display driving period D and one touch driving period T may be one sub-frame time among two or more sub-frame times included in one frame time. One display driving period D included in one sub-frame time may correspond to a sub-active time, and one touch driving period T may correspond to a sub-blank time.

In another example of the time division driving method, as illustrated in FIG. 24, a plurality of display driving periods D and one touch driving period T may alternately proceed. That is, a plurality of display driving periods D may proceed, and then one touch driving period T may proceed.

According to the example of FIG. 24, four display driving periods D may be performed, and then one touch driving period T may be performed. For example, the time summing four display driving periods D and one touch driving period T may correspond to one sub-frame time, and the time summing four sub-frame times may correspond to one frame time for displaying an image on the entire screen.

For example, in one sub-frame time, four display driving periods D may be performed, and then one touch driving period T may be performed. One frame time may include four touch driving periods T and sixteen display driving periods D, without being limited thereto.

According to the example of FIG. 24, four touch driving periods T included in one frame time may include self-sensing-based touch driving periods T and mutual-sensing-based touch driving periods T that are alternately proceeded, without being limited thereto. For example, among the four touch driving periods T included in one frame time, the first and third touch driving periods T may be self-sensing-based touch driving periods T, and the second and fourth touch driving periods T may be mutual-sensing-based touch driving periods T.

Self-sensing-based touch driving may be a touch driving for determining the occurrence of the touch and/or a touch coordinate based on the capacitance (e.g., self-capacitance) between a plurality of row lines RL corresponding to a touch electrode TE and a touch object (e.g., a finger, a pen, etc.).

Mutual-sensing-based touch driving may be a touch driving for determining the occurrence of the touch and/or a touch coordinate based on the capacitance (e.g., mutual-capacitance) between a plurality of row lines RL corresponding to a touch electrode TE and a plurality of row lines RL corresponding to another touch electrode TE.

Referring to FIG. 23, a plurality of row lines RL may simultaneously perform the role of a cathode electrode (or an anode electrode) for display driving and the role of a touch sensor (e.g., touch electrode) for touch driving. Therefore, the electrical state of the row line RL during the display driving period D and the electrical state of the row line RL during the touch driving period T may be different.

Referring to FIG. 23, one row line RL among the plurality of row lines RL may be supplied with a first low-potential voltage VSS1 during a first period PT1 and may be supplied with a second low-potential voltage VSS2 during a second period PT2 different from the first period PT1.

Referring to FIG. 23, the first period PT1 and the second period PT2 may be periods included in one display driving period D or periods included in different display driving periods D.

The first low-potential voltage VSS1 and the second low-potential voltage VSS2 area type of low-potential voltage VSS and may be a row line voltage applied to the row line RL. In addition, the first low-potential voltage VSS1 and the second low-potential voltage VSS2 may be a voltage (for example, a cathode voltage or an anode voltage) applied to the second electrode Erl of the light emitting devices ED connected to the row line RL.

Among the first low-potential voltage VSS1 and the second low-potential voltage VSS2, the first low-potential voltage VSS1 may be a low-potential voltage for driving the display-on, and the second low-potential voltage VSS2 may be a low-potential voltage for driving the display-off.

The first low-potential voltage VSS1 may be a voltage lower than the second low-potential voltage VSS2. That is, the second low-potential voltage VSS2 may be a higher voltage than the first low-potential voltage VSS1. Accordingly, during the first period PT1, the voltage difference between the first electrode Ecl and the second electrode Erl of the light emitting device ED may be higher than the threshold voltage of the light emitting device ED. Accordingly, the light emitting device ED may be in a state capable of emitting light. Then, during the second period PT2, the voltage difference between the first electrode Ecl and the second electrode Erl of the light emitting device ED may be lower than the threshold voltage of the light emitting device ED. Accordingly, the light emitting device ED may be in a state in which it cannot emit light.

Meanwhile, one of the plurality of row lines RL may be supplied with a touch driving signal TDS, which is a signal whose voltage level swings, during a third period PT3 different from the first period PT1 and the second period PT2.

The third period PT3 may be a period included in the touch driving period T.

The touch driving signal TDS may be a signal having a predetermined frequency and whose voltage level fluctuates. The touch driving signal TDS may be a signal that swings between a predefined high voltage and a low voltage. For example, the high voltage may be a second low-potential voltage VSS2, and the low voltage may be a third low-potential voltage VSS3. The amplitude of the touch driving signal TDS may be a voltage difference between the high voltage and the low voltage. For example, the third low-potential voltage VSS3 may be a voltage lower than the second low-potential voltage VSS2 and may be the same as or different from the first low-potential voltage VSS1. For example, the third low-potential voltage VSS3 may be a voltage higher than the first low-potential voltage VSS1 and lower than the second low-potential voltage VSS2.

Depending on the driving type and driving timing, each of the plurality of row lines RL may be driven in a predetermined method.

For example, the display-on driving for each of the plurality of row lines RL may be performed sequentially. For another example, the display-on driving for each of the plurality of row lines RL may be performed simultaneously. For another example, the display-on driving for each of two or more row lines RL among the plurality of row lines RL may be performed simultaneously.

For example, during a specific display driving period, among the plurality of row lines RL arranged in the unit driving area UDA, display-on driving may be performed for at least one row line RL, and display-off driving may be performed for the remaining row lines RL without display-on driving.

The display-on driving performed for a specific row line RL may mean that a first low-potential voltage VSS1 of a predefined level is supplied to the corresponding row line RL.

When the display-on driving for a specific row line RL is performed, the light emitting devices ED arranged corresponding to the corresponding row line RL may emit light.

The display-off driving performed for a specific row line RL without display-on driving may mean that a second low-potential voltage VSS2 of a predefined level is supplied to the corresponding row line RL. Here, the second low-potential voltage VSS2 may be a higher voltage than the first low-potential voltage VSS1.

When display-off driving is performed for a specific row line RL, the light emitting devices ED arranged corresponding to the row line RL may not emit light.

For example, a first row line RL among the plurality of row lines RL may be supplied with a first low-potential voltage VSS1 during a first period and may be supplied with a second low-potential voltage VSS2 higher than the first low-potential voltage VSS1 during a second period different from the first period. For example, the first period and the second period may be included in one display driving period. For another example, the first period and the second period may be included in different display driving periods.

The situation in the display panel 110 during the first to third periods PT1, PT2 and PT3 will be described again as follows.

During the first period PT1, the first row line RL among the plurality of row lines RL may be supplied with a first low-potential voltage VSS1. Accordingly, display-on driving may be performed on the first row line RL during the first period PT1. Accordingly, the first light emitting device ED may emit light during the first period PT1.

During a second period PT2 different from the first period PT1, the first row line RL among the plurality of row lines RL may be supplied with a second low-potential voltage VSS2 higher than the first low-potential voltage VSS1. Accordingly, during the second period PT2, display-off driving may be performed on the first row line RL. Accordingly, the first light emitting device ED may not emit light during the second period PT2.

During a third period PT3 different from the first period PT1 and the second period PT2, the first row line RL among the plurality of row lines RL may be supplied with a touch driving signal TDS, which is a signal whose voltage level swings. That is, during the third period PT3, the first row line RL may function as a touch sensor.

The plurality of row lines RL may further include a second row line RL different from the first row line RL.

The plurality of column lines CL may include a first column line CL overlapping with the first row line RL and the second row line RL.

In addition, the first row line RL, the second row line RL, and the first column line CL may be arranged together in a touch subpixel area TSP which is one unit driving area UDA. The first row line RL, the second row line RL, and the first column line CL may be driven by the same driver DRV.

During the first period PT1 in which display-on driving is performed in the first row line RL, the second row line RL may be supplied with the second low-potential voltage VSS2. That is, during the first period PT1, display-on driving may be performed in the first row line RL, and display-off driving may be performed in the second row line RL.

The plurality of light emitting devices ED may include a first light emitting device ED having a first electrode connected to a first column line CL and a second electrode connected to a first row line RL, and a second light emitting device ED having a first electrode connected to the first column line CL and a second electrode connected to a second row line RL.

During the first period PT1, display-on driving is performed on the first row line RL, and display-off driving is performed on the second row line RL. Accordingly, during the first period PT1, the first light emitting device ED may emit light, and the second light emitting device ED may not emit light.

During the third period PT3, the voltage difference between the first column line CL and the first row line RL may be less than the threshold voltage of the first light emitting device ED. Accordingly, during the third period PT3, the first light emitting device ED may not emit light.

The plurality of drivers DRV may be positioned closer to the substrate 210 than the plurality of light emitting devices ED.

Figure 25:
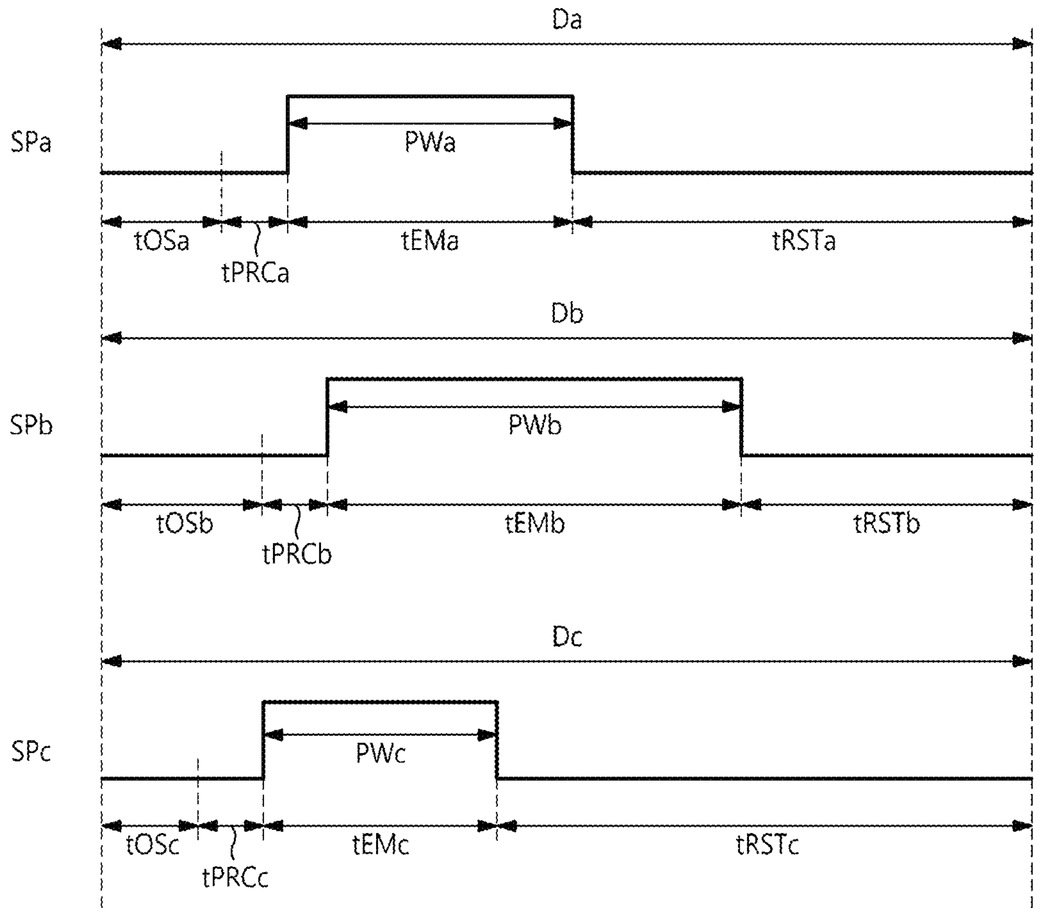
FIG. 25 is a display driving timing diagram for three subpixels of a display device according to exemplary embodiments of the present disclosure.

FIG. 25 is a display driving timing diagram for three subpixels SPa, SPb and SPc of the display device 100 according to exemplary embodiments of the present disclosure.

Referring to FIG. 25, a plurality of pixels P arranged in a display device 100 according to exemplary embodiments of the present disclosure may be classified into k subpixels. The k may be a natural number greater than or equal to 2. For example, k may be 3. In this case, the k subpixels may be three subpixels SPa, SPb and SPc.

Referring to FIG. 25, if k is 3, each of a plurality of pixels P arranged in a display device 100 according to exemplary embodiments of the present disclosure may include three subpixels SPa, SPb and SPc. For example, the three subpixels SPa, SPb and SPc may include a first subpixel SPa including a first light emitting device EDa that emits a first color light, a second subpixel SPb including a second light emitting device EDb that emits a second color light, and a third subpixel SPc including a third light emitting device EDc that emits a third color light. As one example, the first subpixel SPa, the second subpixel SPb, and the third subpixel SPc may emit any one of red light, green light, and blue light, without being limited thereto. For example, the first color light, the second color light, and the third color light may be red light, green light, and blue light, respectively, but are not limited thereto.

Referring to FIG. 25, the display driving period D may include a first display driving period Da, a second display driving period Db, and a third display driving period Dc. The first display driving period Da may include a first pre-charge period tPRCa, a first emission period tEMa, and a first reset period tRSTa for the first subpixel SPa. The second display driving period Db may include a second pre-charge period tPRCb, a second emission period tEMb, and a second reset period tRSTb for the second subpixel SPb. The third display driving period Dc may include a third pre-charge period tPRCc, a third emission period tEMc, and a third reset period tRSTc for the third subpixel SPc.

Referring to FIG. 25, according to the display device 100 according to the embodiments of the present disclosure, the timing of the first emission period tEMa, the timing of the second emission period tEMb, and the timing of the third emission period tEMc may be different from each other, without being limited thereto.

Referring to FIG. 25, according to the display device 100 according to the embodiments of the present disclosure, a first length PWa of the first emission period tEMa, a second length PWb of the second emission period tEMb, and a third length PWc of the third emission period tEMc may be different from each other, without being limited thereto. For example, the second length PWb of the second emission period tEMb may be longer than the first length PWa of the first emission period tEMa and the third length PWc of the third emission period tEMc, without being limited thereto.

The three graphs illustrated in FIG. 25 may be signal waveforms of one of the first emission control signal EM1 and the second emission control signal EM2 for each of the three subpixels SPa, SPb and SPc. For example, according to the display device 100 according to the embodiments of the present disclosure, the first length PWa of the first emission period tEMa, the second length PWb of the second emission period tEMb, and the third length PWc of the third emission period tEMc may each correspond to brightness to be expressed in the corresponding subpixel, correspond to an image signal (e.g., image data) corresponding to the corresponding subpixel, or correspond to a length of a turn-on level voltage section of an emission control signal in the column driver C-DRV. For example, the emission control signal in the column driver C-DRV is a display driving control signal supplied from a controller (e.g., a timing controller) to the column driver C-DRV, and may include the first emission control signal EM1 of FIGS. 5, 8, and 9, and may further include the second emission control signal EM2 of FIG. 9. For example, the turn-on level voltage section of the emission control signal may be a high level voltage section or a low level voltage section.

Referring to FIG. 25, according to the display device 100 according to the embodiments of the present disclosure, the first display driving period Da may further include a first offset period tOSa before the first pre-charge period tPRCa, the second display driving period Db may further include a second offset period tOSb before the second pre-charge period tPRCb, and the third display driving period Dc may further include a third offset period tOSc before the third pre-charge period tPRCc.

Referring to FIG. 25, according to the display device 100 according to the embodiments of the present disclosure, the timing of the first offset period tOSa, the timing of the second offset period tOSb, and the timing of the third offset period tOSc may be different from each other, without being limited thereto.

Referring to FIG. 25, according to the display device 100 according to the embodiments of the present disclosure, the length of the first offset period tOSa, the length of the second offset period tOSb, and the length of the third offset period tOSc may be different from each other, without being limited thereto. For example, the e length of the second offset period tOSb may be longer than the length of the first offset period tOSa and the length of the third offset period tOSc.

Hereinafter, it will be described the driving of the row line RL and the column line CL during the display driving period D in more detail with reference to FIG. 26.

Figure 26:
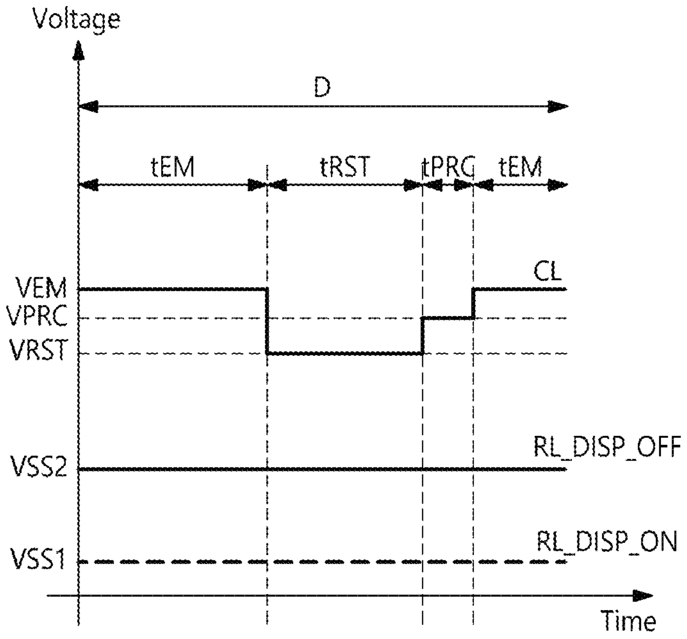
FIG. 26 is a driving timing diagram for a row line and a column line during a display driving period of a display device according to exemplary embodiments of the present disclosure.

FIG. 26 is a driving timing diagram for the row line RL and the column line CL during the display driving period D of the display device 100 according to the embodiments of the present disclosure.

Referring to FIG. 26, according to the display device 100 according to the embodiments of the present disclosure, during the display driving period D, at least one first row line RL_DISP_ON among the plurality of row lines RL is supplied with a first low-potential voltage VSS1. At least one second row line RL_DISP_OFF different from at least one first row line RL_DISP_ON among the plurality of row lines RL may be applied with a second low-potential voltage VSS2 higher than the first low-potential voltage VSS1.

As an example, at least one first row line RL_DISP_ON and at least one second row line RL_DISP_OFF may be arranged in one unit driving area UDA. In this case, at least one first row line RL_DISP_ON and at least one second row line RL_DISP_OFF may be electrically connected to the same driver DRV. At least one first row line RL_DISP_ON and at least one second row line RL_DISP_OFF may be driven by the same driver DRV.

As another example, at least one first row line RL_DISP_ON and at least one second row lines RL_DISP_OFF may be arranged in different unit driving areas UDAs. In this case, at least one first row line RL_DISP_ON and at least one second row line RL_DISP_OFF may be electrically connected to different drivers DRV. At least one first row line RL_DISP_ON and at least one second row line RL_DISP_OFF may be driven by different drivers DRV.

During the display driving period D, the light emitting devices ED overlapping with at least a portion of at least one first row line RL_DISP_ON may emit light, and the light emitting devices ED overlapping with at least a portion of at least one second row line RL_DISP_OFF may not emit light.

Referring to FIG. 26, the display driving period D may include a pre-charge period tPRC, an emission period tEM, and a reset period tRST.

During the pre-charge period tPRC, the emission period tEM, and the reset period tRST, a first low-potential voltage VSS1 may be applied to at least one first row line RL_DISP_ON, and a second low-potential voltage VSS2 can be applied to at least one second row line RL_DISP_OFF.

During the pre-charge period tPRC, a display driving pre-charge voltage VPRC may be applied to at least one column line CL among the plurality of column lines CL. Here, the display driving pre-charge voltage VPRC may be a constant voltage or a variable voltage.

During the emission period tEM, an emission driving voltage VEM may be applied to at least one column line CL. Here, the emission driving voltage VEM may be a display voltage for displaying an image.

During the reset period tRST, a display driving reset voltage VRST may be applied to at least one column line CL. Here, the display driving reset voltage VRST may be a constant voltage or a variable voltage.

The voltage applied to the column line CL may be referred to as a column line voltage and may also be referred to as an anode voltage or a cathode voltage. The pre-charge voltage for display driving VPRC, the emission driving voltage VEM, and the reset voltage for display driving VRST may be column line voltages having different purposes depending on the driving timing.

For example, among the pre-charge voltage for display driving VPRC, the emission driving voltage VEM, and the reset voltage for display driving VRST, the reset voltage for display driving VRST may have the lowest voltage value, and the emission driving voltage VEM may have the highest voltage value, without being limited thereto. For example, the pre-charge voltage for display driving VPRC may be larger than the reset voltage for display driving VRST and smaller than the emission driving voltage VEM, without being limited thereto.

As an example, at least one column line CL may intersect with at least one first row line RL_DISP_ON and at least one second row line RL_DISP_OFF. In this case, at least one column line CL, at least one first row line RL_DISP_ON, and at least one second row line RL_DISP_OFF may be arranged in the same unit driving area UDA. At least one column line CL, at least one first row line RL_DISP_ON, and at least one second row line RL_DISP_OFF may be electrically connected to the same driver DRV. At least one column line CL, at least one first row line RL_DISP_ON, and at least one second row line RL_DISP_OFF may be driven by the same driver DRV.

In another example, the at least one column line CL may not intersect with the at least one first row line RL_DISP_ON and the at least one second row line RL_DISP_OFF. In this case, the at least one column line CL may be arranged in a different unit driving area UDA from the at least one first row line RL_DISP_ON and the at least one second row line RL_DISP_OFF. At least one column line CL may be electrically connected to another driver DRV different from at least one driver DRV that is electrically connected to at least one first row line RL_DISP_ON and at least one second row line RL_DISP_OFF. At least one column line CL may be driven by a driver DRV that is different from the driver DRV driving at least one first row line RL_DISP_ON and at least one second row line RL_DISP_OFF.

In another example, the at least one column line CL may intersect with one of the at least one first row line RL_DISP_ON and the at least one second row line RL_DISP_OFF. In this case, the at least one column line CL may be arranged in the same unit driving area UDA as one of the at least one first row line RL_DISP_ON and the at least one second row line RL_DISP_OFF. At least one column line CL may be electrically connected to at least one driver DRV that is electrically connected to at least one of the first row line RL_DISP_ON and at least one second row line RL_DISP_OFF. At least one column line CL may be driven by a driver DRV driving at least one of the first row line RL_DISP_ON and at least one second row line RL_DISP_OFF.

Figure 27:
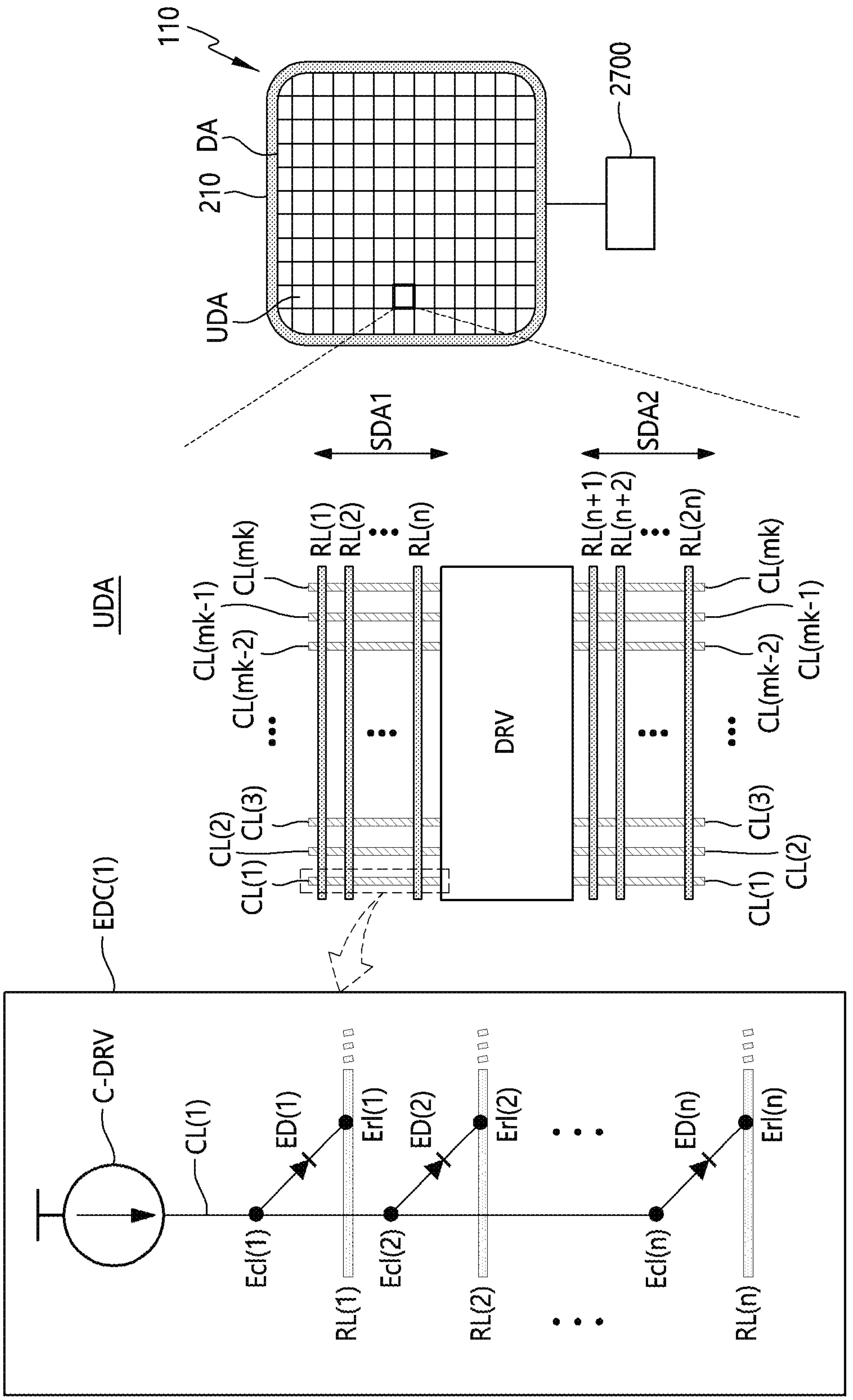
FIG. 27 illustrates a unit driving area of a display device according to exemplary embodiments of the present disclosure and a first light emitting device column within the unit driving area.
Figure 28:
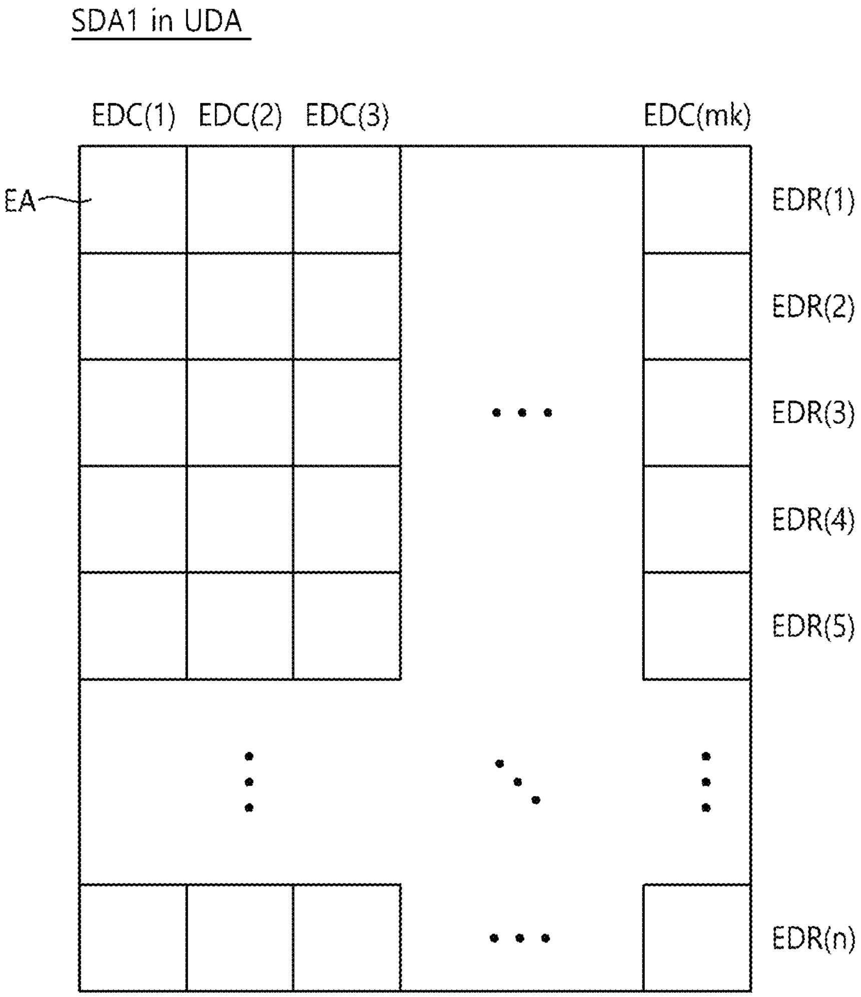
FIG. 28 illustrates an arrangement of light emitting device and emission areas within a first sub-driving area included in a unit driving area of a display device according to exemplary embodiments of the present disclosure.

FIG. 27 illustrates a unit driving area UDA of a display device 100 according to exemplary embodiments of the present disclosure, and a first light emitting device column EDC(1) within the unit driving area UDA. FIG. 28 illustrates an arrangement of light emitting devices and emission areas EA within a first sub-driving area SDA1 included in the unit driving area UDA of a display device 100 according to exemplary embodiments of the present disclosure.

Referring to FIG. 27, the display device 100 according to the embodiments of the present disclosure may include a substrate 210 including a display area DA, a plurality of light emitting devices ED arranged in the display area DA, a plurality of column lines CL arranged in the display area DA and extending in the column direction, a plurality of row lines RL arranged in the display area DA and extending in the row direction, and a plurality of drivers DRV arranged on the substrate 210 and configured to drive the plurality of column lines CL and the plurality of row lines RL. For example, a metal layer on which the plurality of column lines CL are arranged and a metal layer on which the plurality of row lines RL are arranged may be different from each other.

Referring to FIG. 27, the display device 100 according to the embodiments of the present disclosure may include a controller 2700 configured to output image data or a control signal corresponding to the image data to each of the plurality of drivers DRV.

Referring to FIG. 27, the substrate 210, the plurality of light emitting devices ED, the plurality of column lines CL, and the plurality of row lines RL are included in the display panel 110 of the display device 100, and the controller 2700 may be included outside the display panel 110. For example, the controller 2700 may be mounted on a flexible printed circuit 102 or a printed circuit board 104.

Referring to FIG. 27, the display area DA of the display panel 110 of the display device 100 according to the embodiments of the present disclosure may include a plurality of unit driving areas UDAs, and each of the plurality of unit driving areas UDA may be an area driven by one driver DRV.

Each of the plurality of unit driving areas UDA may include a separate driver DRV as well as a separate line structure. Here, the line structure may include a plurality of row lines RL and a plurality of column lines CL. For example, the plurality of unit driving areas UDA may include a first unit driving area and a second unit driving area. Two or more row lines RL included in the first unit driving area and two or more row lines RL included in the second unit driving area may be spaced apart from each other or electrically isolated, and two or more column lines CL included in the first unit driving area and two or more column lines CL included in the second unit driving area may be spaced apart from each other or electrically isolated.

Each of the plurality of unit driving areas UDA may include two or more column lines CL(1) to CL(m×k) among the plurality of column lines CL and may include two or more row lines RL(1) to RL(2*n*) among the plurality of row lines RL.

For example, two or more column lines CL(1) to CL(m×k) and two or more row lines RL(1) to RL(2*n*) arranged in each of the plurality of unit driving areas UDA may intersect each other. That is, in each of the plurality of unit driving areas UDA, each of two or more row lines RL(1) to RL(2*n*) may intersect with two or more column lines CL(1) to CL(m×k).

For example, in each of the plurality of unit driving areas UDA, the metal layer on which the two or more column lines CL(1) to CL(m×k) are arranged and the metal layer on which the two or more row lines RL(1) to RL(2*n*) are arranged may be different from each other. That is, in each of the plurality of unit driving areas UDAs, each of the two or more row lines RL(1) to RL(2*n*) may overlap with two or more column lines CL(1) to CL(m×k).

For example, each of the plurality of unit driving areas UDAs may include a first sub-driving area SDA1 and a second sub-driving area SDA2. The first sub-driving area SDA1 may include two or more column lines CL(1) to CL(m×k) and two or more row lines RL(1) to RL(n) that intersect with each other. The second sub-driving area SDA2 may include two or more column lines CL(1) to CL(m×k) and two or more row lines RL(n+1) to RL(2*n*) that intersect each other.

Here, n may be the number of row lines RL included in each of the first sub-driving area SDA1 and the second sub-driving area SDA2 or the number of pixel rows included in each of the first sub-driving area SDA1 and the second sub-driving area SDA2.

In addition, m may be the number of pixel columns included in each of the first sub-driving area SDA1 and the second sub-driving area SDA2. The k may be the number of subpixels included in one pixel or the number of light emitting devices ED included in one pixel.

In addition, mk may be (m×k), which may be the number of subpixel columns or light emitting device columns included in each of the first sub-driving area SDA1 and the second sub-driving area SDA2, and may be the number of column lines CL included in each of the first sub-driving area SDA1 and the second sub-driving area SDA2.

The first sub-driving area SDA1 included in each of the plurality of unit driving areas UDA may include light emitting devices ED arranged in each of the areas or points where two or more column lines CL(1) to CL(mk) and two or more row lines RL(1) to RL(n) intersect. The second sub-driving area SDA2 included in each of the plurality of unit driving areas UDA may include light emitting devices ED arranged in each of the areas or points where two or more column lines CL(1) to CL(mk) and two or more row lines RL(n+1) to RL(2*n*) intersect.

Accordingly, each of the plurality of column lines CLs may be electrically connected in common with a first electrode of each of two or more light emitting devices ED arranged in the same column among the plurality of light emitting devices ED. Each of the plurality of row lines RL may be electrically connected in common with a second electrode of each of two or more light emitting devices ED arranged in the same row among the plurality of light emitting devices ED.

For example, the first sub-driving area SDA1 may include n row lines RL(1) to RL(n) and (mk) column lines CL(1) to CL(mk) intersecting each other. At each point where n row lines RL(1) to RL(n) and (mk) column lines CL(1) to CL(mk) intersect each other, a light emitting device ED may be arranged.

For example, in the first sub-driving area SDA1, the second electrodes of the mk light emitting devices ED arranged in the first row (i.e., the first light emitting device row) may be electrically connected in common to the first row line RL(1). In the first sub-driving area SDA1, the first electrodes of the mk light emitting devices ED arranged in the first row (i.e., the first light emitting device row) may be electrically connected to the first to (mk)-th column lines CL(1) to CL(mk), respectively.

For example, referring to FIG. 27, in the first sub-driving area SDA1, the first electrodes Ecl(1) to Ecl(n) of the n light emitting devices ED(1) to ED(n) arranged in the first column (i.e., the first light emitting device column EDC(1)) may be electrically connected in common to the first column line CL(1). In the first sub-driving area SDA1, the second electrodes Erl(1) to Erl(n) of the n light emitting devices ED(1) to ED(n) arranged in the first column (i.e., the first light emitting device column (EDC(1)) may be electrically connected to the first to n-th row lines RL(1) to RL(n), respectively.

Referring to FIG. 27, the first column line CL(1) may receive current (or voltage) from the column driver C-DRV.

The display-on driving for each of the first to n-th row lines RL(1) to RL(n) may be sequentially performed. If the first low-potential voltage VSS1, which is a low-potential voltage for display-on driving, is applied to the first row line RL(1), the current supplied from the column driver C-DRV can be supplied to the first light emitting device ED(1). At this time, the current supplied from the column driver C-DRV is not supplied to the second to n-th light emitting devices ED(2) to ED(n).

Subsequently, if the first low-potential voltage VSS1, which is a low-potential voltage for display-on driving, is applied to the second row line RL(2), the current supplied from the column driver C-DRV can be supplied to the second light emitting device ED(2). At this time, the current supplied from the column driver C-DRV is not supplied to the first light emitting device ED(1) and the third to n-th light emitting devices ED(3) to ED(n).

Referring to FIG. 28, one unit driving area UDA may include a plurality of light emitting devices ED arranged in a matrix form, and may include a plurality of emission areas EA that emit light by the plurality of light emitting devices ED. For example, one unit driving area UDA may include a plurality of emission areas EA formed by the plurality of light emitting devices ED, without being limited thereto.

Referring to FIG. 28, for example, a first sub-driving area SDA1 included in one unit driving area UDA may have (n×m×k) light emitting devices ED arranged in n rows and (mk) columns. Accordingly, the first sub-driving area SDA1 included in one unit driving area UDA may include (n×m×k) emission areas EA formed by (n×m×k) light emitting devices ED.

Referring to FIG. 28, for example, a first sub-driving area SDA1 included in one unit driving area UDA may include (mk) light emitting device columns EDC(1) to EDC(mk) and n light emitting device rows EDR(1) to EDR(n). That is, the first sub-driving area SDA1 may include the first to (mk)-th light emitting device columns EDC(1) to EDC(mk). The first sub-driving area SDA1 may include the first to n-th light emitting device rows EDR(1) to EDR(n).

Each of the first to n-th light emitting device rows EDR(1) to EDR(n) may include (mk) light emitting devices. Each of the first to n-th light emitting device rows EDR(1) to EDR(n) may include (mk) emission areas EA formed by (mk) light emitting devices. One row line RL may be arranged in each of the first to n-th light emitting device rows EDR(1) to EDR(n). For example, the number of types of colors of light emitted by the (mk) light emitting devices included in each of the first to n-th light emitting device rows EDR(1) to EDR(n) may be k, without being limited thereto.

Each of the first to (mk)-th light emitting device columns EDC(1) to EDC(mk) may include n light emitting devices. Each of the first to (mk)-th light emitting device columns EDC(1) to EDC(mk) may include n emission areas EA formed by n light emitting devices. Each of the first to (mk)-th light emitting device columns EDC(1) to EDC(mk) may have one column line CL. For example, the n light emitting devices included in each of the first to (mk)-th light emitting device columns EDC(1) to EDC(mk) may emit light of the same color.

In the case of having a redundancy structure as illustrated in FIGS. 12 and 13, each of the first to (mk)-th light emitting device columns EDC(1) to EDC(mk) may include (2*n) light emitting devices. Each of the first to (mk)-th light emitting device columns EDC(1) to EDC(mk) may have two column lines CL. For example, the (2*n) light emitting devices included in each of the first to (mk)-th light emitting device columns EDC(1) to EDC(mk) may include n main light emitting devices and n redundancy light emitting devices. The two column lines CL arranged in each of the first to (mk)-th light emitting device columns EDC(1) to EDC(mk) may include a main column line and a redundancy column line.

FIGS. 29, 30, 31A, 31B, 32, and 33 are diagrams illustrating driving of the first light emitting device column EDC(1) in the display device 100 according to exemplary embodiments of the present disclosure. FIGS. 27 and 28 may also be referred to in the following description.

Figure 29:
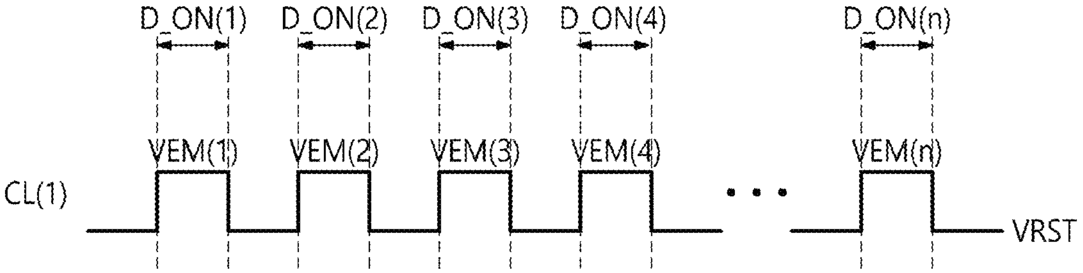
FIG. 29, FIG. 30, FIG. 31A, FIG. 31B, FIG. 32, and FIG. 33 are diagrams illustrating driving for a first light emitting device column in a display device according to exemplary embodiments of the present disclosure.
Figure 30:
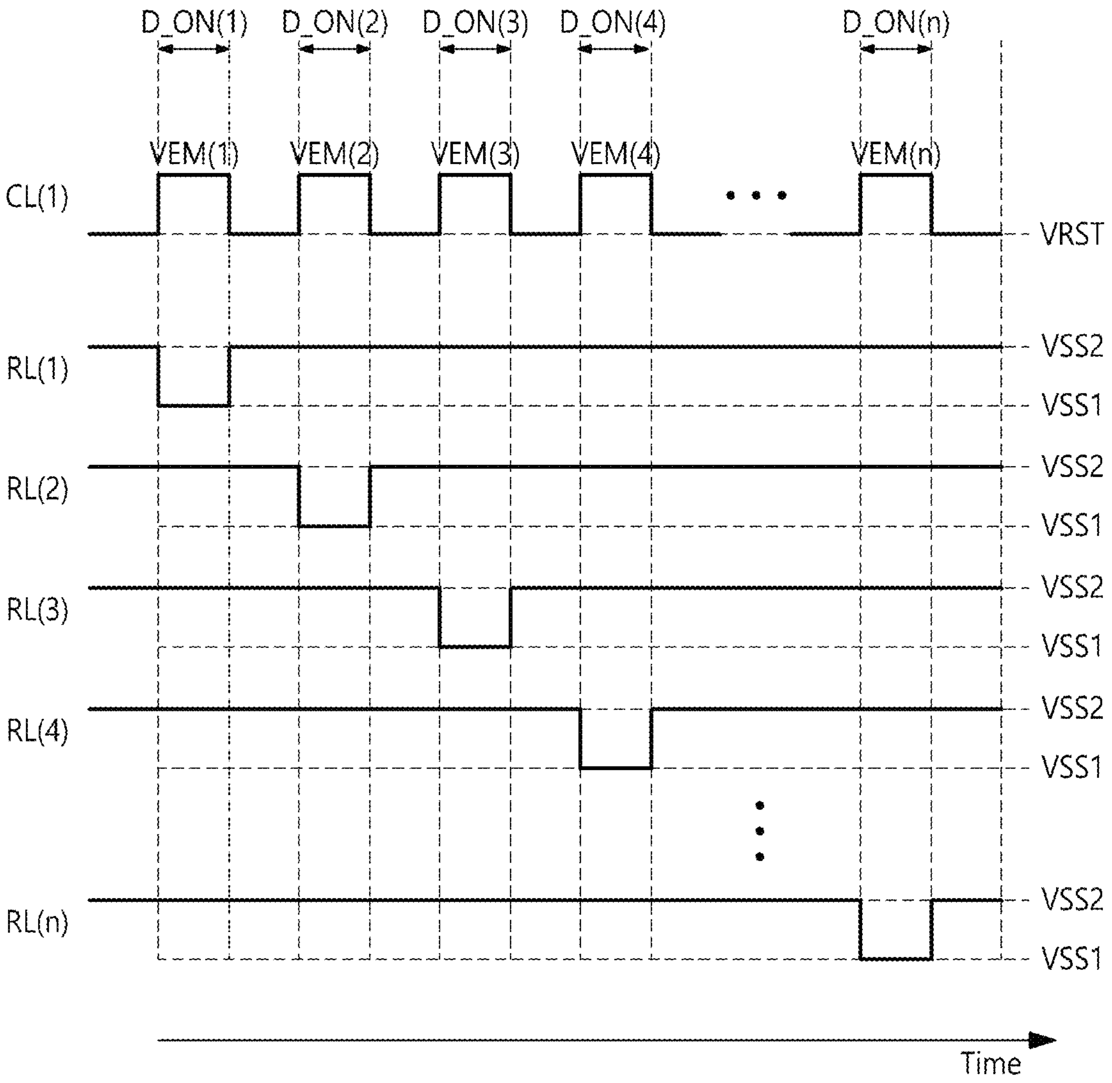

FIG. 29 illustrates the voltage change of the first column line CL(1) arranged in the first light emitting device column EDC(1) in relation to driving the first light emitting device column EDC(1), and FIG. 30 is a driving timing diagram for the first light emitting device column EDC(1).

Referring to FIG. 29 and FIG. 30, in relation to driving the first light emitting device column EDC(1), the first column line CL(1) arranged in the first light emitting device column EDC(1) is sequentially supplied with the first to n-th display voltages VEM(1) to VEM(n) during the first to n-th display-on driving periods D_ON(1) to D_ON(n).

Referring to FIGS. 29 and 30, the first to n-th display-on driving periods D_ON(1) to D_ON(n) may be temporally separated from each other and may be sequentially performed. In a time section other than the first to n-th display-on driving periods D_ON(1) to D_ON(n), a reset voltage VRST may be applied to the first column line CL(1). That is, a reset voltage VRST may be applied to the first column line CL(1) between the first to n-th display-on driving periods D_ON(1) to D_ON(n).

Referring to FIG. 30, the first to n-th display-on driving periods D_ON(1) to D_ON(n) may correspond to periods in which a first low-potential voltage VSS1, which is a display-on driving voltage (i.e., a display-on driving low-potential voltage), is applied to the first to n-th row lines RL(1) to RL(n) intersecting the first column line CL(1).

That is, during the first to n-th display-on driving periods D_ON(1) to D_ON(n), the first low-potential voltage VSS1, which is a low-potential voltage for display-on driving, may be sequentially applied to the first to n-th row lines RL(1) to RL(n).

For example, during the first to n-th display-on driving periods D_ON(1) to D_ON(n), the first low-potential voltage VSS1, which is a low-potential voltage for display-on driving, may be sequentially applied to any one of the first to n-th row lines RL(1) to RL(n), and the second low-potential voltage VSS2, which is a voltage for display-off driving (i.e., low-potential voltage for display-off driving), may be applied to remaining row lines of the first to n-th row lines RL(1) to RL(n), without being limited thereto.

For example, during the first display-on driving period D_ON(1), the first low-potential voltage VSS1 may be applied to the first row line RL(1), and the second low-potential voltage VSS2, which is a voltage for display-off driving (i.e., low-potential voltage for display-off driving), may be applied to the second to n-th row lines RL(2) to RN(n). During the second display-on driving period D_ON (2), a first low-potential voltage VSS1 may be applied to the second row line RL(2), and a second low-potential voltage VSS2 may be applied to the first row line RL(1) and the third to n-th row lines RL(3) to RL(n). During the third display-on driving period D_ON(3), a first low-potential voltage VSS1 may be applied to the third row line RL(3), and a second low-potential voltage VSS2 may be applied to the first and second row lines RL(1) and RL(2), and the fourth to n-th row lines RL(4) to RL(n). During the n-th display-on driving period D_ON(n), a first low-potential voltage VSS1 may be applied to the n-th row line RL(n), and a second low-potential voltage VSS2, which is a low-potential voltage for display-off driving, may be applied to the first to (n−1)-th row lines RL(1) to RL(n−1).

During the first to n-th display-on driving periods D_ON (1) to D_ON(n), the first to n-th light emitting devices ED(1) to ED(n) connected to the first to n-th row lines RL(1) to RL(n) may sequentially emit normal light.

For example, during the first to n-th display-on driving periods D_ON(1) to D_ON(n), the first to n-th light emitting devices ED(1) to ED(n) may sequentially emit light normally.

Figure 31A:
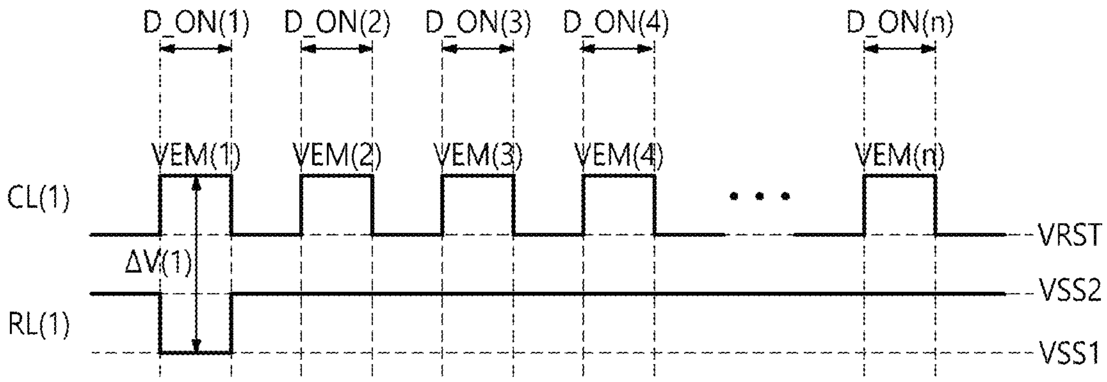
Figure 31B:
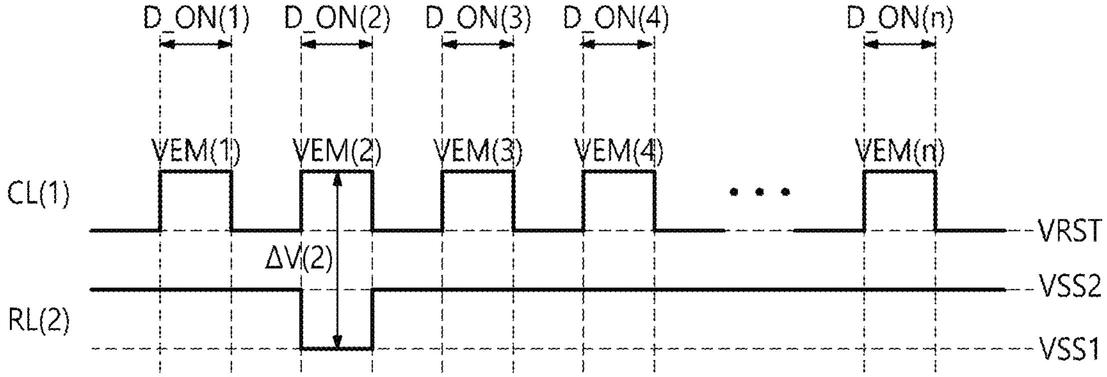

FIG. 31A is a driving timing diagram for the first row line RL(1) and the first column line CL(1) when the first light emitting device column EDC(1) is driven, and FIG. 31B is a driving timing diagram for the second row line RL(2) and the first column line CL(1) when the first light emitting device column EDC(1) is driven.

Referring to FIG. 31A, during the first display-on driving period D_ON(1), the first display voltage VEM(1) may be applied to the first column line CL(1) and the first low-potential voltage VSS1 may be applied to the first row line RL(1). At this time, the voltage difference between the first column line CL(1) and the first row line RL(1) may be a first voltage ΔV(1).

Referring to FIG. 31A, a first light emitting device ED(1) may be connected between the first column line CL(1) and the first row line RL(1). For example, a first electrode Ecl(1) of the first light emitting device ED(1) may be electrically connected to the first column line CL(1), and a second electrode Erl(1) of the first light emitting device ED(1) may be electrically connected to the first row line RL(1).

Figure 32:
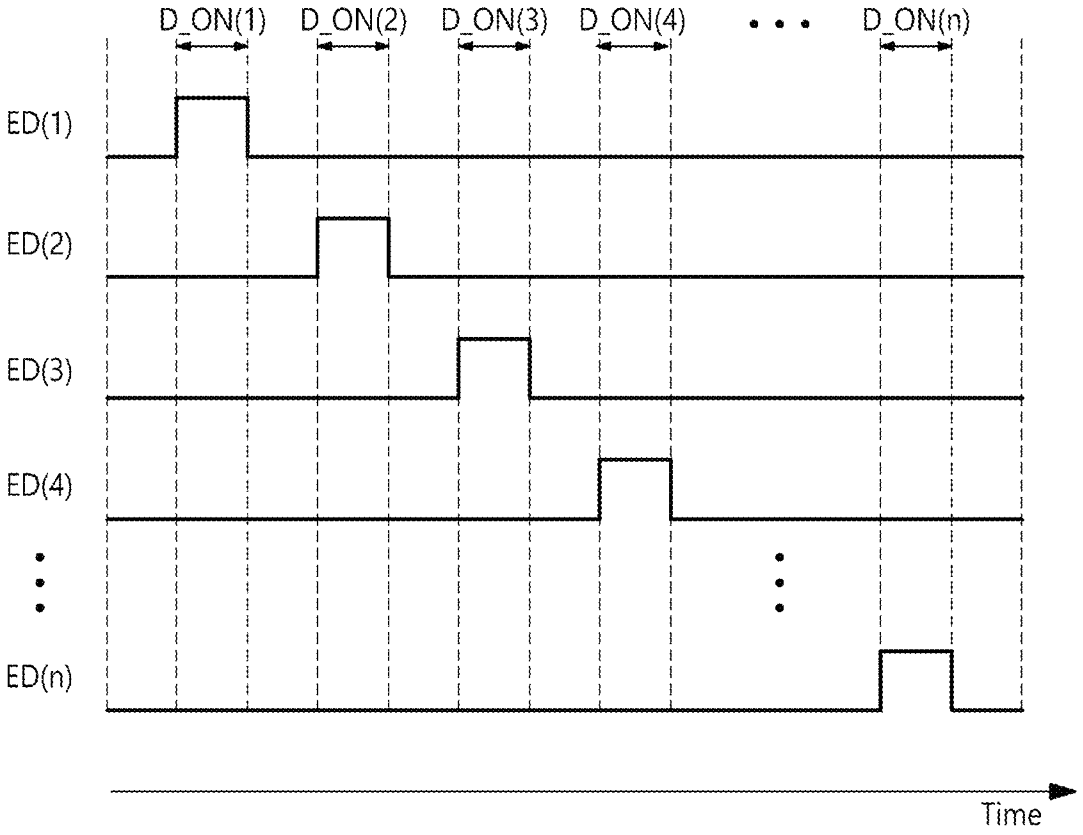

Referring to FIG. 31A, a voltage difference (VEM(1)−VSS1) between the first column line CL(1) and the first row line RL(1) may be a voltage difference (VEM(1)−VSS1) between the first electrode Ecl(1) and the second electrode Erl(1) of the first light emitting device ED(1). Therefore, the voltage difference (VEM(1)−VSS1) between the first electrode Ecl(1) and the second electrode Erl(1) of the first light emitting device ED(1) may be the first voltage ΔV(1). The first voltage ΔV(1) may be higher than the threshold voltage of the first light emitting device ED(1). Therefore, as illustrated in FIG. 32, during the first display-on driving period D_ON(1), the first light emitting device ED(1) may emit light by the current supplied from the column driver C-DRV.

Referring to FIG. 31B, during the second display-on driving period D_ON(2), a second display voltage VEM(2) may be applied to the first column line CL(1), and the first low-potential voltage VSS1 may be applied to the second row line RL(2). At this time, the voltage difference between the first column line CL(1) and the second row line RL(2) may be a second voltage ΔV(2).

Referring to FIG. 31B, a second light emitting device ED(2) may be connected between the first column line CL(1) and the second row line RL(2). For example, the first electrode Ecl(2) of the second light emitting device ED(2) may be electrically connected to the first column line CL(1), and the second electrode Erl(2) of the second light emitting device ED(2) may be electrically connected to the second row line RL(2).

Referring to FIG. 31B, the voltage difference between the first column line CL(1) and the second row line RL(2) may be the voltage difference between the first electrode Ecl(2) and the second electrode Erl(2) of the second light emitting device ED(2). Therefore, the voltage difference (VEM(2)−VSS1) between the first electrode Ecl(2) and the second electrode Erl(2) of the second light emitting device ED(2) may be the second voltage ΔV(2). The second voltage ΔV(2) may be higher than the threshold voltage of the second light emitting device ED(2). Therefore, as illustrated in FIG. 32, during the second display-on driving period D_ON(2), the second light emitting device ED(2) may emit light by the current supplied from the column driver C-DRV.

FIG. 32 illustrates the light emission luminance of n light emitting devices ED(1) to ED(n) arranged in the first light emitting device column EDC(1) when the first light emitting device column EDC(1) is driven.

Referring to FIG. 32, during the first to n-th display-on driving periods D_ON(1) to D_ON(n), the first to n-th light emitting devices ED(1) to ED(n) may sequentially emit light normally.

Figure 33:
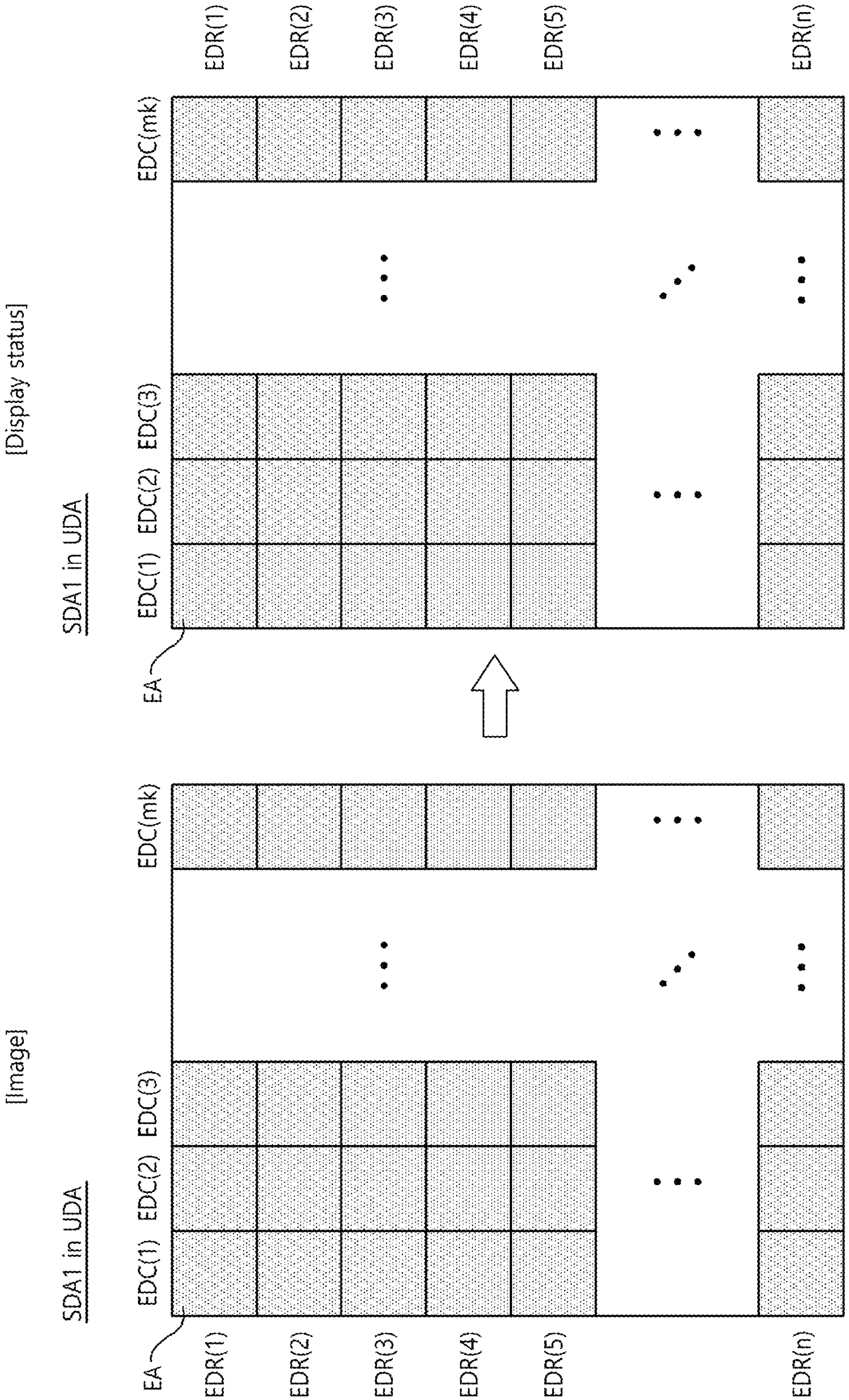

FIG. 33 illustrates an image and display state for the first sub-driving area SDA1 if all light emitting devices ED arranged in the first sub-driving area SDA1 included in the unit driving area UDA are normal. For example, the light emitting device ED being normal may mean that the light emitting device ED is arranged at a corresponding position and normal current can flow through the light emitting device ED.

Referring to FIG. 33, if all light emitting devices ED arranged in the first sub-driving area SDA1 included in the unit driving area UDA are normal, the display state of the first sub-driving area SDA1 may be the same or substantially the same as the image (or image data) to be expressed in the first sub-driving area SDA1.

If all light emitting devices ED in the first sub-driving area SDA1 are normal, the light emission state (or light emission luminance) of each of the plurality of emission areas EA included in the first sub-driving area SDA1 may be the same or substantially the same as the image (or image data) of each of the plurality of emission areas EA included in the first sub-driving area SDA1.

Figure 34:
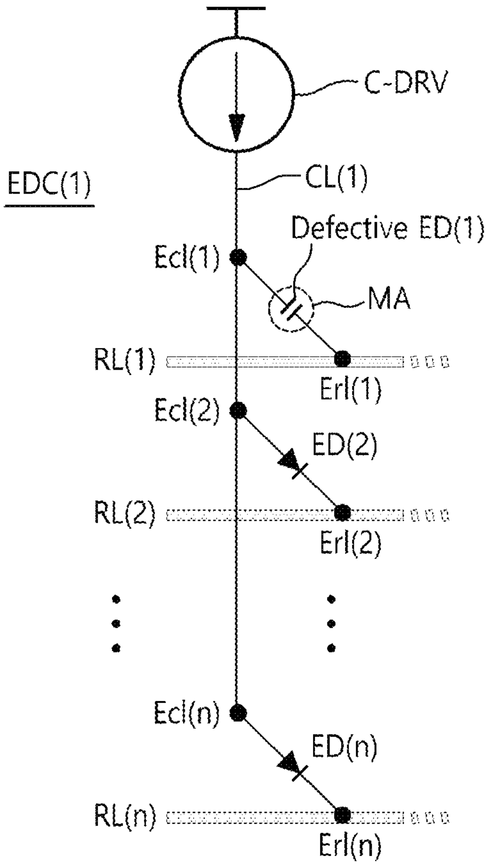
FIG. 34 illustrates a first light emitting device column having a defective point in a display device according to exemplary embodiments of the present disclosure.

FIG. 34 illustrates a first light emitting device column EDC(1) having a defective point in a display device 100 according to exemplary embodiments of the present disclosure. FIGS. 27 to 33 are also referred to in the following description.

Referring to FIG. 34, the plurality of light emitting devices ED may include a defective first light emitting device ED(1) with a defect, or there may be a missing area MA in which the first light emitting device ED(1) is missing in the array of the plurality of light emitting devices ED. Such a case may be referred to as a "defect."

The plurality of column lines CL may include a first column line CL(1) that is electrically connected to a first electrode Ecl(1) of the first light emitting device ED(1) or is arranged to overlap with at least a portion of the missing area MA. The plurality of row lines RL may include a first row line RL(1) that is electrically connected to a second electrode Erl(1) of the first light emitting device ED(1) or is arranged to overlap with at least a portion of the missing area MA.

Referring to FIG. 34, for example, a defect of the first light emitting device column EDC(1) included in the unit driving area UDA may include a first type defect in which at least one light emitting device among the first to n-th light emitting devices ED(1) to ED(n) included in the first light emitting device column EDC(1) has a defect, and a second type defect in which at least one missing area MA in which at least one light emitting device is missing exists in the first light emitting device column EDC(1). With respect to the second type defect, if the light emitting device ED is an inorganic-based light emitting diode LED, the missing area MA may be also referred to as an unmounted area, and the second type defect may be a non-transfer defect that occurs when the transfer of the light emitting device ED fails during a transfer process included in the panel manufacturing process.

For example, a defect in the light emitting device may mean that the light emitting device is in an open state or that the light emitting device is in a short-circuit state. An open state of a light emitting device may mean that no current (e.g., no forward current) flows through the light emitting device. A short-circuited state of a light emitting device may mean that the first and second electrodes of the light emitting device are directly connected, allowing abnormal current to flow through the light emitting device.

The missing light emitting device or an omission of the light emitting device may be an electrically similar state to the light emitting device being in an open state.

For example, a defect in the first light emitting device column EDC(1) included in the unit driving area UDA may include a first type defect in which the first light emitting device ED(1) among the first to n-th light emitting devices ED(1) to ED(n) included in the first light emitting device column EDC(1) is defective, and a second type defect in which a missing area MA in which the first light emitting device ED(1) is missing exists in the first light emitting device column EDC(1). According to this example, the defective point in the first light emitting device column EDC(1) may be an area in which a defective first light emitting device ED(1) is arranged or a missing area MA in which the first light emitting device ED(1) is missing.

FIGS. 35, 36, 37A, 37B, 38, and 39 are diagrams illustrating operation when the first light emitting device column EDC(1) has a defective point in the display device 100 according to exemplary embodiments of the present disclosure. In the following description, descriptions of the same contents as those referring to FIGS. 29 to 33 may be omitted.

Figure 35:
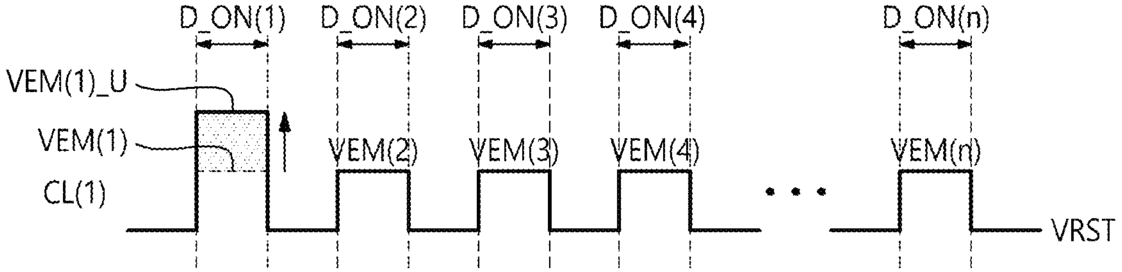
FIG. 35, FIG. 36, FIG. 37A, FIG. 37B, FIG. 38, and FIG. 39 are diagrams illustrating driving in a display device according to exemplary embodiments of the present disclosure in the case that a first light emitting device column has a defective point.
Figure 36:
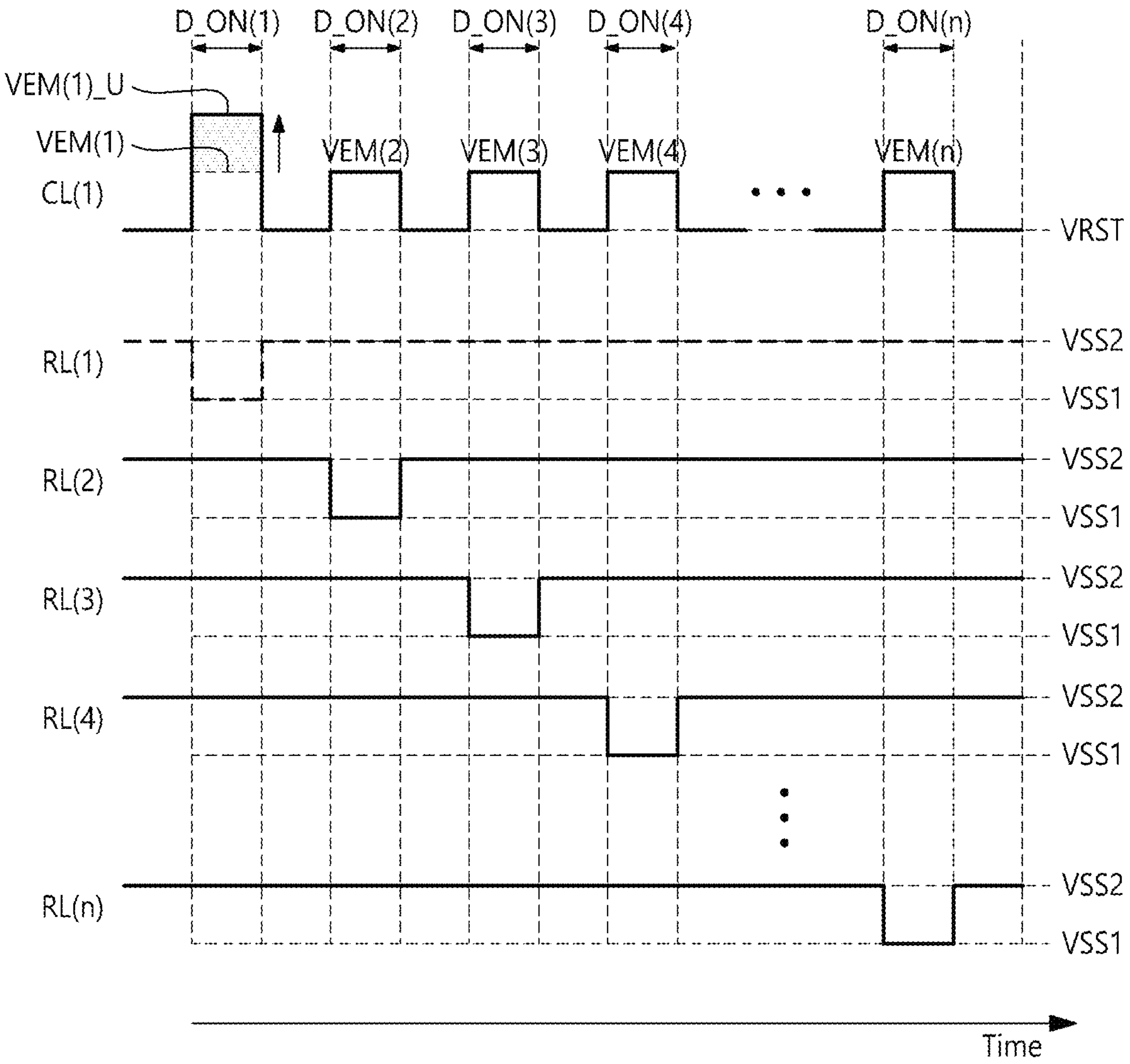

FIG. 35 illustrates voltage changes in the first column line CL(1) arranged in the first light emitting device column EDC(1) when driving the first light emitting device column EDC(1) having a defective point, and FIG. 36 is a driving timing diagram for the first light emitting device column EDC(1) when the first light emitting device column EDC 1) having a defective point is driven.

Referring to FIG. 35 and FIG. 36, during the first display-on driving period D_ON(1), display-on driving may be performed for the first row line RL(1) among the first to n-th row lines RL(1) to RL(n).

Referring to FIG. 35 and FIG. 36, during the first display-on driving period D_ON(1), a first low-potential voltage VSS1, which is a low-potential voltage for display-on driving, may be supplied to the first row line RL(1), and a first display voltage VEM(1) may be supplied to the first column line CL(1).

At this time, if there is a defect in the first light emitting device ED(1) or a defect in which the first light emitting device ED(1) is missing, the first column line CL(1) may have a voltage VEM(1)_U that is higher than the first display voltage VEM(1).

Hereinafter, it will be described the reason of increasing the voltage of the first column line CL(1).

During the first display-on driving period D_ON(1), the first low-potential voltage VSS1, which is a low-potential voltage for display-on driving, is supplied to the first row line RL(1), and when the first display voltage VEM(1) is supplied to the first column line CL(1), the second low-potential voltage VSS2 may be supplied to the second to n-th row lines RL(2) to RL(n). Here, the second low-potential voltage VSS2 is a low-potential voltage for display-off driving and may be a voltage higher than the first low-potential voltage VSS1.

During the second display-on driving period D_ON(2), the first low-potential voltage VSS1, which is a low-potential voltage for display-on driving, may be applied to the second row line RL(2), and a second low-potential voltage VSS2, which is a low-potential voltage for display-off driving, may be applied to the first row line RL(1) and the third to n-th row lines RL(3) to RL(n). Here, the second low-potential voltage VSS2 is a low-potential voltage for display-off driving and may be a voltage higher than the first low-potential voltage VSS1.

If there is a defect in the first light emitting device ED(1) between the first row line RL(1) and the first column line CL(1) or a defect in which the first light emitting device ED(1) is missing, during the first display-on driving period D_ON(1), the first column line CL(1) is related to the second to n-th row lines RL(2) to RL(n) and is affected by the second low-potential voltage VSS2 higher than the first low-potential voltage VSS1, so that a voltage increase may occur in the first display voltage VEM(1). Here, the magnitude of the voltage rise of the first column line CL(1) may correspond to the voltage difference (VSS2−VSS1) between the second low-potential voltage VSS2 and the first low-potential voltage VSS1.

Figure 37A:
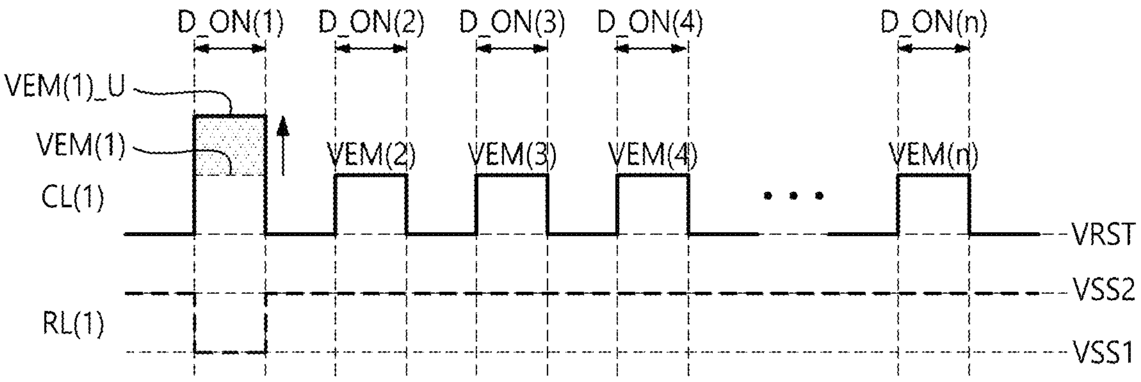
Figure 37B:
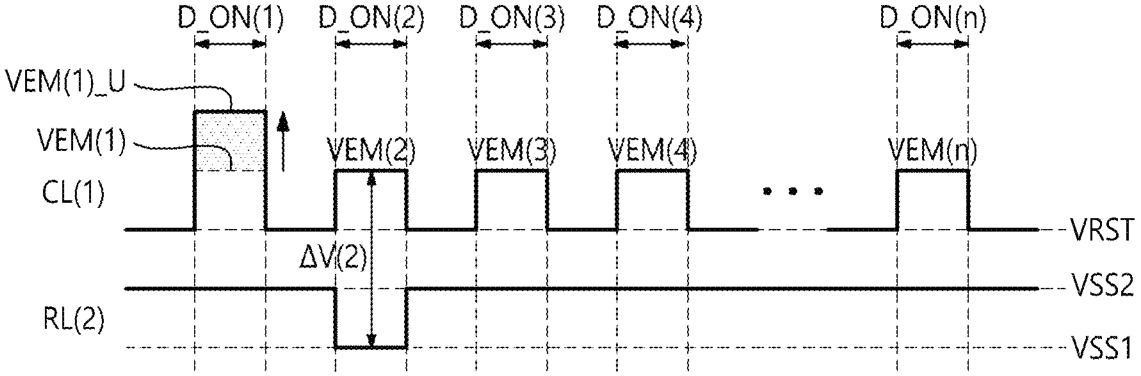

FIG. 37A is a driving timing diagram for the first row line RL(1) and the first column line CL(1) having a defective point when driving the first light emitting device column EDC(1) having a defective point, and FIG. 37B is a driving timing diagram for the second row line RL(2) and the first column line CL(1) having a defective point when driving the first light emitting device column EDC(1) having a defective point.

Referring to FIG. 37A, during the first display-on driving period D_ON(1), the first display voltage VEM(1) may be applied to the first column line CL(1) and the first low-potential voltage VSS1 may be applied to the first row line RL(1). At this time, if there is a defect in the first light emitting device ED(1) or a defect in which the first light emitting device ED(1) is missing, the first column line CL(1) may have a voltage VEM(1)_U that is higher than the first display voltage VEM(1).

Accordingly, the voltage difference (VEM(1)−VSS1) between the first column line CL(1) and the first row line RL(1) may increase, but the first light emitting device ED(1) with a defect (e.g., open state) does not emit light, or there is no light emission in the missing area MA where the first light emitting device ED(1) is missing.

Referring to FIG. 37B, during the second display-on driving period D_ON(2), a second display voltage VEM(2) may be applied to the first column line CL(1) and a first low-potential voltage VSS1 may be applied to the second row line RL(2). At this time, a voltage difference (VEM(2)−VSS1) between the first column line CL(1) and the second row line RL(2) may be a second voltage ΔV(2).

Referring to FIG. 37B, a second light emitting device ED(2) may be connected between the first column line CL(1) and the second row line RL(2). That is, the first electrode Ecl(2) of the second light emitting device ED(2) may be electrically connected to the first column line CL(1), and the second electrode Erl(2) of the second light emitting device ED(2) may be electrically connected to the second row line RL(2).

Referring to FIG. 37B, the voltage difference (VEM(2)−VSS1) between the first column line CL(1) and the second row line RL(2) may be the voltage difference (VEM(2)−VSS1) between the first electrode Ecl(2) and the second electrode Erl(2) of the second light emitting device ED(2). Therefore, the voltage difference (VEM(2)−VSS1) between the first electrode Ecl(2) and the second electrode Erl(2) of the second light emitting device ED(2) may be the second voltage ΔV(2). The second voltage ΔV(2) may be higher than the threshold voltage of the second light emitting device ED(2). Therefore, during the second display-on driving period D_ON(2), the second light emitting device ED(2) may emit light by the current supplied from the column driver C-DRV.

Figure 38:
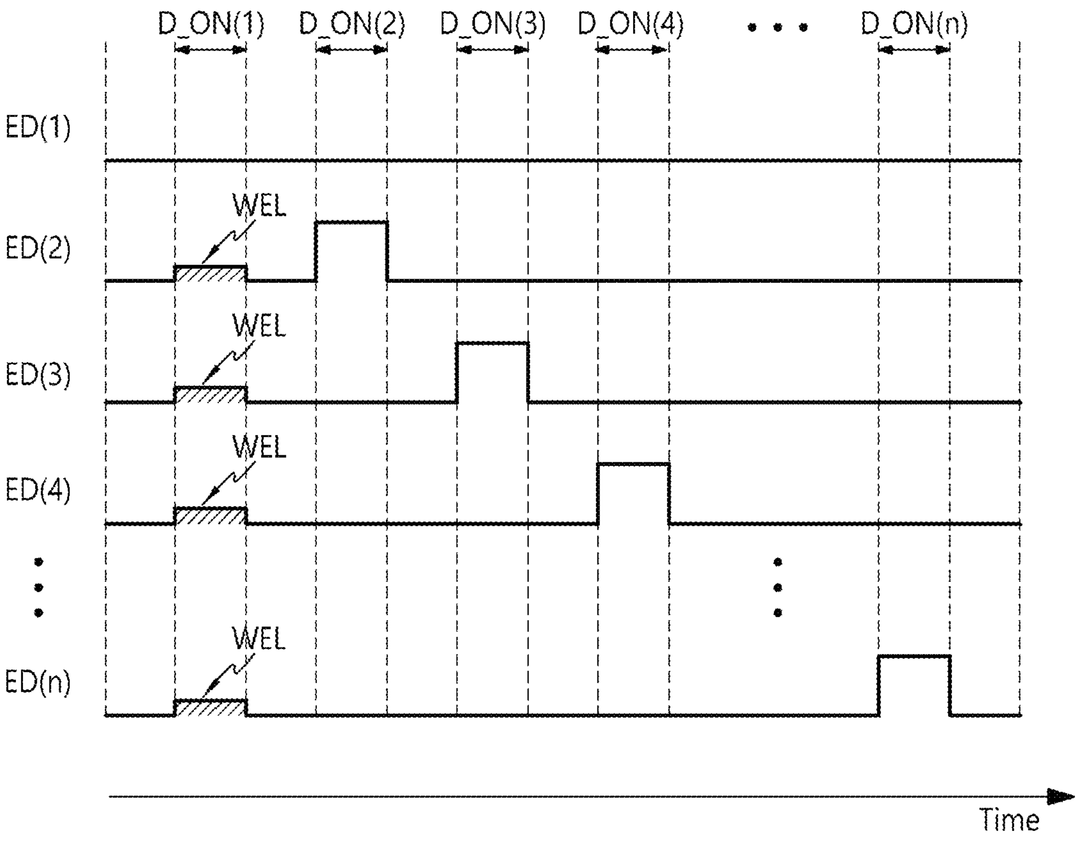

FIG. 38 illustrates the light emission luminance of n light emitting devices ED(1) to ED(n) arranged in the first light emitting device column EDC(1) when driving the first light emitting device column EDC(1) having a defective point.

Referring to FIG. 38, during the first display-on driving period D_ON(1), the first light emitting device ED(1) does not emit light due to a defect or omission of the first light emitting device ED(1), or there is no emission in an area where the first light emitting device ED(1) is missing. In comparison, during the second to n-th display-on driving periods D_ON(2) to D_ON(n), the normal second to n-th light emitting devices ED(2) to ED(n) can sequentially emit normal light.

During the first display-on driving period D_ON(1), due to a defect or omission of the first light emitting device ED(1), the current supplied from the column driver C-DRV to the first column line CL(1) may be divided and flow to the first electrodes Ecl(2) to Ecl(n) of the second to n-th light emitting devices ED(2) to ED(n). For example, 1/(n−1) of the current I(1) supplied from the column driver C-DRV to the first column line CL(1) may flow to each of the first electrodes Ecl(2) to Ecl(n) of the second to n-th light emitting devices ED(2) to ED(n).

As a result, during the first display-on driving period D_ON(1), due to a defect or omission of the first light emitting device ED(1), unwanted weak light emission WEL may occur in the second to n-th light emitting devices ED(2) to ED(n).

Figure 39:
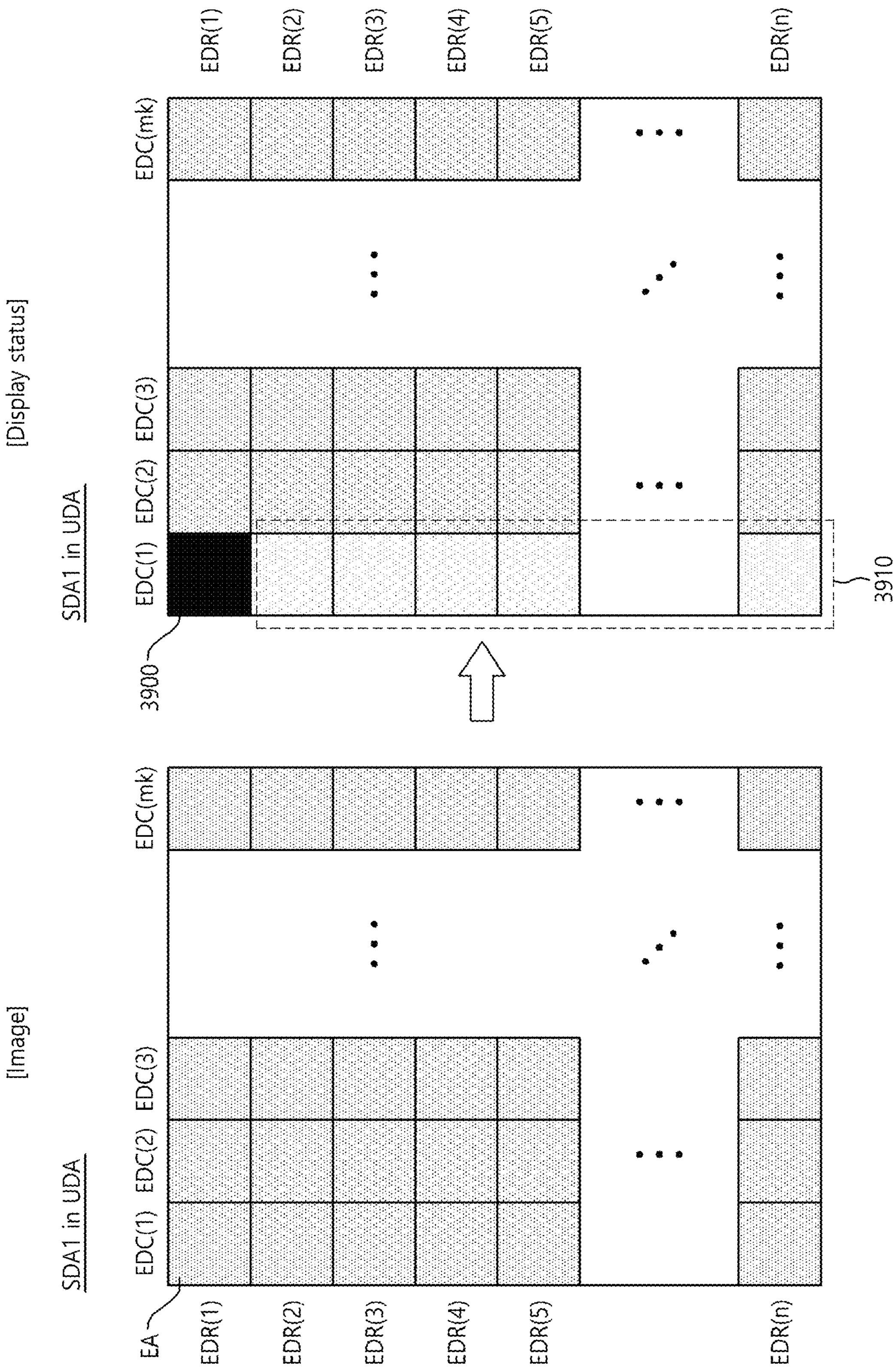

FIG. 39 illustrates an image and a display state for the first sub-driving area SDA1 when the first light emitting device column EDC(1) arranged in the first sub-driving area SDA1 included in the unit driving area UDA has a defective point.

Referring to FIG. 39, in the case that the first light emitting device column EDC(1) among the first to (mk)-th light emitting device columns EDC(1) to EDC(mk) arranged in the first sub-driving area SDA1 included in the unit driving area UDA has a defective point, the display state of the first sub-driving area SDA1 included in the unit driving area UDA may be different from the image (or image data) to be expressed in the first sub-driving area SDA1 included in the unit driving area UDA. In particular, the display state in the area corresponding to the first light emitting device column EDC(1) having a defective point may be different from the image data in the area corresponding to the first light emitting device column EDC(1) having a defective point.

Referring to FIG. 39, in the first light emitting device column EDC(1) arranged in the first sub-driving area SDA1 included in the unit driving area UDA, since there is a defect in the first light emitting device ED(1) or there is a defect in which the first light emitting device ED(1) is missing, during the first display-on driving period D_ON(1) in which the first display-on driving for the first light emitting device ED(1) is performed, the emission area EA corresponding to the first light emitting device ED(1) may exhibit an abnormal emission state. That is, during the first display-on driving period D_ON(1) in which the first display-on driving is in progress, the emission area EA corresponding to the first light emitting device ED(1) may be an abnormal emission area 3900 due to a defect.

For example, in the case that the first light emitting device column EDC(1) among the first to (mk)-th light emitting device columns EDC(1) to EDC(mk) arranged in the first sub-driving area SDA1 included in the unit driving area UDA has a defective point, due to a defect or omission of the first light emitting device column EDC(1), unwanted weak light emission WEL may occur in the second to n-th light emitting devices ED(2) to ED(n).

Referring to FIG. 39, in the first light emitting device column EDC(1) arranged in the first sub-driving area SDA1 included in the unit driving area UDA, since the first light emitting device ED(1) has a defect or there is a defect in which the first light emitting device ED(1) is missing, during the first display-on driving period D_ON(1) for performing the first display-on driving for the first light emitting device ED(1), an unwanted minute current may flow to the second to n-th light emitting devices ED(2) to ED(n) included in the first light emitting device column EDC(1) and connected to the first column line CL(1), so that unwanted weak light emission may occur in the second to n-th light emitting devices ED(2) to ED(n).

Accordingly, during the first display-on driving period D_ON(1), an area 3910 including the emission areas EA corresponding to the second to n-th light emitting devices ED(2) to ED(n) may refer to the remaining area in the first light emitting device column EDC(1) excluding the defective point.

During the first display-on driving period D_ON(1), the area 3910 including the emission areas EA corresponding to the second to n-th light emitting devices ED(2) to ED(n) may be abnormally displayed brighter than the brightness defined by the image to be displayed.

During the first display-on driving period D_ON(1), the area 3910 that is abnormally displayed brighter due to the influence of the defect may refer to the remaining area in the first light emitting device column EDC(1) excluding the defective point. Here, the defective point may be the location of the defective first light emitting device ED(1) or the location where the first light emitting device ED(1) is missing (i.e., missing area MA).

As described above, if there is a defect in the light emitting device ED or there is a defect in which the light emitting device ED is missing, an abnormally bright phenomenon may occur in the light emitting device column where the defective point exists. This phenomenon may appear as an image defect of the display panel 110. This phenomenon (i.e., image defect phenomenon) is referred to as an “abnormal bright display phenomenon due to defect” in this disclosure. The place where the abnormal bright display phenomenon occurs may be an area 3910 excluding the defective point 3900 in the light emitting device column EDC1 to which the defective point 3900 belongs.

In the case of the display device 100 according to the embodiments of this disclosure, the first electrodes of a plurality of light emitting devices ED have a characteristic in which they are commonly connected to one column line CL. Due to these characteristics, if a defect occurs due to a defect and/or omission of some of the light emitting devices EDs among the plurality of light emitting devices ED, an abnormal light emission phenomenon may also occur in a normal light emitting device ED among the plurality of light emitting devices ED commonly connected to one column line CL. This may lead to an image defect of the display panel 110.

Accordingly, the display device 100 according to the embodiments of the present disclosure may provide a defect improvement driving method capable of preventing an abnormal bright display phenomenon due to a defect. Hereinafter, a defect improvement driving method of the display device 100 according to the embodiments of the present disclosure will be described.

Figure 40:
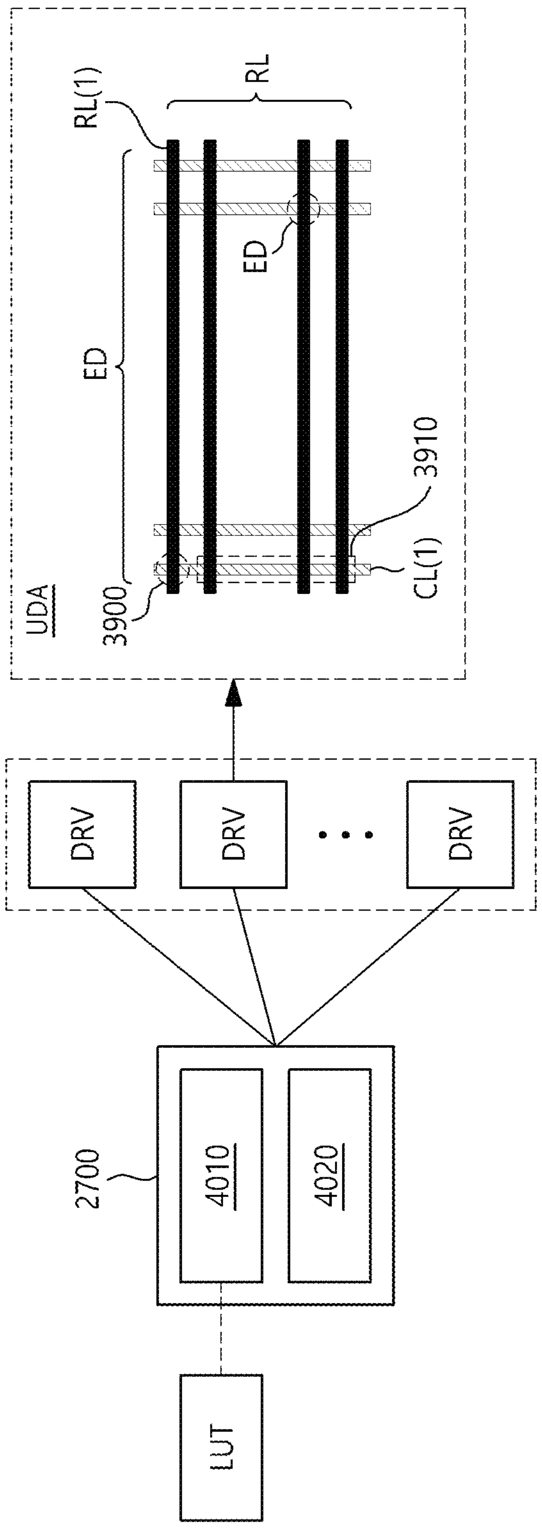
FIG. 40 illustrates a defect improvement driving system of a display device according to exemplary embodiments of the present disclosure.

FIG. 40 illustrates a defect improvement driving system of a display device 100 according to exemplary embodiments of the present disclosure.

Referring to FIG. 40, a display device 100 according to exemplary embodiments of the present disclosure may include a plurality of drivers DRV configured to drive a plurality of light emitting devices ED, and a controller 2700 (e.g., a circuit) configured to control the plurality of drivers DRV.

The controller 2700 may be configured to output image data or various control signals for controlling the operation of the plurality of drivers DRV to each of the plurality of drivers DRV. The various control signals for controlling the operation of the plurality of drivers DRV output by the controller 2700 may include control signals corresponding to the image data. The fact that the control signal corresponds to the image data may mean that, when the corresponding driver DRV operates according to the control signal, the corresponding image may be displayed by the light emission of each of the light emitting devices ED according to the operation of the corresponding driver DRV.

Various control signals for controlling the operation of the plurality of drivers DRV output by the controller 2700 may include a control signal for controlling the operation of the column driver C-DRV.

As an example, the control signal for controlling the operation of the column driver C-DRV may include a first emission control signal EM1 for controlling the on-off of the first emission control transistor EMT1 in the column driver C-DRV of FIG. 5.

In another example, the control signal for controlling the operation of the column driver C-DRV may include a first emission control signal EM1 for controlling the on-off of the first emission control transistor EMT1 in the column driver C-DRV of FIG. 8. In addition, the control signal for controlling the operation of the column driver C-DRV may further include an on-off control signal for at least one of the initialization switch SW_INT, the pre-charge switch SW_PRC, and the reset switch SW_RST in the column driver C-DRV of FIG. 8.

In another example, the control signal for controlling the operation of the column driver C-DRV may include at least one of the first emission control signal EM1 for controlling the on-off of the first emission control transistor EMT1 in the column driver C-DRV of FIG. 9, and the second emission control signal EM2 for controlling the on-off of the second emission control transistor EMT2. In addition, the control signal for controlling the operation of the column driver C-DRV may further include at least one of the first to fourth scan signals SC1 to SC4 in the column driver C-DRV of FIG. 9.

Various control signals for controlling the operation of the plurality of drivers DRV may include a control signal for controlling the operation of the row driver R-DRV.

As an example, the control signal for controlling the operation of the row driver R-DRV may include a control signal for controlling the on-off of each of the n display-on switches SW_ON(1) to SW_ON(n) and the n display-off switches SW_OFF(1) to SW_OFF(n) included in the row driver R-DRV of FIG. 8.

In another example, various control signals for controlling the operation of the row driver R-DRV may include n display-on control signals CS1(1) to CS1(*n*) and n display-off control signals CS2(1) to CS1(*n*) that control the on-off of n display-on transistors TR_ON(1) to TR_ON(n) and n display-off transistors TR_OFF(1) to TR_OFF(n) included in the row driver D-DRV of FIG. 9.

Each of the plurality of drivers DRV may drive two or more row lines RL and two or more column lines CL arranged in the corresponding unit driving area UDA under the control of the controller 270, and may drive at least one light emitting device ED arranged at each point where the two or more row lines RL and the two or more column lines CL intersect.

As described above, if at least one defective point 3900 exists in at least one of the plurality of unit driving areas UDA driven by the plurality of drivers DRV, an abnormal bright display phenomenon due to the defect may occur. Each defective point 3900 may include an area (or point) where a light emitting device ED with a defect is arranged or a missing area of the light emitting device ED. The area where the abnormal bright display phenomenon due to the defect occurs may mean an area 3910 excluding the defective point 3900 in the light emitting device column to which the defective point 3900 belongs.

The display device 100 according to the embodiments of the present disclosure may include a defect improvement driving system that performs defect improvement driving capable of preventing an abnormal bright display phenomenon due to a defect. The defect improvement driving system may include a plurality of controllers 2700.

The defect improvement driving according to the embodiments of the present disclosure is a driving that prevents normal light emitting devices ED from abnormally emitting light due to a defect even if a defect occurs due to a defect and/or omission of some light emitting devices ED and may be a driving that can prevent an abnormal bright display phenomenon due to a defect.

As exemplified above, if it is assumed that the defective point 3900 is an area where the first light emitting device ED(1) is arranged or an area where the first light emitting device ED(1) is omitted or missing, the plurality of column lines CL may include a first column line CL(1) electrically connected to the first electrode of the first light emitting device ED(1) or overlapping with at least a portion of the missing area MA. In addition, the plurality of row lines RL may include a first row line RL(1) that is electrically connected to the second electrode of the first light emitting device ED(1) or overlaps with at least a portion of the missing area MA.

The plurality of drivers DRV may include a first driver DRV configured to drive the first row line RL(1) and the first column line CL(1).

During the defect improvement driving, the first driver DRV may supply a predefined low level voltage to the first column line CL(1) during a predefined first display-on driving period D_ON(1) for the first light emitting device ED(1).

The controller 2700 may generate compensation image data as image data for the first light emitting device ED(1) based on the defect information and output the compensation image data or a compensation control signal corresponding to the compensation image data to the first driver DRV.

For example, the compensation control signal may be a control signal included in various control signals for controlling the operation of the driver DRV. As another example, the compensation control signal may be a specific power voltage.

For example, the defect information may include information about a defect in the first light emitting device ED(1) (e.g., position information of the first light emitting device ED(1)) or information about a missing area MA where the first light emitting device ED(1) is missing (e.g., position information of the missing area MA or the missing first light emitting device ED(1)).

For example, the first driver DRV may perform a driving operation using compensation image data or a compensation control signal provided from the controller 2700. For example, during the first display-on driving period D_ON (1), the first driver DRV may supply a predefined low level voltage to the first column line CL(1) according to compensation image data or a compensation control signal provided from the controller 2700.

The controller 2700 may be included in a first circuit component 230 or a second circuit component 240 of FIG. 2. As an example, the controller 2700 may be a timing controller.

Referring to FIG. 40, the controller 2700 may include a defect detection unit 4010 (e.g., a circuit) that detects defect information, and a compensation unit 4020 (e.g., a circuit) that performs compensation processing to prevent or at least reduce abnormal bright display phenomenon due to defects based on the defect information detected by the defect detection unit 4010.

The defect detection unit 4010 may detect defect information by checking whether a defect point exists on the display panel 110 or checking the location information of the defect point.

For example, the defect information may include whether a defect point exists and the location information of the defect point. The defect information may further include defect type information, etc.

For example, the location information of the defect point may include identification information or location information of a subpixel corresponding to the defect point and identification information or location information of a light emitting device corresponding to the defect point.

For example, the location information of the defective point may further include identification information or location information of the unit driving area UDA where the defective point exists, and identification information or location information of the driver DRV of the unit driving area UDA where the defective point exists.

For example, the defect type information may include at least one of defect type information due to a defect in the light emitting device ED and defect type information due to an omission of a light emitting device ED.

Referring to FIG. 40, the defect detection unit 4010 may refer to the look-up table LUT to check whether a defective point exists in the display panel 110 or to check the location information of the defective point. The look-up table LUT may include defect information including information that a defect exists in the first light emitting device ED(1) or information that the first light emitting device ED(1) is missing.

A defect in the display panel 110 may occur during the manufacturing process of the display panel 110. In this case, the look-up table LUT may include defect information obtained through a preliminary test conducted during the manufacturing process of the display panel 110.

Meanwhile, a defect in the display panel 110 may occur after the manufacturing process of the display panel 110 is completed. In this case, the defect detection unit 4010 may detect defect information based on an image generated during image compensation through image inspection.

Hereinafter, the defect improvement driving method according to the embodiments of the present disclosure briefly described above will be described in more detail.

FIGS. 41, 42, 43A, 43B, 44, and 45 are diagrams illustrating defect improvement driving when the first light emitting device column EDC(1) has a defect point in the display device 100 according to the embodiments of the present disclosure. FIGS. 27 to 40 may also be referred to in the following description.

Figure 41:
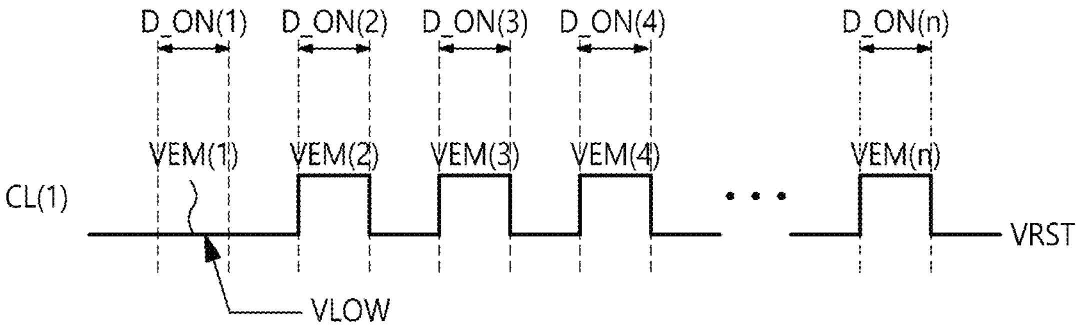
FIG. 41, FIG. 42, FIG. 43A, FIG. 43B, FIG. 44, and FIG. 45 are diagrams illustrating defect improvement driving in a display device according to exemplary embodiments of the present disclosure in the case that a first light emitting device column has a defective point.
Figure 42:
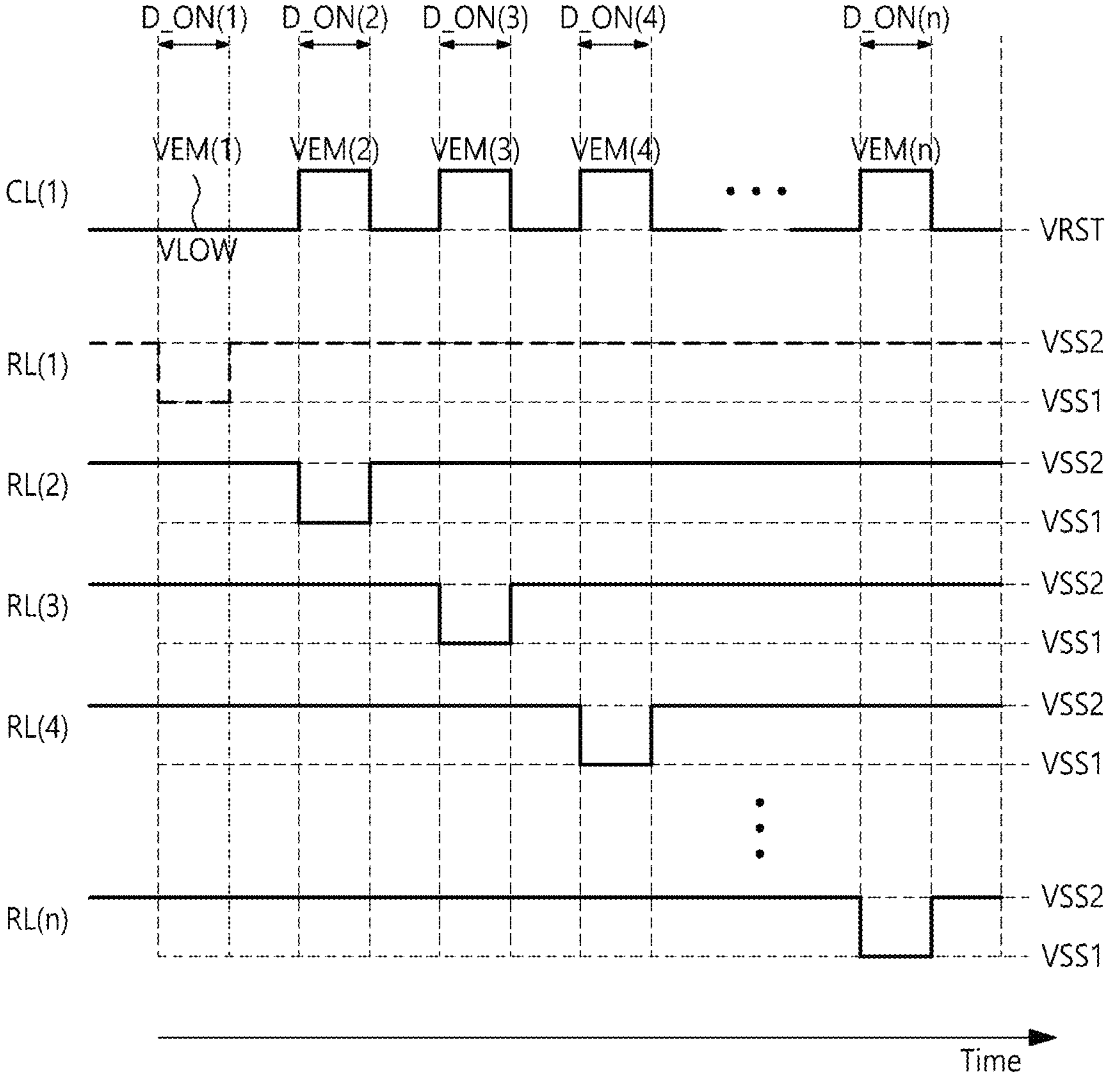

FIG. 41 illustrates the voltage change of the first column line CL(1) arranged in the first light emitting device column EDC(1) having a defective point when driving the first light emitting device column EDC(1) having a defective point, and FIG. 42 is a driving timing diagram for the first light emitting device column EDC(1) having a defective point in the display device 100 according to the embodiments of the present disclosure.

Referring to FIG. 41 and FIG. 42, during the first display-on driving period D_ON(1), the first low-potential voltage VSS1, which is a low-potential voltage for display-on driving, may be supplied to the first row line RL(1), and the first display voltage VEM(1) may be supplied to the first column line CL(1).

For example, during the first display-on driving period D_ON(1), the first low-potential voltage VSS1, which is a low-potential voltage for display-on driving, may be supplied to the first row line RL(1), and a second low-potential voltage VSS2 may be applied to the second to n-th row lines RL(2) to RL(n).

Referring to FIG. 41 and FIG. 42, during the second display-on driving period D_ON(2), the first low-potential voltage VSS1, which is a low-potential voltage for display-on driving, may be supplied to the second row line RL(2), and the second display voltage VEM(2) may be supplied to the first column line CL(1).

For example, during the second display-on driving period D_ON(2), the first low-potential voltage VSS1, which is a low-potential voltage for display-on driving, may be supplied to the second row line RL(2), and a second low-potential voltage VSS2 may be applied to the first row line RL(1) and the third to n-th row lines RL(3) to RL(n).

The first row line RL(1) has a first low-potential voltage VSS1 during the first display-on driving period D_ON(1), but may have a second low-potential voltage VSS2 higher than the first low-potential voltage VSS1 before and after the first display-on driving period D_ON(1). Here, before and after the first display-on driving period D_ON(1) may mean immediately before and immediately after the first display-on driving period D_ON(1).

In this case, the first display voltage VEM(1) supplied to the first column line CL(1) may be a predefined low level voltage VLOW. That is, during a first display-on driving period D_ON(1) predefined for the first light emitting device ED(1), a predefined low level voltage VLOW may be supplied to the first column line CL(1) as a first display voltage VEM(1). For example, the low level voltage VLOW may be a voltage corresponding to predefined black data, a voltage corresponding to predefined low grayscale data, a reset voltage VRST for display driving, or a voltage corresponding to brightness below a predefined brightness level. For example, the low level voltage VLOW may have a voltage value that is the same as or similar to the reset voltage VRST.

During a first display-on driving period D_ON(1) defined in advance for the first light emitting device ED(1) arranged in the first light emitting device column EDC(1), a predefined low level voltage VLOW is supplied as a first display voltage VEM(1) to the first column line CL(1), so that even if a defect occurs due to a defect or omission of the first light emitting device ED(1), an unwanted current can be prevented from flowing to the second to n-th light emitting devices ED(2) to ED(n) arranged in the first light emitting device column EDC(1).

Therefore, the predefined low level voltage VLOW may have a voltage value that does not generate a current in the first column line CL(1).

During the first display-on driving period D_ON(1), a second low-potential voltage VSS2, which is a low-potential voltage for display-off driving, may be applied to the second to n-th row lines RL(2) to RL(n).

During the first display-on driving period D_ON(1), there is no light emission in the first light emitting device column EDC(1).

During the second display-on driving period D_ON(2), a second display voltage VEM(2) may be applied to the first column line CL(1). During the second display-on driving period D_ON(2), a first low-potential voltage VSS1 may be applied to the second row line RL(2), and a second low-potential voltage VSS2 may be applied to the first row line RL(1) and the third to n-th row lines RL(3) to RL(n)).

Accordingly, during the second display-on driving period D_ON(2), only the second light emitting device ED(2) in the first light emitting device column EDC(1) may emit light. Here, the second light emitting device ED(2) may include a first electrode Ecl(2) electrically connected to the first column line CL(1) and a second electrode Erl(2) electrically connected to the second row line RL(2) (see FIG. 27).

Figure 43A:
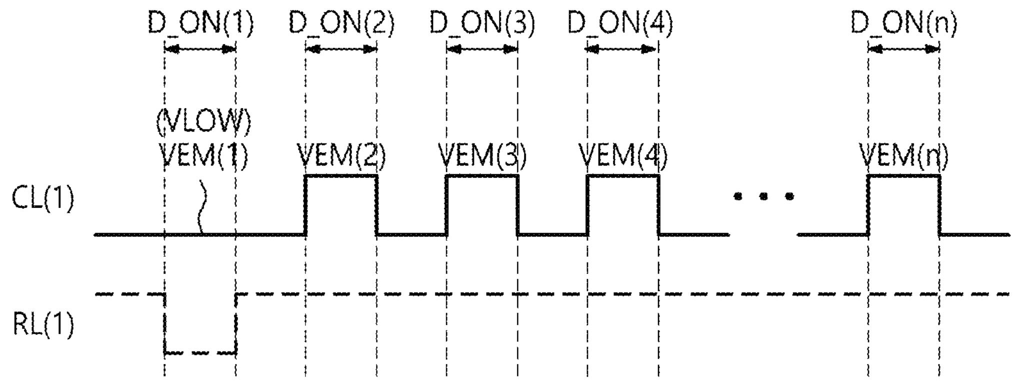
Figure 43B:
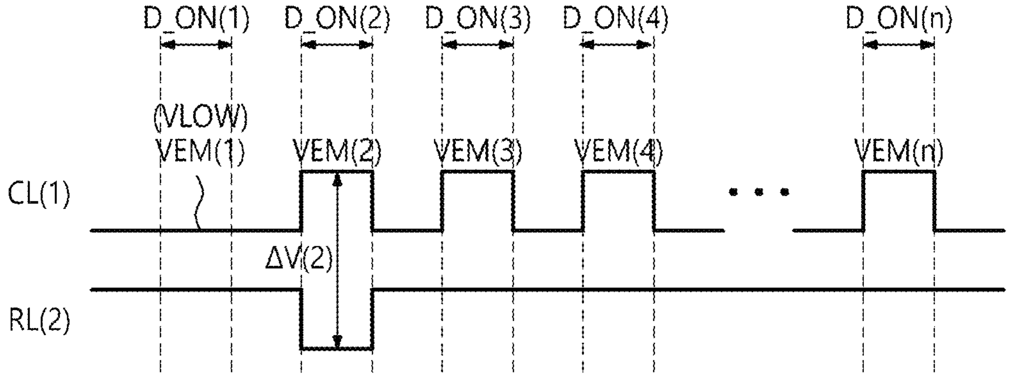

FIG. 43A is a driving timing diagram for the first row line RL(1) and the first column line CL(1) having a defective point in a display device 100 according to exemplary embodiments of the present disclosure, and FIG. 43B is a driving timing diagram for the second row line RL(2) and the first column line CL(1) having a defective point in a display device 100 according to exemplary embodiments of the present disclosure.

Referring to FIG. 43A, during the first display-on driving period D_ON(1), a low level voltage VLOW predefined as a first display voltage VEM(1) may be applied to the first column line CL(1), and a first low-potential voltage VSS1 may be applied to the first row line RL(1).

Since there is a defect in the first light emitting device ED(1) connected between the first row line RL(1) and the first column line CL(1) or there is a defect in which the first light emitting device ED(1) is missing between the first row line RL(1) and the first column line CL(1), during the first display-on driving period D_ON(1), the defective first light emitting device ED(1) does not emit light, or there is no light emission itself in the area where the first light emitting device ED(1) is missing.

In addition, since the low level voltage VLOW predefined as the first display voltage VEM(1) is applied to the first column line CL(1), even if there is a defect due to a defect or omission of the first light emitting device ED(1), the current according to the first display voltage VEM(1) is not generated in the first column line CL(1).

Therefore, during the first display-on driving period D_ON(1), weak light emission does not occur in the second to n-th light emitting devices ED(2) to ED(n). That is, during the first display-on driving period D_ON(1), the second to n-th light emitting devices ED(2) to ED(n) may be in a normal non-emission state.

Referring to FIG. 43B, after the first display-on driving period D_ON(1), a predefined second display-on driving period D_ON(2) may be performed for the second light emitting device ED.

Referring to FIG. 43B, during the second display-on driving period D_ON(2), a second display voltage VEM(2) higher than the low level voltage VLOW may be applied to the first column line CL(1), and a first low-potential voltage VSS1 may be applied to the second row line RL(2). At this time, a second low-potential voltage VSS2 may be applied to the first row line RL(1).

During the second display-on driving period D_ON(2), the voltage difference (VEM(2)−VSS1) between the first column line CL(1) and the second row line RL(2) may be a second voltage ΔV(2).

Referring to FIG. 43B, a second light emitting device ED(2) may be connected between the first column line CL(1) and the second row line RL(2). That is, a first electrode Ecl(2) of the second light emitting device ED(2) may be electrically connected to the first column line CL(1), and a second electrode Erl(2) of the second light emitting device ED(2) may be electrically connected to the second row line RL(2). Here, the second light emitting device ED(2) is arranged in the same column as the first light emitting device ED(1) and may have a first electrode electrically connected to the first column line CL(1).

Referring to FIG. 43B, during the second display-on driving period D_ON(2), the voltage difference (VEM(2)−VSS1) between the first column line CL(1) and the second row line RL(2) may be equal to or higher than the threshold voltage of the second light emitting device ED(2).

During the second display-on driving period D_ON(2), the voltage difference (VEM(2)−VSS1) between the first column line CL(1) and the second row line RL(2) may be the voltage difference (VEM(2)−VSS1) between the first electrode Ecl(2) and the second electrode Erl(2) of the second light emitting device ED(2).

Therefore, the voltage difference (VEM(2)−VSS1) between the first electrode Ecl(2) and the second electrode Erl(2) of the second light emitting device ED(2) may be the second voltage ΔV(2). The second voltage ΔV(2) may be higher than the threshold voltage of the second light emitting device ED(2). Therefore, during the second display-on driving period D_ON(2), the second light emitting device ED(2) can emit light by the current supplied from the column driver C-DRV.

Figure 44:
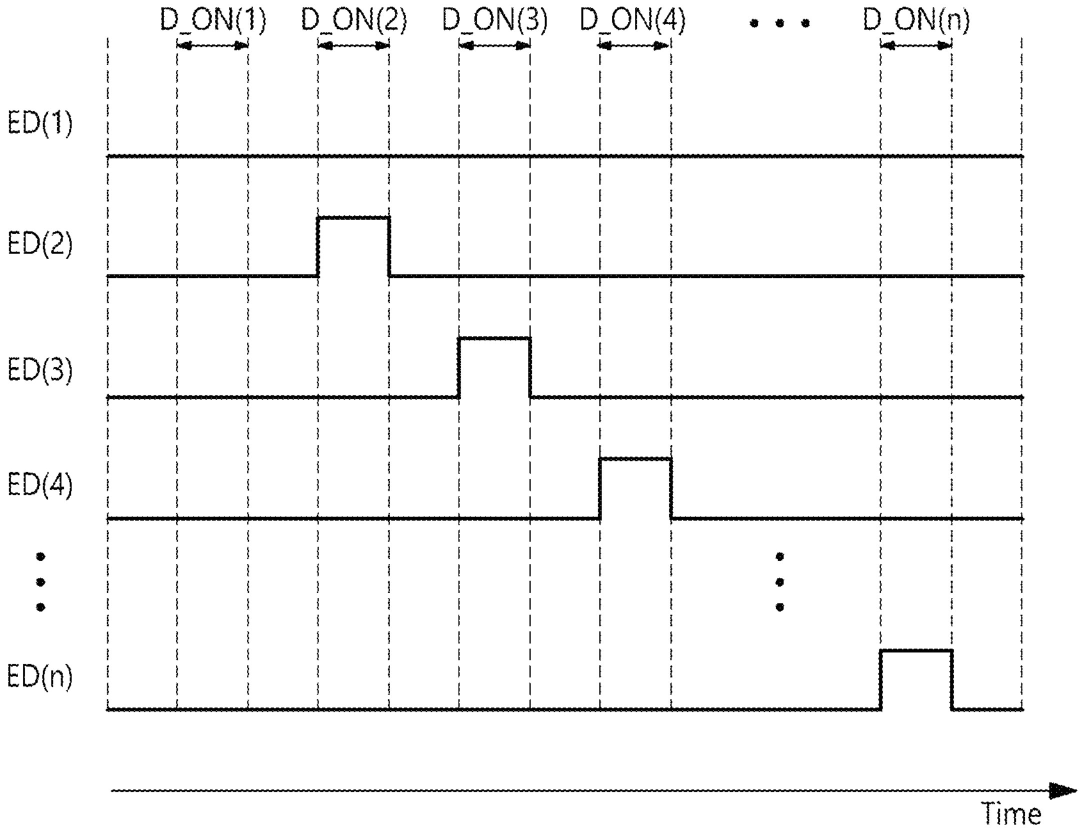

FIG. 44 illustrates the emission state (e.g., emission luminance) of n light emitting devices ED(1) to ED(n) arranged in the first light emitting device column EDC(1)

having a defective point in the display device 100 according to the embodiments of the present disclosure.

Referring to FIG. 44, during the first display-on driving period D_ON(1), due to a defect or omission of the first light emitting device ED(1), the first light emitting device ED(1) does not emit light or there is no light emission in an area where the first light emitting device ED(1) is missing. In comparison, during the second to n-th display-on driving periods D_ON(2) to D_ON(n), the normal second to n-th light emitting devices ED(2) to ED(n) can sequentially emit normal light.

During the first display-on driving period D_ON(1), even if there is a defect caused by a defect or omission of the first light emitting device ED(1), since a predefined low level voltage VLOW is applied to the first column line CL(1), current is not generated in the first column line CL(1) during the first display-on driving period D_ON(1), and thus current does not flow to the first electrodes Ecl(2) to Ecl(n) of the second to n-th light emitting devices ED(2) to ED(n).

As a result, during the first display-on driving period D_ON(1), undesired weak light emission WEL does not occur in the second to n-th light emitting devices ED(2) to ED(n) due to a defect caused by a defect or omission of the first light emitting device ED(1). That is, during the first display-on driving period D_ON(1), the second to n-th light emitting devices ED(2) to ED(n) may be in a normal non-emission state. This means that the "abnormal bright display phenomenon due to defect" is prevented.

Figure 45:
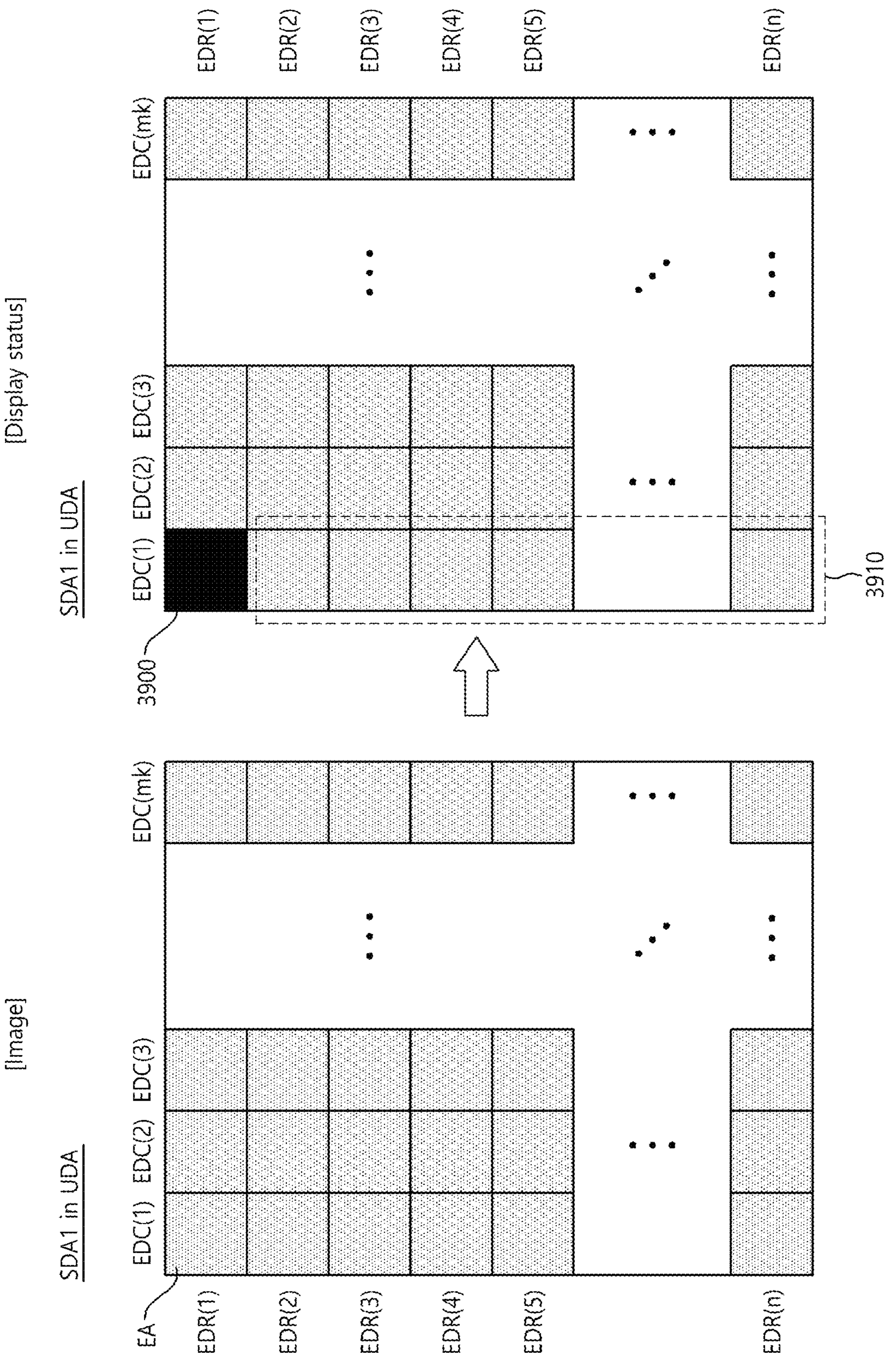
Figure 46:
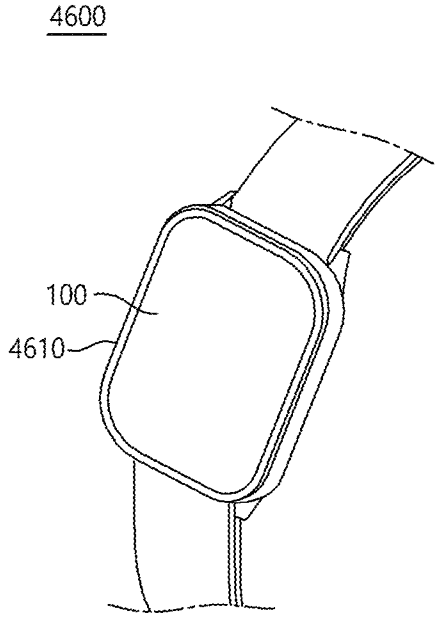
FIG. 46 to FIG. 49 illustrate various devices with a display device according to exemplary embodiments of the present disclosure.
Figure 47:
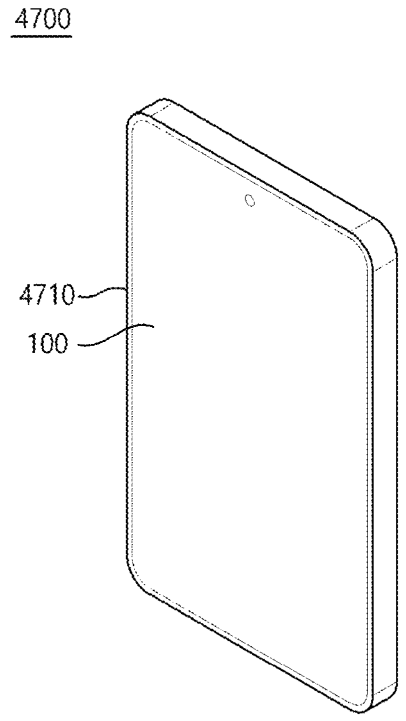
Figure 48:
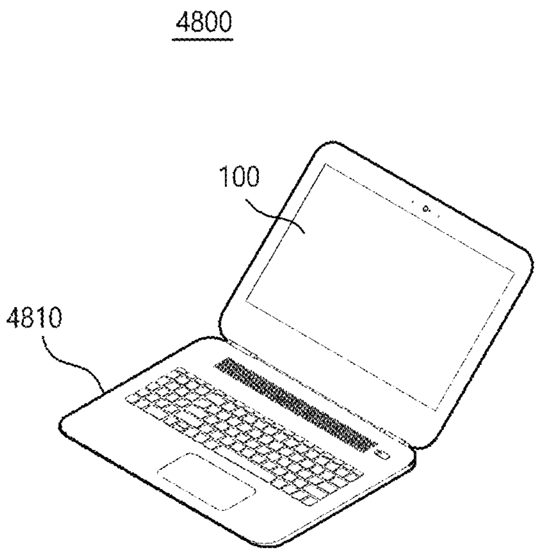
Figure 49:
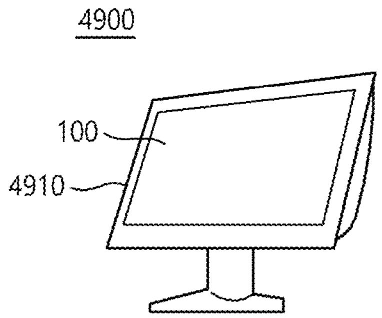

FIG. 45 illustrates an image and display state for a first sub-driving area SDA1 when a first light emitting device column EDC(1) arranged in a first sub-driving area SDA1 included in a unit driving area UDA has a defective point.

Referring to FIG. 45, if there is a defective point in the first light emitting device column EDC(1) among the first to (mk)-th light emitting device columns EDC(1) to EDC(mk) arranged in the first sub-driving area SDA1 included in the unit driving area UDA, the display state of the first sub-driving area SDA1 may be different from the image (or image data) to be expressed in the first sub-driving area SDA1. In particular, the display state in the area corresponding to the first light emitting device column EDC(1) having the defective point may be different from the image to be displayed in the area corresponding to the first light emitting device column EDC(1) having the defective point.

Referring to FIG. 45, in the first light emitting device column EDC(1) arranged in the first sub-driving area SDA1 included in the unit driving area UDA, since there is a defect in the first light emitting device ED(1) or there is a defect in which the first light emitting device ED(1) is missing, during the first display-on driving period D_ON(1), the emission area EA corresponding to the defective or missing first light emitting device ED(1) may exhibit an abnormal emission state. That is, during the first display-on driving period D_ON(1) in which the first display-on driving is in progress, the emission area EA corresponding to the defective or missing first light emitting device ED(1) may be an abnormal emission area 3900 due to a defect.

Referring to FIG. 45, in the first light emitting device column EDC(1) arranged in the first sub-driving area SDA1 included in the unit driving area UDA, even if there is a defect in the first light emitting device ED(1) or there is a defect in which the first light emitting device ED(1) is missing, during the first display-on driving period D_ON(1) in which the first display-on driving for the first light emitting device ED(1) is performed according to the defect improvement driving, an unwanted minute current does not flow to the second to n-th light emitting devices ED(2) to ED(n) included in the first light emitting device column EDC(1) and connected to the first column line CL(1) according to the defect improvement driving, and thus, unwanted weak light emission may not occur in the second to n-th light emitting devices ED(2) to ED(n).

During the first display-on driving period D_ON(1), even if there is a defect in the first light emitting device ED(1) or there is a defect in which the first light emitting device ED(1) is missing, according to the defect improvement driving, the area 3910 including the emission areas EA corresponding to the second to n-th light emitting devices ED(2) to ED(n) may be in a normal non-emission state. This means that the "abnormal bright display phenomenon due to defect" is prevented.

The display device 100 according to the embodiments of the present disclosure described above can be applied to various types of devices. Hereinafter, various devices to which the display device 100 according to the embodiments of the present disclosure is applied will be described.

FIGS. 46 to 49 illustrate various devices 4600, 4700, 4800 and 4900 to which the display device 100 according to the embodiments of the present disclosure is applied.

Referring to FIGS. 46 to 49, the display device 100 according to the embodiments of the present disclosure may be included in various devices or electronic devices. For example, referring to FIGS. 46 to 49, the various electronic devices may include a wearable device 4600, a mobile device 4700, a notebook 4800, and a monitor or television (TV) 4900, but the embodiments of the present disclosure are not limited thereto.

Each of the wearable device 4600, the mobile device 4700, the notebook 4800, and the monitor or TV 4900 may include the display device 100 according to the embodiments of the present disclosure described with reference to FIGS. 1 to 45, and a case unit 4610, 4710, 4810 and 4910, respectively.

For example, the display device 100 according to the embodiment of the present disclosure can be applied to a mobile device, a video phone, a smart watch, a watch phone, a wearable apparatus, a foldable apparatus, a rollable apparatus, a bendable apparatus, a flexible apparatus, a curved apparatus, a sliding apparatus, a variable apparatus, an electronic notebook, an electronic book, a portable multimedia player (PMP), a personal digital assistant (PDA), an MP3 player, a mobile medical device, a desktop PC, a laptop PC, a netbook computer, a workstation, a navigation system, a vehicle display device, a theater display device, a television, a wallpaper device, a signage device, a game device, a notebook, a monitor, a camera, a camcorder, and home appliances.

A display device according to exemplary embodiments of the present disclosure may be described as follows.

A display device according to exemplary embodiments of the present disclosure may include a substrate including a display area, a plurality of light emitting devices disposed in the display area, a plurality of column lines disposed in the display area and extending in a column direction respectively, a plurality of row lines disposed in the display area and extending in a row direction respectively, and a plurality of drivers disposed on the substrate and positioned in the display area, and configured to drive the plurality of column lines and the plurality of row lines.

In the display device according to exemplary embodiments of the present disclosure, each of the plurality of column lines may be electrically connected in common with a first electrode of each of two or more light emitting devices arranged in the same column among the plurality of light emitting devices. Each of the plurality of row lines may be electrically connected in common with a second electrode of each of two or more light emitting devices arranged in the same row among the plurality of light emitting devices.

In the display device according to exemplary embodiments of the present disclosure, the plurality of light emitting devices may include a first light emitting device with a defect, or a missing area in which the first light emitting device is missing may exist in an arrangement of the plurality of light emitting devices. In this case, the plurality of column lines may include a first column line electrically connected to a first electrode of the first light emitting device or disposed to overlap with at least a part of the missing area, and the plurality of row lines may include a first row line electrically connected to a second electrode of the first light emitting device or disposed to overlap with at least a part of the missing area.

In the display device according to exemplary embodiments of the present disclosure, a predefined low level voltage may be supplied to the first column line during a first display-on driving period predefined for the first light emitting device.

In the display device according to exemplary embodiments of the present disclosure, the low level voltage may be a voltage corresponding to predefined black data, a voltage corresponding to predefined low grayscale data, a reset voltage for driving a display, or a voltage corresponding to brightness below a predefined brightness level.

In the display device according to exemplary embodiments of the present disclosure, the first row line may have a first low-potential voltage during the first display-on driving period and may have a second low-potential voltage higher than the first low-potential voltage before and after the first display-on driving period.

In the display device according to exemplary embodiments of the present disclosure, the plurality of light emitting devices may include a second light emitting device arranged in the same column as the first light emitting device and having a first electrode electrically connected to the first column line. The plurality of row lines may further include a second row line electrically connected to a second electrode of the second light emitting device.

In the display device according to exemplary embodiments of the present disclosure, a second display-on driving period for the second light emitting device may be performed after the first display-on driving period. During the second display-on driving period, the first column line may have a display voltage higher than the low level voltage, the first row line may have the second low-potential voltage, and the second row line may have the first low-potential voltage.

In the display device according to exemplary embodiments of the present disclosure, during the second display-on driving period, a voltage difference between the first column line and the second row line may be greater than a threshold voltage of the second light emitting device. Accordingly, the second light emitting device may emit light during the second display-on driving period.

In the display device according to exemplary embodiments of the present disclosure, current may not flow through the second light emitting device during the first display-on driving period. For example, during the first display-on driving period, no current may flow through the second light emitting device, which is one of the other light emitting devices connected to the first column line.

The display device according to exemplary embodiments of the present disclosure may further include a controller configured to output image data or a control signal corresponding to the image data to each of the plurality of drivers. The plurality of drivers may include a first driver configured to drive the first row line and the first column line. The controller may generate compensation image data as image data for the first light emitting device based on defect information including information on a defect or omission of the first light emitting device, and output the compensation image data or a compensation control signal corresponding to the compensation image data to the first driver, In the display device according to exemplary embodiments of the present disclosure, the defect information may include information on a defect or an omission of the first light emitting device.

The display device according to exemplary embodiments of the present disclosure may further include a look-up table including defect information regarding the defect or the omission of the first light emitting device.

In the display device according to exemplary embodiments of the present disclosure, the low level voltage may be a voltage supplied to the first column line according to the compensation image data or the compensation control signal. That is, during the first display-on driving period, the first driver may supply the low level voltage to the first column line according to the compensation image data or the compensation control signal.

In the display device according to exemplary embodiments of the present disclosure, the display area may include a plurality of unit driving areas corresponding to the plurality of drivers. Each of the plurality of unit driving areas may include two or more row lines among the plurality of row lines and two or more column lines among the plurality of column lines. The plurality of unit driving areas may include a first unit driving area and a second unit driving area. Two or more row lines included in the first unit driving area and two or more row lines included in the second unit driving area may be spaced apart from each other or electrically isolated, and two or more column lines included in the first unit driving area and two or more column lines included in the second unit driving area may be spaced apart from each other or electrically isolated.

In the display device according to exemplary embodiments of the present disclosure, each of the two or more row lines included in each of the plurality of unit driving areas may be applied with one of a display-on driving voltage and a display-off driving voltage that are different from each other. The display-on driving voltage may be sequentially applied to the two or more row lines. For example, at one point in time, a display-on driving voltage may be applied to one row line among two or more row lines arranged in each of the first sub-driving area and the second sub-driving area included in each of the plurality of unit driving areas, and a display-off driving voltage may be applied to the remaining row lines.

In the display device according to exemplary embodiments of the present disclosure, the display-on driving voltage may be a first low-potential voltage, and the display-off driving voltage may be a second low-potential voltage higher than the first low-potential voltage.

In the display device according to exemplary embodiments of the present disclosure, each of the plurality of light emitting devices may include a first electrode electrically connected to a corresponding column line among the plurality of column lines, and a second electrode electrically connected to a corresponding row line among the plurality of row lines.

In the display device according to exemplary embodiments of the present disclosure, during a display driving period of the display device, a first low-potential voltage may be applied to at least one row line among the plurality of row lines, and a second low-potential voltage higher than the first low-potential voltage may be applied to at least one other row line different from the at least one row line among the plurality of row lines.

In the display device according to exemplary embodiments of the present disclosure, during the display driving period, the light emitting devices overlapping with at least a portion of the at least one row line may emit light, and the light emitting devices overlapping with at least a portion of the at least one other row line may not emit light.

In the display device according to exemplary embodiments of the present disclosure, the display driving period may include a pre-charge period, an emission period, and a reset period.

In the display device according to exemplary embodiments of the present disclosure, during the pre-charge period, the emission period, and the reset period, the first low-potential voltage may be applied to the at least one row line, and the second low-potential voltage may be applied to the at least one other row line.

In the display device according to exemplary embodiments of the present disclosure, a pre-charge voltage may be applied to at least one column line among the plurality of column lines during the pre-charge period, a display voltage may be applied to the at least one column line during the emission period, and a reset voltage may be applied to the at least one column line during the reset period.

In the display device according to exemplary embodiments of the present disclosure, among the pre-charge voltage, the display voltage and the reset voltage, the reset voltage may have a lowest voltage value, and the display voltage may have a highest voltage value.

The display device according to exemplary embodiments of the present disclosure may further include a plurality of pixels disposed in the display area. Each of the plurality of pixels may include a first subpixel including a first light emitting device emitting a first color light, a second subpixel including a second light emitting device emitting a second color light, and a third subpixel including a third light emitting device emitting a third color light.

In the display device according to exemplary embodiments of the present disclosure, the display driving period may include a first display driving period including a first pre-charge period, a first emission period, and a first reset period for the first subpixel, a second display driving period including a second pre-charge period, a second emission period, and a second reset period for the second subpixel, and a third display driving period including a third pre-charge period, a third emission period, and a third reset period for the third subpixel.

In the display device according to exemplary embodiments of the present disclosure, a timing of the first emission period, a timing of the second emission period, and a timing of the third emission period may be different from each other, and a first length of the first emission period, a second length of the second emission period, and a third length of the third emission period may be different from each other.

In the display device according to exemplary embodiments of the present disclosure, the first display driving period may further include a first offset period prior to the first pre-charge period, the second display driving period may further include a second offset period prior to the second pre-charge period, the third display driving period may further include a third offset period prior to the third pre-charge period. A length of the first offset period, a length of the second offset period, and a length of the third offset period may be different from each other.

In the display device according to exemplary embodiments of the present disclosure, the display area may include a plurality of unit driving areas corresponding to the plurality of drivers. Each of the plurality of unit driving areas may include two or more row lines among the plurality of row lines and two or more column lines among the plurality of column lines. Each of the plurality of drivers may include a row driver configured to drive two or more row lines arranged in a corresponding unit driving area among the plurality of row lines, and a column driver configured to drive two or more column lines arranged in a corresponding unit driving area among the plurality of column lines.

In the display device according to exemplary embodiments of the present disclosure, a driving period of at least one of the plurality of row lines may include a first period in which a first voltage (e.g., first low-potential voltage) is applied, a second period in which a second voltage (e.g., second low-potential voltage) higher than the first voltage (e.g., first low-potential voltage) is applied, and a third period in which a signal having a variable voltage level (e.g., touch driving signal) is applied. Here, the lowest voltage of the signal having a variable voltage level may be higher than the first voltage.

The display device according to exemplary embodiments of the present disclosure may further include a plurality of pixels disposed in the display area. The plurality of column lines may include a plurality of main column lines and a plurality of redundancy column lines. Each of the plurality of pixels may include k main light emitting devices connected to k main column lines among the plurality of main column lines, and k redundancy light emitting devices connected to k redundancy column lines among the plurality of redundancy column lines. Here, k may be a natural number greater than or equal to 2.

The display device according to exemplary embodiments of the present disclosure may further include a layer stack on the plurality of drivers disposed on the substrate, an optical layer disposed between the plurality of light emitting devices on the layer stack, an adhesive layer disposed on the plurality of light emitting devices and the optical layer, and a cover member disposed on the adhesive layer. The plurality of column lines may be disposed between the layer stack and the plurality of light emitting devices. The plurality of row lines may be disposed on the plurality of light emitting devices and the optical layer.

In the display device according to exemplary embodiments of the present disclosure, the display device may further comprise an overcoat layer disposed on the plurality of light emitting devices and the optical layer. The adhesive layer may be disposed on the overcoat layer.

In the display device according to exemplary embodiments of the present disclosure, the layer stack may include a side protection layers disposed on each side of the plurality of drivers, an upper protection layers disposed on the plurality of drivers and the side protection layers, a plurality of insulating layers disposed on the upper protection layers, and a bank disposed on the plurality of insulating layers. Each of the plurality of light emitting devices may be disposed on the bank and positioned in an opening of the optical layer. At least a portion of each of the plurality of column lines may extend onto the bank on the plurality of insulating layers. Each of the plurality of row lines may be disposed on the optical layer and the plurality of light emitting devices. A first electrode of each of the plurality of light emitting device may be electrically connected to at least a portion of a column line extending onto the bank among the plurality of column lines. A second electrode of each of the plurality of light emitting devices may be electrically connected to one of the plurality of row lines.

In the display device according to exemplary embodiments of the present disclosure, the substrate may further comprise a non-display area, the non-display area comprises a bending area. The side protection layers may comprise a first protection layer and a second protection layer, and at least one of the first protection layer and the second protection layer is removed in all or part of the bending area.

In the display device according to exemplary embodiments of the present disclosure, the plurality of insulating layers may include a first insulating layer on the upper protection layer and a second insulating layer on the first insulating layer. The layer stack may further include a plurality of line connection patterns connecting each of a plurality of lines including the plurality of row lines and the plurality of column lines with the plurality of drivers.

In the display device according to exemplary embodiments of the present disclosure, the plurality of line connection patterns may include a first line connection pattern disposed on the side protection layer, a second line connection pattern disposed on the upper protection layer and electrically connected to the first line connection pattern through a hole in the upper protection layer, a third line connection pattern disposed on the first insulating layer and electrically connected to the second line connection pattern through a hole in the first insulating layer, and a fourth line connection pattern disposed on the second insulating layer and electrically connected to the third line connection pattern through a hole in the second insulating layer.

In the display device according to exemplary embodiments of the present disclosure, the first line connection pattern may be electrically connected to one of the plurality of drivers. The fourth line connection pattern may be electrically connected to the second electrode of at least one of the plurality of light emitting devices, or may be electrically connected to the first electrode of at least one of the plurality of light emitting devices.

In the display device according to exemplary embodiments of the present disclosure, the side protection layer may include at least one organic layer.

A display device according to exemplary embodiments of the present disclosure may include a substrate including a display area, a plurality of light emitting devices disposed in the display area, a plurality of column lines arranged in the display area and extending in a column direction respectively, a plurality of row lines arranged in the display area and extending in a row direction respectively, and a plurality of drivers arranged on the substrate and positioned in the display area and configured to drive the plurality of column lines and the plurality of row lines.

In the display device according to exemplary embodiments of the present disclosure, each of the plurality of column lines may be electrically connected in common with a first electrode of each of two or more light emitting devices arranged in the same column among the plurality of light emitting devices. Each of the plurality of row lines may be electrically connected in common with a second electrode of each of two or more light emitting devices arranged in the same row among the plurality of light emitting devices.

In the display device according to exemplary embodiments of the present disclosure, the plurality of row lines may include a first row line. A first low-potential voltage may be applied to the first row line during a first period. A second low-potential voltage higher than the first low-potential voltage may be applied to the first row line during a second period different from the first period.

In the display device according to exemplary embodiments of the present disclosure, a signal having a swing voltage level may be applied to the first row line during a third period different from the first period and the second period.

A display device according to exemplary embodiments of the present disclosure may include a substrate including a display area; a plurality of light emitting devices disposed in the display area and comprising a first light emitting device with a defect; a plurality of column lines comprising a first column line electrically connected to the first light emitting device. A predefined low level voltage may be supplied to the first column line during a first display-on driving period predefined for the first light emitting device. During the first display-on driving period, the other light emitting devices connected to the first column line except for the first light emitting device do not emit light.

Although the embodiments of the present disclosure are described in more detail with reference to the attached drawings, the present disclosure is not necessarily limited to these embodiments, and various modifications may be made without departing from the technical spirit of the present disclosure. Accordingly, the embodiments disclosed in the present disclosure are not intended to limit the technical spirit of the present disclosure, but to explain, and the scope of the technical spirit of the present disclosure is not limited by these embodiments. Therefore, the embodiments described above should be understood as illustrative and not restrictive in all respects.

What is claimed is:

1. A display device comprising:

a substrate including a display area;

a plurality of light emitting devices in the display area;

a plurality of column lines in the display area, the plurality of column lines extending in a column direction;

a plurality of row lines in the display area, the plurality of row lines extending in a row direction; and a plurality of drivers on the substrate and in the display area, the plurality of drivers configured to drive the plurality of column lines and the plurality of row lines, wherein the plurality of light emitting devices include a first light emitting device with a defect, or a missing area in which the first light emitting device is missing exists in an arrangement of the plurality of light emitting devices, wherein the plurality of column lines include a first column line electrically connected to a first electrode of the first light emitting device or overlapping with at least a part of the missing area, wherein the plurality of row lines include a first row line electrically connected to a second electrode of the first light emitting device or overlapping with at least a part of the missing area, wherein a predefined low level voltage is supplied to the first column line during a first display-on driving period predefined for the first light emitting device.

2. The display device of claim 1, wherein each of the plurality of column lines is electrically connected in common with a first electrode of each of two or more light emitting devices arranged in a same column among the plurality of light emitting devices, wherein each of the plurality of row lines is electrically connected in common with a second electrode of each of two or more light emitting devices arranged in a same row among the plurality of light emitting devices.

3. The display device of claim 1, wherein the predefined low level voltage is a voltage corresponding to predefined black data, a voltage corresponding to predefined low gray-scale data, a reset voltage that drives a display, or a voltage corresponding to brightness below a predefined brightness level.

4. The display device of claim 1, wherein the first row line has a first low-potential voltage during the first display-on driving period and has a second low-potential voltage that is greater than the first low-potential voltage before and after the first display-on driving period.

5. The display device of claim 4, wherein the plurality of light emitting devices include a second light emitting device arranged in a same column as the first light emitting device and having a first electrode electrically connected to the first column line, wherein the plurality of row lines further include a second row line electrically connected to a second electrode of the second light emitting device, wherein a second display-on driving period for the second light emitting device is performed after the first display-on driving period, wherein, during the second display-on driving period, the first column line has a display voltage that is greater than the predefined low level voltage, the first row line has the second low-potential voltage, and the second row line has the first low-potential voltage.

6. The display device of claim 5, wherein, during the second display-on driving period, a voltage difference between the first column line and the second row line is greater than a threshold voltage of the second light emitting device, and the second light emitting device emits light.

7. The display device of claim 5, wherein current does not flow through the second light emitting device during the first display-on driving period.

8. The display device of claim 1, further comprising:

a controller configured to output image data or a control signal corresponding to the image data to each of the plurality of drivers, wherein the plurality of drivers include a first driver configured to drive the first row line and the first column line, wherein the controller generates compensation image data as image data for the first light emitting device based on defect information including information on a defect or omission of the first light emitting device, and outputs the compensation image data or a compensation control signal corresponding to the compensation image data to the first driver, wherein the first driver supplies the predefined low level voltage to the first column line according to the compensation image data or the compensation control signal.

9. The display device of claim 8, further comprising:

a look-up table including defect information regarding the defect or the omission of the first light emitting device.

10. The display device of claim 1, wherein the display area includes a plurality of unit driving areas corresponding to the plurality of drivers, wherein each of the plurality of unit driving areas includes two or more row lines among the plurality of row lines and two or more column lines among the plurality of column lines, wherein the plurality of unit driving areas include a first unit driving area and a second unit driving area, wherein two or more row lines included in the first unit driving area and two or more row lines included in the second unit driving area are spaced apart from each other or electrically isolated, wherein two or more column lines included in the first unit driving area and two or more column lines included in the second unit driving area are spaced apart from each other or electrically isolated.

11. The display device of claim 10, wherein each of the two or more row lines included in each of the plurality of unit driving areas is applied with one of a display-on driving voltage and a display-off driving voltage that are different from each other, wherein the display-on driving voltage is sequentially applied to the two or more row lines.

12. The display device of claim 11, wherein the display-on driving voltage is a first low-potential voltage and the display-off driving voltage is a second low-potential voltage that is greater than the first low-potential voltage.

13. The display device of claim 1, wherein, during a display driving period of the display device, a first low-potential voltage is applied to at least one row line among the plurality of row lines and a second low-potential voltage that is greater than the first low-potential voltage is applied to at least one other row line that is different from the at least one row line among the plurality of row lines.

14. The display device of claim 13, wherein, during the display driving period, light emitting devices from the plurality of light emitting devices overlapping with at least a portion of the at least one row line emit light and light emitting devices from the plurality of light emitting devices overlapping with at least a portion of the at least one other row line do not emit light.

15. The display device of claim 13, wherein the display driving period includes a pre-charge period, an emission period, and a reset period, wherein, during the pre-charge period, the emission period, and the reset period, the first low-potential voltage is applied to the at least one row line and the second low-potential voltage is applied to the at least one other row line, wherein a pre-charge voltage is applied to at least one column line among the plurality of column lines during the pre-charge period, a display voltage is applied to the at least one column line during the emission period, and a reset voltage is applied to the at least one column line during the reset period.

16. The display device of claim 15, wherein among the pre-charge voltage, the display voltage and the reset voltage, the reset voltage has a lowest voltage value and the display voltage has a highest voltage value.

17. The display device of claim 15, further comprising:

a plurality of pixels in the display area, each of the plurality of pixels comprising a first subpixel including a first light emitting device emitting a first color light, a second subpixel including a second light emitting device emitting a second color light, and a third subpixel including a third light emitting device emitting a third color light, wherein the display driving period includes;

a first display driving period including a first pre-charge period, a first emission period, and a first reset period for the first subpixel, a second display driving period including a second pre-charge period, a second emission period, and a second reset period for the second subpixel, and a third display driving period including a third pre-charge period, a third emission period, and a third reset period for the third subpixel, wherein a timing of the first emission period, a timing of the second emission period, and a timing of the third emission period are different from each other, and a first length of the first emission period, a second length of the second emission period, and a third length of the third emission period are different from each other.

18. The display device of claim 17, wherein the first display driving period further includes a first offset period prior to the first pre-charge period, the second display driving period further includes a second offset period prior to the second pre-charge period, the third display driving period further includes a third offset period prior to the third pre-charge period, wherein a length of the first offset period, a length of the second offset period, and a length of the third offset period are different from each other.

19. The display device of claim 1, wherein the display area includes a plurality of unit driving areas corresponding to the plurality of drivers, each of the plurality of unit driving areas including two or more row lines among the plurality of row lines and two or more column lines among the plurality of column lines, wherein each of the plurality of drivers includes:

a row driver configured to drive two or more row lines arranged in a corresponding unit driving area among the plurality of row lines; and a column driver configured to drive two or more column lines arranged in a corresponding unit driving area among the plurality of column lines.

20. The display device of claim 1, wherein a driving period of at least one of the plurality of row lines includes:

a first period during which a first voltage is applied;

a second period during which a second voltage that is greater than the first voltage is applied; and a third period during which a signal having a variable voltage level is applied.

21. The display device of claim 20, wherein a lowest voltage of the signal having the variable voltage level is greater than the first voltage.

22. The display device of claim 1, further comprising:

a plurality of pixels in the display area, wherein the plurality of column lines include a plurality of main column lines and a plurality of redundancy column lines, wherein each of the plurality of pixels includes k main light emitting devices connected to k main column lines among the plurality of main column lines, and k redundancy light emitting devices connected to k redundancy column lines among the plurality of redundancy column lines, wherein k is a natural number greater than or equal to 2.

23. The display device of claim 1, further comprising:

a layer stack on the plurality of drivers disposed on the substrate;

an optical layer between the plurality of light emitting devices on the layer stack;

an adhesive layer on the plurality of light emitting devices and the optical layer; and a cover member on the adhesive layer, wherein the plurality of column lines are between the layer stack and the plurality of light emitting devices, wherein the plurality of row lines are on the plurality of light emitting devices and the optical layer.

24. The display device of claim 23, further comprising:

an overcoat layer on the plurality of light emitting devices and the optical layer, wherein the adhesive layer is on the overcoat layer.

25. The display device of claim 23, wherein the layer stack includes:

side protection layers on each side of the plurality of drivers;

upper protection layers on the plurality of drivers and the side protection layers;

a plurality of insulating layers on the upper protection layers; and a bank on the plurality of insulating layers, wherein each of the plurality of light emitting devices is on the bank and positioned in an opening of the optical layer, wherein at least a portion of each of the plurality of column lines extends onto the bank on the plurality of insulating layers, wherein each of the plurality of row lines is on the optical layer and the plurality of light emitting devices, wherein a first electrode of each of the plurality of light emitting devices is electrically connected to at least a portion of a column line extending onto the bank among the plurality of column lines, wherein a second electrode of each of the plurality of light emitting devices is electrically connected to one of the plurality of row lines.

26. The display device of claim 25, wherein the substrate further comprises a non-display area that includes a bending area, and wherein the side protection layers comprise a first protection layer and a second protection layer, and at least one of the first protection layer and the second protection layer is not disposed in all or part of the bending area.

27. The display device of claim 25, wherein the plurality of insulating layers include a first insulating layer on the upper protection layers and a second insulating layer on the first insulating layer, wherein the layer stack further includes a plurality of line connection patterns connecting each of a plurality of lines including the plurality of row lines and the plurality of column lines with the plurality of drivers, wherein the plurality of line connection patterns include:

a first line connection pattern on the side protection layers;

a second line connection pattern on the upper protection layers and electrically connected to the first line connection pattern through a hole in the upper protection layers;

a third line connection pattern on the first insulating layer and electrically connected to the second line connection pattern through a hole in the first insulating layer; and a fourth line connection pattern on the second insulating layer and electrically connected to the third line connection pattern through a hole in the second insulating layer, wherein the first line connection pattern is electrically connected to one of the plurality of drivers, wherein the fourth line connection pattern is electrically connected to the second electrode of at least one of the plurality of light emitting devices or is electrically connected to the first electrode of at least one of the plurality of light emitting devices.

28. The display device of claim 25, wherein the side protection layers include at least one organic layer.

29. A display device comprising:

a substrate including a display area;

a plurality of light emitting devices in the display area;

a plurality of column lines in the display area, the plurality of column lines extending in a column direction;

a plurality of row lines in the display area, the plurality of row lines extending in a row direction; and a plurality of drivers on the substrate and in the display area, the plurality of drivers configured to drive the plurality of column lines and the plurality of row lines, wherein each of the plurality of column lines is electrically connected in common with a first electrode of each of two or more light emitting devices arranged in a same column among the plurality of light emitting devices, wherein each of the plurality of row lines is electrically connected in common with a second electrode of each of two or more light emitting devices arranged in a same row among the plurality of light emitting devices, and wherein, during one frame time, each of the plurality of column lines has a voltage that varies over time and each of the plurality of row lines has a voltage that varies over time.

30. The display device of claim 29, wherein the plurality of row lines include a first row line, wherein a first low-potential voltage is applied to the first row line during a first period, wherein a second low-potential voltage that is greater than the first low-potential voltage is applied to the first row line during a second period different from the first period.

31. The display device of claim 30, wherein a signal having a swing voltage level is applied to the first row line during a third period that is different from the first period and the second period.

32. The display device of claim 29, wherein the plurality of light emitting devices include a first light emitting device with a defect or a missing area in which the first light emitting device is missing exists in an arrangement of the plurality of light emitting devices, wherein the plurality of column lines include a first column line electrically connected to a first electrode of the first light emitting device or overlapping with at least a portion of the missing area, wherein the plurality of row lines include a first row line electrically connected to a second electrode of the first light emitting device or overlapping with at least a portion of the missing area, wherein a predefined low level voltage is supplied to the first column line during a first display-on driving period predefined for the first light emitting device.

33. The display device of claim 32, wherein the predefined low level voltage is a voltage corresponding to predefined black data, a voltage corresponding to predefined low grayscale data, or a voltage corresponding to brightness below a predefined brightness level.

34. The display device of claim 32, wherein current does not flow to other light emitting devices connected to the first column line except for the first light emitting device during the first display-on driving period.

35. A display device comprising:

a substrate including a display area;

a plurality of light emitting devices in the display area, the plurality of light emitting devices comprising a first light emitting device with a defect;

a plurality of column lines comprising a first column line that is electrically connected to a first electrode of the first light emitting device; and a plurality of row lines comprising a first row line that is electrically connected to a second electrode of the first light emitting device, wherein a predefined low level voltage is supplied to the first column line during a first display-on driving period predefined for the first light emitting device, wherein, during the first display-on driving period, other light emitting devices connected to the first column line except for the first light emitting device do not emit light, and wherein, during one frame time including the first display-on driving period, each of the plurality of column lines has a voltage that varies over time and each of the plurality of row lines has a voltage that varies over time.

* * * * *